(12) United States Patent
Takemoto et al.

(10) Patent No.: US 11,973,135 B2
(45) Date of Patent: Apr. 30, 2024

(54) SEMICONDUCTOR DEVICE

(71) Applicant: NISSAN MOTOR CO., LTD., Yokohama (JP)

(72) Inventors: Keisuke Takemoto, Kanagawa (JP); Tetsuya Hayashi, Kanagawa (JP); Wei Ni, Kanagawa (JP); Toshiharu Marui, Kanagawa (JP); Ryouta Tanaka, Kanagawa (JP); Shigeharu Yamagami, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 271 days.

(21) Appl. No.: 16/967,195

(22) PCT Filed: Feb. 6, 2018

(86) PCT No.: PCT/JP2018/003893
§ 371 (c)(1),
(2) Date: Aug. 4, 2020

(87) PCT Pub. No.: WO2019/155504
PCT Pub. Date: Aug. 15, 2019

(65) Prior Publication Data
US 2020/0365717 A1    Nov. 19, 2020

(51) Int. Cl.
*H01L 29/872* (2006.01)
*H01L 29/20* (2006.01)
*H01L 29/47* (2006.01)
*H01L 29/66* (2006.01)
*H01L 29/778* (2006.01)
*H01L 29/861* (2006.01)

(52) U.S. Cl.
CPC ...... *H01L 29/7783* (2013.01); *H01L 29/2003* (2013.01); *H01L 29/47* (2013.01); *H01L 29/66462* (2013.01); *H01L 29/7786* (2013.01); *H01L 29/7787* (2013.01); *H01L 29/861* (2013.01); *H01L 29/872* (2013.01); *H01L 29/8725* (2013.01)

(58) Field of Classification Search
None
See application file for complete search history.

(56) References Cited

U.S. PATENT DOCUMENTS

2008/0315256 A1    12/2008   Ohta et al.
2012/0305987 A1    12/2012   Hirler et al.
(Continued)

FOREIGN PATENT DOCUMENTS

CN    104051520 A    9/2014
CN    107564960 A    1/2018
(Continued)

*Primary Examiner* — Grant S Withers
(74) *Attorney, Agent, or Firm* — Foley & Lardner LLP

(57) ABSTRACT

A semiconductor device includes a main groove formed in a main surface of a substrate, a semiconductor region formed in contact with a surface of the main groove, an electron supply region formed in contact with a surface of the semiconductor region on opposite sides of at least side surfaces of the main groove to generate a two-dimensional electron gas layer in the semiconductor region, and a first electrode and a second electrode formed in contact with the two-dimensional electron gas layer and apart from each other.

21 Claims, 171 Drawing Sheets

(56) References Cited

U.S. PATENT DOCUMENTS

| | | | |
|---|---|---|---|
| 2013/0099247 A1 | 4/2013 | Palacios et al. | |
| 2013/0264579 A1 | 10/2013 | Bridger et al. | |
| 2014/0070228 A1 | 3/2014 | Palacios et al. | |
| 2014/0264369 A1* | 9/2014 | Padmanabhan | H01L 29/785 438/172 |
| 2014/0291725 A1 | 10/2014 | Ishiguro et al. | |
| 2015/0187886 A1 | 7/2015 | Park et al. | |
| 2016/0343844 A1 | 11/2016 | Then et al. | |
| 2017/0222034 A1 | 8/2017 | Xiao et al. | |
| 2017/0243967 A1 | 8/2017 | Kim et al. | |

FOREIGN PATENT DOCUMENTS

| | | |
|---|---|---|
| EP | 2 779 247 A2 | 9/2014 |
| JP | 5-055263 A | 3/1993 |
| JP | 5-283337 A | 10/1993 |
| JP | 2006-120694 A | 5/2006 |
| JP | 2008-311355 A | 12/2008 |
| JP | 2009-212291 A | 9/2009 |
| JP | 2014-534632 A | 12/2014 |

* cited by examiner

SEMICONDUCTOR DEVICE

TECHNICAL FIELD

The present invention relates to a semiconductor device.

BACKGROUND ART

A high electron mobility field effect transistor (High Electron Mobility Transistor) device having an AlGaN/GaN hetero structure (hereinafter, also referred to as AlGaN/GaN-HEMT or GaN-HEMT) is conventionally known (see Patent Literature 1). In Patent Literature 1, a GaN semiconductor substrate is configured by sequentially stacking a buffer layer, a channel layer (GaN layer), a Schottky layer (AlGaN layer), and a cap layer (GaN layer) on a silicon substrate. Electrons confined in the vicinity of the heterojunction between the channel layer and the Schottky layer (two-dimensional electron gas: 2DEG) have high mobility, and the current due to the two-dimensional electron gas flowing between the source and the drain is controlled by the voltage applied to the gate.

CITATION LIST

Patent Literature

Patent Literature 1: Japanese Unexamined Patent Application Publication No. 2006-120694

SUMMARY OF INVENTION

However, in the GaN-HEMT of Patent Literature 1, the source electrode and the drain electrode are formed in contact with the cap layer and electrically connected to the two-dimensional electron gas layer near the heterojunction through the cap layer and the Schottky layer. Accordingly, the current due to the two-dimensional electron gas flows to the source electrode or the drain electrode through the cap layer and the Schottky layer, which impairs the high electron mobility of the GaN-HEMT and increases the on-resistance.

The present invention has been made in view of the above-described problem, and an object thereof is to provide a semiconductor device reducing on-resistance.

Solution to Problem

A semiconductor device according to an aspect of the present invention includes a main groove formed in a main surface of a substrate, a semiconductor region formed in contact with a surface of the main groove, an electron supply region formed in contact with a surface of the semiconductor region on opposite sides of at least side surfaces of the main groove to generate a two-dimensional electron gas layer in the semiconductor region, and a first electrode and a second electrode formed in contact with the two-dimensional electron gas layer and apart from each other. The main groove has a depth greater than or equal to a width of the main groove.

Advantageous Effects

According to the present invention, on-resistance is reduced.

BRIEF DESCRIPTION OF DRAWINGS

FIG. 65 is a perspective view illustrating the method for manufacturing the semiconductor device according to the modification 3 of the second embodiment.

FIG. 66A is a perspective view illustrating the method for manufacturing the semiconductor device according to the modification 3 of the second embodiment.

FIG. 66B is a sectional view along a section A-A in FIG. 66A.

FIG. 67A is a perspective view illustrating the method for manufacturing the semiconductor device according to the modification 3 of the second embodiment.

FIG. 67B is a sectional view along a section A-A in FIG. 67A.

FIG. 68A is a perspective view illustrating the method for manufacturing the semiconductor device according to the modification 3 of the second embodiment.

FIG. 68B is a sectional view along a section A-A in FIG. 68A.

FIG. 69A is a perspective view illustrating a configuration of a semiconductor device according to a modification 4 of the second embodiment.

FIG. 69B is a sectional view along a section A-A in FIG. 69A.

FIG. 69C is a sectional view along a section B-B in FIG. 69A.

FIG. 70A is a perspective view illustrating a method for manufacturing the semiconductor device according to the modification 4 of the second embodiment.

FIG. 70B is a sectional view along a section A-A in FIG. 70A.

Figure 71:
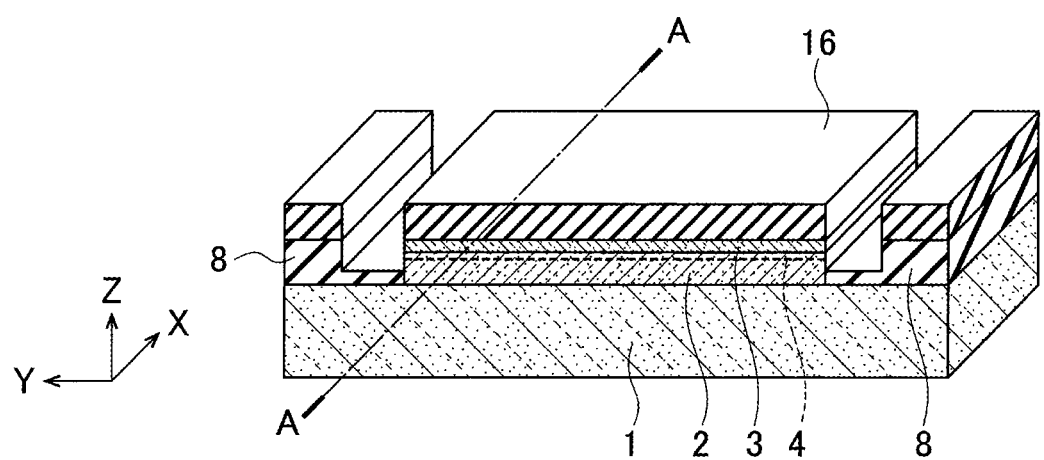

FIG. 71 is a perspective view illustrating the method for manufacturing the semiconductor device according to the modification 4 of the second embodiment.

Figure 72A:
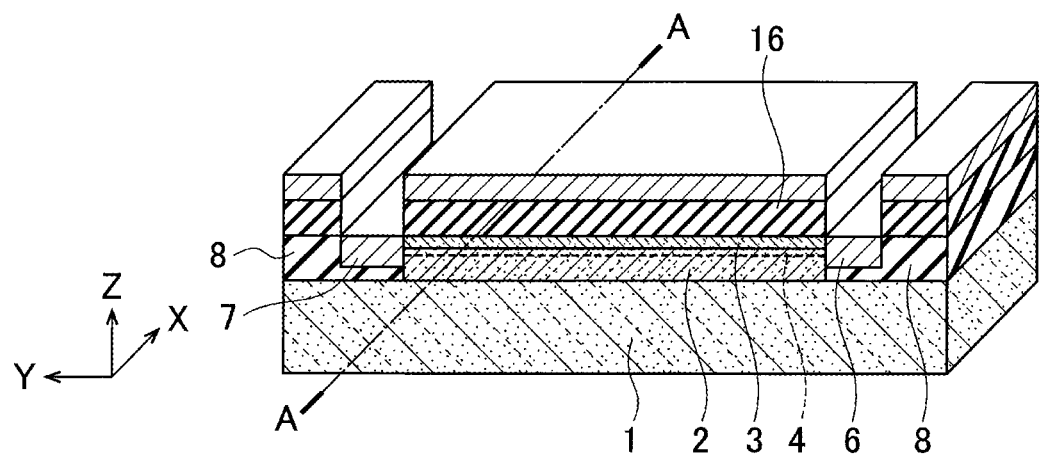

FIG. 72A is a perspective view illustrating the method for manufacturing the semiconductor device according to the modification 4 of the second embodiment.

Figure 72B:
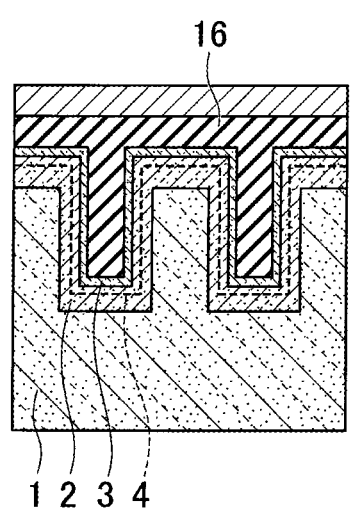

FIG. 72B is a sectional view along a section A-A in FIG. 72A.

Figure 73A:
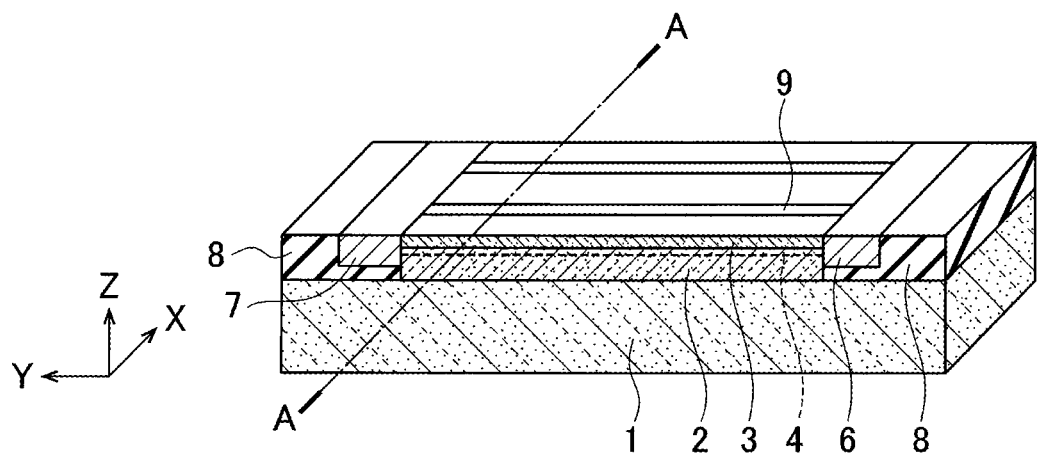

FIG. 73A is a perspective view illustrating the method for manufacturing the semiconductor device according to the modification 4 of the second embodiment.

Figure 73B:
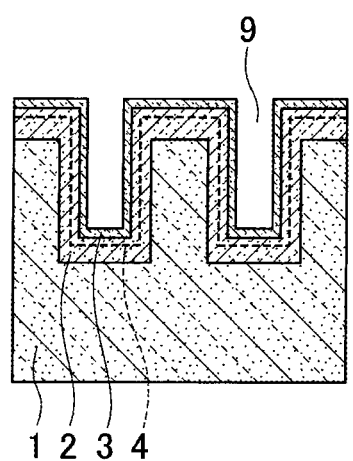

FIG. 73B is a sectional view along a section A-A in FIG. 73A.

Figure 74A:
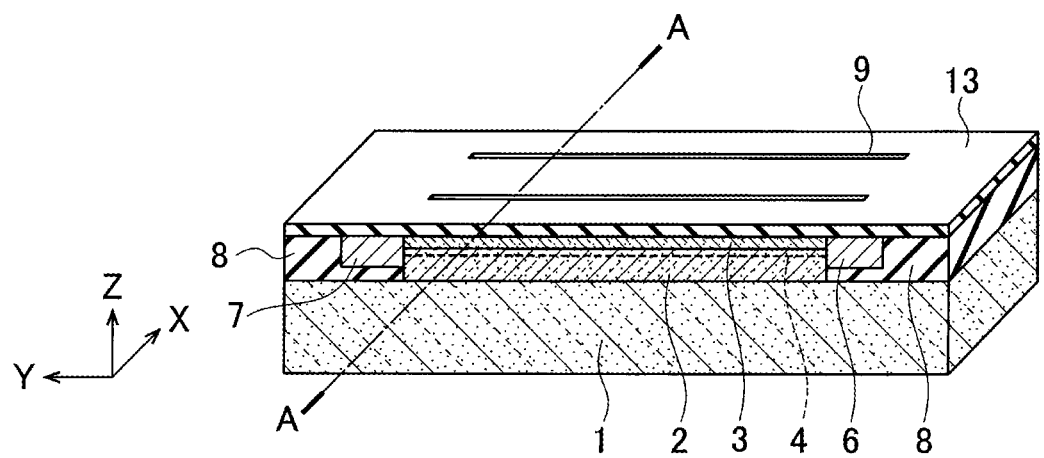

FIG. 74A is a perspective view illustrating the method for manufacturing the semiconductor device according to the modification 4 of the second embodiment.

Figure 74B:
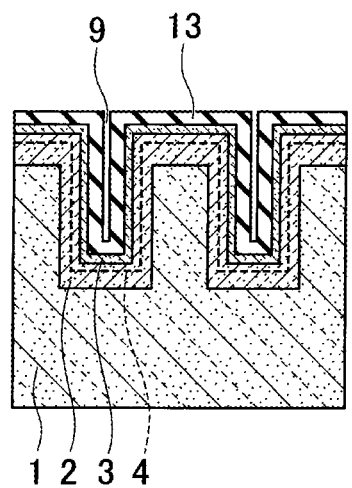

FIG. 74B is a sectional view along a section A-A in FIG. 74A.

Figure 75:
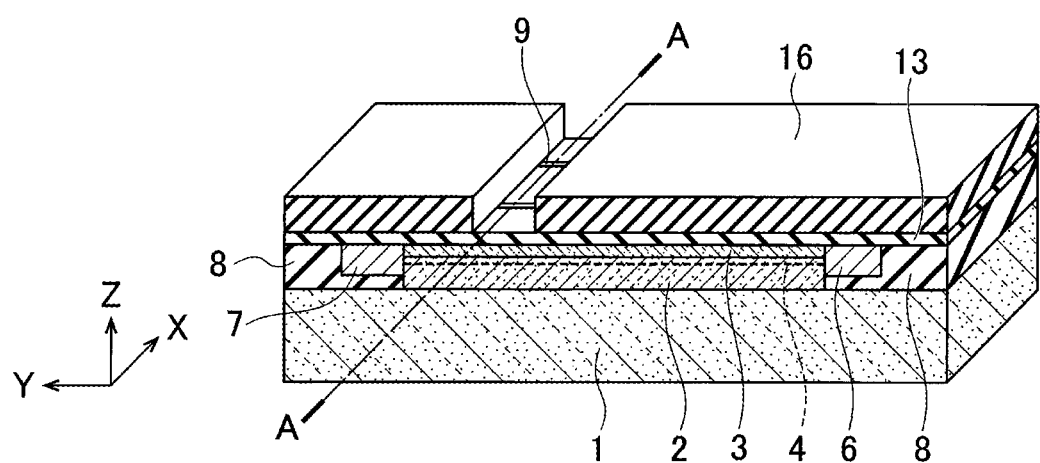

FIG. 75 is a perspective view illustrating the method for manufacturing the semiconductor device according to the modification 4 of the second embodiment.

Figure 76A:
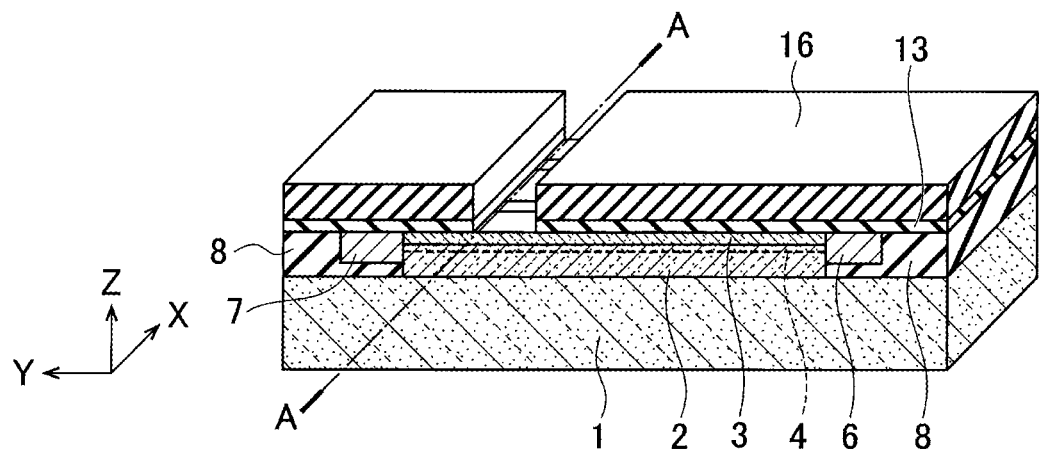

FIG. 76A is a perspective view illustrating the method for manufacturing the semiconductor device according to the modification 4 of the second embodiment.

Figure 76B:
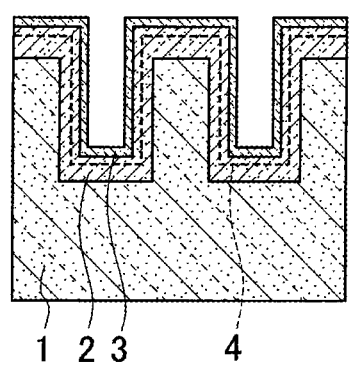

FIG. 76B is a sectional view along a section A-A in FIG. 76A.

Figure 77A:
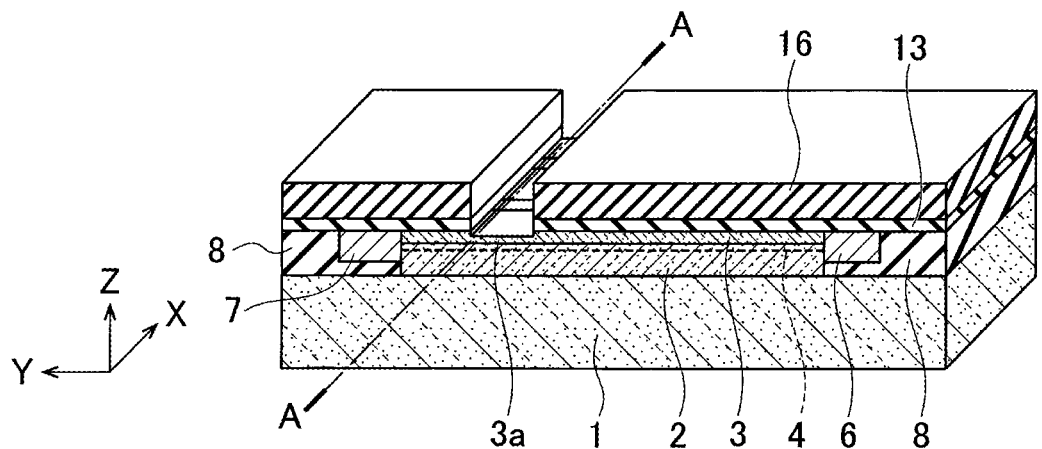

FIG. 77A is a perspective view illustrating the method for manufacturing the semiconductor device according to the modification 4 of the second embodiment.

Figure 77B:
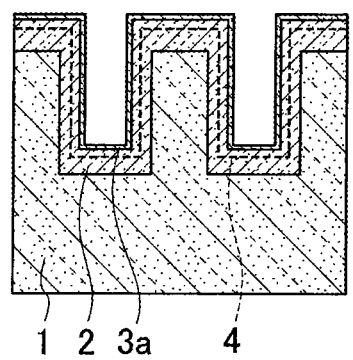

FIG. 77B is a sectional view along a section A-A in FIG. 77A.

Figure 78A:
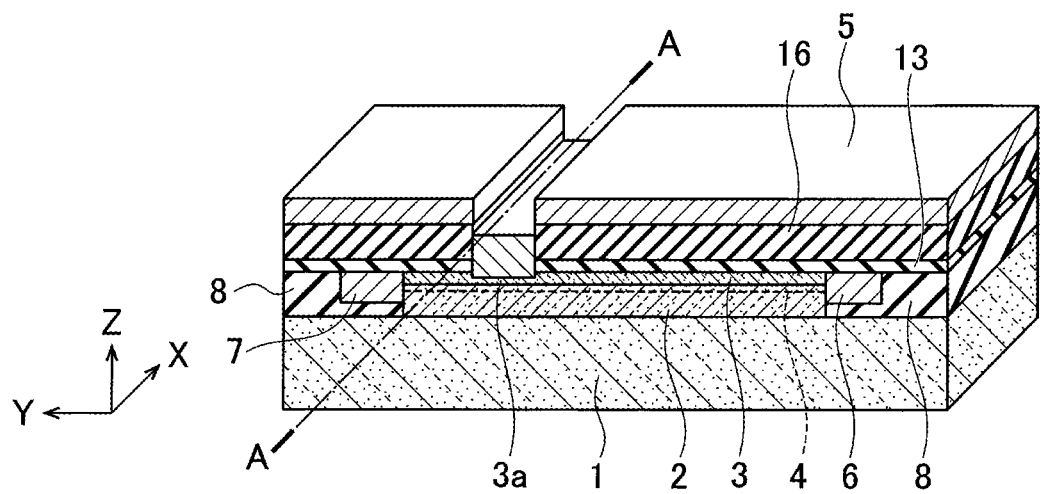

FIG. 78A is a perspective view illustrating the method for manufacturing the semiconductor device according to the modification 4 of the second embodiment.

Figure 78B:
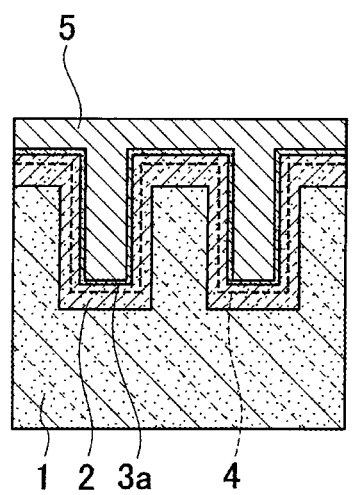

FIG. 78B is a sectional view along a section A-A in FIG. 78A.

Figure 79:
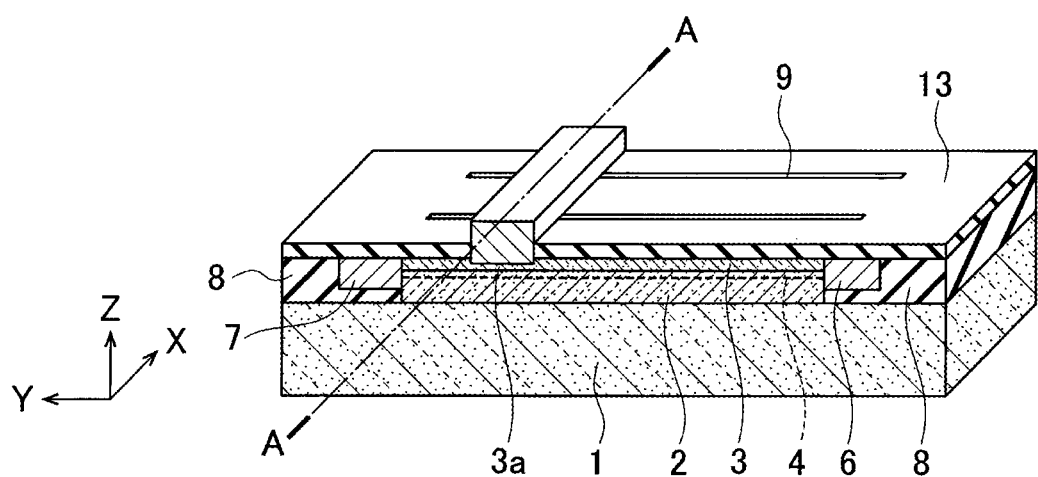

FIG. 79 is a perspective view illustrating the method for manufacturing the semiconductor device according to the modification 4 of the second embodiment.

Figure 80A:
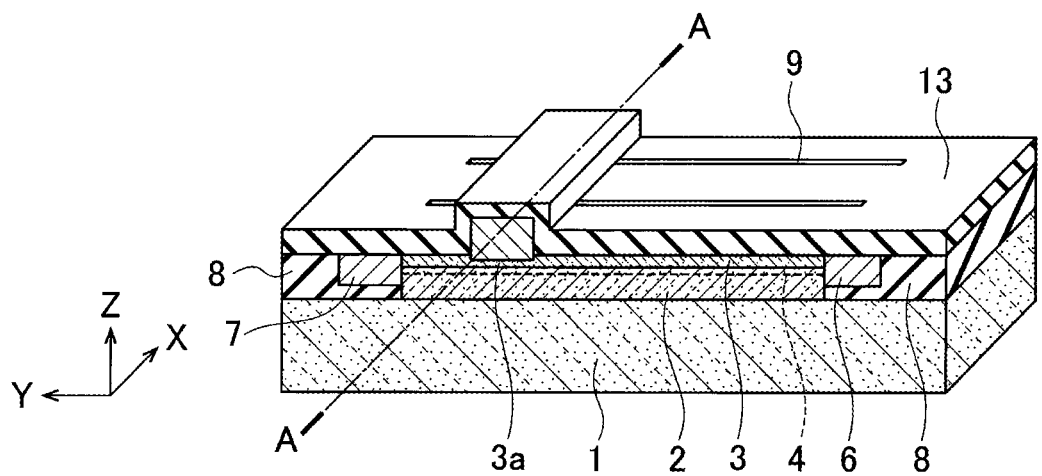

FIG. 80A is a perspective view illustrating the method for manufacturing the semiconductor device according to the modification 4 of the second embodiment.

Figure 80B:
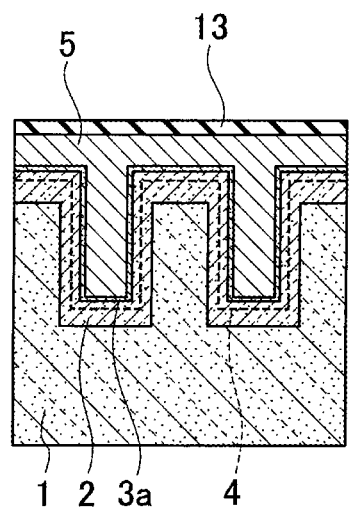

FIG. 80B is a sectional view along a section A-A in FIG. 80A.

Figure 81:
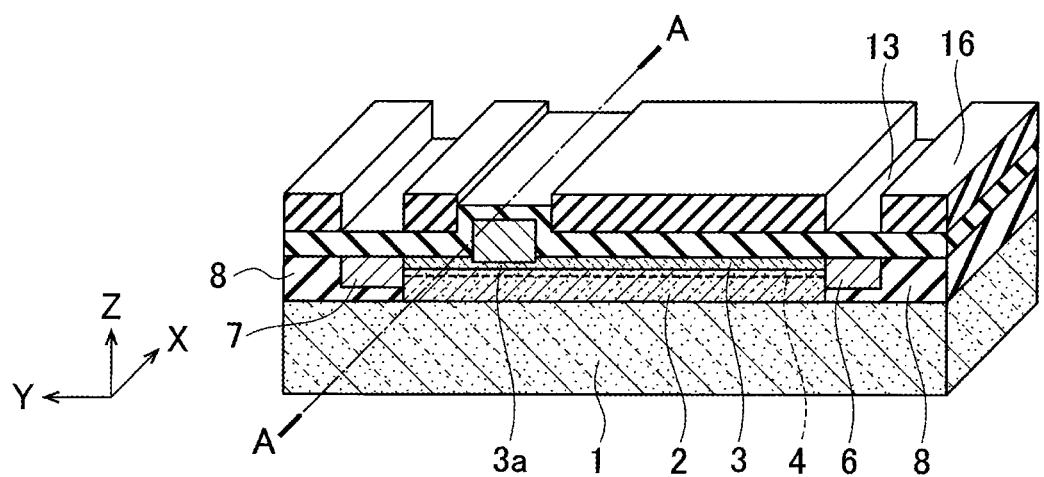

FIG. 81 is a perspective view illustrating the method for manufacturing the semiconductor device according to the modification 4 of the second embodiment.

Figure 82:
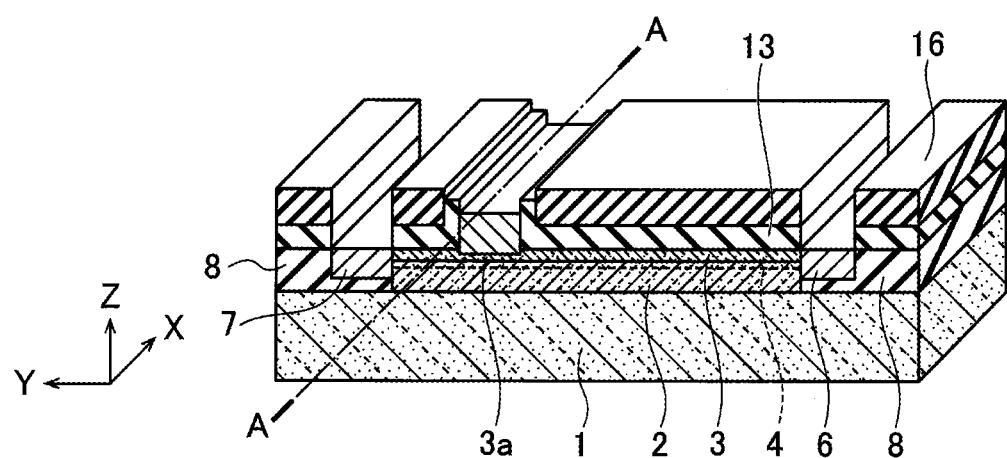

FIG. 82 is a perspective view illustrating the method for manufacturing the semiconductor device according to the modification 4 of the second embodiment.

Figure 83A:
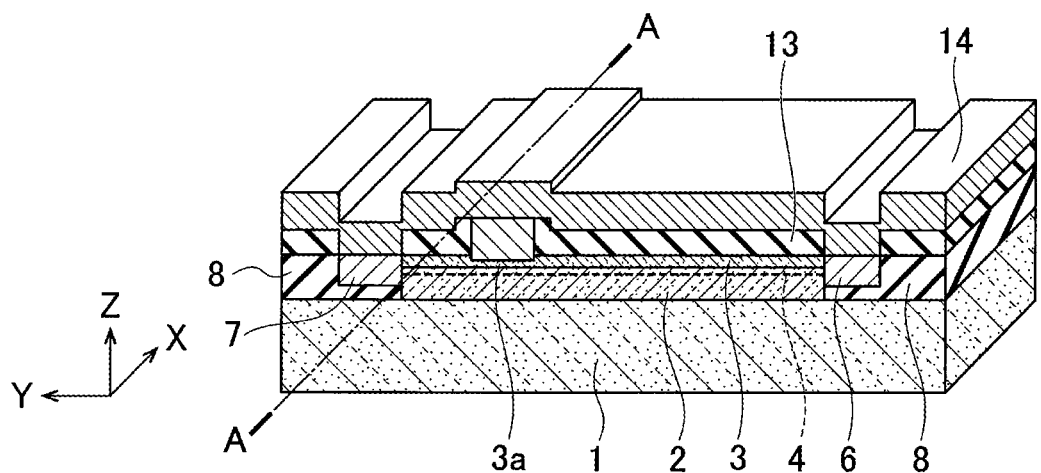

FIG. 83A is a perspective view illustrating the method for manufacturing the semiconductor device according to the modification 4 of the second embodiment.

Figure 83B:
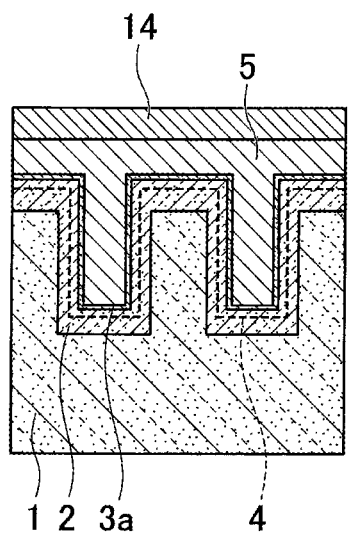

FIG. 83B is a sectional view along a section A-A in FIG. 83A.

Figure 84A:
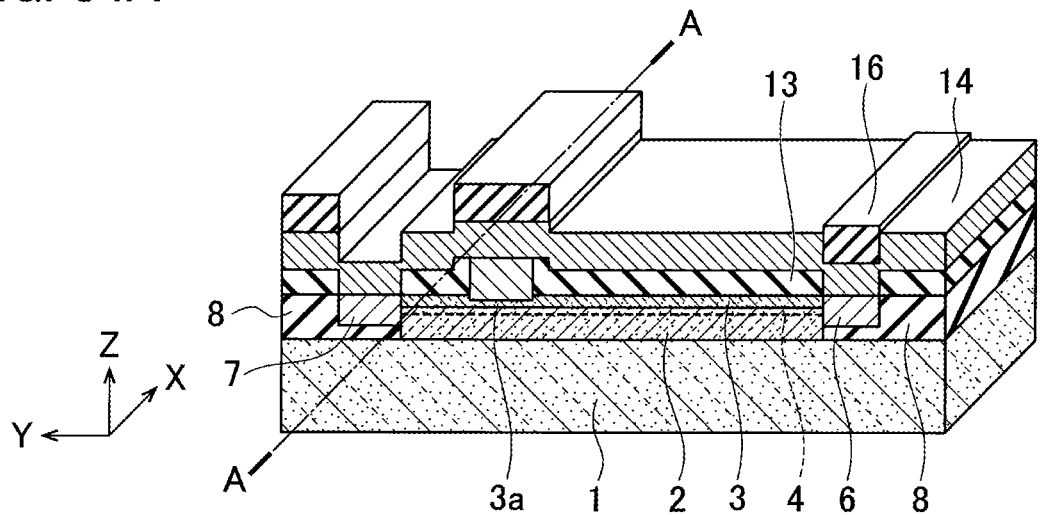

FIG. 84A is a perspective view illustrating the method for manufacturing the semiconductor device according to the modification 4 of the second embodiment.

Figure 84B:
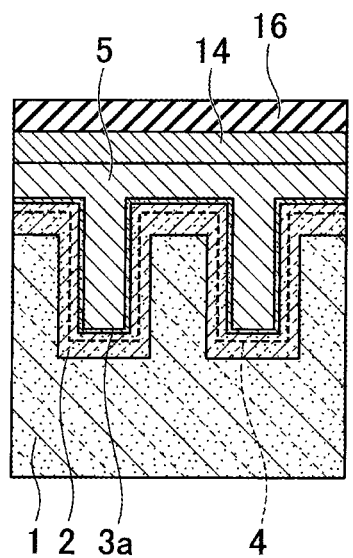

FIG. 84B is a sectional view along a section A-A in FIG. 84A.

Figure 85A:
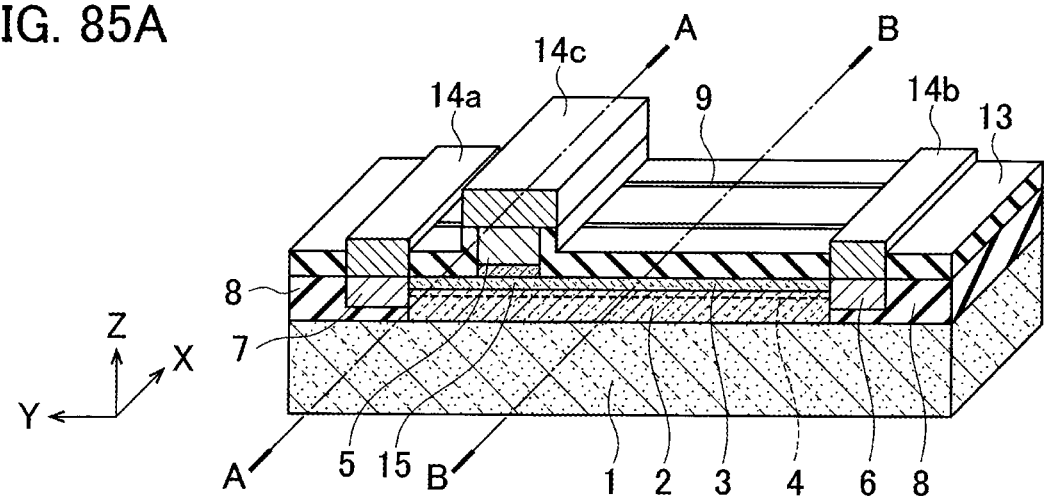

FIG. 85A is a perspective view illustrating a method for manufacturing a semiconductor device according to a modification 5 of the second embodiment.

Figure 85B:
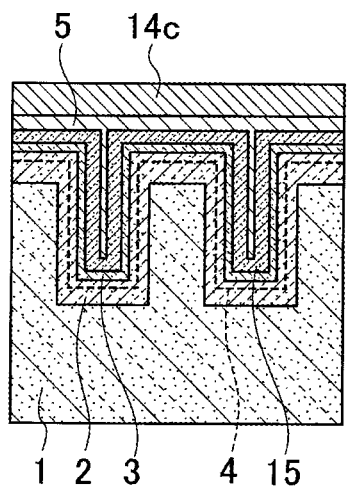

FIG. 85B is a sectional view along a section A-A in FIG. 85A.

Figure 85C:
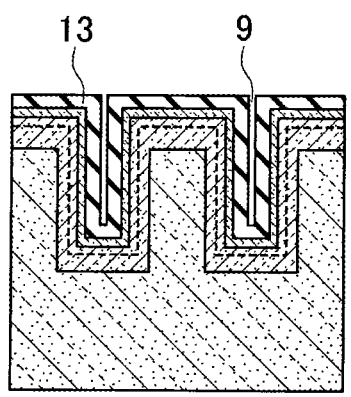

FIG. 85C is a sectional view along a section B-B in FIG. 85A.

Figure 86A:
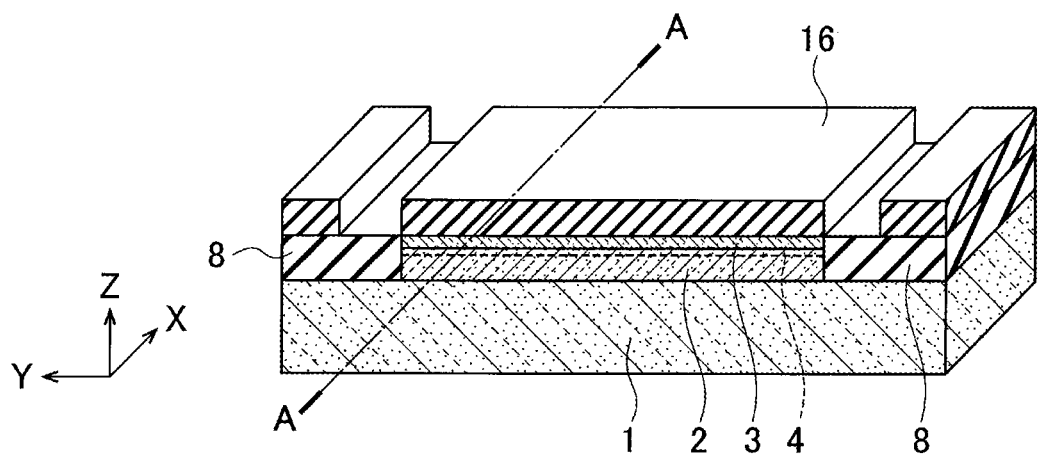

FIG. 86A is a perspective view illustrating the method for manufacturing the semiconductor device according to the modification 5 of the second embodiment.

Figure 86B:
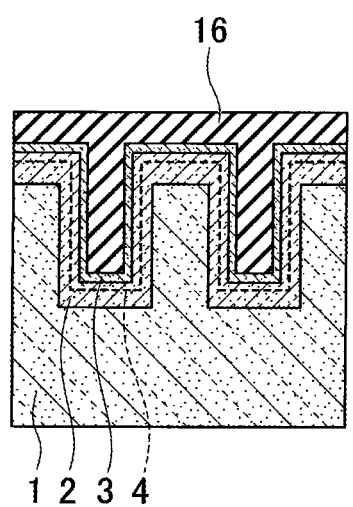

FIG. 86B is a sectional view along a section A-A in FIG. 86A.

Figure 87:
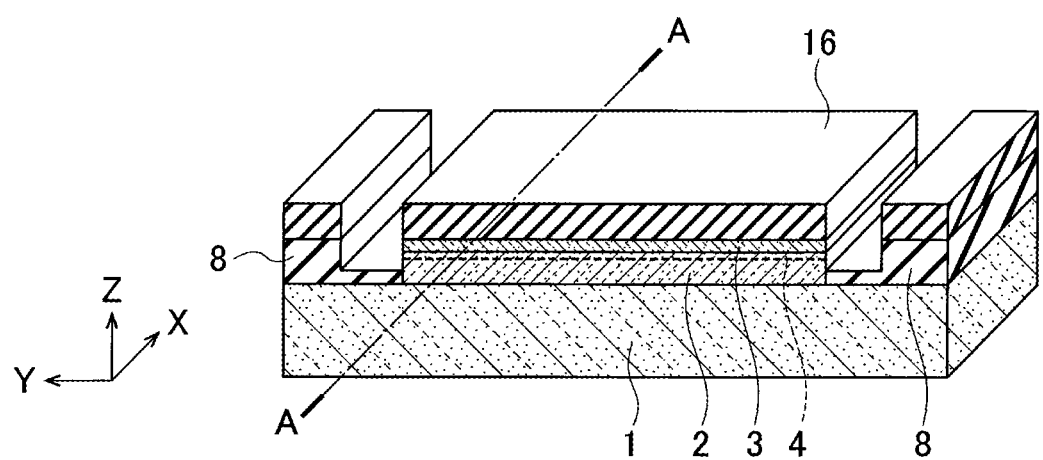

FIG. 87 is a perspective view illustrating the method for manufacturing the semiconductor device according to the modification 5 of the second embodiment.

Figure 88A:
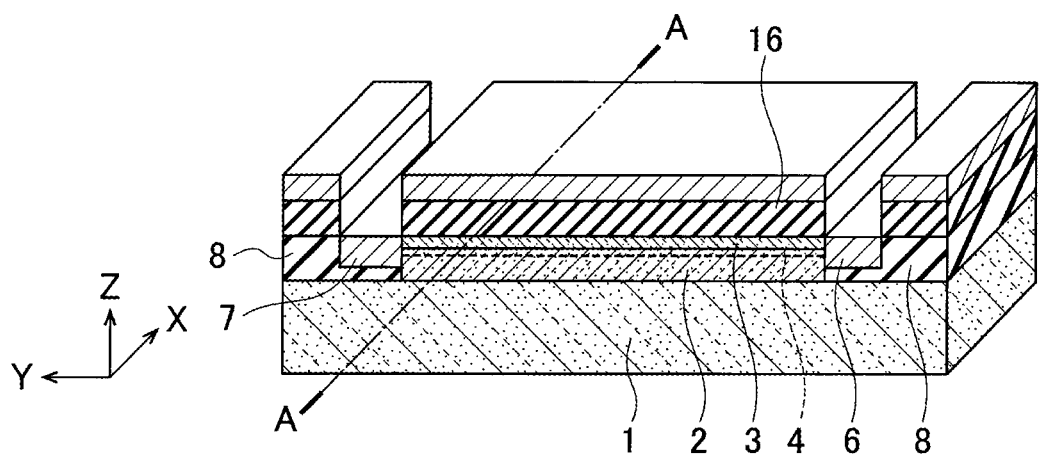

FIG. 88A is a perspective view illustrating the method for manufacturing the semiconductor device according to the modification 5 of the second embodiment.

Figure 88B:
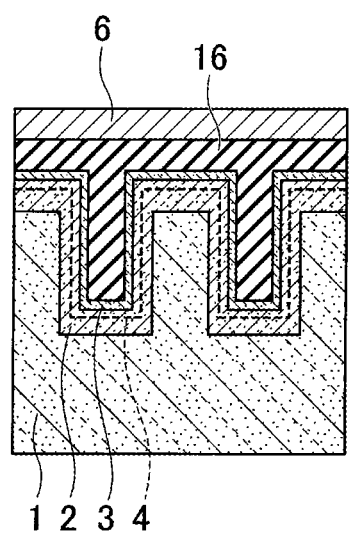

FIG. 88B is a sectional view along a section A-A in FIG. 88A.

Figure 89A:
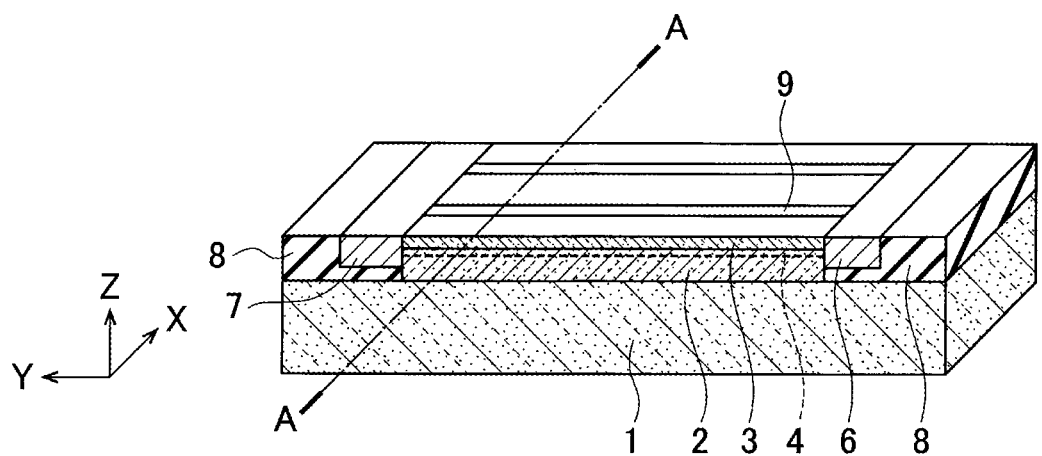

FIG. 89A is a perspective view illustrating the method for manufacturing the semiconductor device according to the modification 5 of the second embodiment.

Figure 89B:
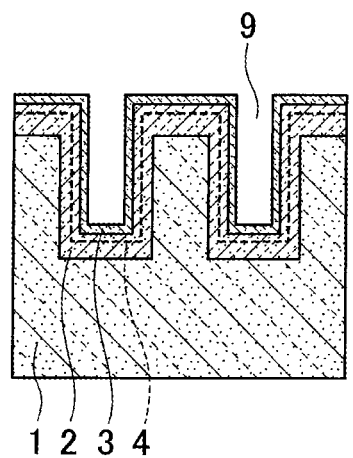

FIG. 89B is a sectional view along a section A-A in FIG. 89A.

Figure 90A:
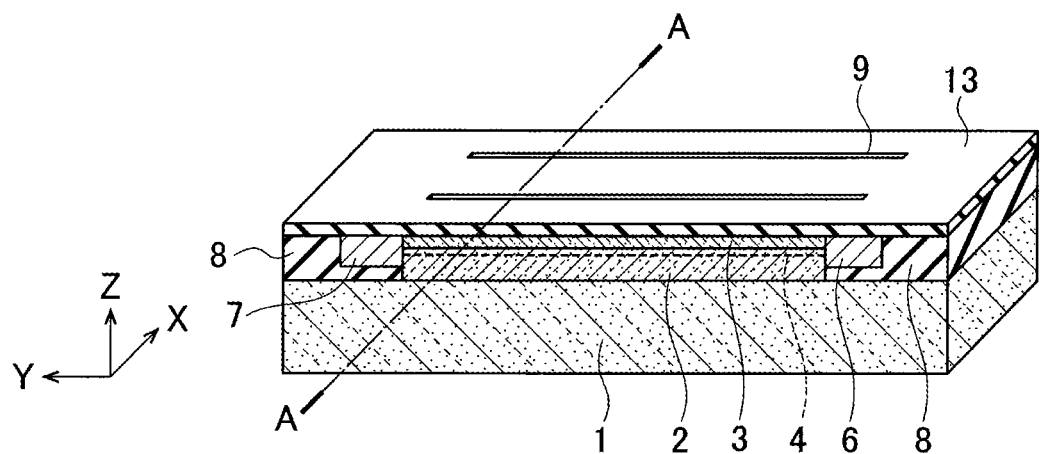

FIG. 90A is a perspective view illustrating the method for manufacturing the semiconductor device according to the modification 5 of the second embodiment.

Figure 90B:
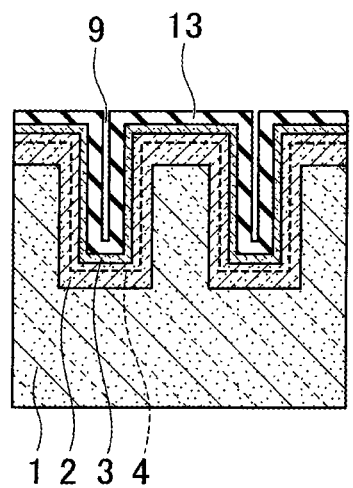

FIG. 90B is a sectional view along a section A-A in FIG. 90A.

Figure 91:
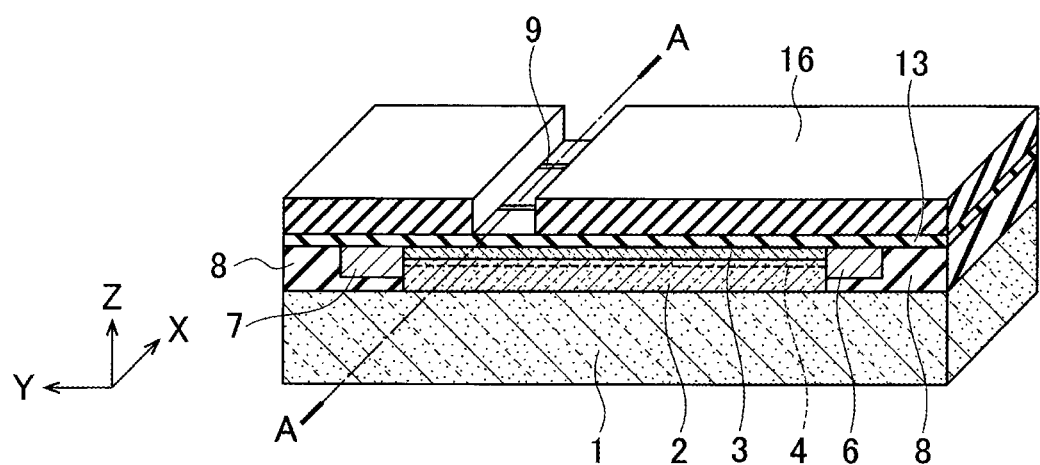

FIG. 91 is a perspective view illustrating the method for manufacturing the semiconductor device according to the modification 5 of the second embodiment.

Figure 92A:
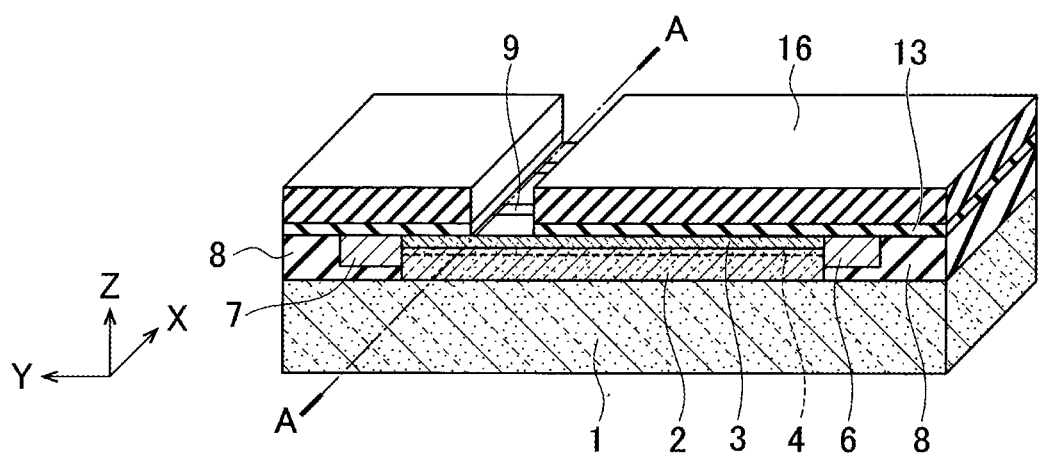

FIG. 92A is a perspective view illustrating the method for manufacturing the semiconductor device according to the modification 5 of the second embodiment.

Figure 92B:
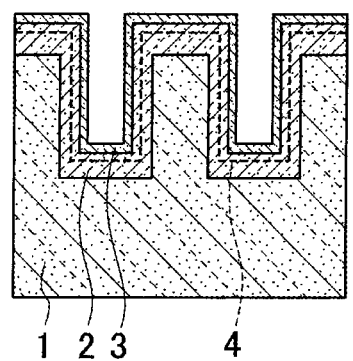

FIG. 92B is a sectional view along a section A-A in FIG. 92A.

Figure 93A:
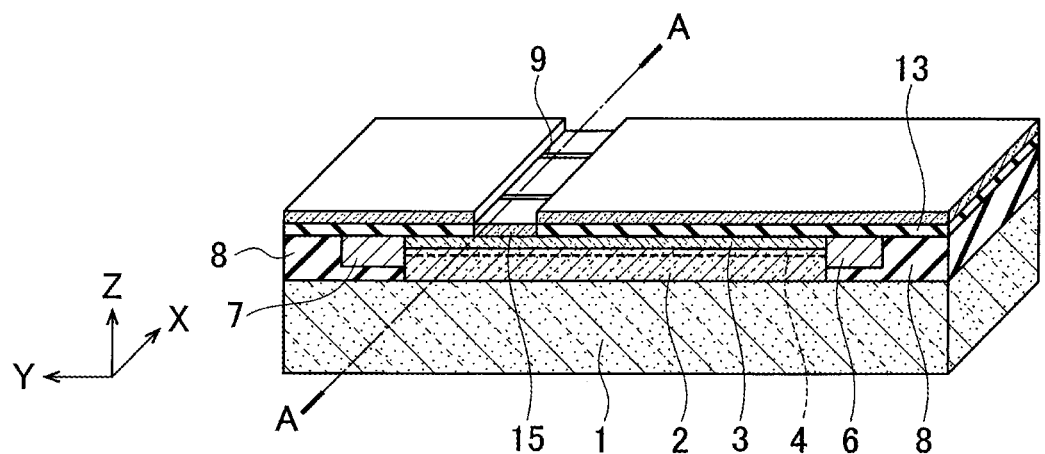

FIG. 93A is a perspective view illustrating the method for manufacturing the semiconductor device according to the modification 5 of the second embodiment.

Figure 93B:
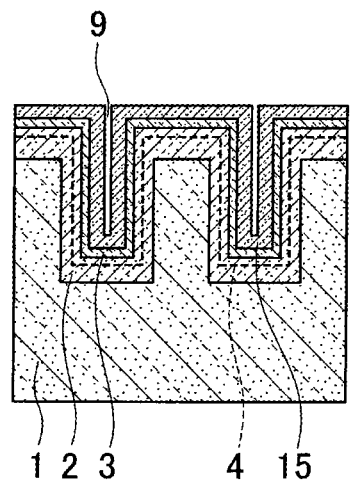

FIG. 93B is a sectional view along a section A-A in FIG. 93A.

Figure 94A:
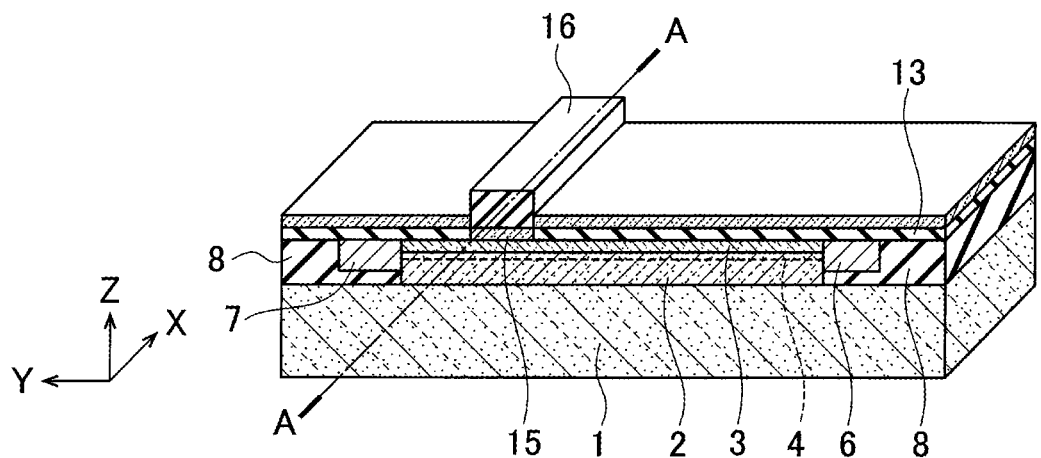

FIG. 94A is a perspective view illustrating the method for manufacturing the semiconductor device according to the modification 5 of the second embodiment.

Figure 94B:
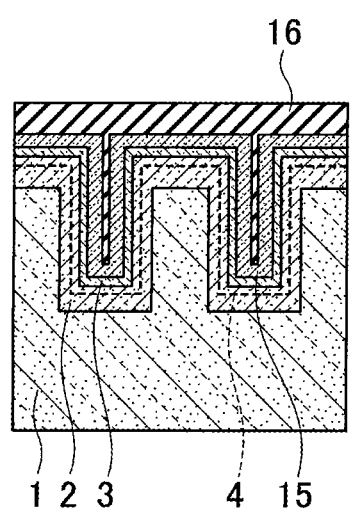

FIG. 94B is a sectional view along a section A-A in FIG. 94A.

Figure 95A:
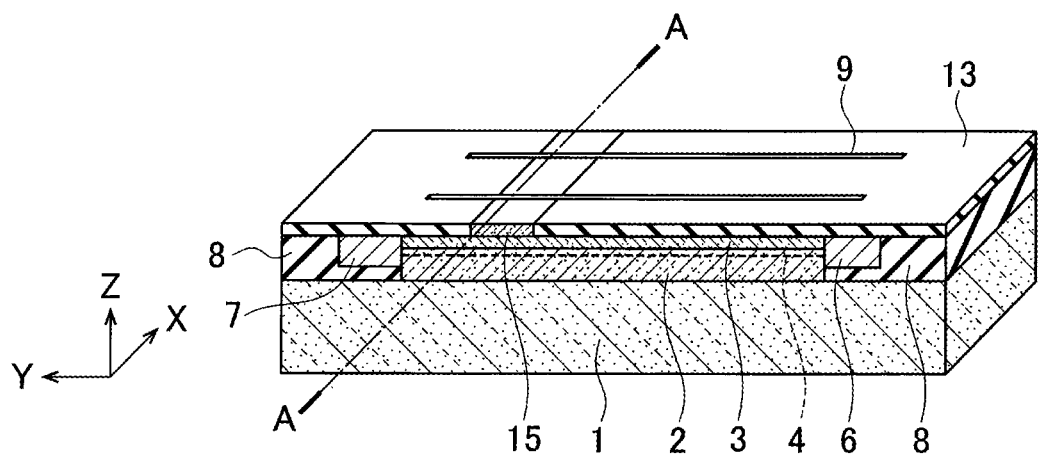

FIG. 95A is a perspective view illustrating the method for manufacturing the semiconductor device according to the modification 5 of the second embodiment.

Figure 95B:
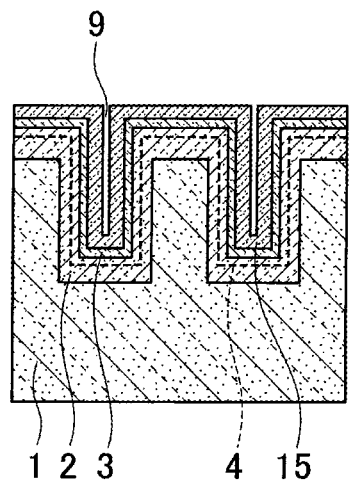

FIG. 95B is a sectional view along a section A-A in FIG. 95A.

Figure 96:
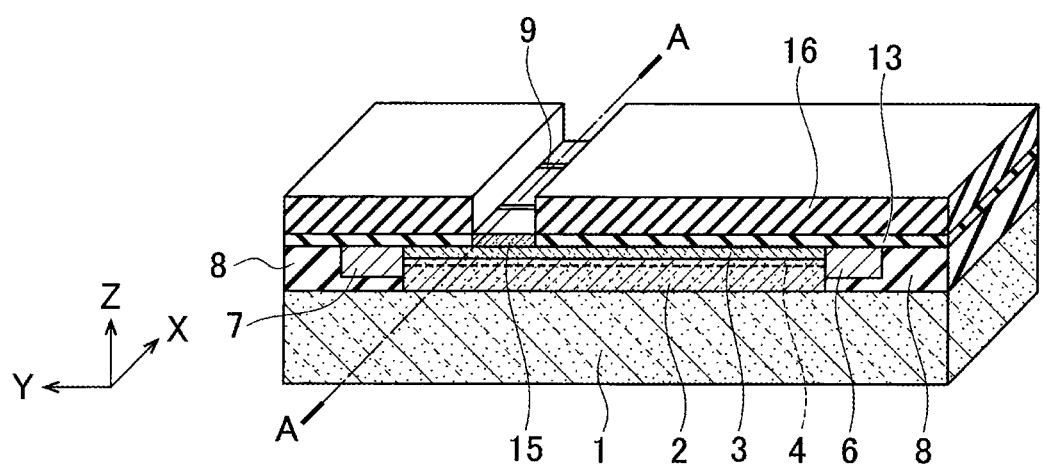

FIG. 96 is a perspective view illustrating the method for manufacturing the semiconductor device according to the modification 5 of the second embodiment.

Figure 97A:
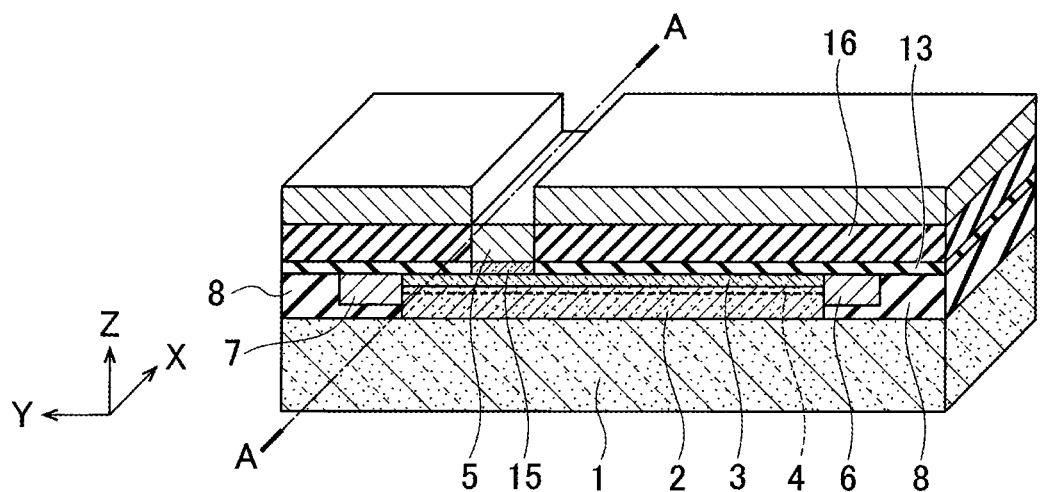

FIG. 97A is a perspective view illustrating the method for manufacturing the semiconductor device according to the modification 5 of the second embodiment.

Figure 97B:
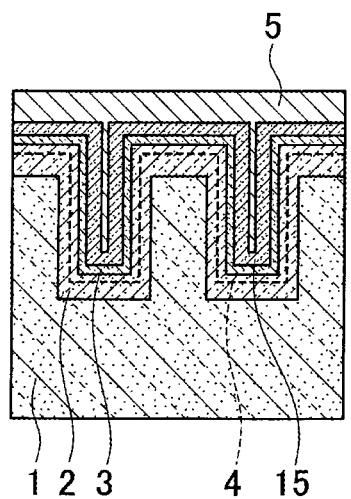

FIG. 97B is a sectional view along a section A-A in FIG. 97A.

Figure 98:
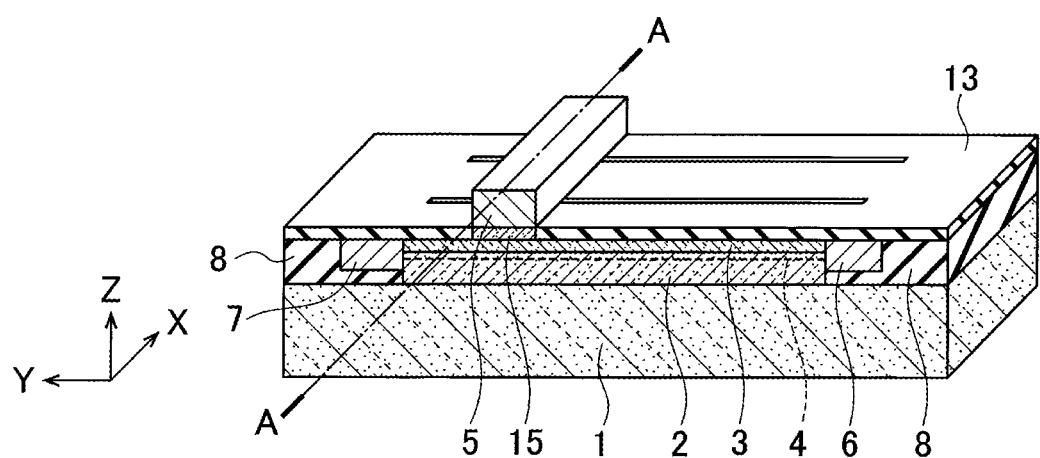

FIG. 98 is a perspective view illustrating the method for manufacturing the semiconductor device according to the modification 5 of the second embodiment.

Figure 99A:
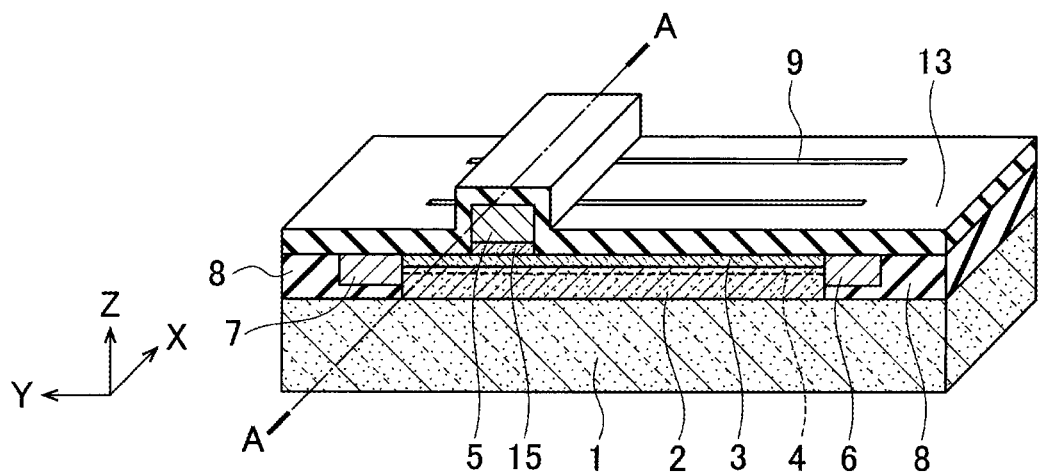

FIG. 99A is a perspective view illustrating the method for manufacturing the semiconductor device according to the modification 5 of the second embodiment.

Figure 99B:
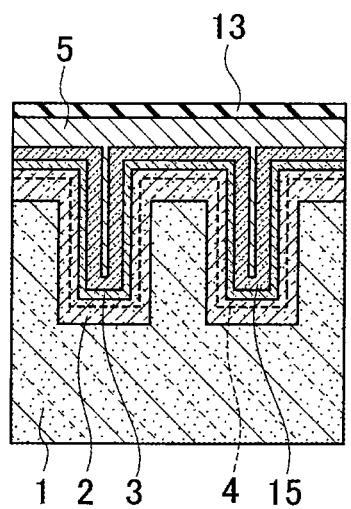

FIG. 99B is a sectional view along a section A-A in FIG. 99A.

Figure 100:
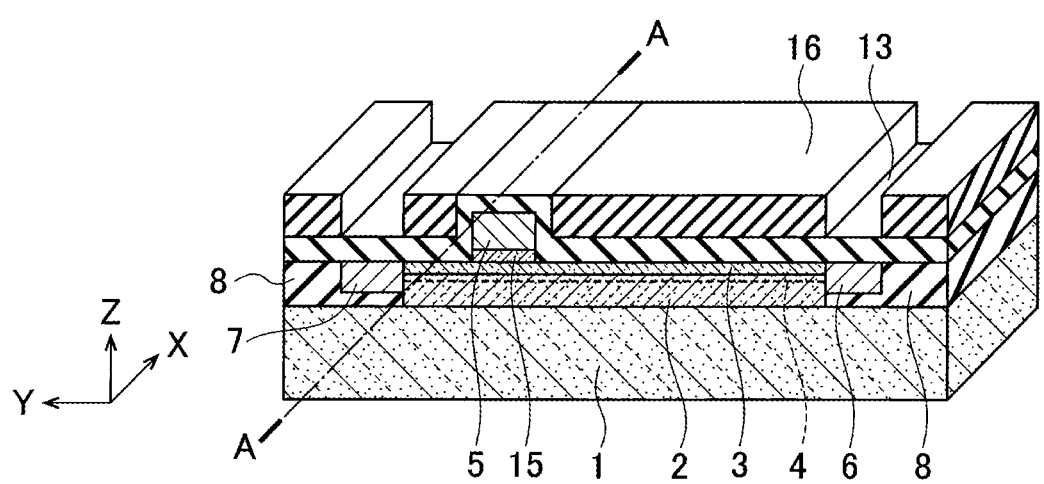

FIG. 100 is a perspective view illustrating the method for manufacturing the semiconductor device according to the modification 5 of the second embodiment.

Figure 101A:
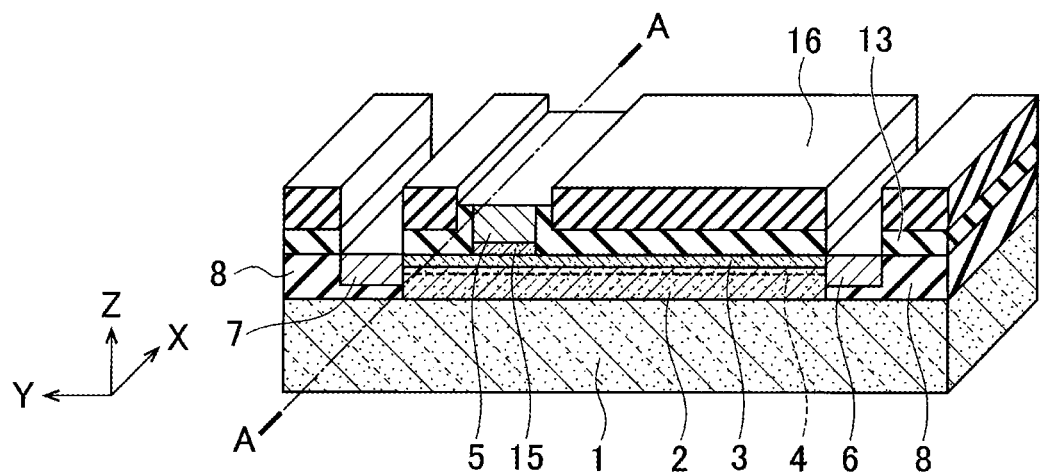

FIG. 101A is a perspective view illustrating the method for manufacturing the semiconductor device according to the modification 5 of the second embodiment.

Figure 101B:
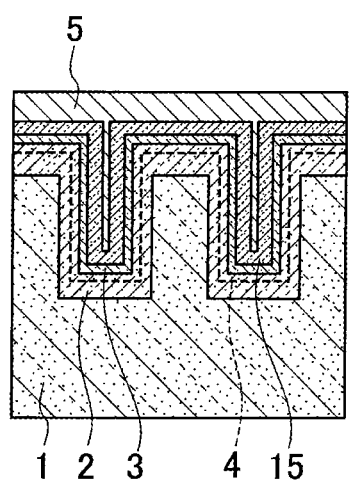

FIG. 101B is a sectional view along a section A-A in FIG. 101A.

Figure 102A:
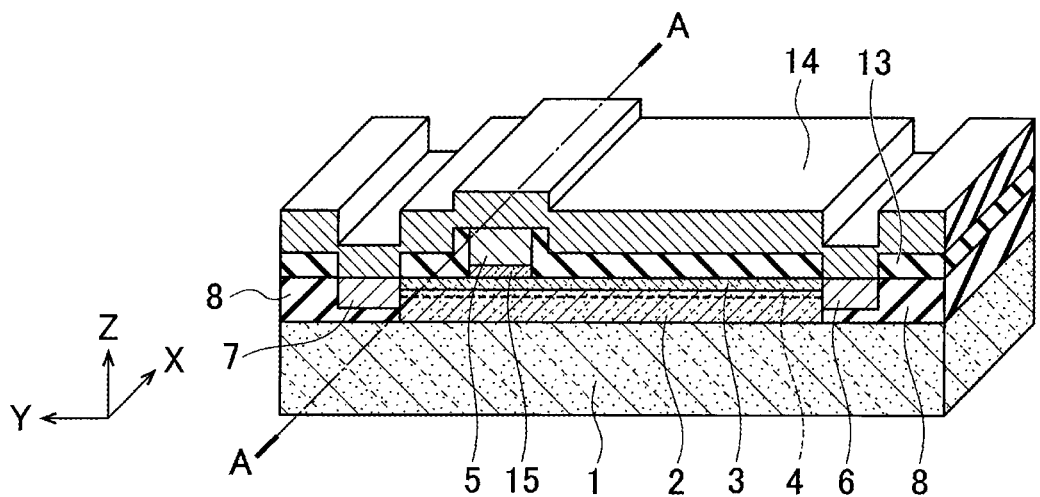

FIG. 102A is a perspective view illustrating the method for manufacturing the semiconductor device according to the modification 5 of the second embodiment.

Figure 102B:
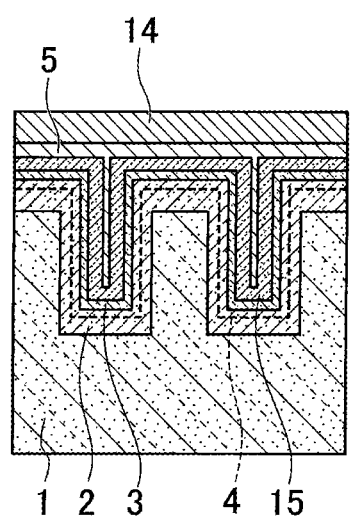

FIG. 102B is a sectional view along a section A-A in FIG. 102A.

Figure 103A:
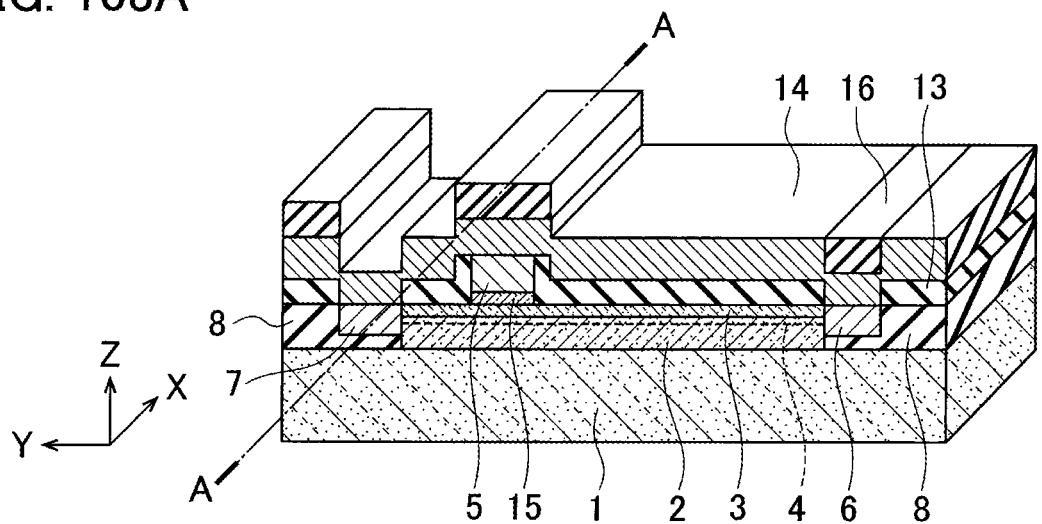

FIG. 103A is a perspective view illustrating the method for manufacturing the semiconductor device according to the modification 5 of the second embodiment.

Figure 103B:
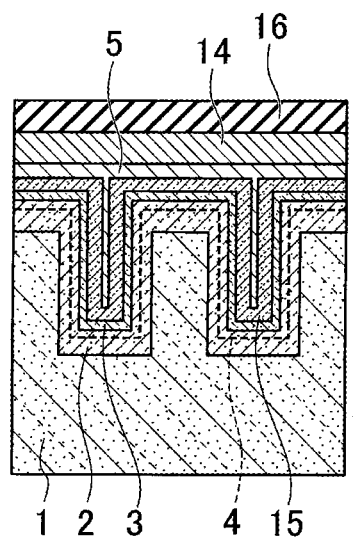

FIG. 103B is a sectional view along a section A-A in FIG. 103A.

Figure 104A:
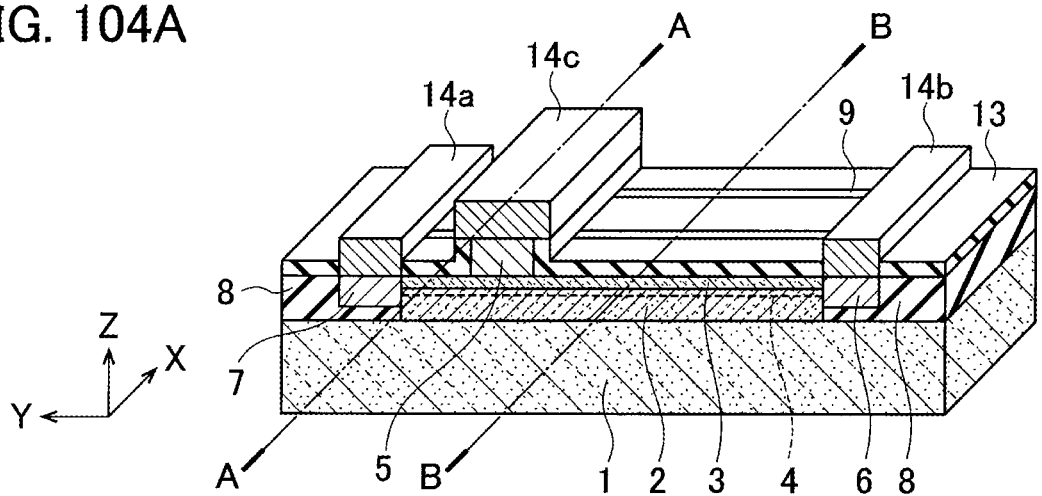

FIG. 104A is a perspective view illustrating a configuration of a semiconductor device according to a modification 6 of the second embodiment.

Figure 104B:
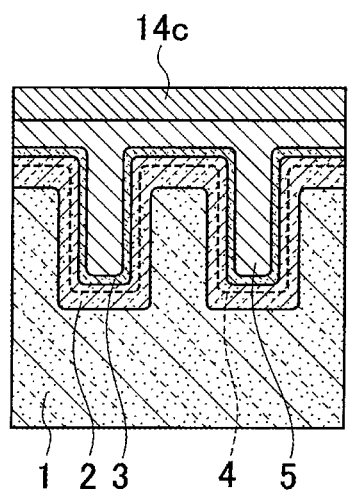

FIG. 104B is a sectional view along a section A-A in FIG. 104A.

Figure 104C:
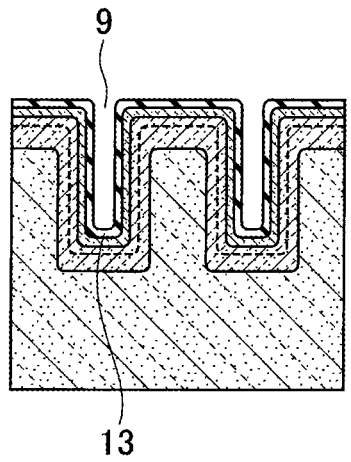

FIG. 104C is a sectional view along a section B-B in FIG. 104A.

Figure 105A:
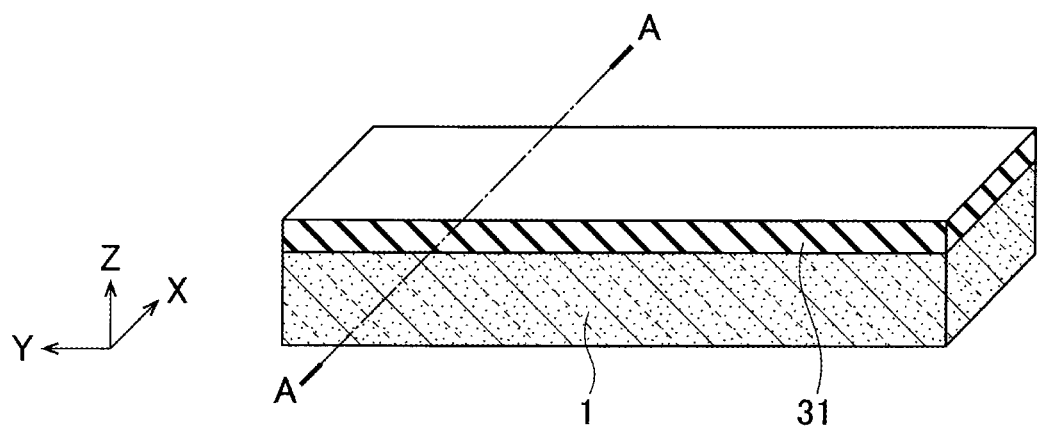

FIG. 105A is a perspective view illustrating a method for manufacturing the semiconductor device according to the modification 6 of the second embodiment.

Figure 105B:
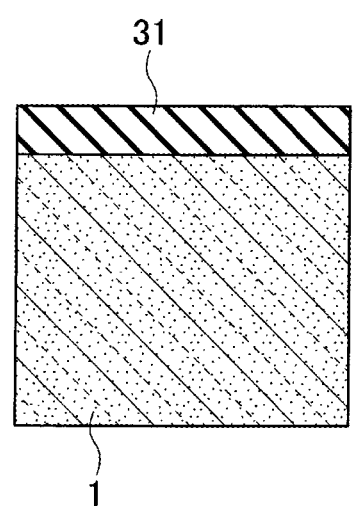

FIG. 105B is a sectional view along a section A-A in FIG. 105A.

Figure 106A:
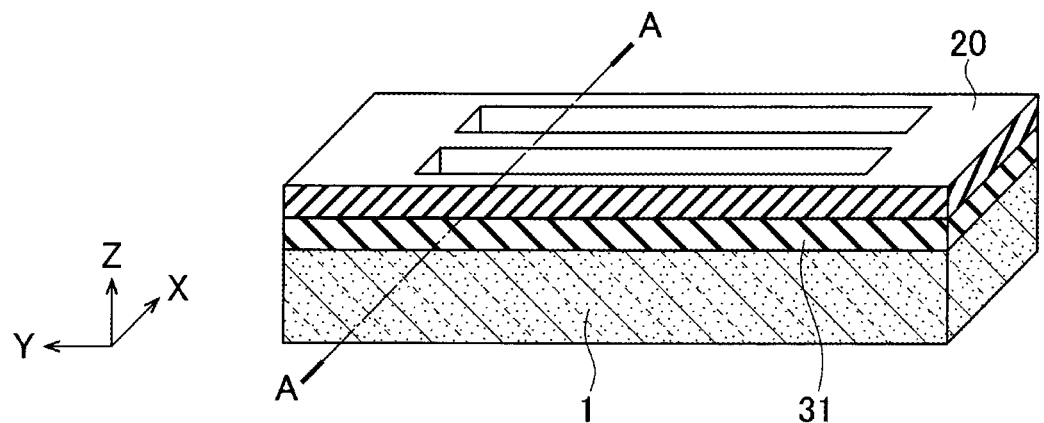

FIG. 106A is a perspective view illustrating the method for manufacturing the semiconductor device according to the modification 6 of the second embodiment.

Figure 106B:
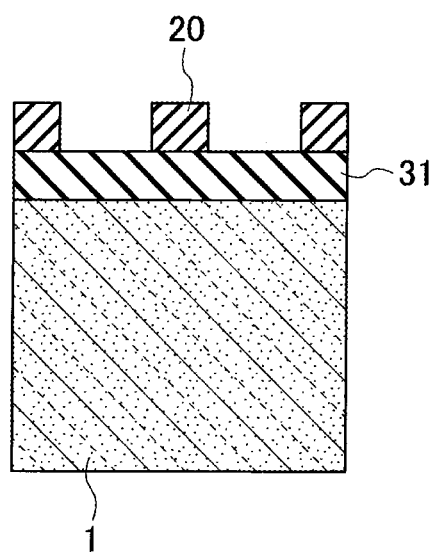

FIG. 106B is a sectional view along a section A-A in FIG. 106A.

Figure 107A:
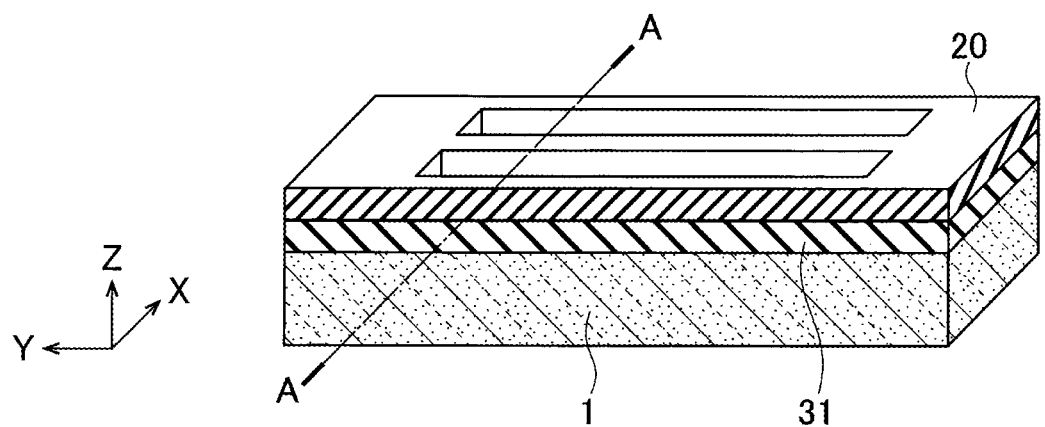

FIG. 107A is a perspective view illustrating the method for manufacturing the semiconductor device according to the modification 6 of the second embodiment.

Figure 107B:
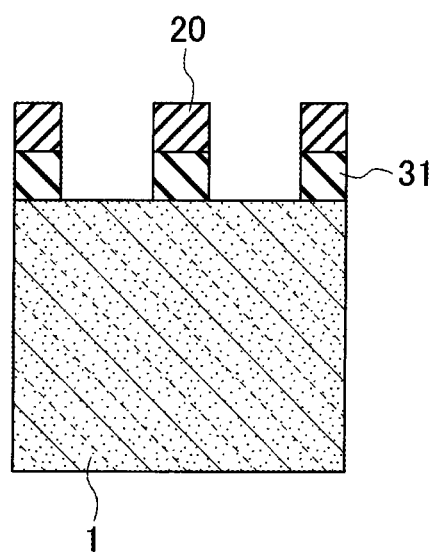

FIG. 107B is a sectional view along a section A-A in FIG. 107A.

Figure 108A:
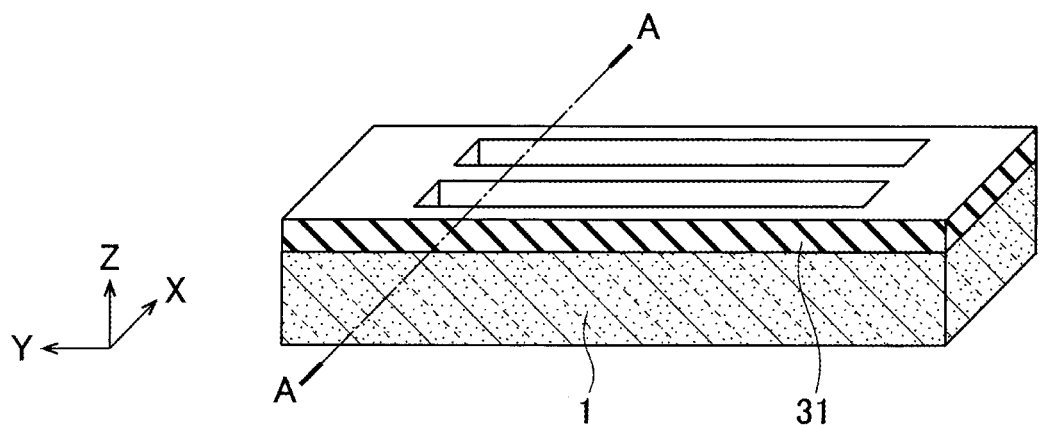

FIG. 108A is a perspective view illustrating the method for manufacturing the semiconductor device according to the modification 6 of the second embodiment.

Figure 108B:
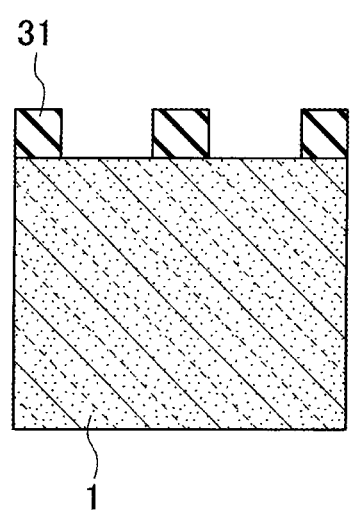

FIG. 108B is a sectional view along a section A-A in FIG. 108A.

Figure 109A:
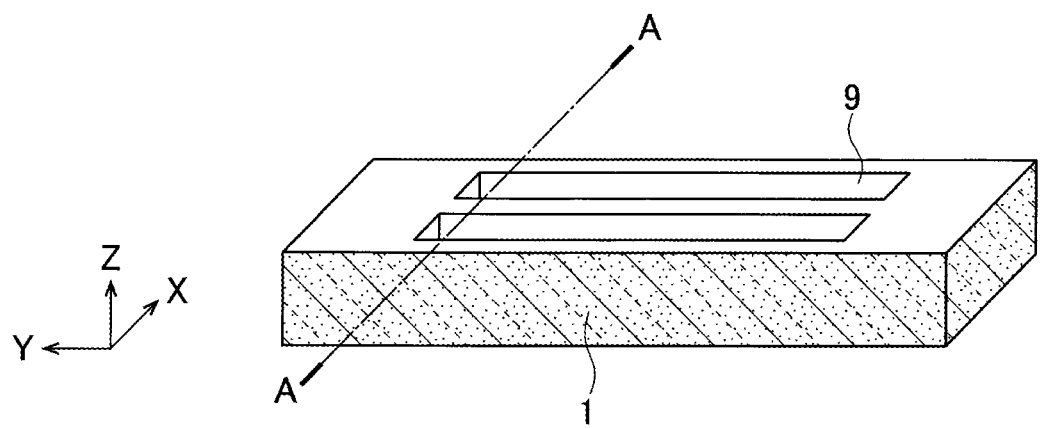

FIG. 109A is a perspective view illustrating the method for manufacturing the semiconductor device according to the modification 6 of the second embodiment.

Figure 109B:
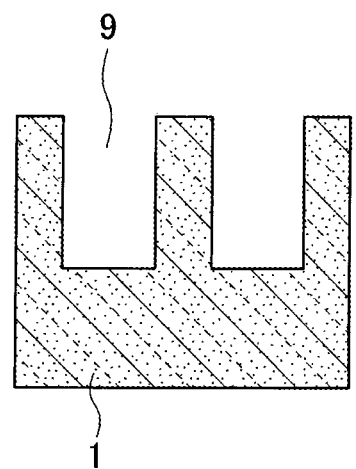

FIG. 109B is a sectional view along a section A-A in FIG. 109A.

Figure 110:
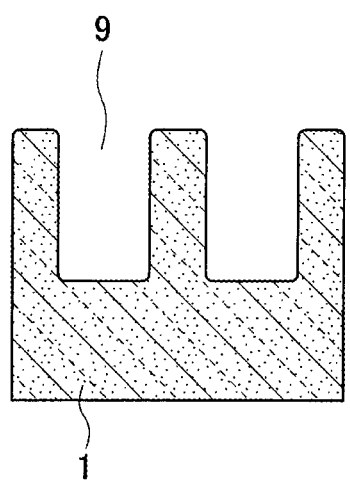

FIG. 110 is a sectional view illustrating the method for manufacturing the semiconductor device according to the modification 6 of the second embodiment.

Figure 111A:
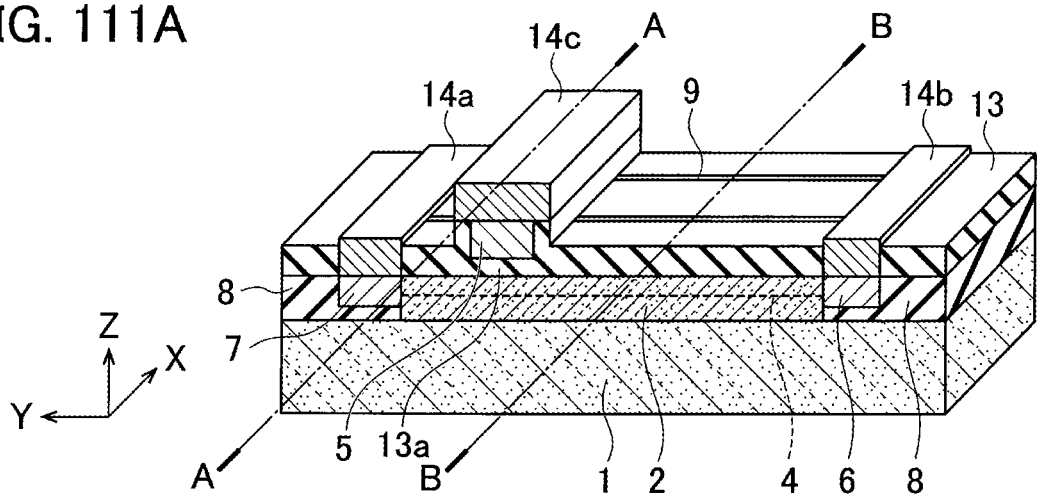

FIG. 111A is a perspective view illustrating a configuration of a semiconductor device according to a modification 7 of the second embodiment.

Figure 111B:
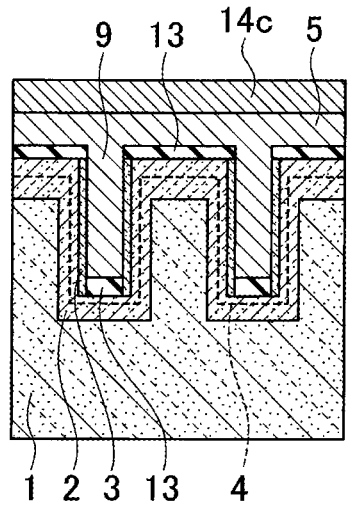

FIG. 111B is a sectional view along a section A-A in FIG. 111A.

Figure 111C:
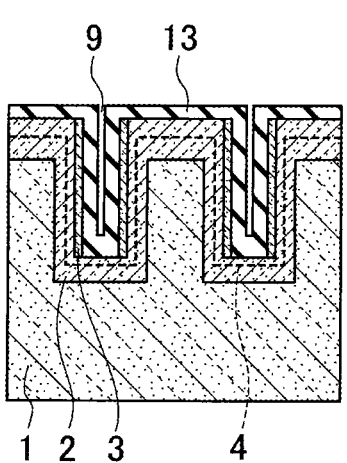

FIG. 111C is a sectional view along a section B-B in FIG. 111A.

Figure 112A:
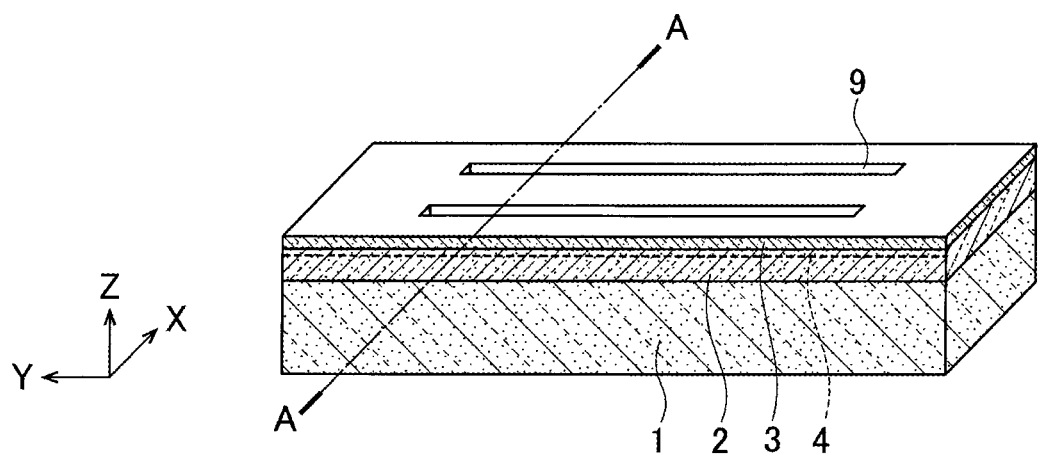

FIG. 112A is a perspective view illustrating a method for manufacturing the semiconductor device according to the modification 7 of the second embodiment.

Figure 112B:
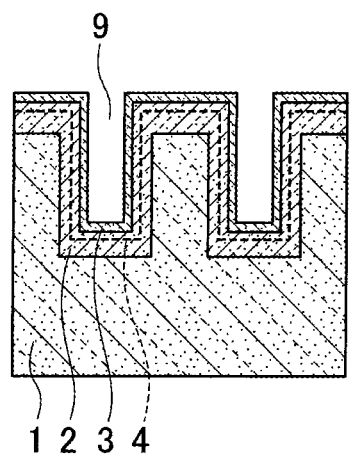

FIG. 112B is a sectional view along a section A-A in FIG. 112A.

Figure 113A:
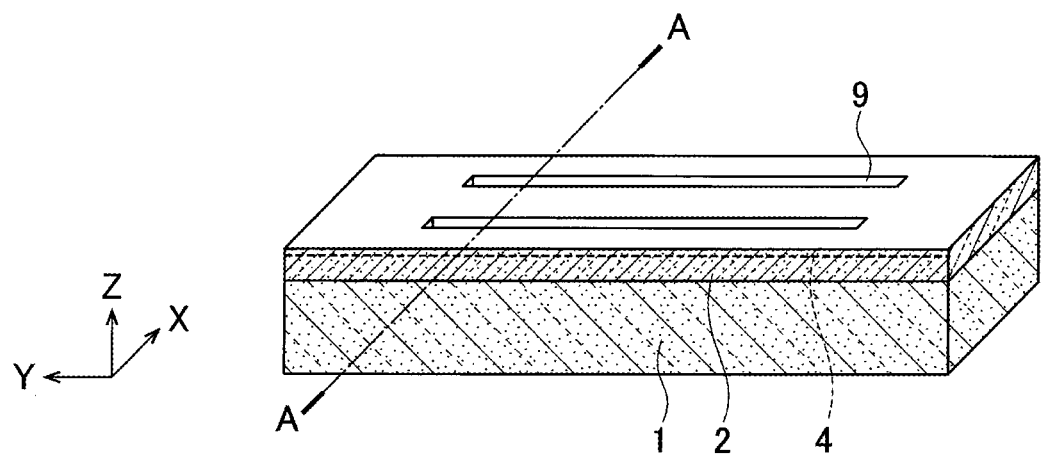

FIG. 113A is a perspective view illustrating the method for manufacturing the semiconductor device according to the modification 7 of the second embodiment.

Figure 113B:
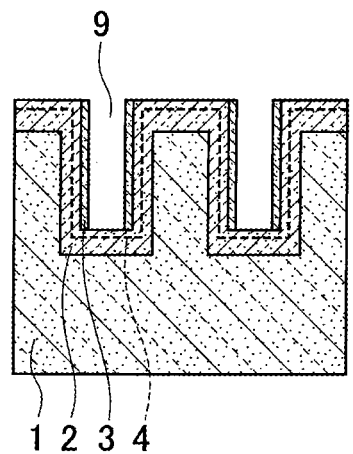

FIG. 113B is a sectional view along a section A-A in FIG. 113A.

Figure 114A:
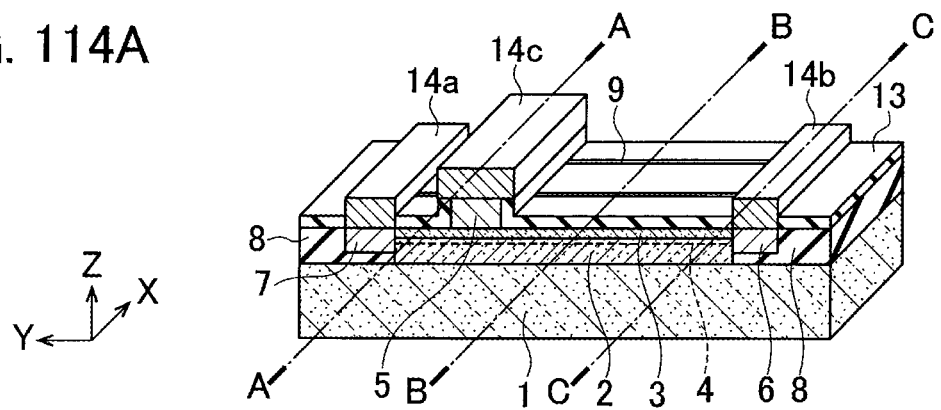

FIG. 114A is a perspective view illustrating a configuration of a semiconductor device according to a modification 8 of the second embodiment.

Figure 114B:
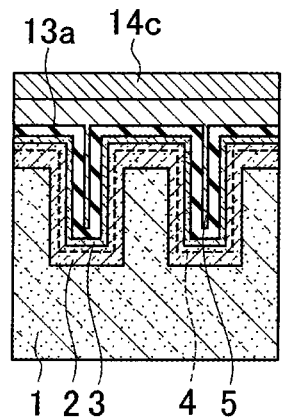

FIG. 114B is a sectional view along a section A-A in FIG. 114A.

Figure 114C:
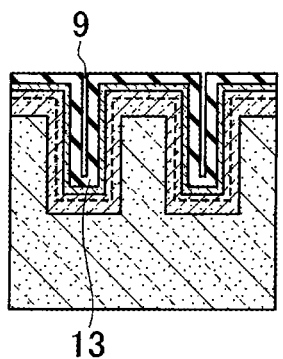

FIG. 114C is a sectional view along a section B-B in FIG. 114A.

Figure 114D:
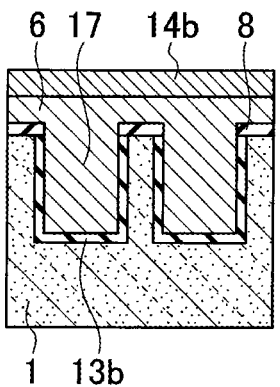

FIG. 114D is a sectional view along a section C-C in FIG. 114A.

Figure 115A:
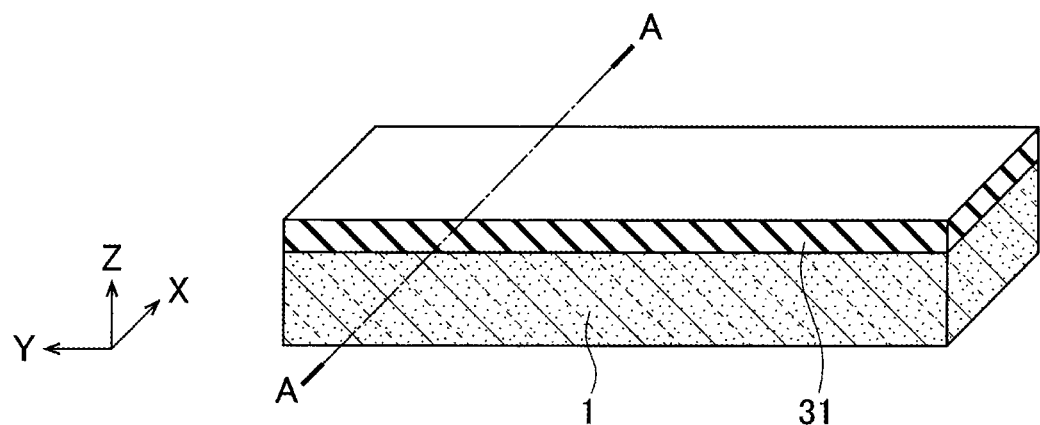

FIG. 115A is a perspective view illustrating a method for manufacturing the semiconductor device according to the modification 8 of the second embodiment.

Figure 115B:
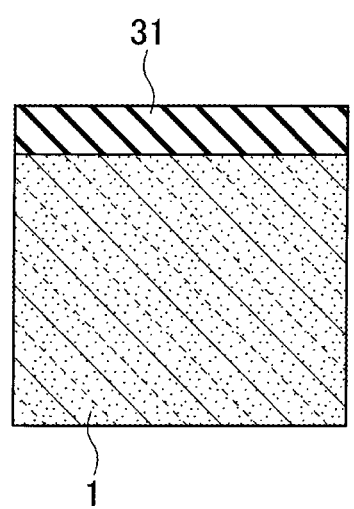

FIG. 115B is a sectional view along a section A-A in FIG. 115A.

Figure 116A:
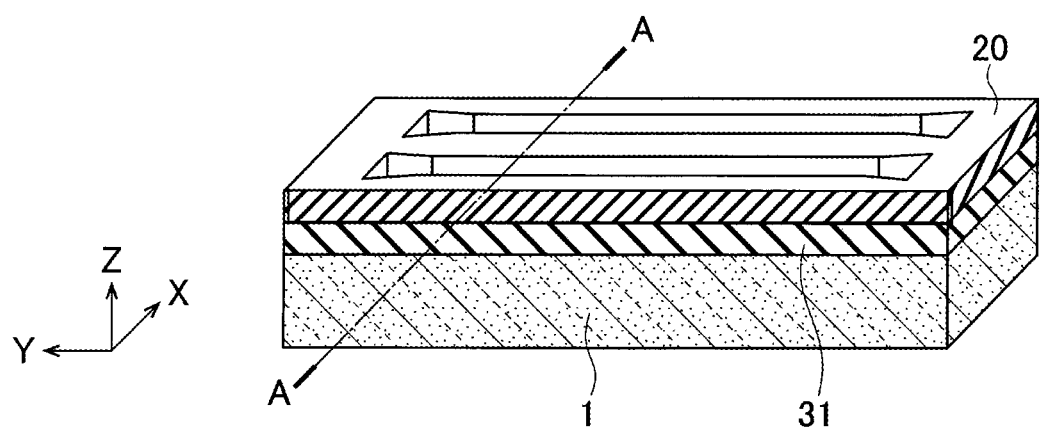

FIG. 116A is a perspective view illustrating the method for manufacturing the semiconductor device according to the modification 8 of the second embodiment.

Figure 116B:
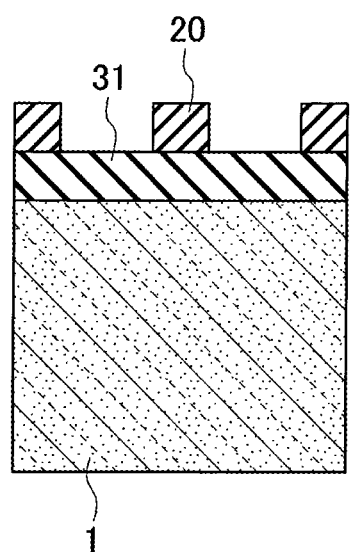

FIG. 116B is a sectional view along a section A-A in FIG. 116A.

Figure 117A:
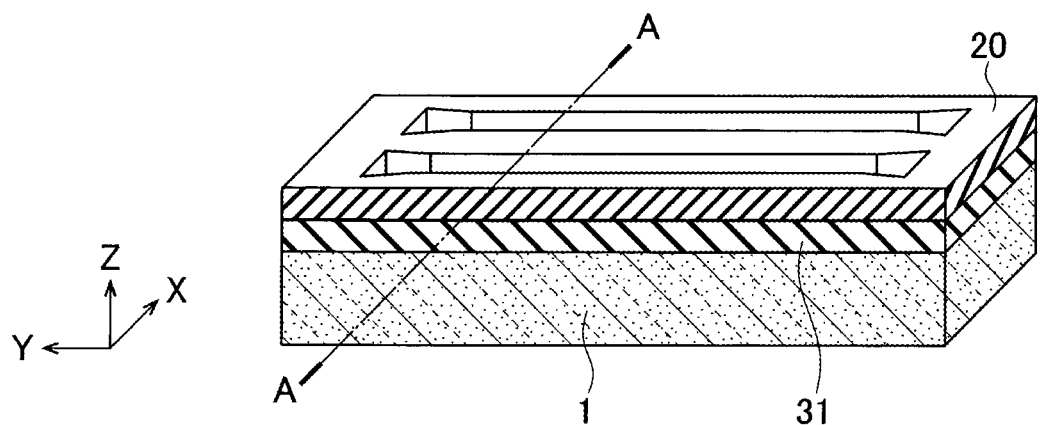

FIG. 117A is a perspective view illustrating the method for manufacturing the semiconductor device according to the modification 8 of the second embodiment.

Figure 117B:
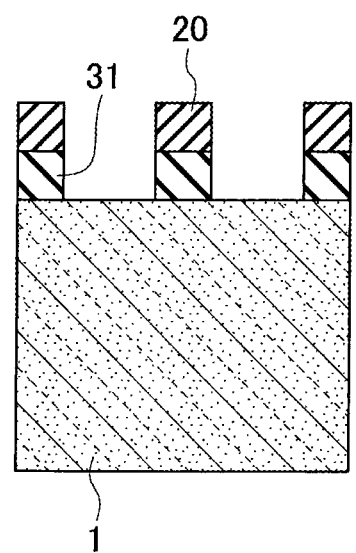

FIG. 117B is a sectional view along a section A-A in FIG. 117A.

Figure 118A:
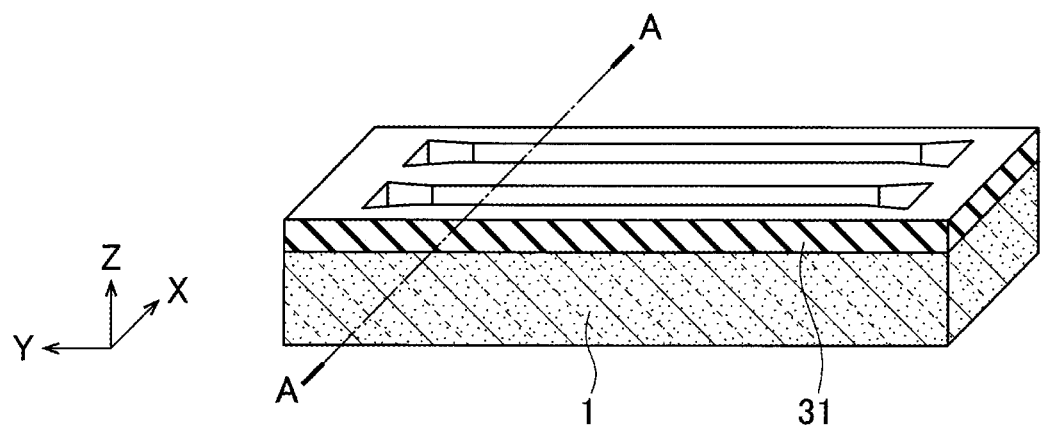

FIG. 118A is a perspective view illustrating the method for manufacturing the semiconductor device according to the modification 8 of the second embodiment.

Figure 118B:
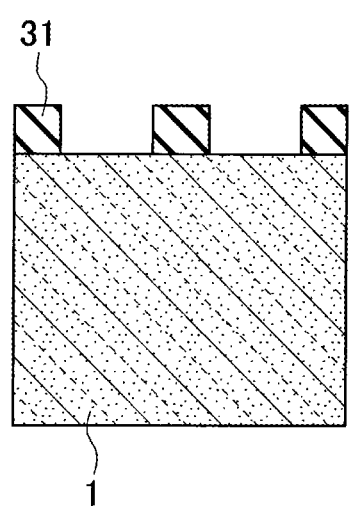

FIG. 118B is a sectional view along a section A-A in FIG. 118A.

Figure 119A:
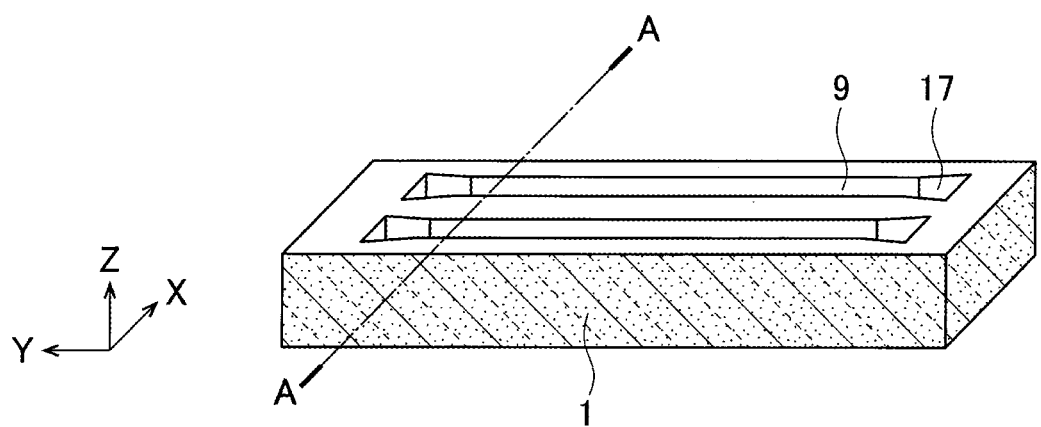

FIG. 119A is a perspective view illustrating the method for manufacturing the semiconductor device according to the modification 8 of the second embodiment.

Figure 119B:
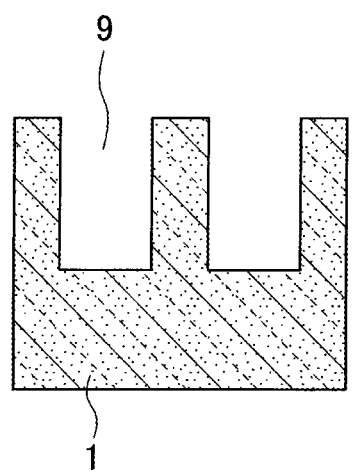

FIG. 119B is a sectional view along a section A-A in FIG. 119A.

Figure 120A:
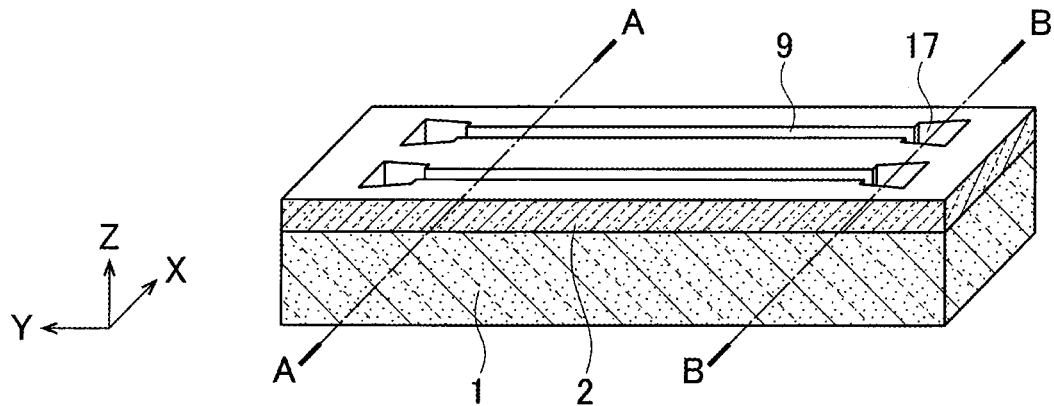

FIG. 120A is a perspective view illustrating the method for manufacturing the semiconductor device according to the modification 8 of the second embodiment.

Figure 120B:
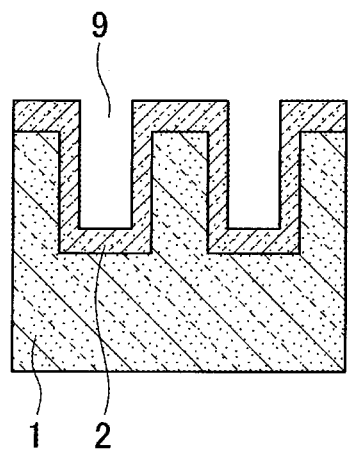

FIG. 120B is a sectional view along a section A-A in FIG. 120A.

Figure 120C:
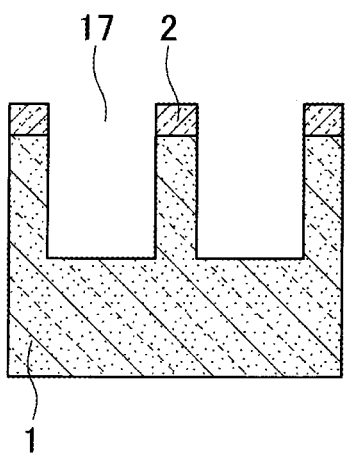

FIG. 120C is a sectional view along a section B-B in FIG. 120A.

Figure 121A:
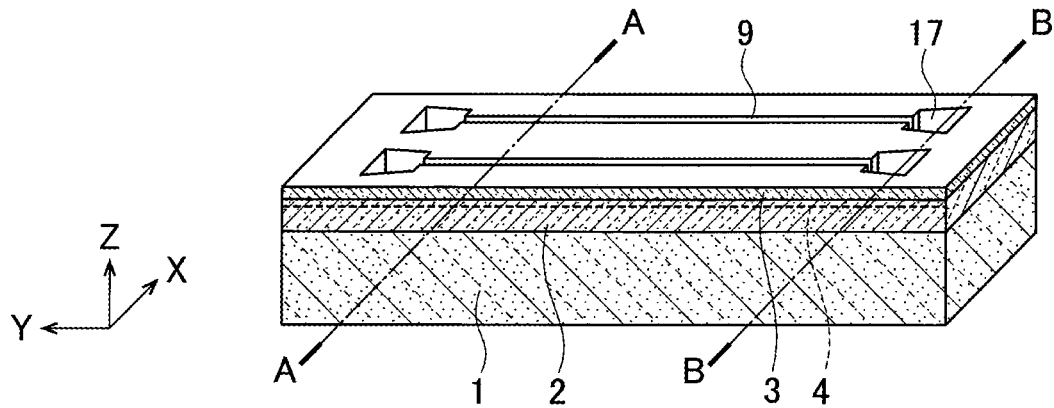

FIG. 121A is a perspective view illustrating the method for manufacturing the semiconductor device according to the modification 8 of the second embodiment.

Figure 121B:
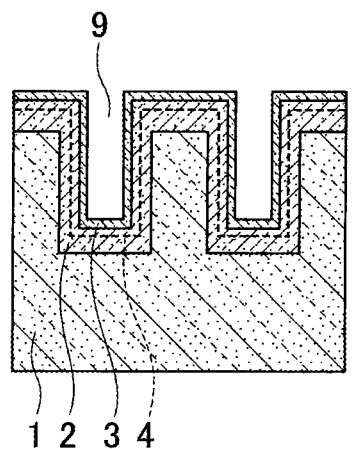

FIG. 121B is a sectional view along a section A-A in FIG. 121A.

Figure 121C:
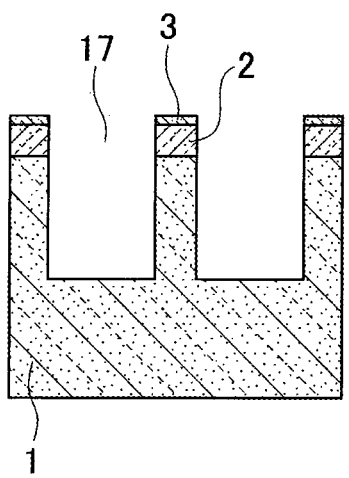

FIG. 121C is a sectional view along a section B-B in FIG. 121A.

Figure 122:
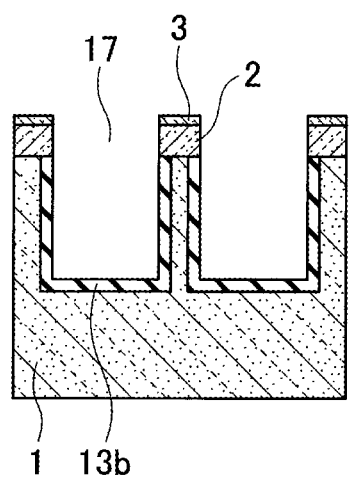

FIG. 122 is a sectional view illustrating the method for manufacturing the semiconductor device according to the modification 8 of the second embodiment.

Figure 123A:
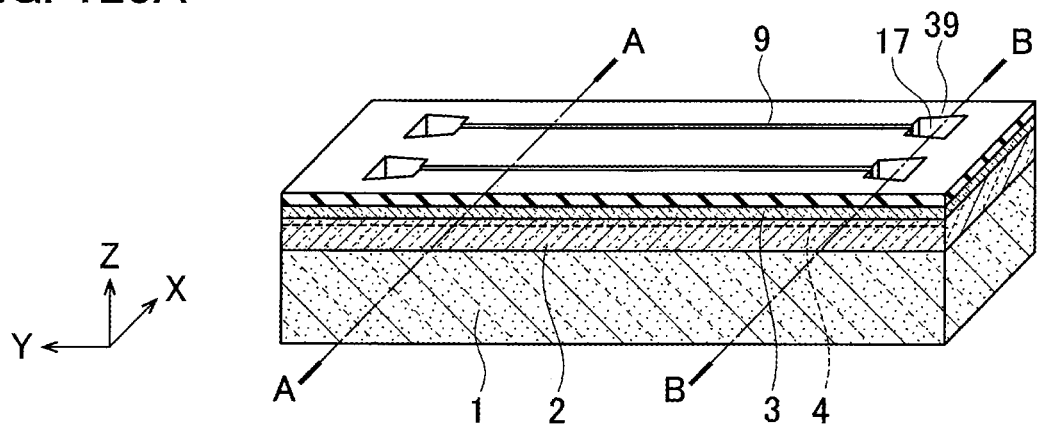

FIG. 123A is a perspective view illustrating the method for manufacturing the semiconductor device according to the modification 8 of the second embodiment.

Figure 123B:
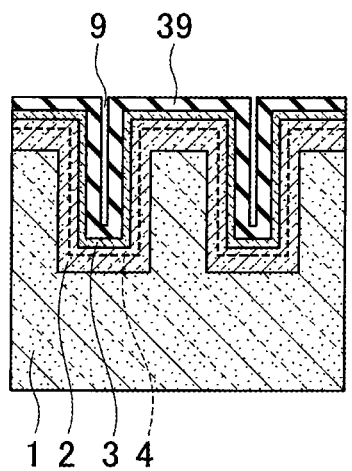

FIG. 123B is a sectional view along a section A-A in FIG. 123A.

Figure 123C:
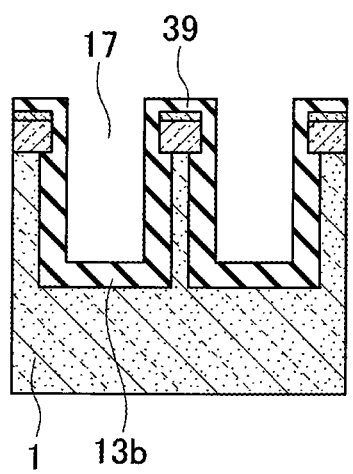

FIG. 123C is a sectional view along a section B-B in FIG. 123A.

Figure 124A:
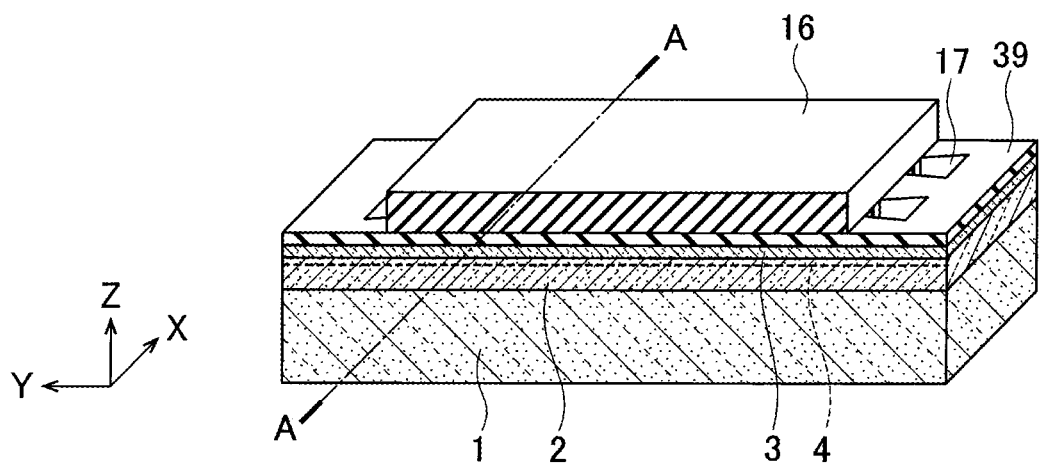

FIG. 124A is a perspective view illustrating the method for manufacturing the semiconductor device according to the modification 8 of the second embodiment.

Figure 124B:
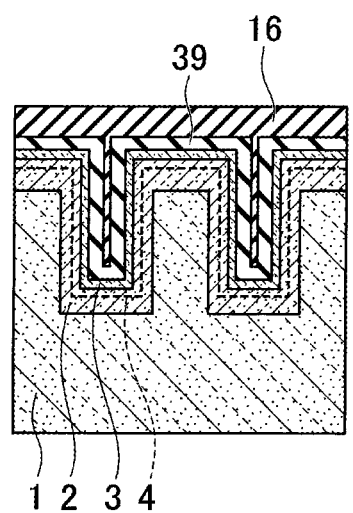

FIG. 124B is a sectional view along a section A-A in FIG. 124A.

Figure 125A:
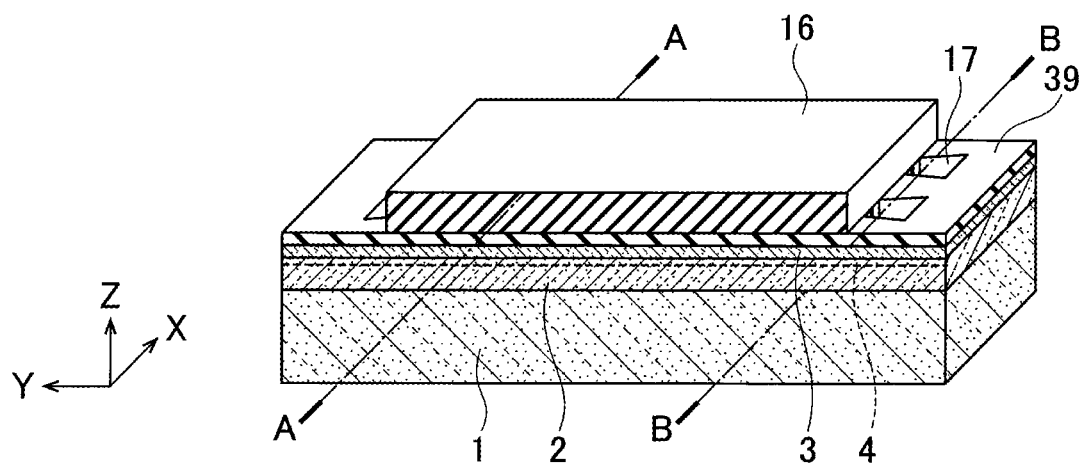

FIG. 125A is a perspective view illustrating the method for manufacturing the semiconductor device according to the modification 8 of the second embodiment.

Figure 125B:
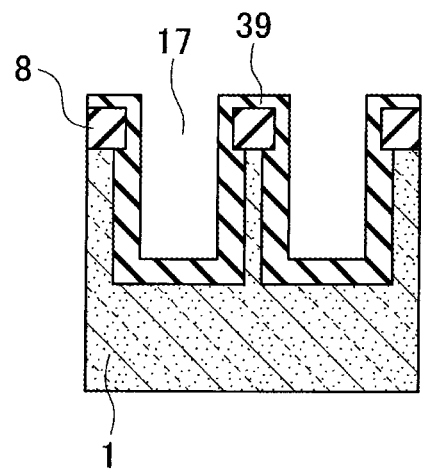

FIG. 125B is a sectional view along a section A-A in FIG. 125A.

Figure 126A:
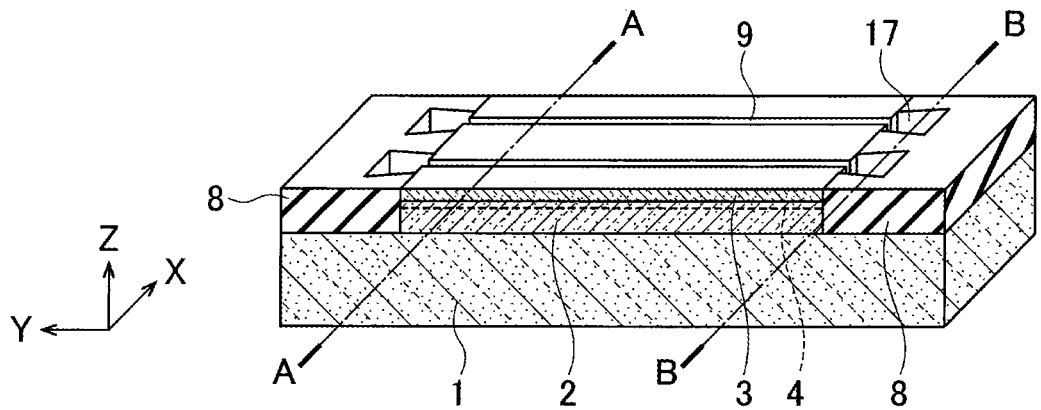

FIG. 126A is a perspective view illustrating the method for manufacturing the semiconductor device according to the modification 8 of the second embodiment.

Figure 126B:
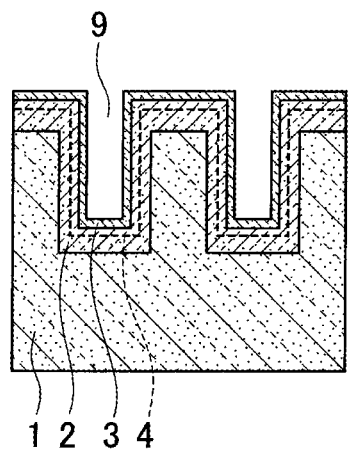

FIG. 126B is a sectional view along a section A-A in FIG. 126A.

Figure 126C:
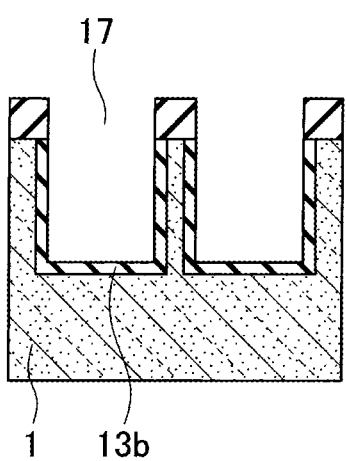

FIG. 126C is a sectional view along a section B-B in FIG. 126A.

Figure 127:
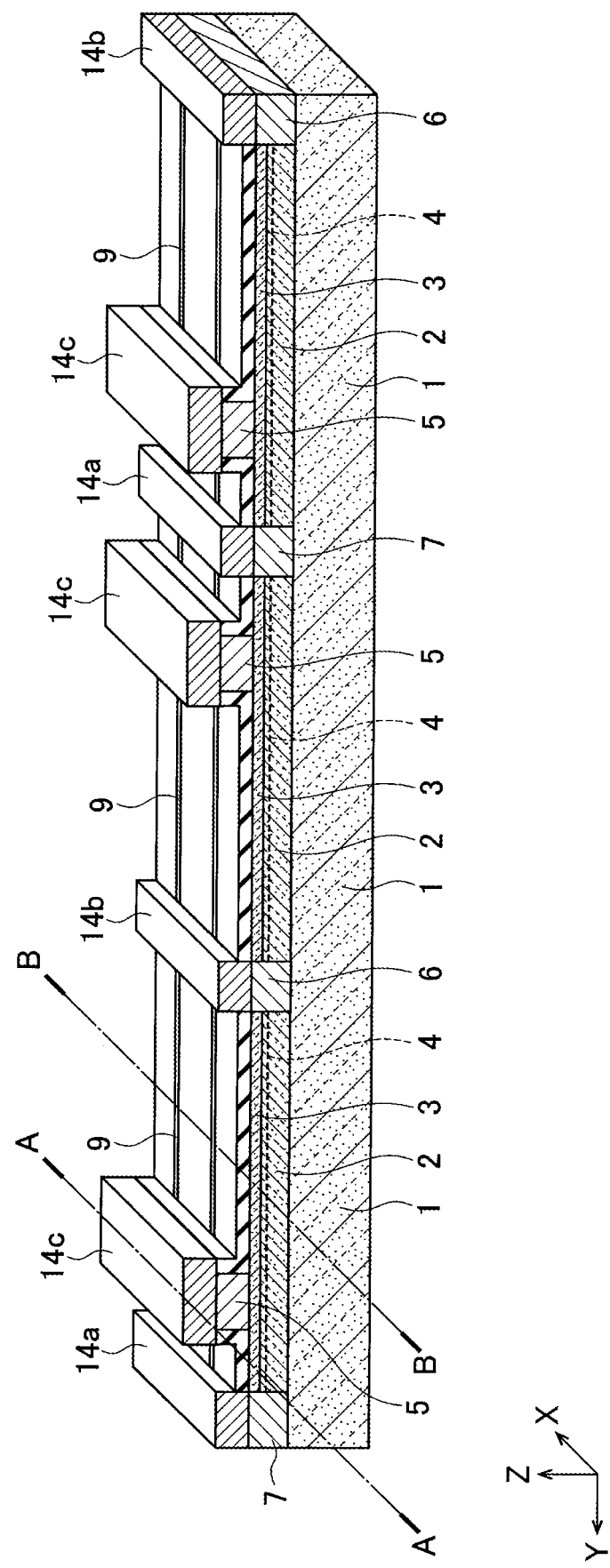

FIG. 127 is a perspective view illustrating a configuration of a semiconductor device according to a modification 9 of the second embodiment.

Figure 128A:
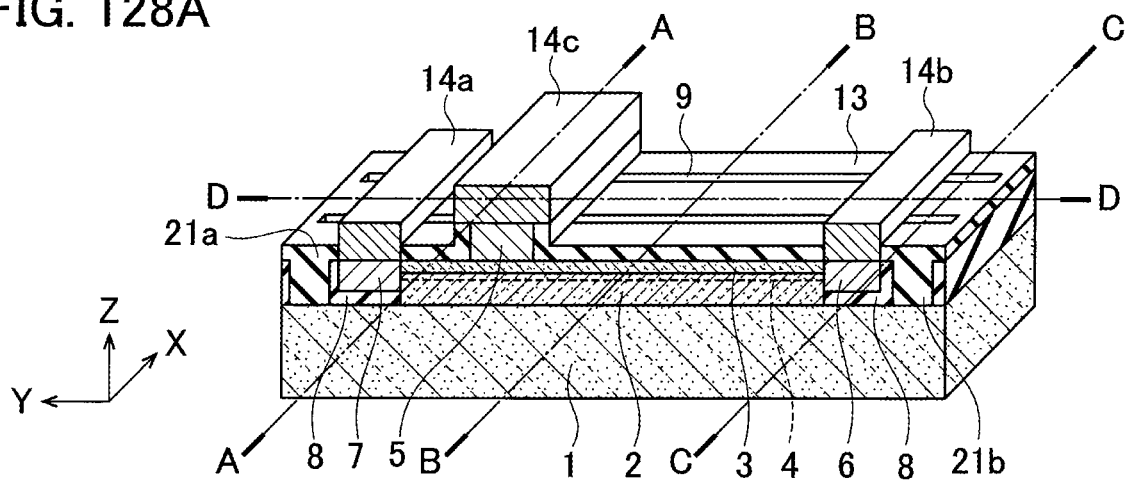

FIG. 128A is a perspective view illustrating a configuration of a semiconductor device according to a modification 10 of the second embodiment.

Figure 128B:
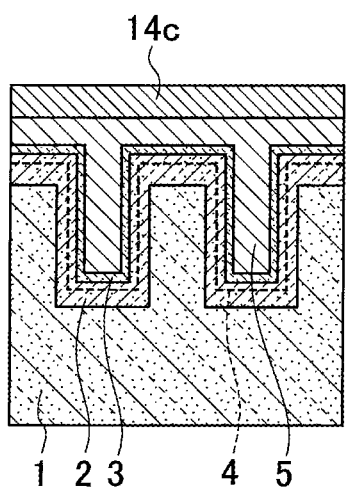

FIG. 128B is a sectional view along a section A-A in FIG. 128A.

Figure 128C:
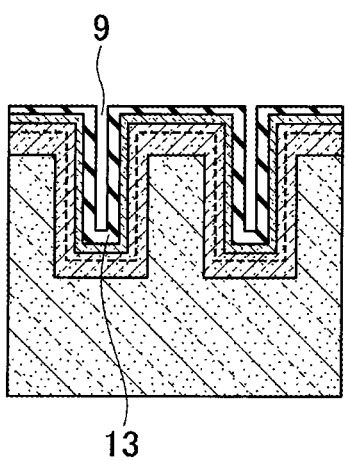

FIG. 128C is a sectional view along a section B-B in FIG. 128A.

Figure 128D:
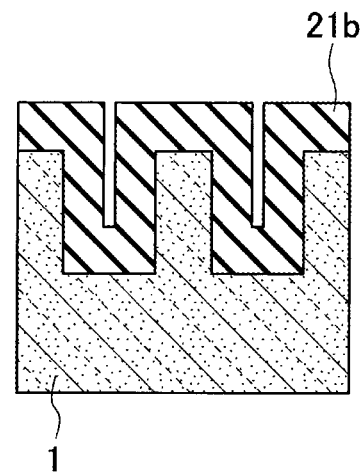

FIG. 128D is a sectional view along a section C-C in FIG. 128A.

Figure 128E:
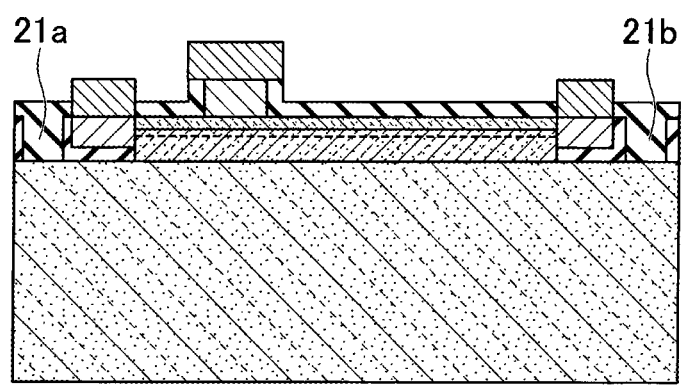

FIG. 128E is a sectional view along a section D-D in FIG. 128A.

Figure 129A:
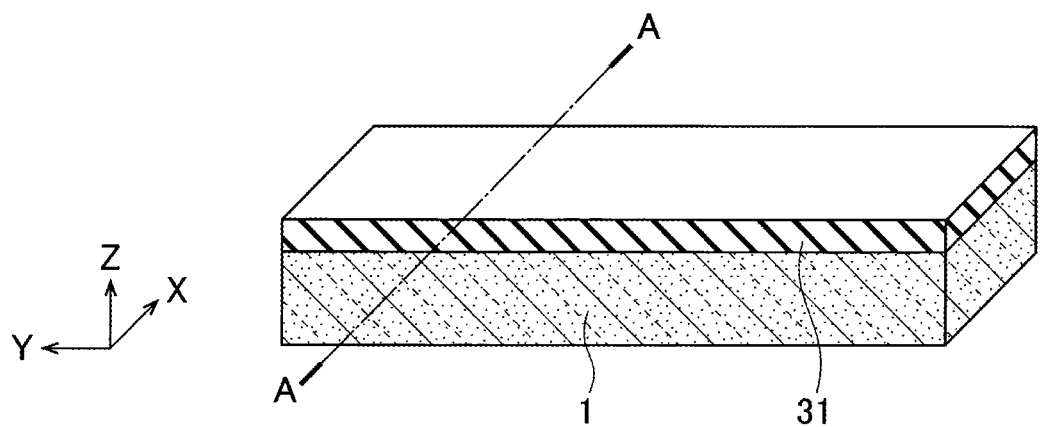

FIG. 129A is a perspective view illustrating a method for manufacturing the semiconductor device according to the modification 10 of the second embodiment.

Figure 129B:
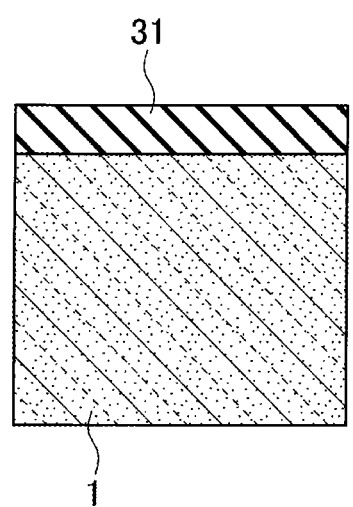

FIG. 129B is a sectional view along a section A-A in FIG. 129A.

Figure 130A:
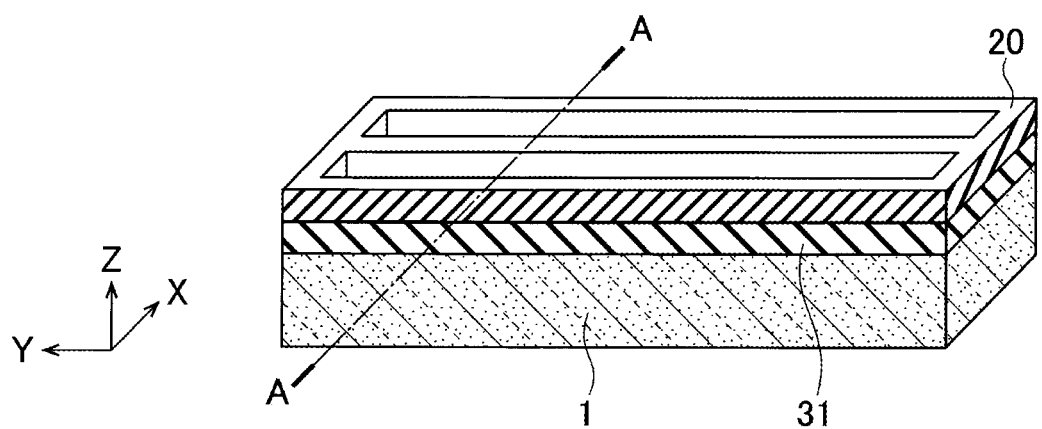

FIG. 130A is a perspective view illustrating the method for manufacturing the semiconductor device according to the modification 10 of the second embodiment.

Figure 130B:
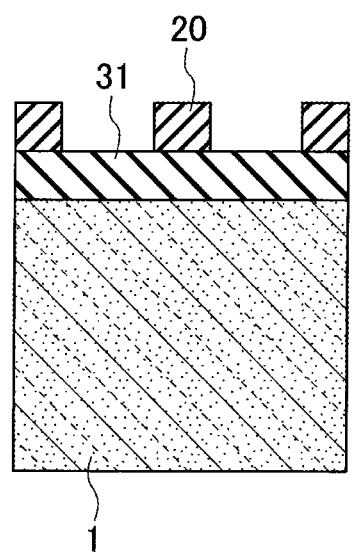

FIG. 130B is a sectional view along a section A-A in FIG. 130A.

Figure 131A:
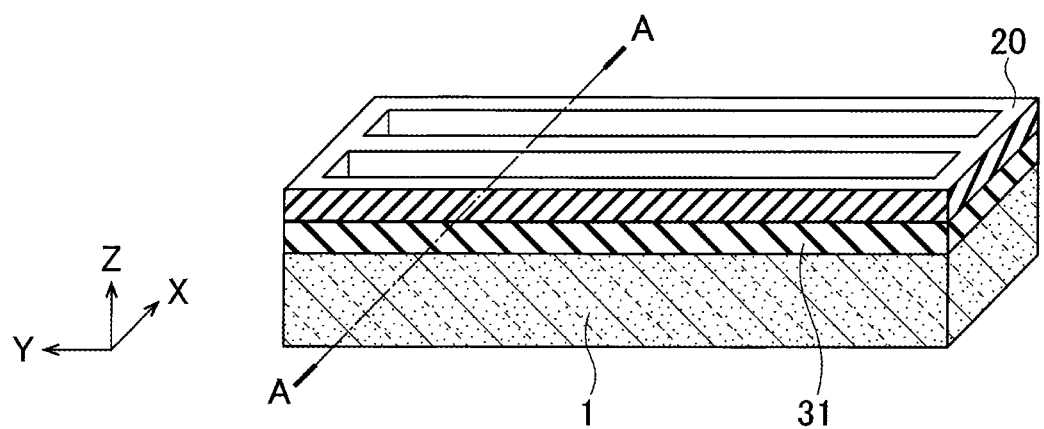

FIG. 131A is a perspective view illustrating the method for manufacturing the semiconductor device according to the modification 10 of the second embodiment.

Figure 131B:
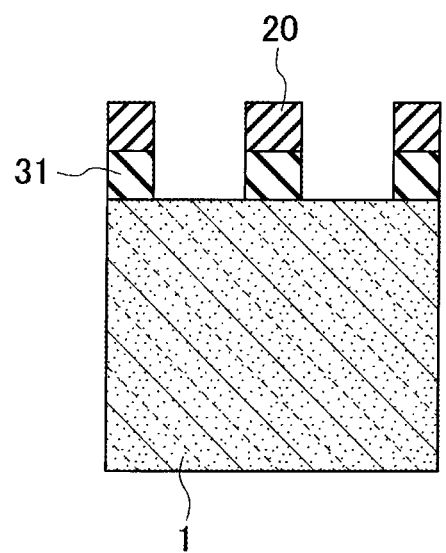

FIG. 131B is a sectional view along a section A-A in FIG. 131A.

Figure 132A:
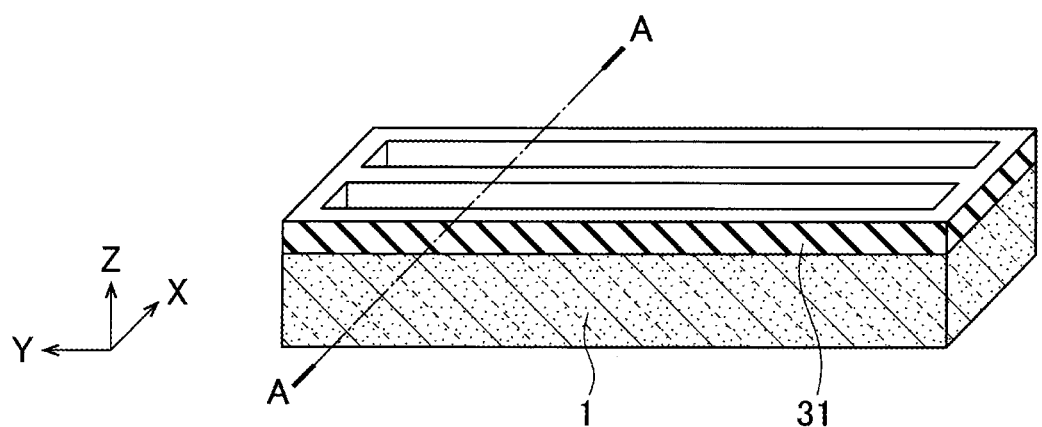

FIG. 132A is a perspective view illustrating the method for manufacturing the semiconductor device according to the modification 10 of the second embodiment.

Figure 132B:
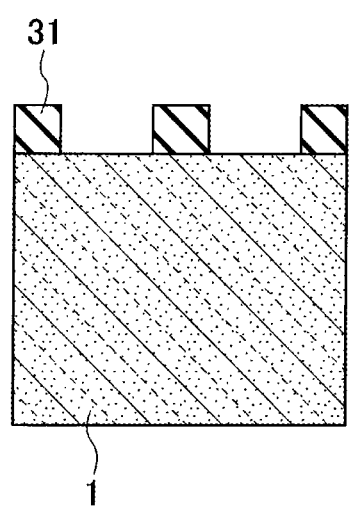

FIG. 132B is a sectional view along a section A-A in FIG. 132A.

Figure 133A:
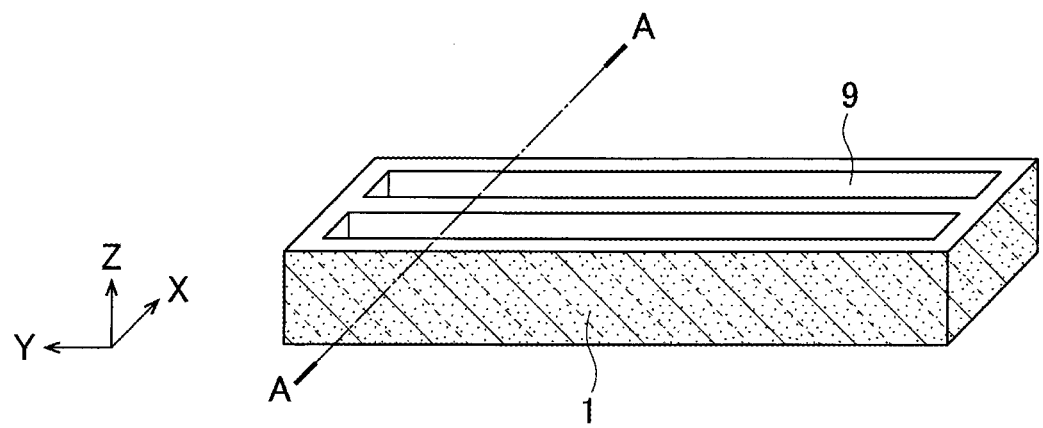

FIG. 133A is a perspective view illustrating the method for manufacturing the semiconductor device according to the modification 10 of the second embodiment.

Figure 133B:
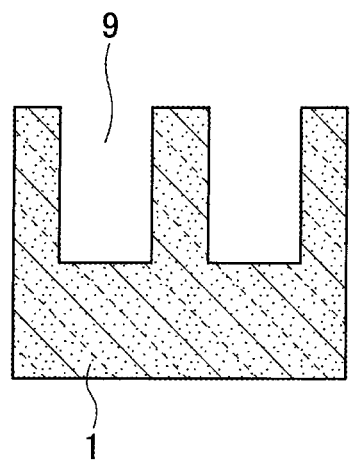

FIG. 133B is a sectional view along a section A-A in FIG. 133A.

Figure 134A:
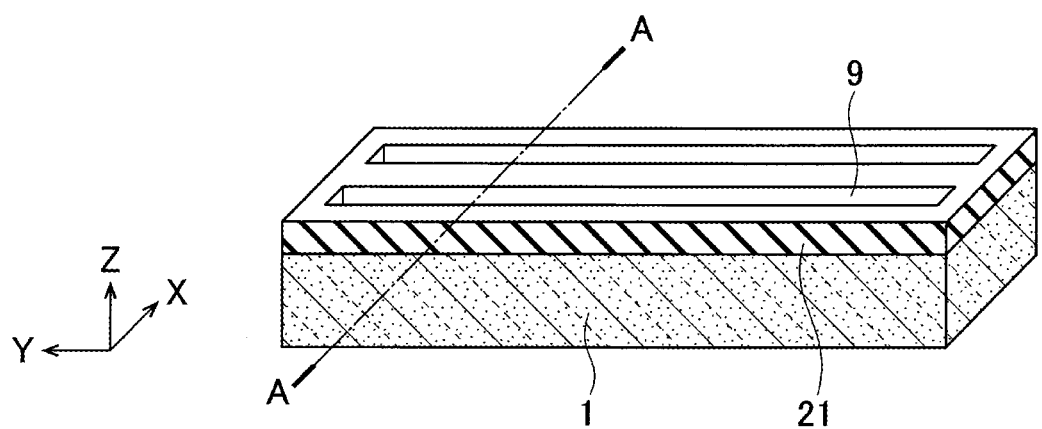

FIG. 134A is a perspective view illustrating the method for manufacturing the semiconductor device according to the modification 10 of the second embodiment.

Figure 134B:
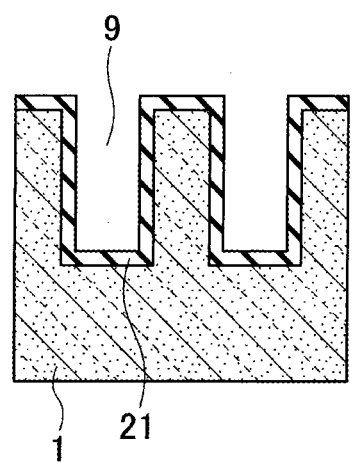

FIG. 134B is a sectional view along a section A-A in FIG. 134A.

Figure 135A:
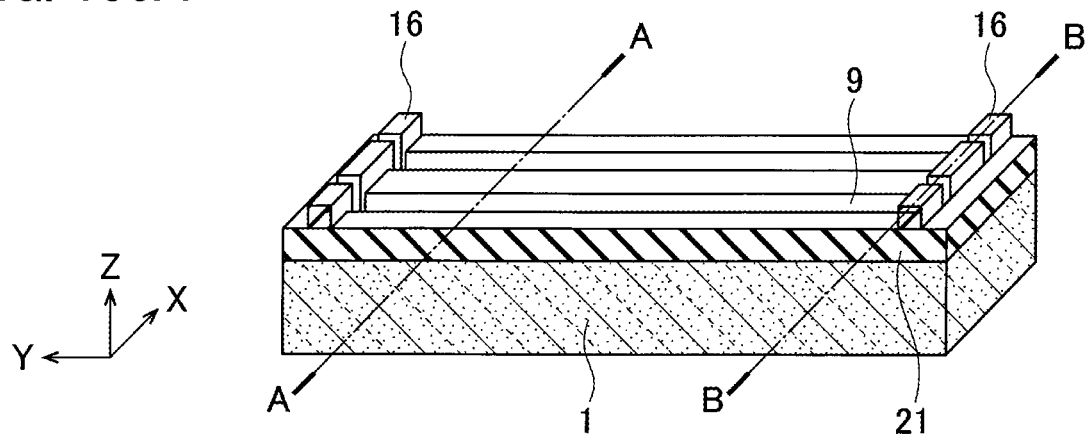

FIG. 135A is a perspective view illustrating the method for manufacturing the semiconductor device according to the modification 10 of the second embodiment.

Figure 135B:
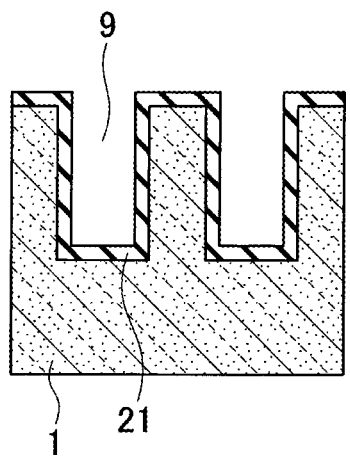

FIG. 135B is a sectional view along a section A-A in FIG. 135A.

Figure 135C:
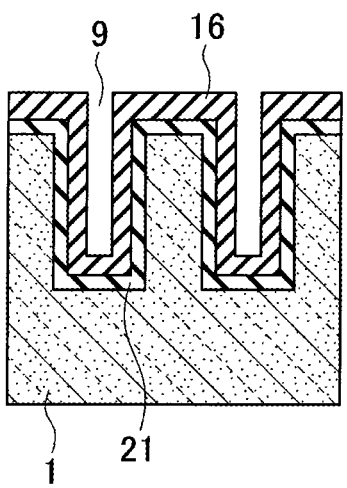

FIG. 135C is a sectional view along a section B-B in FIG. 135A.

Figure 136A:
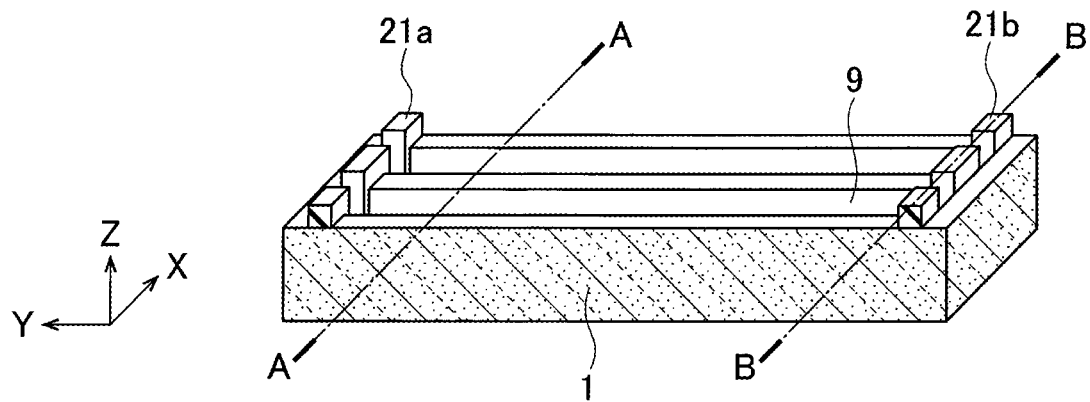

FIG. 136A is a perspective view illustrating the method for manufacturing the semiconductor device according to the modification 10 of the second embodiment.

Figure 136B:
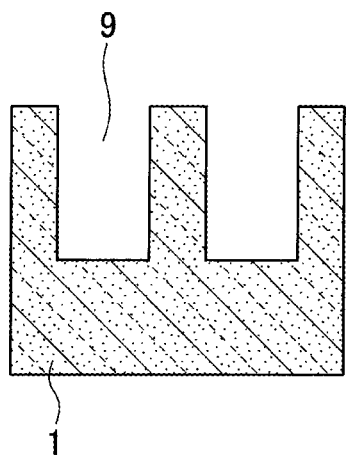

FIG. 136B is a sectional view along a section A-A in FIG. 136A.

Figure 136C:
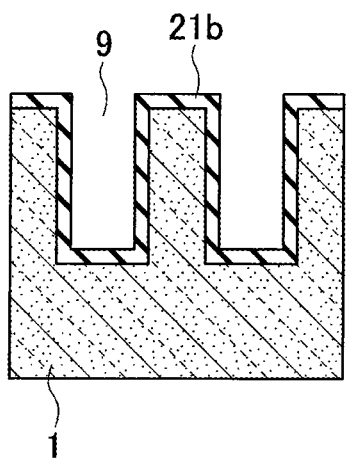

FIG. 136C is a sectional view along a section B-B in FIG. 136A.

Figure 137A:
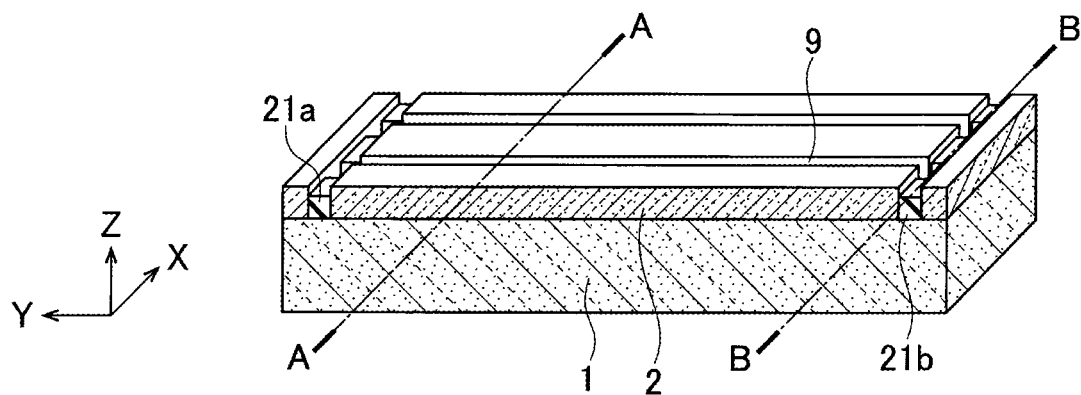

FIG. 137A is a perspective view illustrating the method for manufacturing the semiconductor device according to the modification 10 of the second embodiment.

Figure 137B:
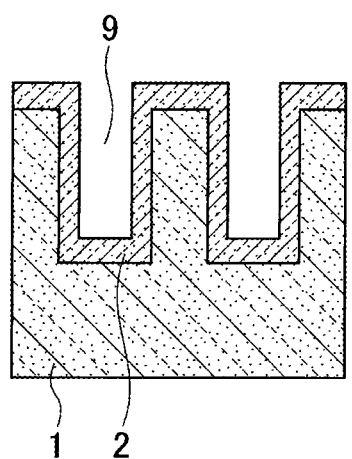

FIG. 137B is a sectional view along a section A-A in FIG. 137A.

Figure 137C:
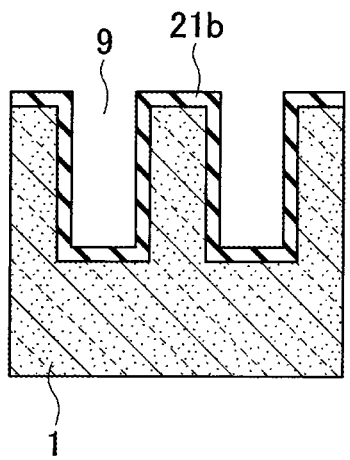

FIG. 137C is a sectional view along a section B-B in FIG. 137A.

Figure 138A:
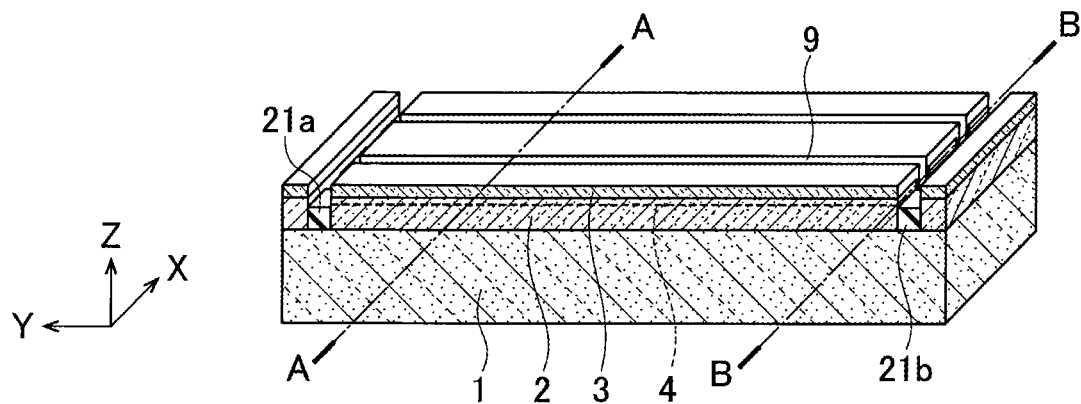

FIG. 138A is a perspective view illustrating the method for manufacturing the semiconductor device according to the modification 10 of the second embodiment.

Figure 138B:
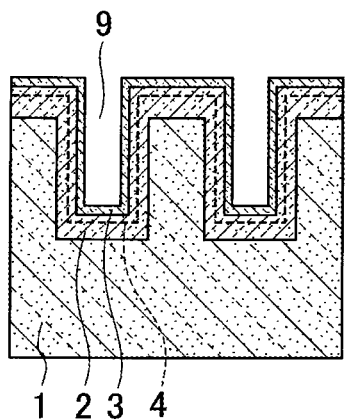

FIG. 138B is a sectional view along a section A-A in FIG. 138A.

Figure 138C:
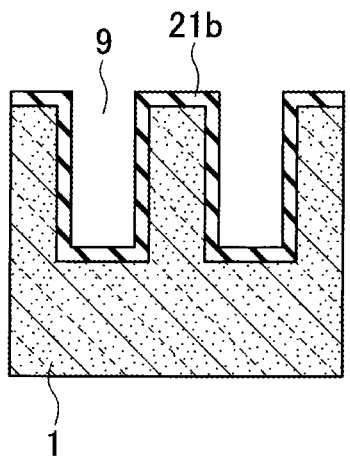

FIG. 138C is a sectional view along a section B-B in FIG. 138A.

Figure 139A:
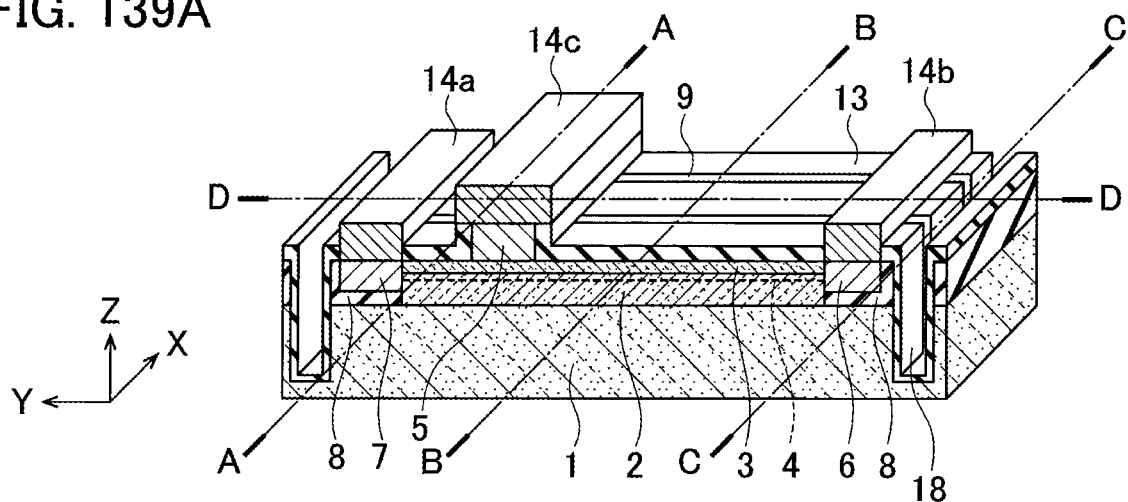

FIG. 139A is a perspective view illustrating a configuration of a semiconductor device according to a modification 11 of the second embodiment.

Figure 139B:
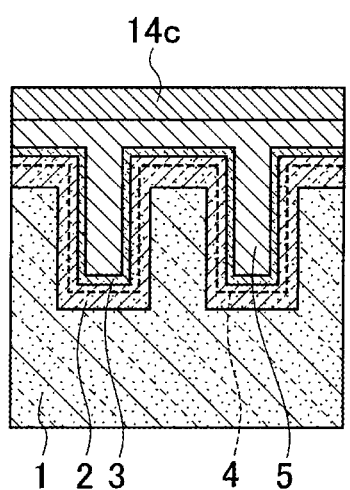

FIG. 139B is a sectional view along a section A-A in FIG. 139A.

Figure 139C:
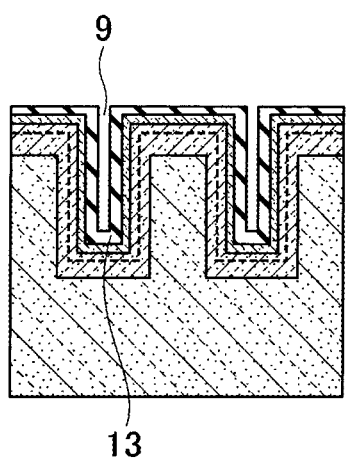

FIG. 139C is a sectional view along a section B-B in FIG. 139A.

Figure 139D:
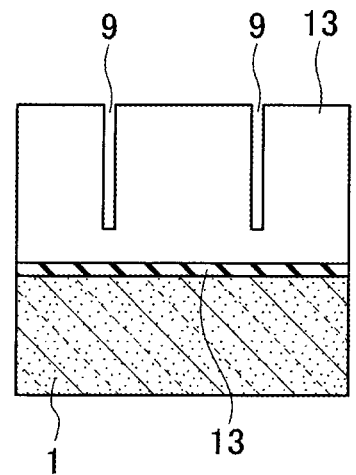

FIG. 139D is a sectional view along a section C-C in FIG. 139A.

Figure 139E:
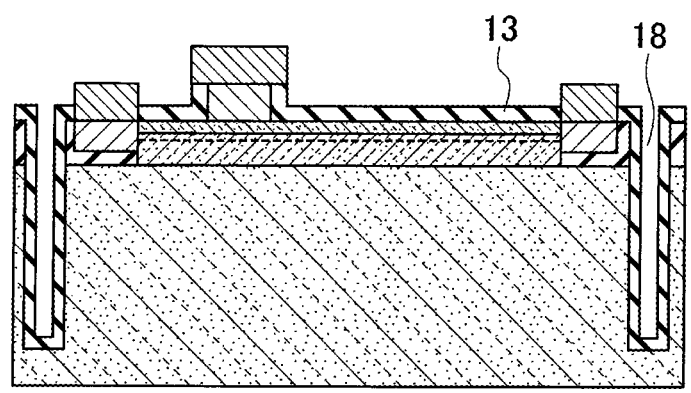

FIG. 139E is a sectional view along a section D-D in FIG. 139A.

Figure 140A:
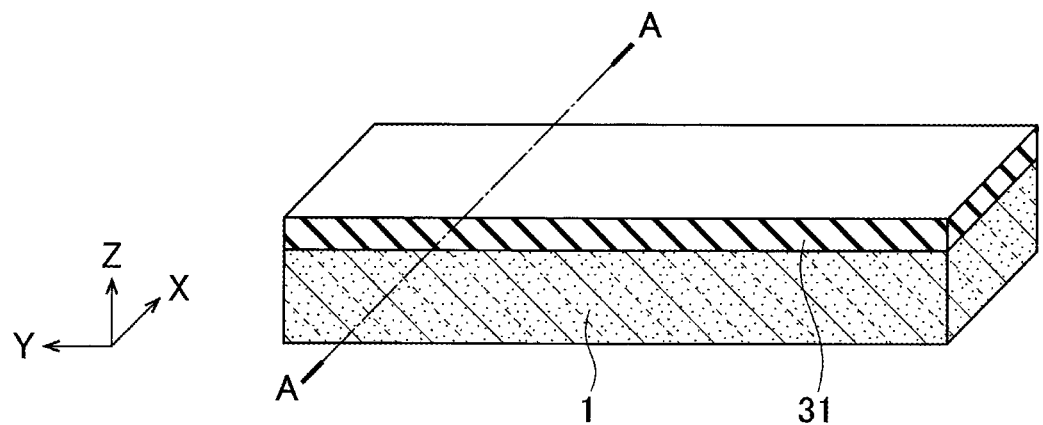

FIG. 140A is a perspective view illustrating a method for manufacturing the semiconductor device according to the modification 11 of the second embodiment.

Figure 140B:
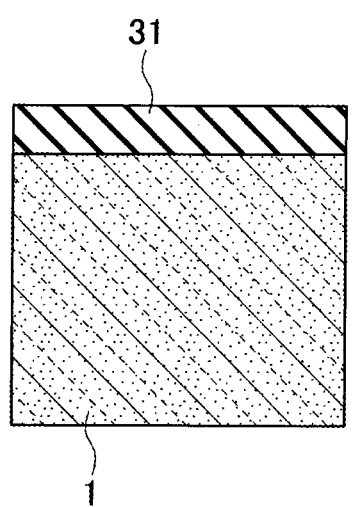

FIG. 140B is a sectional view along a section A-A in FIG. 140A.

Figure 141A:
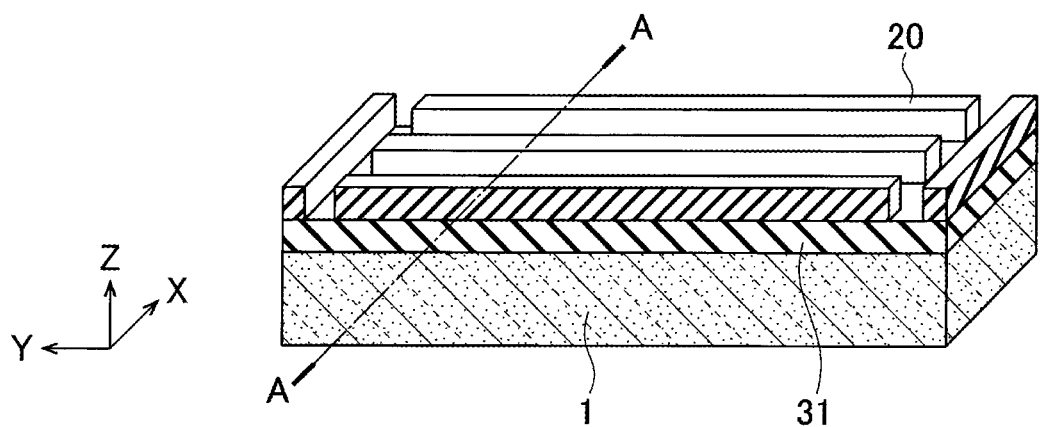

FIG. 141A is a perspective view illustrating the method for manufacturing the semiconductor device according to the modification 11 of the second embodiment.

Figure 141B:
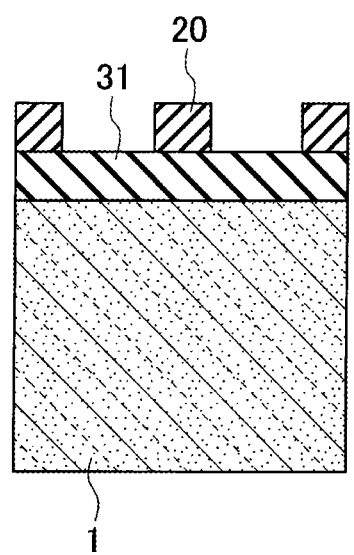

FIG. 141B is a sectional view along a section A-A in FIG. 141A.

Figure 142A:
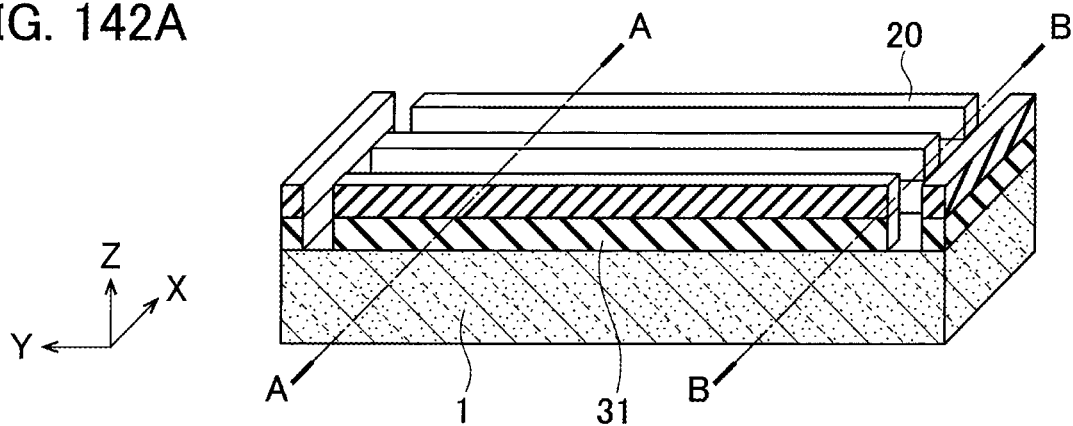

FIG. 142A is a perspective view illustrating the method for manufacturing the semiconductor device according to the modification 11 of the second embodiment.

Figure 142B:
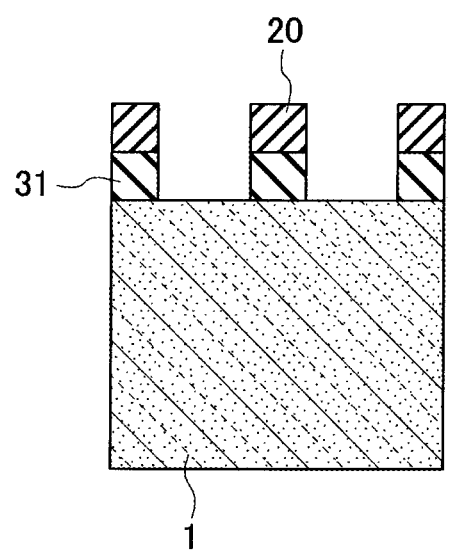

FIG. 142B is a sectional view along a section A-A in FIG. 142A.

Figure 142C:
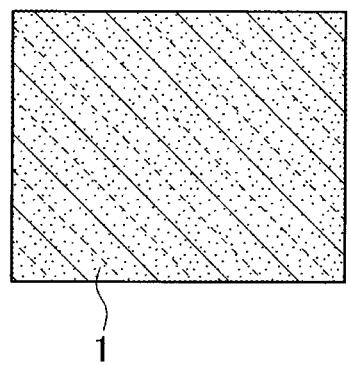

FIG. 142C is a sectional view along a section B-B in FIG. 142A.

Figure 143A:
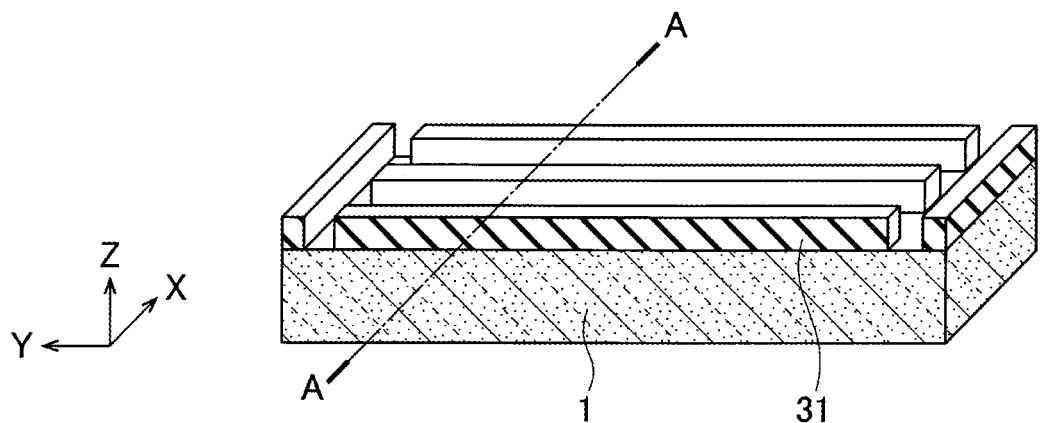

FIG. 143A is a perspective view illustrating the method for manufacturing the semiconductor device according to the modification 11 of the second embodiment.

Figure 143B:
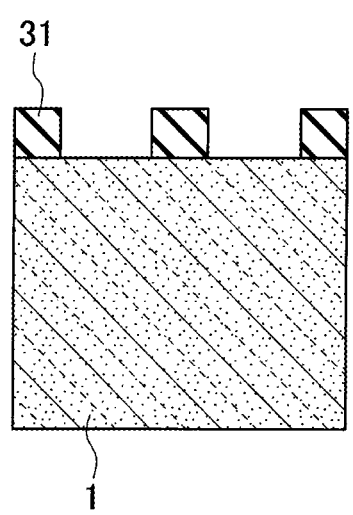

FIG. 143B is a sectional view along a section A-A in FIG. 143A.

Figure 144A:
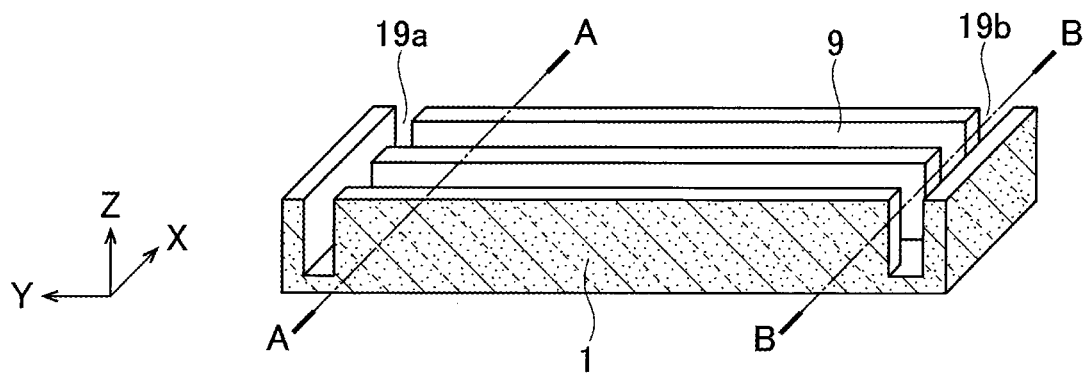

FIG. 144A is a perspective view illustrating the method for manufacturing the semiconductor device according to the modification 11 of the second embodiment.

Figure 144B:
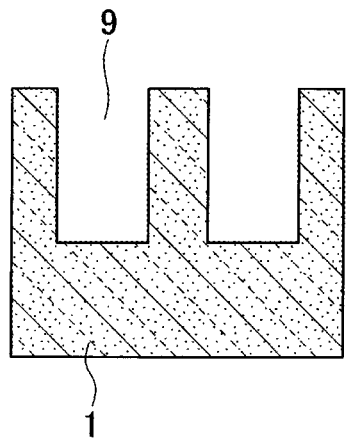

FIG. 144B is a sectional view along a section A-A in FIG. 144A.

Figure 144C:
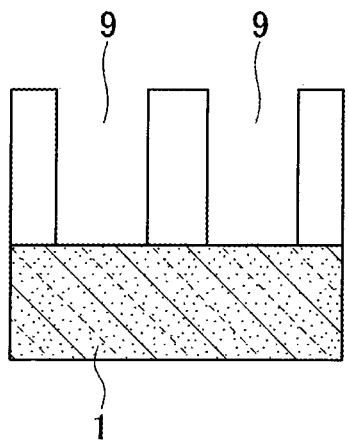

FIG. 144C is a sectional view along a section B-B in FIG. 144A.

Figure 145A:
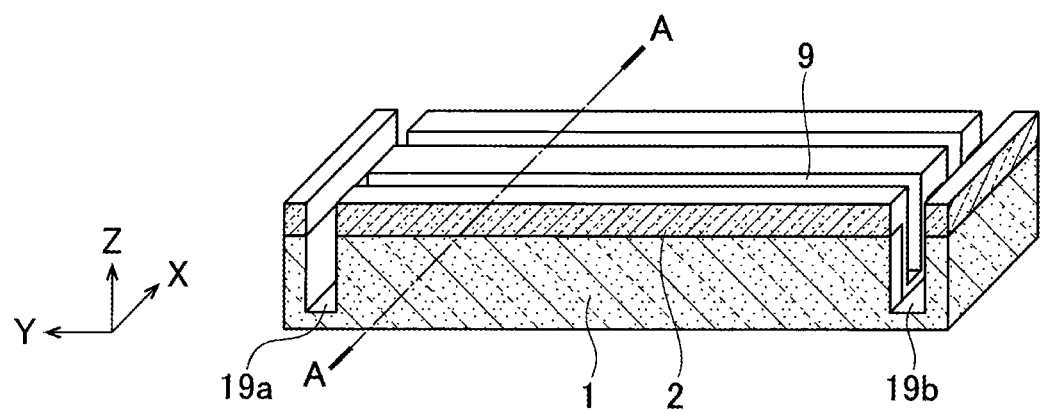

FIG. 145A is a perspective 5 view illustrating the method for manufacturing the semiconductor device according to the modification 11 of the second embodiment.

Figure 145B:
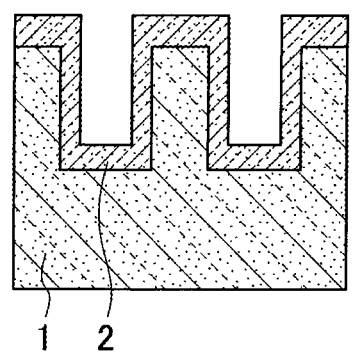

FIG. 145B is a sectional view along a section A-A in FIG. 145A.

Figure 146A:
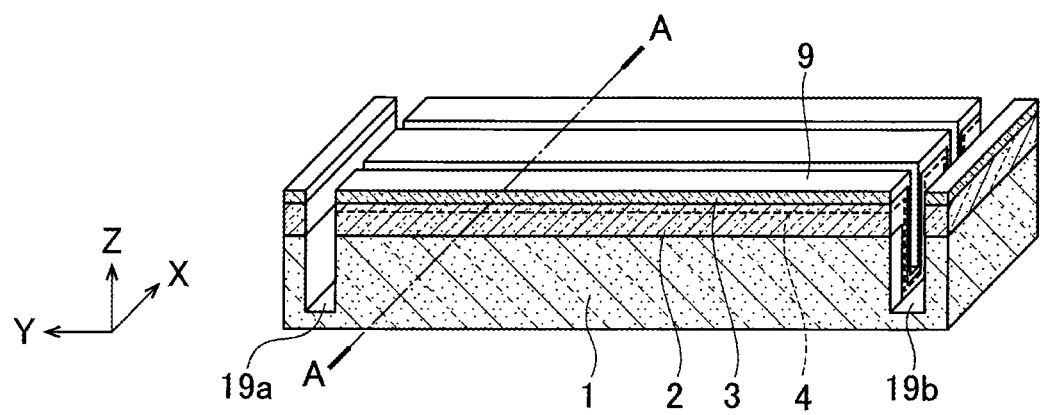

FIG. 146A is a perspective view illustrating the method for manufacturing the semiconductor device according to the modification 11 of the second embodiment.

Figure 146B:
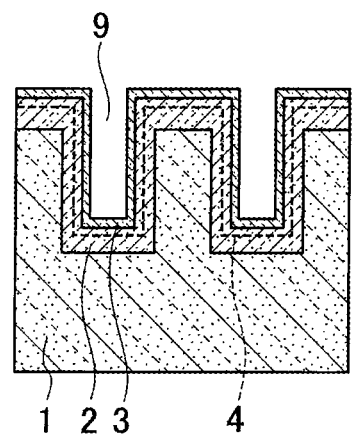

FIG. 146B is a sectional view along a section A-A in FIG. 146A.

Figure 147A:
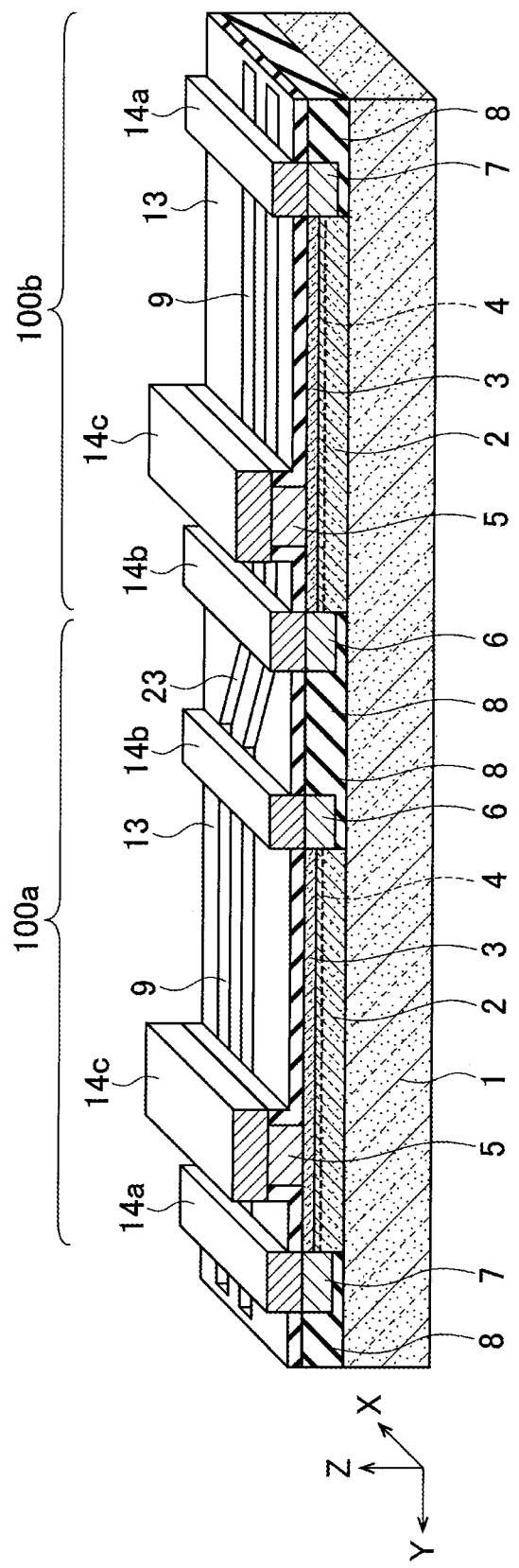

FIG. 147A is a perspective view illustrating a configuration of a semiconductor device according to a modification 12 of the second embodiment.

Figure 147B:
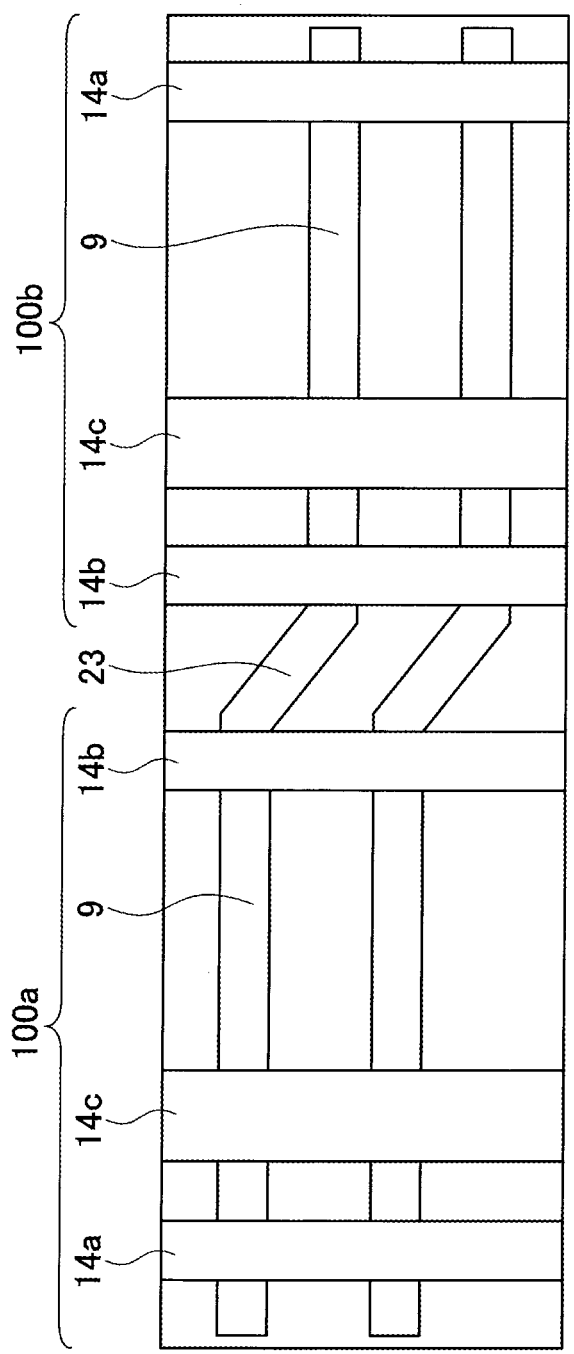

FIG. 147B is a top view of a main surface of a substrate 1 in FIG. 147A seen from a normal direction thereof.

Figure 148:
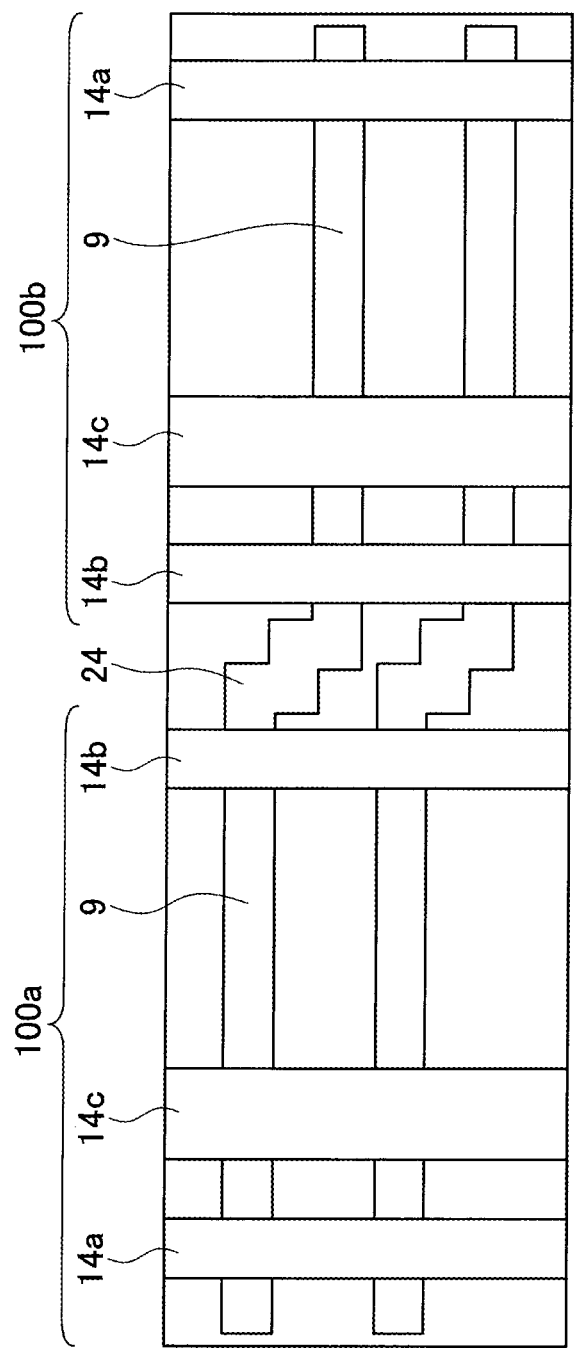

FIG. 148 is a top view illustrating a configuration of a semiconductor device according to a first alternative example of the modification 12 of the second embodiment.

Figure 149:
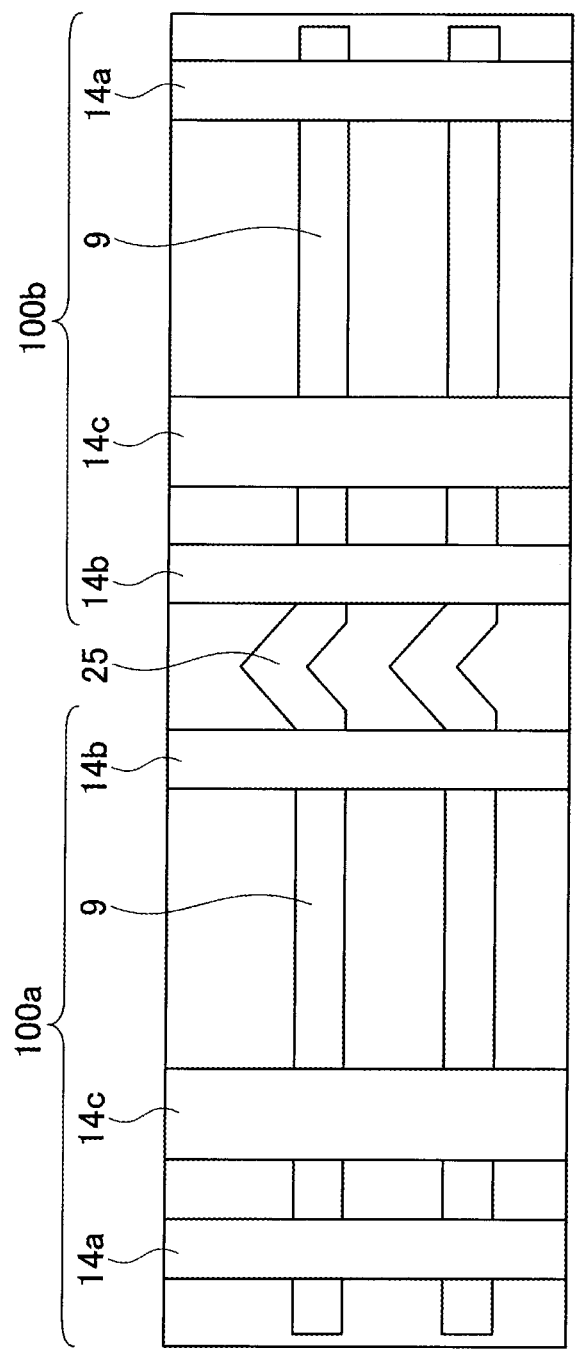

FIG. 149 is a top view illustrating a configuration of a semiconductor device according to a second alternative example of the modification 12 of the second embodiment.

Figure 150:
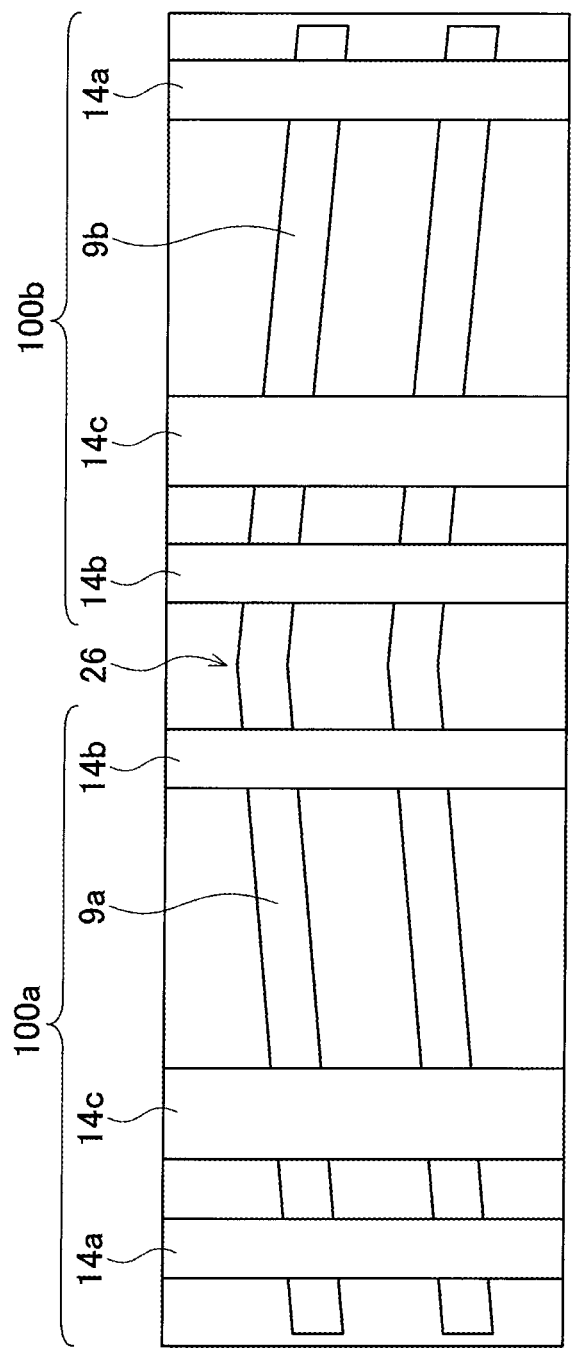

FIG. 150 is a top view illustrating a configuration of a semiconductor device according to a third alternative example of the modification 12 of the second embodiment.

Figure 151A:
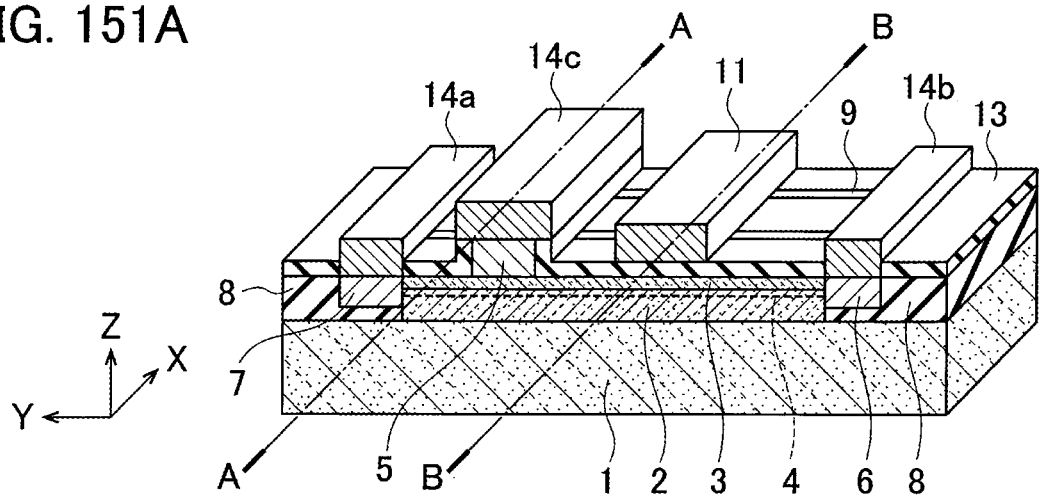

FIG. 151A is a perspective view illustrating a configuration of a semiconductor device according to a third embodiment.

Figure 151B:
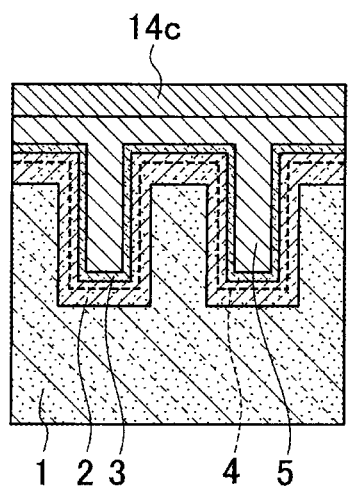

FIG. 151B is a sectional view along a section A-A in FIG. 151A.

Figure 151C:
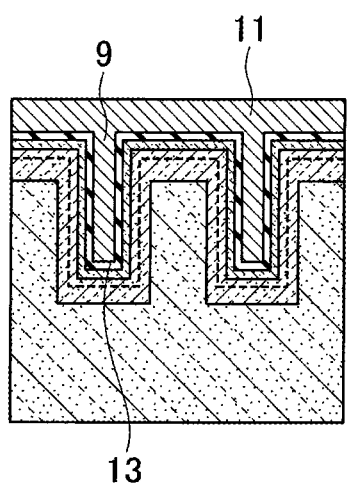

FIG. 151C is a sectional view along a section B-B in FIG. 151A.

Figure 152A:
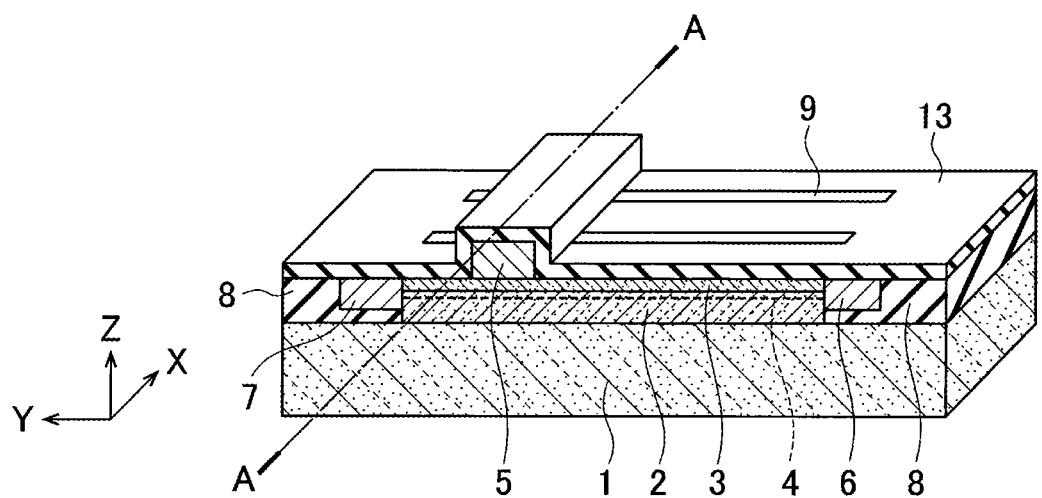

FIG. 152A is a perspective view illustrating a method for manufacturing the semiconductor device according to the third embodiment.

Figure 152B:
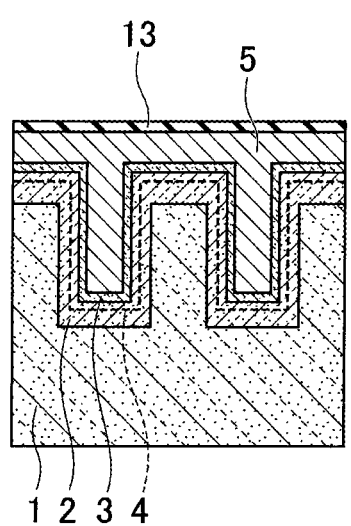

FIG. 152B is a sectional view along a section A-A in FIG. 152A.

Figure 153:
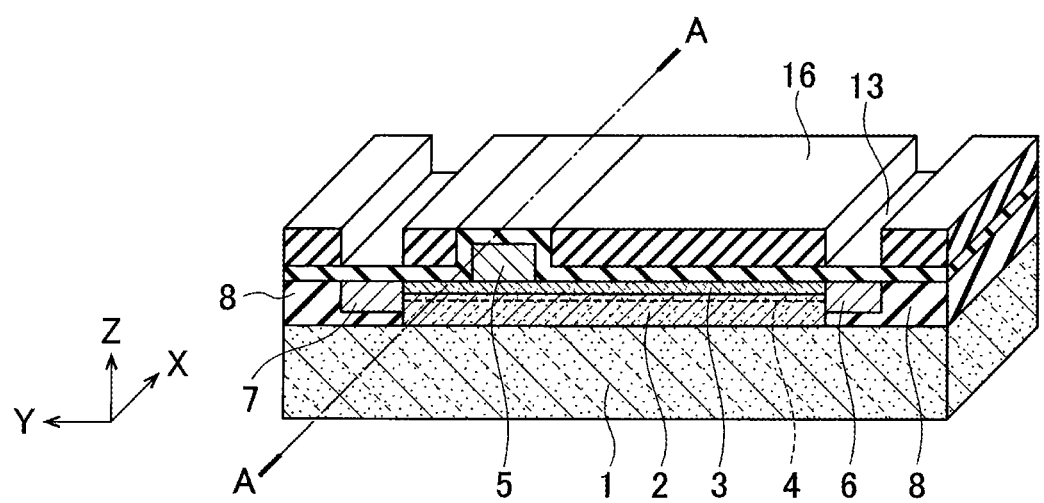

FIG. 153 is a perspective view illustrating the method for manufacturing the semiconductor device according to the third embodiment.

Figure 154A:
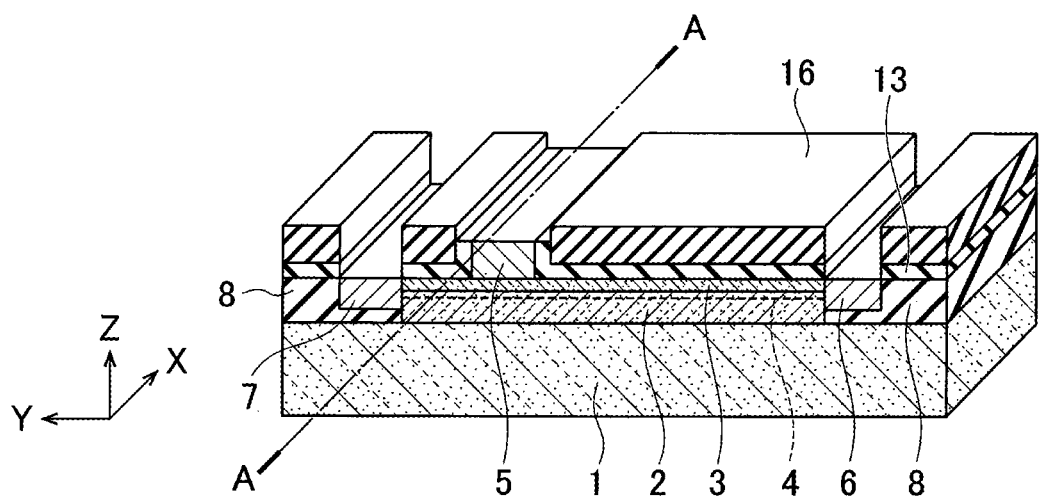

FIG. 154A is a perspective view illustrating the method for manufacturing the semiconductor device according to the third embodiment.

Figure 154B:
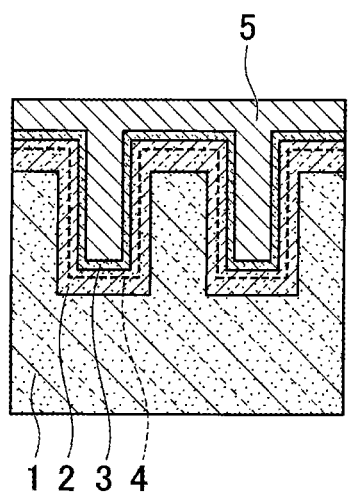

FIG. 154B is a sectional view along a section A-A in FIG. 1545A.

Figure 155A:
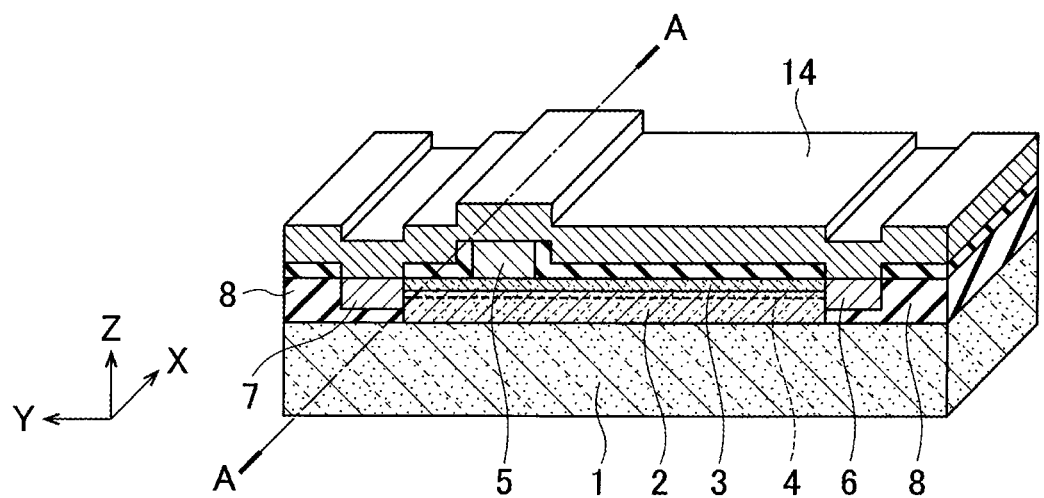

FIG. 155A is a perspective view illustrating the method for manufacturing the semiconductor device according to the third embodiment.

Figure 155B:
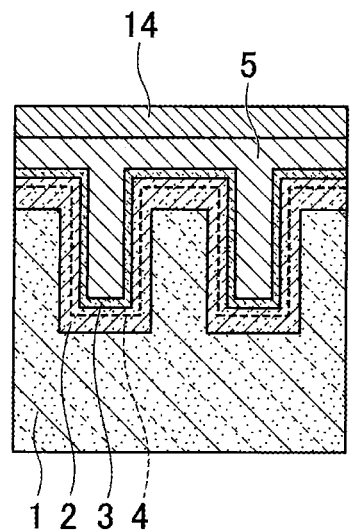

FIG. 155B is a sectional view along a section A-A in FIG. 155A.

Figure 156A:
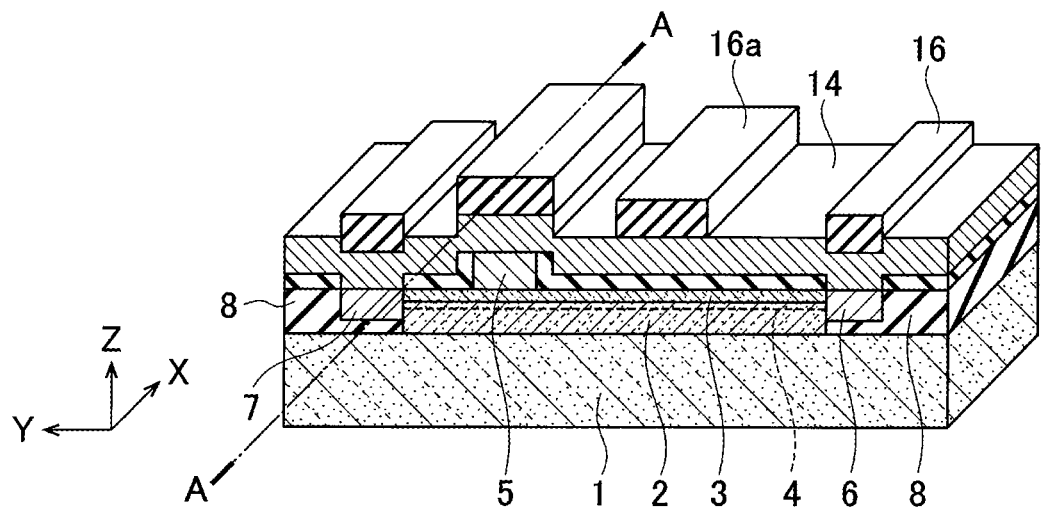

FIG. 156A is a perspective view illustrating the method for manufacturing the semiconductor device according to the third embodiment.

Figure 156B:
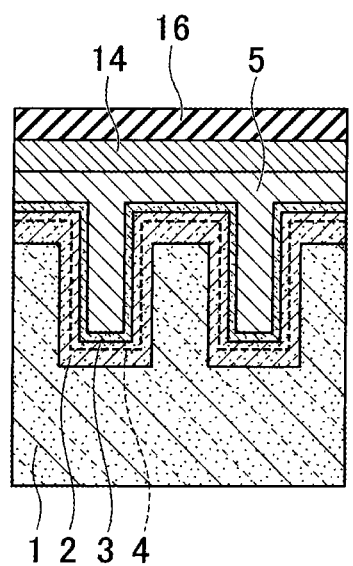

FIG. 156B is a sectional view along a section A-A in FIG. 156A.

Figure 157A:
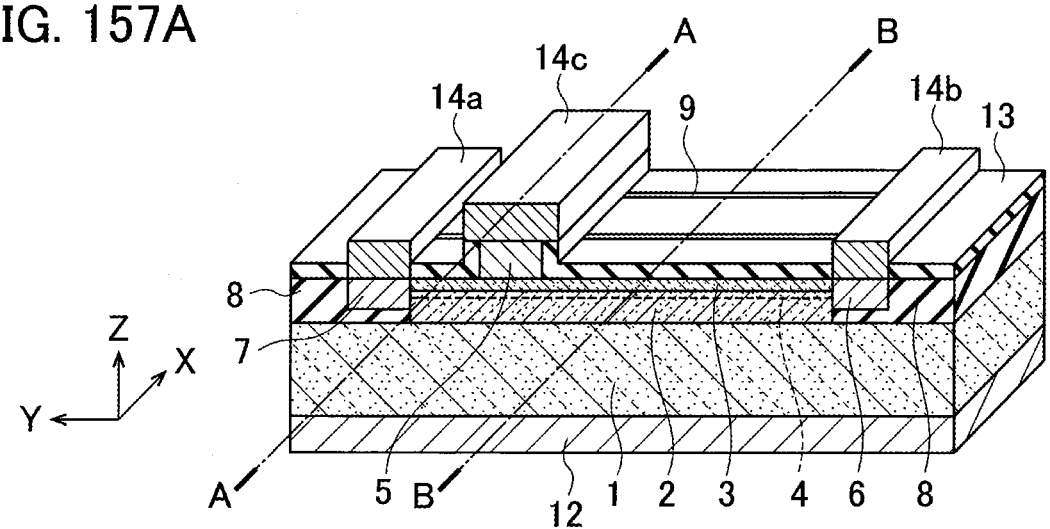

FIG. 157A is a perspective view illustrating a configuration of a semiconductor device according to a fourth embodiment.

Figure 157B:
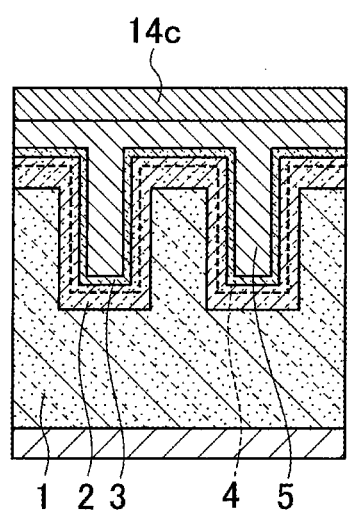

FIG. 157B is a sectional view along a section A-A in FIG. 157A.

Figure 157C:
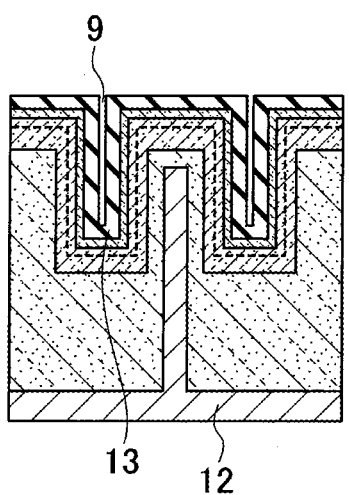

FIG. 157C is a sectional view along a section B-B in FIG. 157A.

Figure 158A:
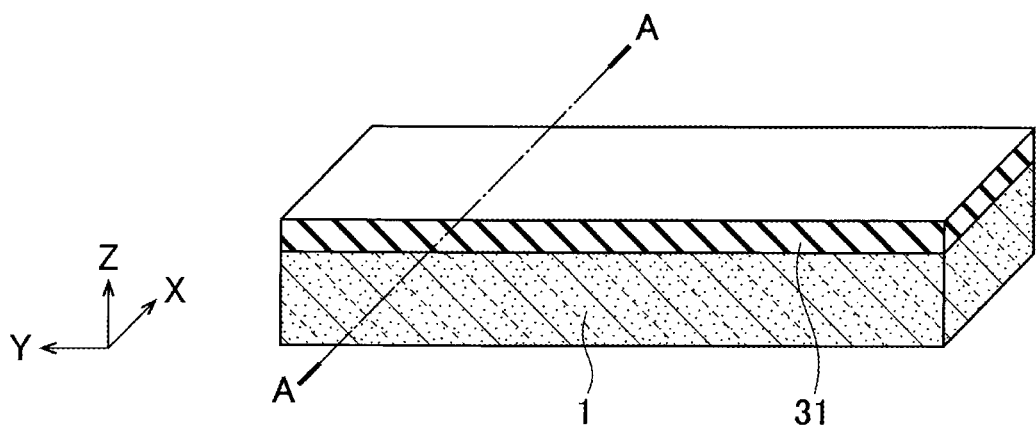

FIG. 158A is a perspective view illustrating a method for manufacturing the semiconductor device according to the fourth embodiment.

Figure 158B:
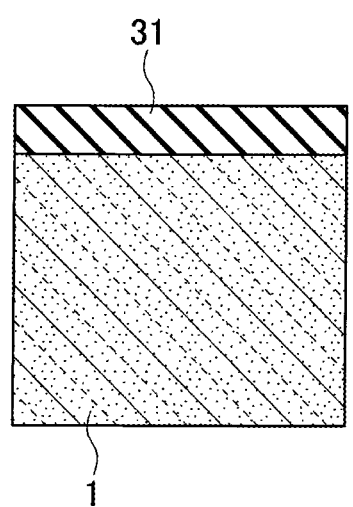

FIG. 158B is a sectional view along a section A-A in FIG. 158A.

Figure 159A:
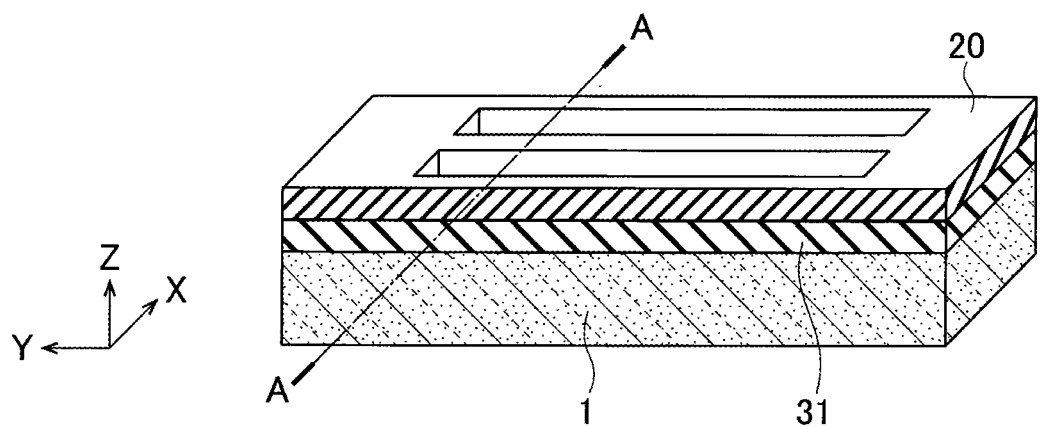

FIG. 159A is a perspective view illustrating the method for manufacturing the semiconductor device according to the fourth embodiment.

Figure 159B:
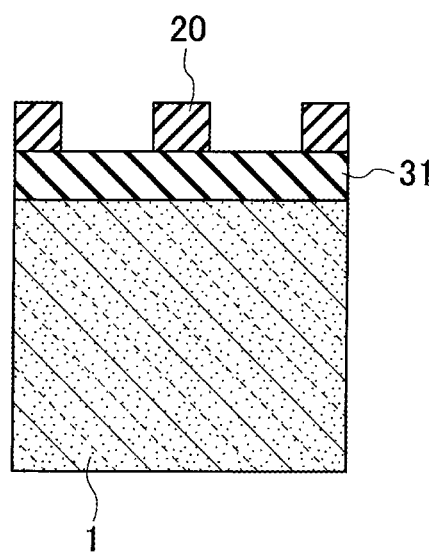

FIG. 159B is a sectional view along a section A-A in FIG. 159A.

Figure 160A:
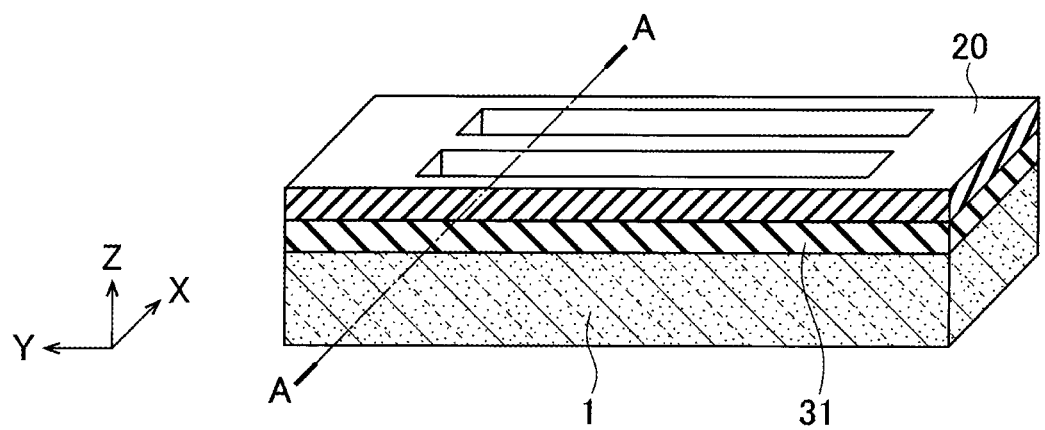

FIG. 160A is a perspective view illustrating the method for manufacturing the semiconductor device according to the fourth embodiment.

Figure 160B:
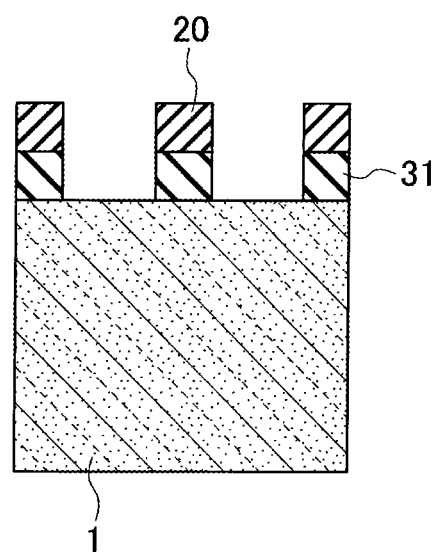

FIG. 160B is a sectional view along a section A-A in FIG. 160A.

Figure 161A:
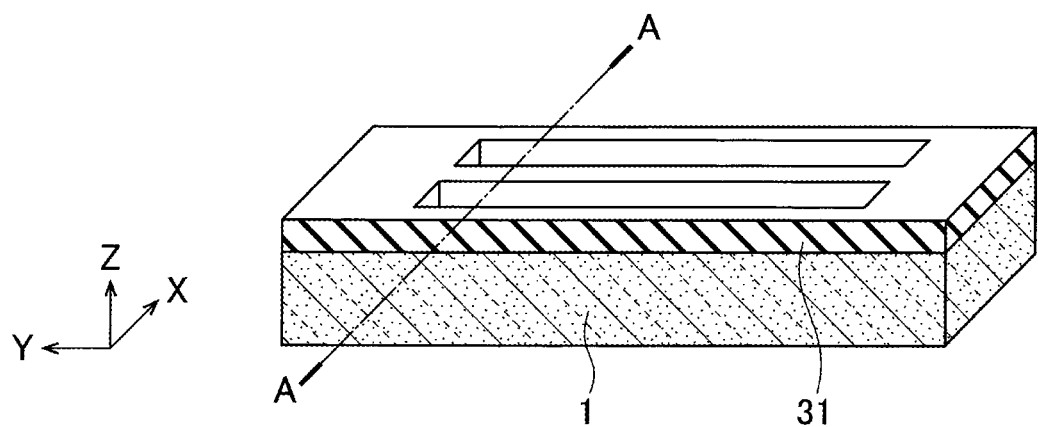

FIG. 161A is a perspective view illustrating the method for manufacturing the semiconductor device according to the fourth embodiment.

Figure 161B:
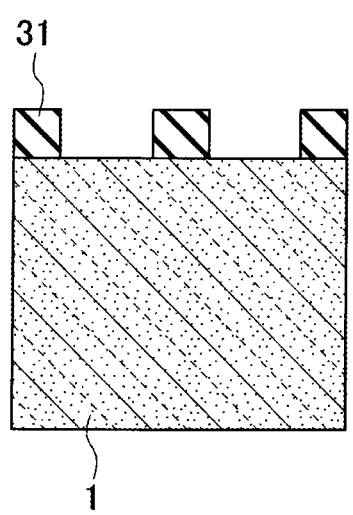

FIG. 161B is a sectional view along a section A-A in FIG. 161A.

Figure 162A:
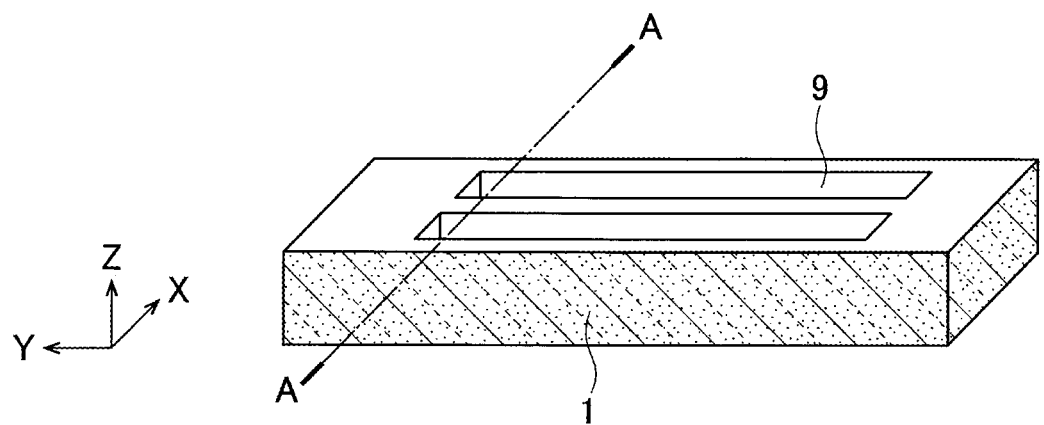

FIG. 162A is a perspective view illustrating the method for manufacturing the semiconductor device according to the fourth embodiment.

Figure 162B:
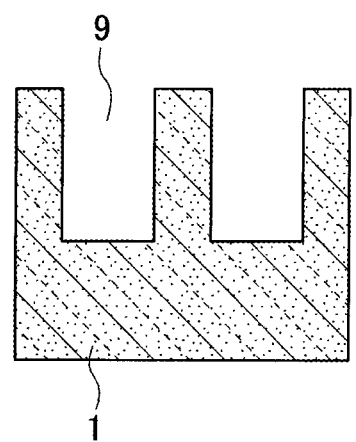

FIG. 162B is a sectional view along a section A-A in FIG. 162A.

Figure 163A:
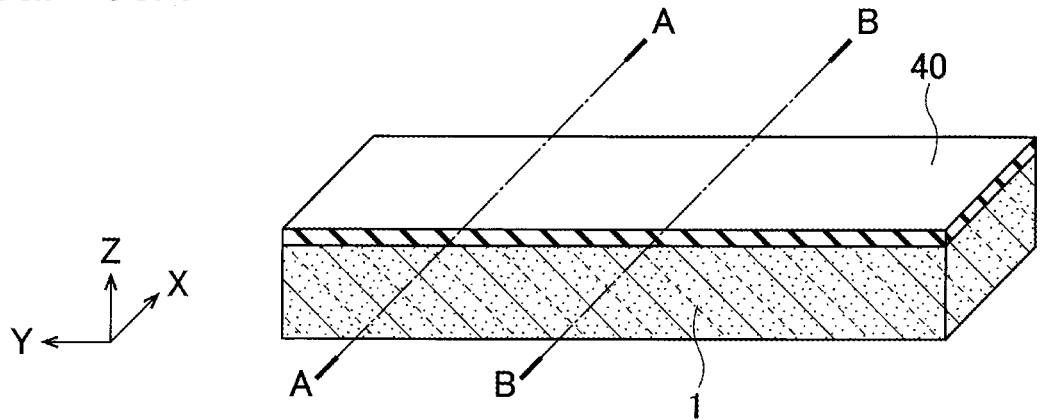

FIG. 163A is a perspective view illustrating the method for manufacturing the semiconductor device according to the fourth embodiment.

Figure 163B:
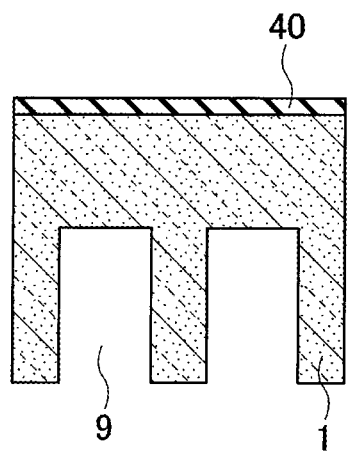

FIG. 163B is a sectional view along a section A-A in FIG. 163A.

Figure 163C:
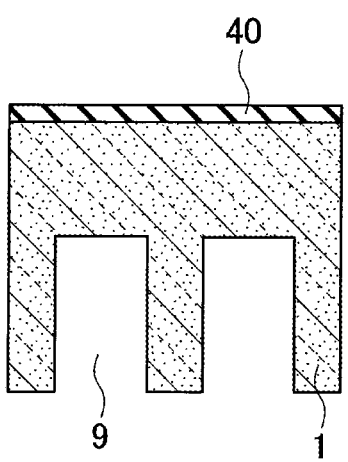

FIG. 163C is a sectional view along a section B-B in FIG. 163A.

Figure 164A:
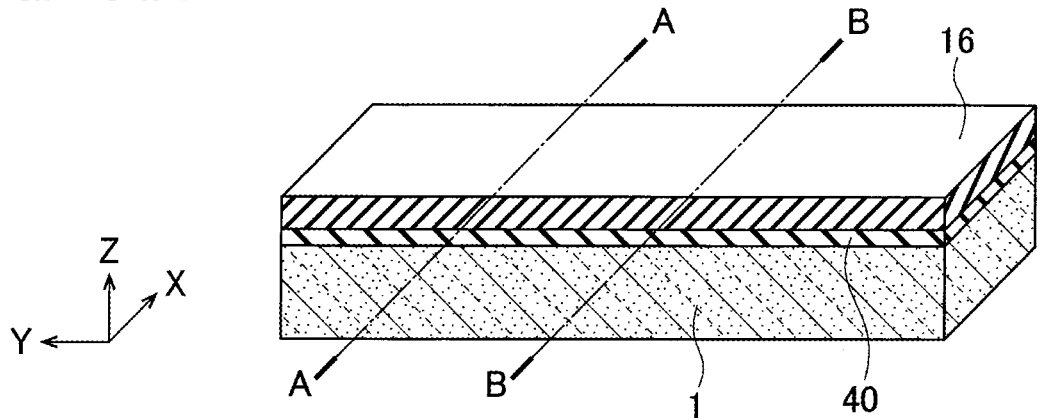

FIG. 164A is a perspective view illustrating the method for manufacturing the semiconductor device according to the fourth embodiment.

Figure 164B:
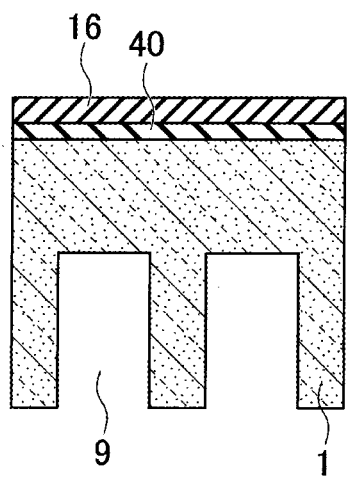

FIG. 164B is a sectional view along a section A-A in FIG. 164A.

Figure 164C:
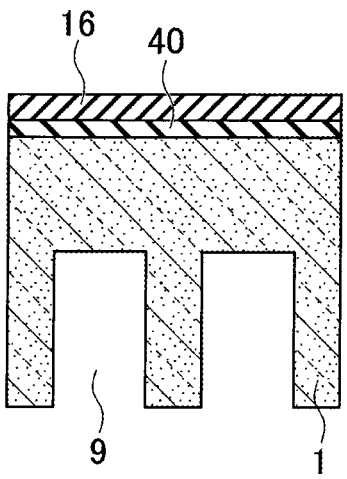

FIG. 164C is a sectional view along a section B-B in FIG. 164A.

Figure 165A:
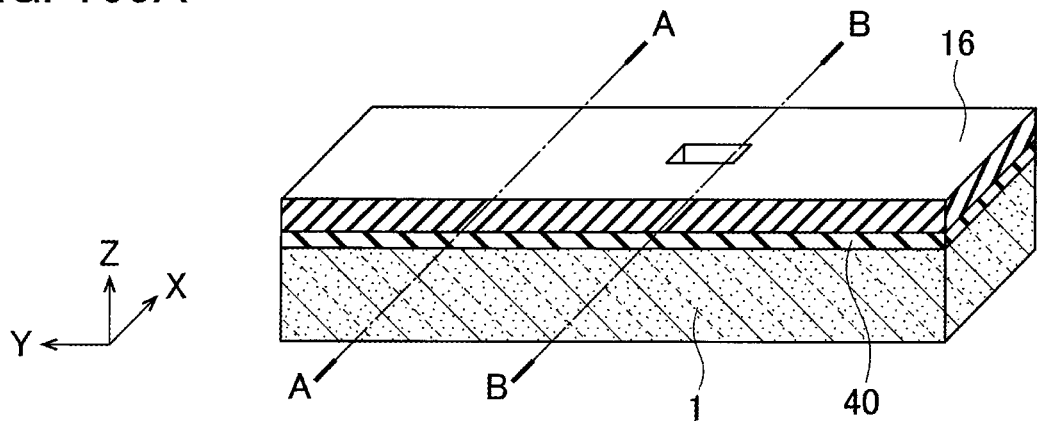

FIG. 165A is a perspective view illustrating the method for manufacturing the semiconductor device according to the fourth embodiment.

Figure 165B:
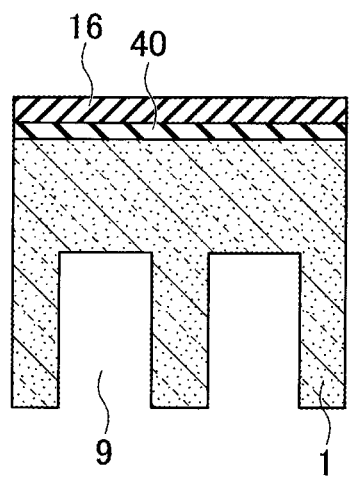

FIG. 165B is a sectional view along a section A-A in FIG. 165A.

Figure 165C:
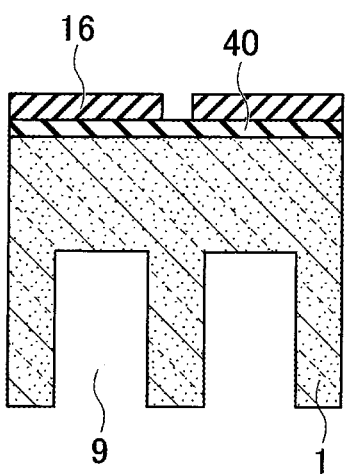

FIG. 165C is a sectional view along a section B-B in FIG. 165A.

Figure 166A:
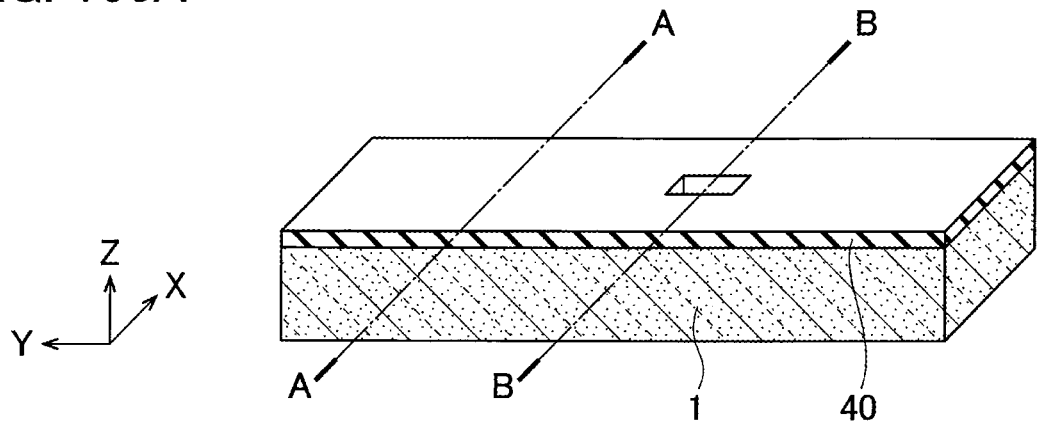

FIG. 166A is a perspective view illustrating the method for manufacturing the semiconductor device according to the fourth embodiment.

Figure 166B:
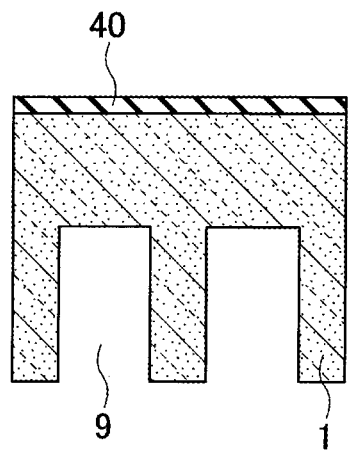

FIG. 166B is a sectional view along a section A-A in FIG. 166A.

Figure 166C:
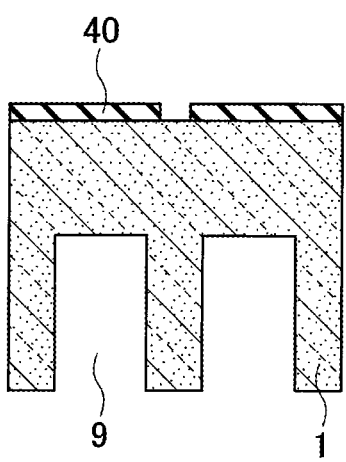

FIG. 166C is a sectional view along a section B-B in FIG. 166A.

Figure 167A:
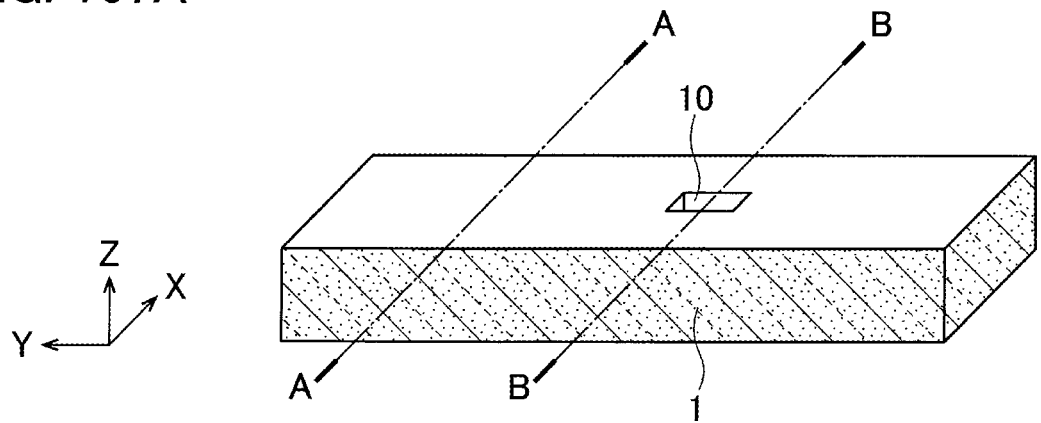

FIG. 167A is a perspective view illustrating the method for manufacturing the semiconductor device according to the fourth embodiment.

Figure 167B:
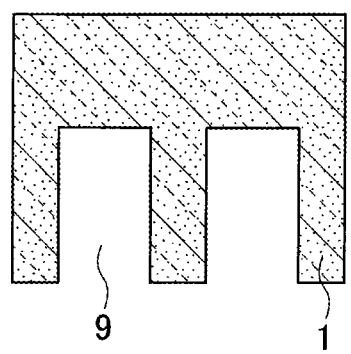

FIG. 167B is a sectional view along a section A-A in FIG. 167A.

Figure 167C:
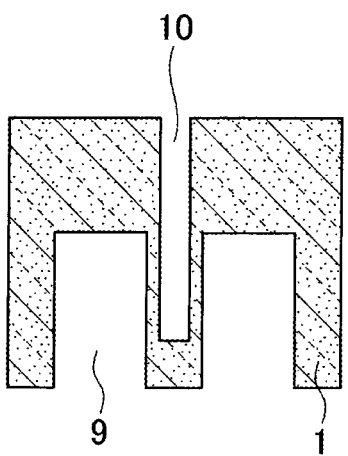

FIG. 167C is a sectional view along a section B-B in FIG. 167A.

Figure 168A:
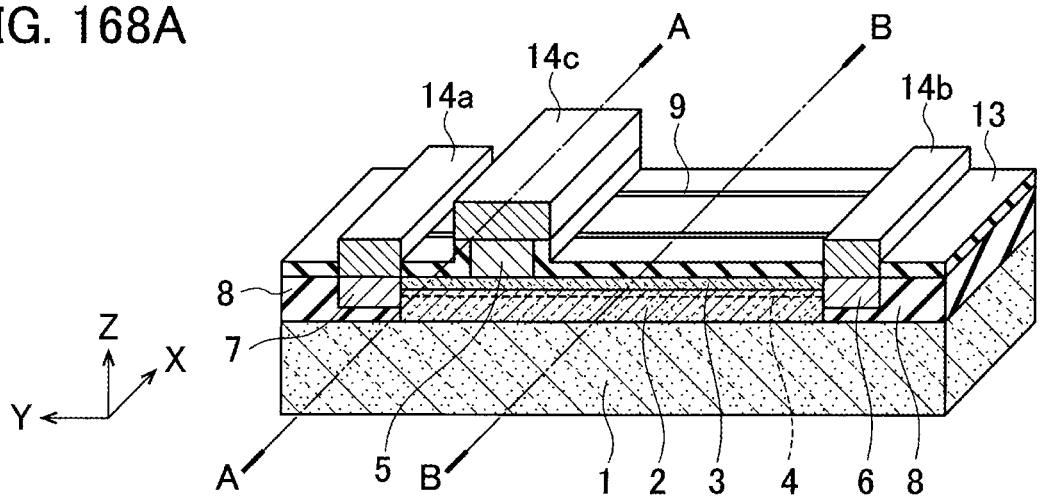

FIG. 168A is a perspective view illustrating the method for manufacturing the semiconductor device according to the fourth embodiment.

Figure 168B:
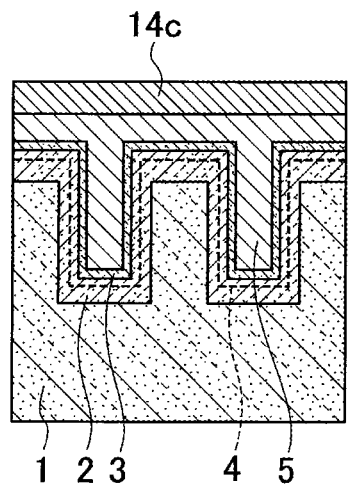

FIG. 168B is a sectional view along a section A-A in FIG. 168A.

Figure 168C:
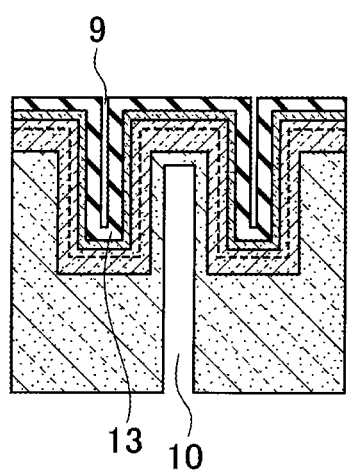

FIG. 168C is a sectional view along a section B-B in FIG. 168A.

DESCRIPTION OF EMBODIMENTS

Embodiments will be described below with reference to the drawings. Note that the embodiments include a first to a fourth embodiments. Moreover, the second embodiment includes a first to a twelfth modifications as its modifications.

In the description of the embodiments, the same reference number is given to the same portions in the description of the drawings, and the duplicate description is omitted. However, the drawings are schematic and may include portions different from the actual ones, such as a relationship between a thickness and a planar dimension, and a ratio of thickness of each layer. Moreover, the drawings may include portions having different dimensional relationships and ratios among the drawings. Further, the following embodiments exemplify apparatuses and methods for embodying the technical idea of the present invention, and the technical idea of the present invention does not limit the material, shape, structure, arrangement, and the like of components to the following.

First Embodiment

[Configuration of Semiconductor Device]

Figure 1A:
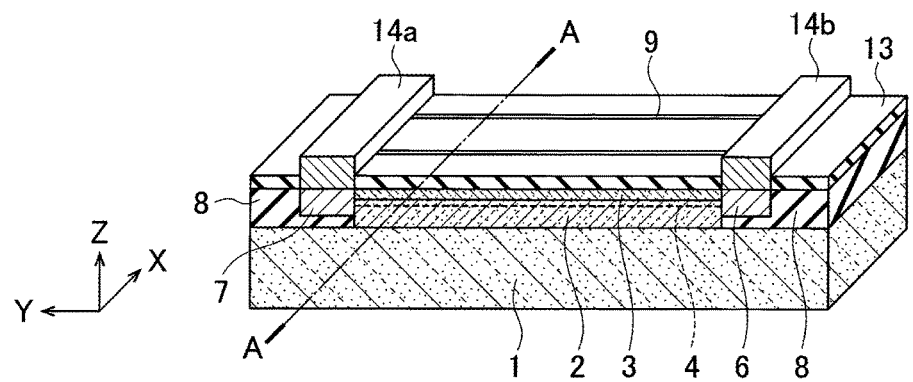
FIG. 1A is a perspective view illustrating a configuration of a semiconductor device according to a first embodiment.
Figure 1B:
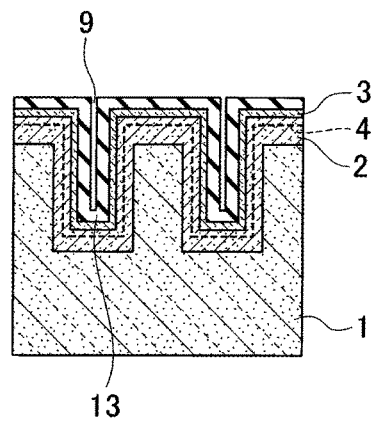
FIG. 1B is a sectional view along a section A-A in FIG. 1A.

With reference to FIGS. 1A to 1B, the configuration of a semiconductor device according to a first embodiment is described. As the semiconductor device, the first embodiment describes a high electron mobility diode using as a carrier a two-dimensional electron gas formed by using a semiconductor heterojunction and a modulation-doping technique.

The semiconductor device according to the first embodiment includes a substrate 1, a semiconductor region 2, an electron supply region 3, a two-dimensional electron gas layer 4, an anode electrode 6 as a second electrode, a cathode electrode 7 as a first electrode, an element isolation region 8, main grooves 9, an insulating film 13, and lines 14a, 14b (sometimes referred to collectively as line 14).

The substrate 1 is a flat plate made of an insulator. As the insulator serving as the material of the substrate 1, for example, silicon may be used. The substrate 1 has a thickness of, for example, several hundreds of micrometers. The substrate 1 has multiple main grooves 9 formed in its main surface to extend along one direction (Y-axis direction). The main grooves 9 are orthogonal to the main surface of the substrate 1, and each has two side surfaces parallel each other and a bottom surface parallel to the main surface of the substrate 1. In the following description, a face including the side surfaces and the bottom surface of the main groove 9 is called a surface of the main groove 9. Although FIGS. 1A to 1B show two main grooves 9, the number of main grooves 9 may be singular or three or more, and it or they can be arranged in a X-axis direction. Moreover, the aspect ratio of the depth to the width of the main groove 9 is greater than or equal to 1.

The semiconductor region 2 is formed in contact with the main surface of the substrate 1 and the surface of each main groove 9. In the example shown in FIGS. 1A to 1B, the semiconductor region 2 is formed on the exposed main surface of the substrate 1 in a region from one end to the other end of each main groove 9 in extending directions of the main grooves 9. The semiconductor region 2 includes a buffer layer in contact with the surface of the main groove 9, and an electron transit layer formed on a surface of the buffer layer on a side opposite to the main groove 9. The buffer layer is made of, for example, aluminum gallium nitride (AlGaN) represented by a general formula of Al$_x$Ga$_y$N ($0 \le x \le 1, 0 \le y \le 1, 0 \le 1-x-y \le 1$) and has a thickness of several hundreds of nanometers. The electron transit layer is made of, for example, undoped gallium nitride (GaN) and has a thickness of several micrometers.

The electron supply region 3 is formed in contact with a surface of the semiconductor region 2 on a side opposite to the surface of the main groove 9. The electron supply region 3 is made of, for example, aluminum gallium nitride and has a thickness of several nanometers to several tens of nanometers. The electron supply region 3 formed on the surface of the semiconductor region 2 generates the two-dimensional electron gas layer 4 in the semiconductor region 2 by a work function difference between gallium nitride and aluminum gallium nitride. The two-dimensional electron gas layer 4 is a layer in which a two-dimensional electron gas serving as a channel is formed and is an electron transit layer. The two-dimensional electron gas layer 4 is formed in the semiconductor region 2 near the interface with the electron supply region 3. The electron supply region 3 has a band gap larger than that of the electron transit layer of the semiconductor region 2 and a lattice constant different from that of the electron transit layer of the semiconductor region 2.

The anode electrode 6 is formed in contact at least with the two-dimensional electron gas layer 4 and apart from the cathode electrode 7. An energy barrier is between the anode electrode 6 and the two-dimensional electron gas layer 4. The junction between the anode electrode 6 and the two-dimensional electron gas layer 4 forms a pn junction or a Schottky junction showing rectifying action. In the example shown in FIGS. 1A to 1B, the anode electrode 6 comes in contact with the electron supply region 3 and the two-dimensional electron gas layer 4 from the main surface side of the substrate 1 and is formed in a depth where the anode electrode 6 is separated from the substrate 1. More specifically, the anode electrode 6 is in direct contact with not only the two-dimensional electron gas layer 4 but also the electron supply region 3 on one end of the main groove 9. An energy barrier is also between the anode electrode 6 and the electron supply region 3. The junction between the anode electrode 6 and the electron supply region 3 forms a pn junction or a Schottky junction showing rectifying action. The anode electrode 6 extends across the multiple main grooves 9 along the main surface of the substrate 1 in a direction (X-axis direction) orthogonal to the extending direction of the main grooves 9. The anode electrode 6 is formed apart from the cathode electrode 7 in the extending direction (Y direction) of the main grooves 9.

In the first embodiment, metal is used as the anode electrode 6, and thus a Schottky junction is formed between the anode electrode 6, and the two-dimensional electron gas layer 4 and the electron supply region 3.

The cathode electrode 7 is formed in contact at least with the two-dimensional electron gas layer 4 and apart from the anode electrode 6. The cathode electrode 7 is in ohmic contact with the two-dimensional electron gas layer 4. In the example shown in FIGS. 1A to 1B, the cathode electrode 7 comes in contact with the electron supply region 3 and the two-dimensional electron gas layer 4 from the main surface side of the substrate 1 and is formed in a depth where the cathode electrode 7 is separated from the substrate 1. More specifically, the cathode electrode 7 is in electrical contact with low resistance with not only the two-dimensional electron gas layer 4 but also the electron supply region 3 on the other end of the main groove 9. The cathode electrode 7 extends across the multiple main grooves 9 along the surface of the substrate 1 in the direction (X-axis direction) orthogonal to the extending direction of the main grooves 9.

The element isolation region 8 is a region for electrically insulating the semiconductor device from other circuits and the like on the main surface side of the substrate 1. The element isolation region 8 is formed between the cathode electrode 7 and the substrate 1 and between the anode electrode 6 and the substrate 1.

The insulating film 13 is a film for electrically insulating the semiconductor device from other circuits and the like and mechanically protecting the semiconductor device. The insulating film 13 is made of an insulator including a ceramic material, such as a silicon nitride film ($Si_3N_4$) and a silicon oxide film ($SiO_2$). The insulating film 13 is formed on the entire surface on the main surface side of the substrate 1 except above the cathode electrode 7 and the anode electrode 6.

The line electrode 14 includes the first line 14a connected to the cathode electrode 7, and the second line 14b connected to the anode electrode 6. The first line 14*a* and the second line 14*b* are independent of each other and electrically insulated.

[Operation of Semiconductor Device]

Next, the basic operation of the semiconductor device shown in FIGS. 1A to 1B is described. The junction between the semiconductor region 2 and the electron supply region 3 is a heterojunction and has an energy band structure with a potential well. Electrons (two-dimensional electron gas) confined in the potential well are lack of freedom of movement in a direction orthogonal to the heterojunction surface and thus forms the two-dimensional electron gas layer 4. A current due to the two-dimensional electron gas flows between the anode and the cathode.

On the other hand, a Schottky barrier is formed at the interface between the anode electrode 6 and the two-dimensional electron gas layer 4, and the junction between the cathode electrode 7 and the two-dimensional electron gas layer 4 is an ohmic junction. As a result, the Schottky barrier diode works between the anode electrode 6 and the cathode electrode 7. Specifically, when a positive voltage is applied to the anode electrode 6 and a negative voltage is applied to the cathode electrode 7, that is, a forward bias is applied, a large current flows from the anode to the cathode. On the other hand, a negative voltage is applied to the anode electrode 6 and a positive voltage is applied to the cathode electrode 7, that is, a reverse bias is applied. Even if the voltage is increased, almost no current flows from the cathode to the anode until a predetermined withstand voltage (breakdown voltage). The two-dimensional electron gas has high density and high electron mobility in the direction parallel to the junction surface to show good characteristics as a high electron mobility diode.

[Method for Manufacturing Semiconductor Device]

With reference to FIGS. 2A to 28, an example of a method for manufacturing the semiconductor device shown in FIGS. 1A to 1B is described.

[First Step]

Figure 2A:
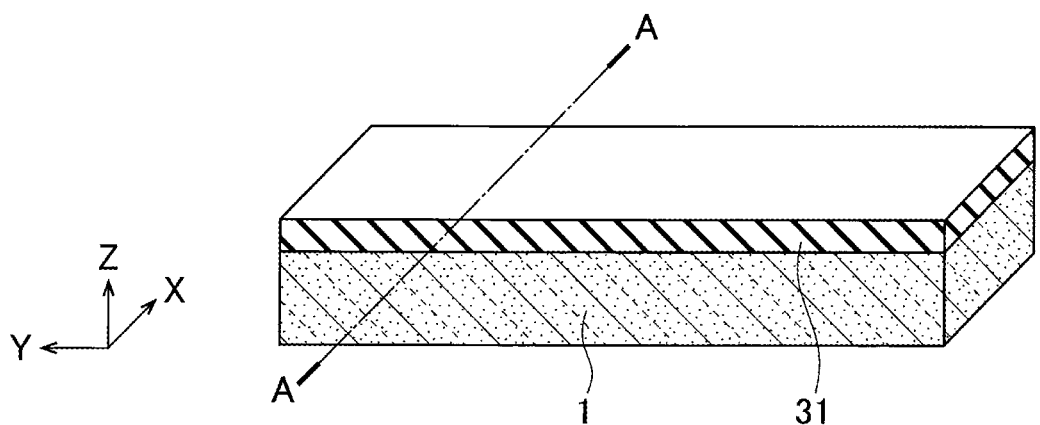
FIG. 2A is a perspective view illustrating a method for manufacturing the semiconductor device according to the first embodiment.
Figure 2B:
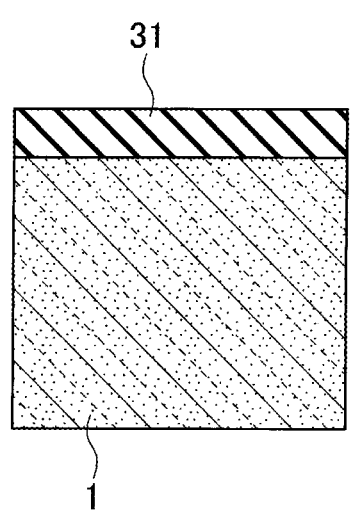
FIG. 2B is a sectional view along a section A-A in FIG. 2A.

First, as shown in FIGS. 2A and 2B, an insulating film 31 is formed on the main surface of the substrate 1 as a mask material for forming the main grooves 9. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main grooves 9 are a silicon crystal face. Note that the silicon crystal face is (111) face.

Figure 3A:
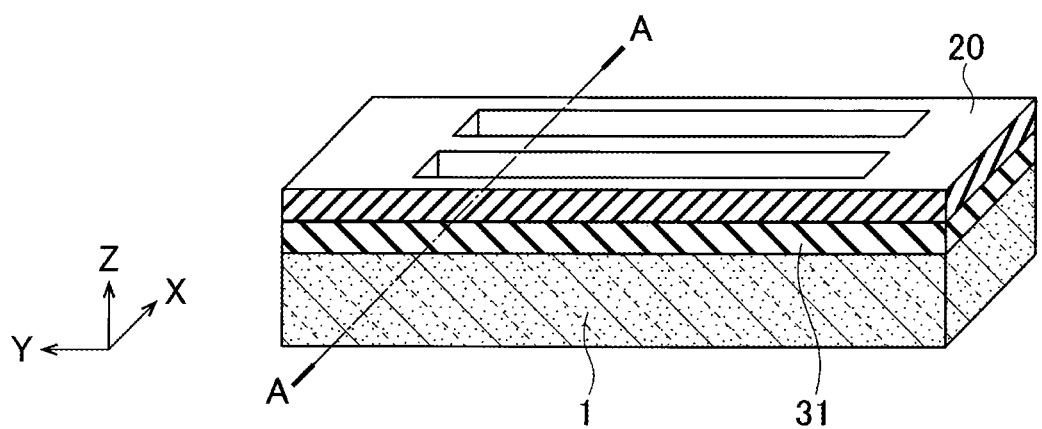
FIG. 3A is a perspective view illustrating the method for manufacturing the semiconductor device according to the first embodiment.
Figure 3B:
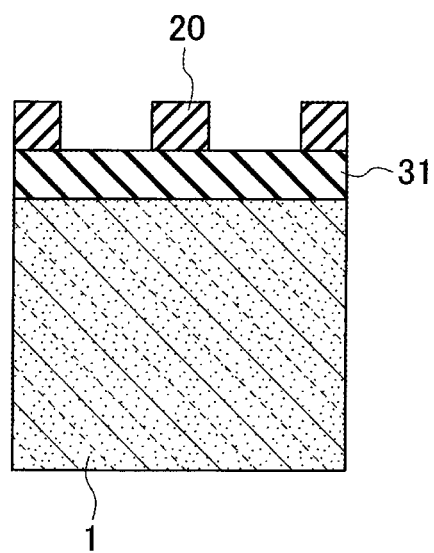
FIG. 3B is a sectional view along a section A-A in FIG. 3A.

Next, as shown in FIGS. 3A and 3B, a resist material 20 is applied to the upper surface of the insulating film 31 by a photolithography method, and regions where the main grooves 9 are to be formed are selectively removed. That is, the resist material 20 is patterned into a shape with openings in the regions where the main grooves 9 are to be formed.

Figure 4A:
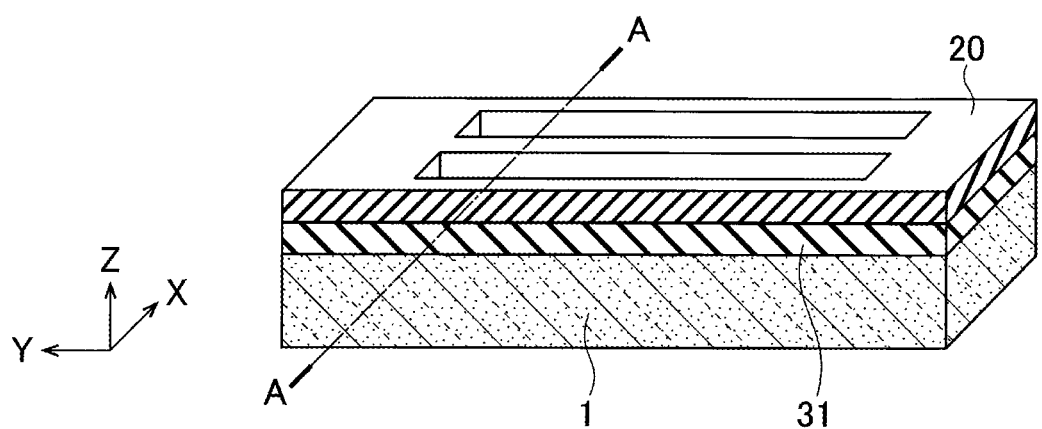
FIG. 4A is a perspective view illustrating the method for manufacturing the semiconductor device according to the first embodiment.
Figure 4B:
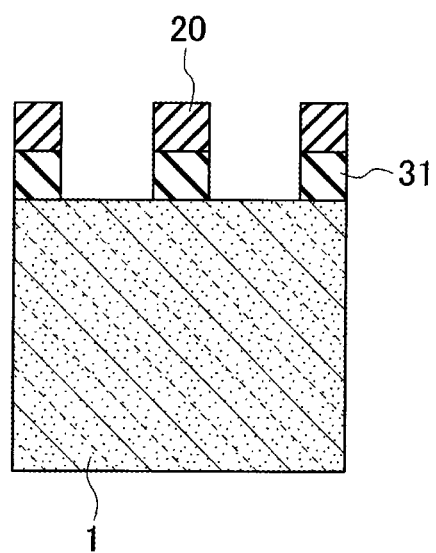
FIG. 4B is a sectional view along a section A-A in FIG. 4A.

Next, as shown in FIGS. 4A and 4B, the insulating film 31 is patterned using the remaining resist material 20 as a mask. The patterning can be performed by wet etching using hydrofluoric acid, or dry etching, such as reactive ion etching.

Figure 5A:
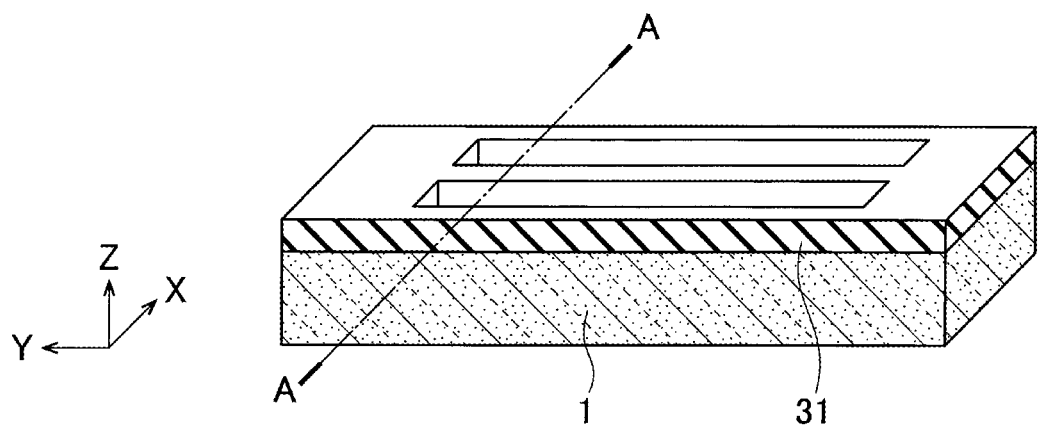
FIG. 5A is a perspective view illustrating the method for manufacturing the semiconductor device according to the first embodiment.
Figure 5B:
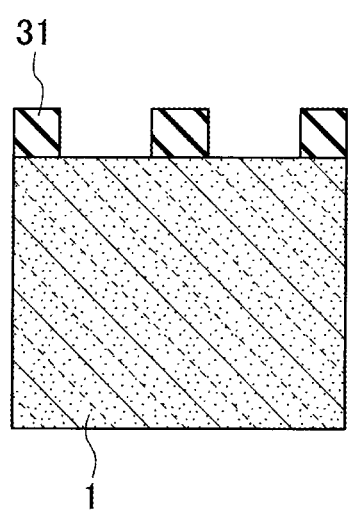
FIG. 5B is a sectional view along a section A-A in FIG. 5A.

After the patterning of the insulating film 31 is completed, as shown in FIGS. 5A and 5B, the resist material 20 is removed by oxygen plasma, sulfuric acid, or the like.

Figure 6A:
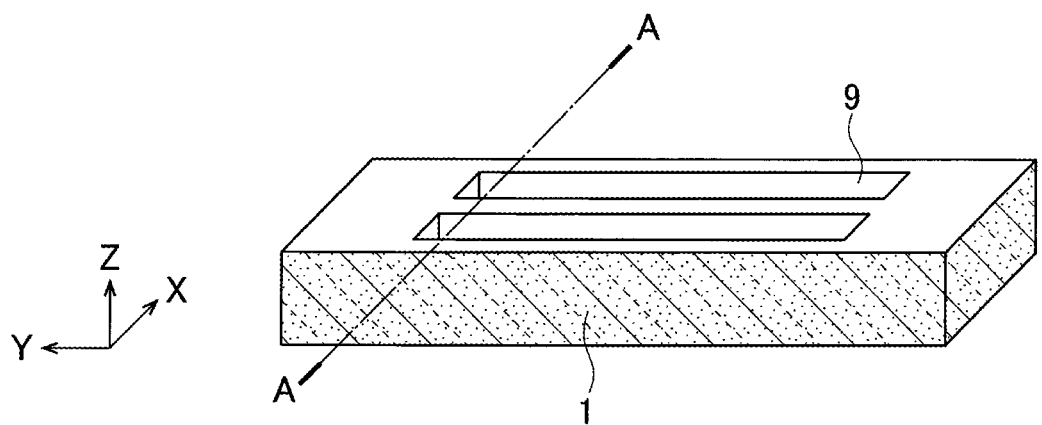
FIG. 6A is a perspective view illustrating the method for manufacturing the semiconductor device according to the first embodiment.
Figure 6B:
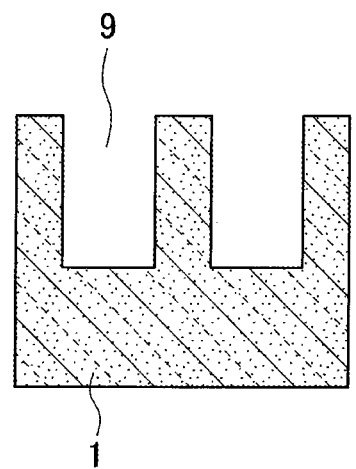
FIG. 6B is a sectional view along a section A-A in FIG. 6A.

Next, as shown in FIGS. 6A and 6B, using the patterned insulating film 31 as a mask, the main grooves 9 are formed in the main surface of the substrate 1 by dry etching. More specifically, the main grooves 9 each extending in a direction (Y-axis direction) along the main surface of the substrate 1 are formed. The main groove 9 is formed to have the aspect ratio of the depth to the width of the main groove 9 greater than or equal to 1. For example, the main groove 9 has a width of about 20 μm and a depth of about 500 μm.

[Second Step]

Figure 7A:
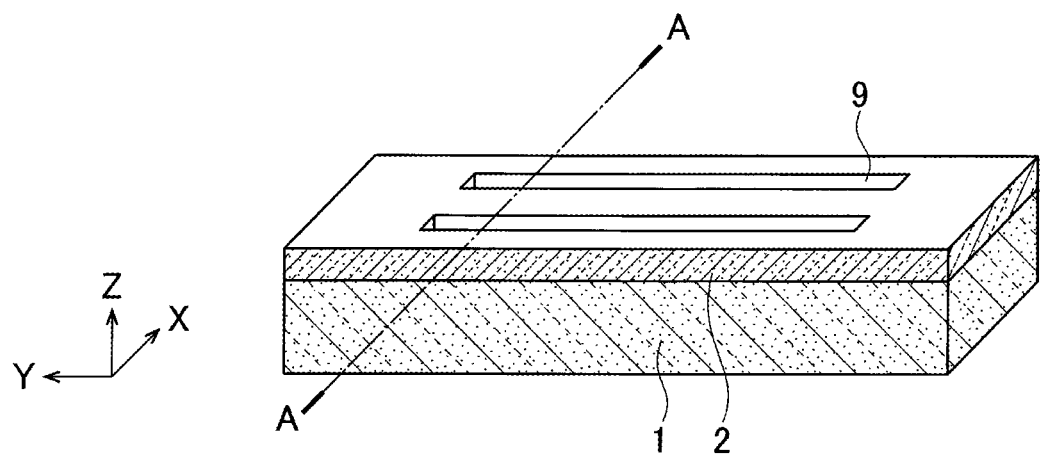
FIG. 7A is a perspective view illustrating the method for manufacturing the semiconductor device according to the first embodiment.
Figure 7B:
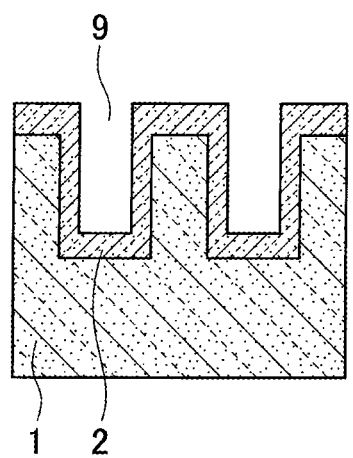
FIG. 7B is a sectional view along a section A-A in FIG. 7A.

Next, as shown in FIGS. 7A and 7B, a buffer layer is grown by a thermal CVD method on the substrate 1 on which the grooves 9 are formed. Specifically, the substrate 1 is introduced into a MOCVD apparatus and heated to a predetermined temperature (for example, 600° C.). When the temperature is stabilized, the substrate 1 is rotated, and trimethylaluminum (TMA) as a raw material is introduced at a predetermined flow rate onto the surface of the substrate 1 to grow a buffer layer. The film thickness of the buffer layer is several hundreds of nanometers. Then, gallium nitride (GaN) that is not doped with impurities is deposited on the buffer layer, thereby forming the semiconductor region 2 including the buffer layer and the non-doped gallium nitride layer. The film thickness of the non-doped gallium nitride layer is determined by a required withstand voltage value and is described as, for example, 5 μm in the present embodiment.

[Third Step]

Figure 8A:
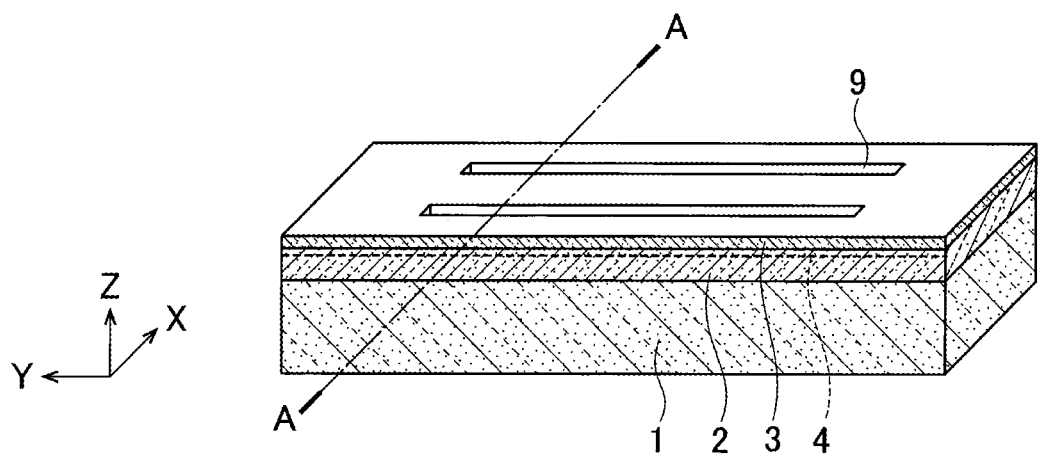
FIG. 8A is a perspective view illustrating the method for manufacturing the semiconductor device according to the first embodiment.
Figure 8B:
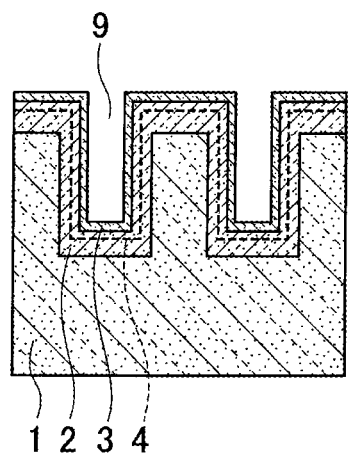
FIG. 8B is a sectional view along a section A-A in FIG. 8A.

Next, as shown in FIGS. 8A and 8B, the electron supply region 3 made of aluminum gallium nitride (AlGaN) is formed by a method similar to the method described in the second step. The film thickness of the electron supply region 3 is preferably several to several tens of nanometers.

[Fourth Step]

Figure 9A:
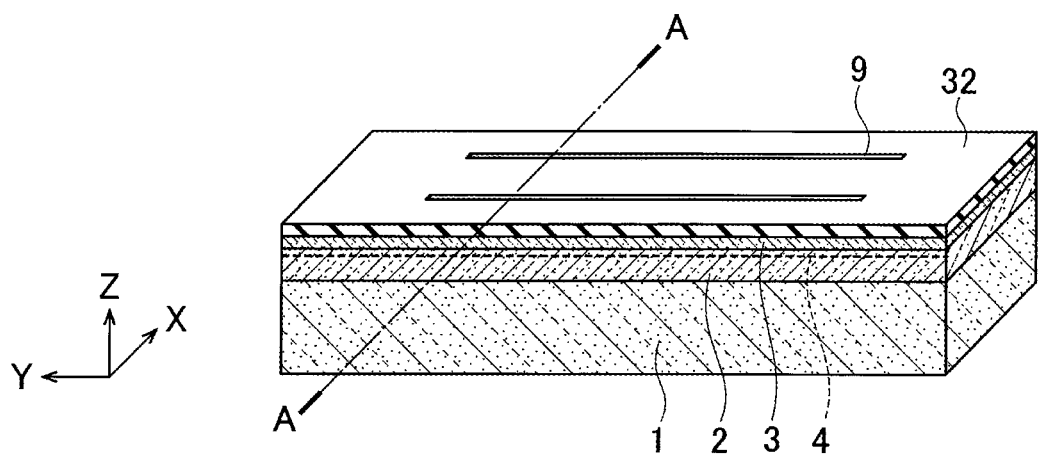
FIG. 9A is a perspective view illustrating the method for manufacturing the semiconductor device according to the first embodiment.
Figure 9B:
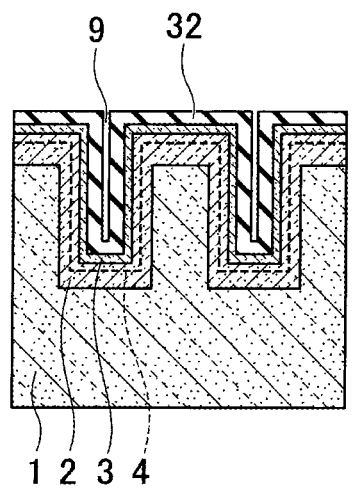
FIG. 9B is a sectional view along a section A-A in FIG. 9A.

Next, as shown in FIGS. 9A and 9B, an insulating film 32 as a mask material is formed on the electron supply region 3. A silicon oxide film may be used as the insulating film 32, and the thermal CVD method or the plasma CVD method may be used as the deposition method.

Figure 10A:
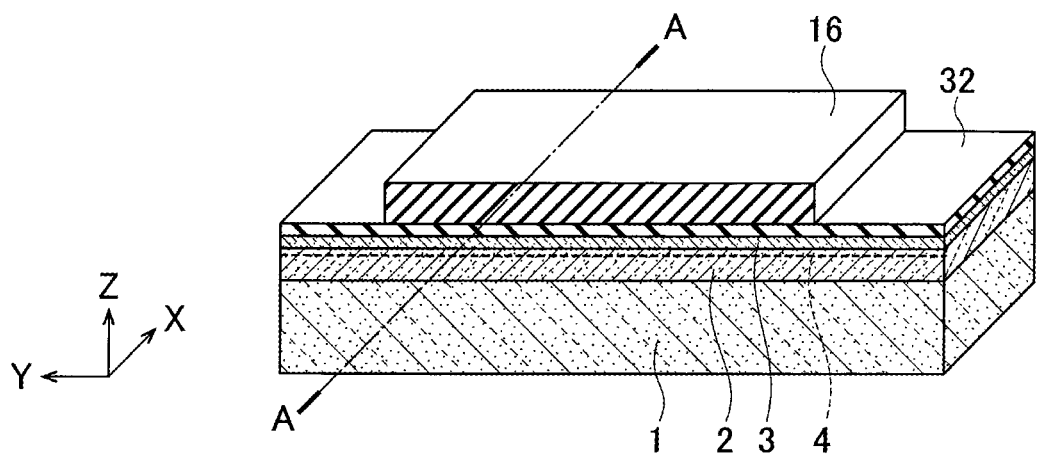
FIG. 10A is a perspective view illustrating the method for manufacturing the semiconductor device according to the first embodiment.
Figure 10B:
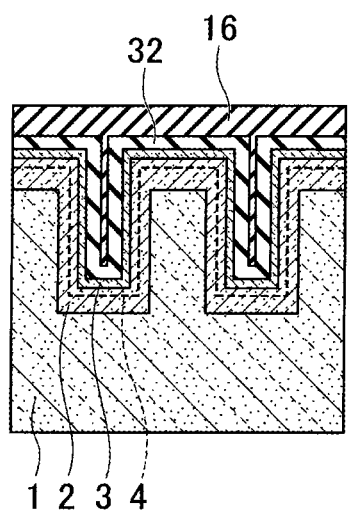
FIG. 10B is a sectional view along a section A-A in FIG. 10A.

Next, as shown in FIGS. 10A and 10B, a resist material 16 is formed on the insulating film 32, and an element isolation area is patterned.

Figure 11:
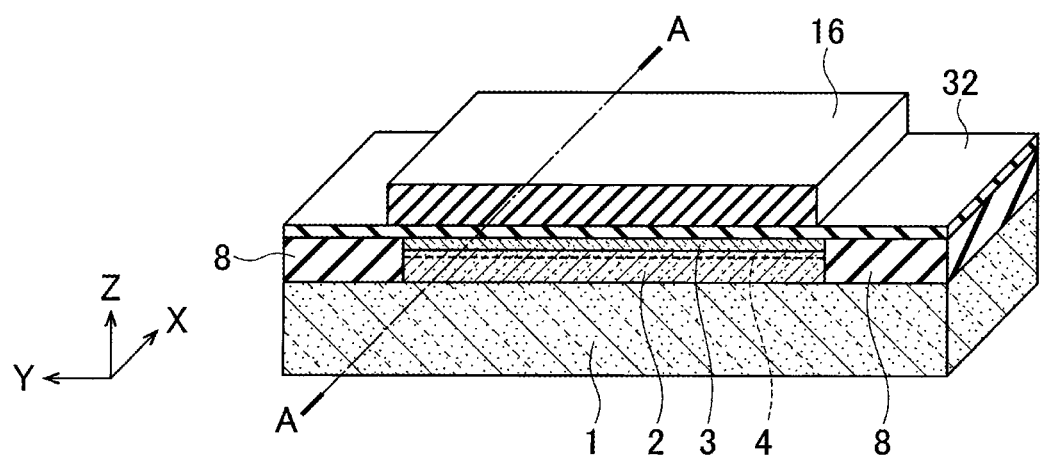
FIG. 11 is a perspective view illustrating the method for manufacturing the semiconductor device according to the first embodiment.

Next, as shown in FIG. 11, an element isolation region 8 is provided by implanting argon ions by an ion implantation method, and element isolation is performed. Note that although the ion implantation method is used in the present embodiment, the substrate 1 having a mesa structure formed by the dry etching method using a patterned mask material may be used.

Figure 12A:
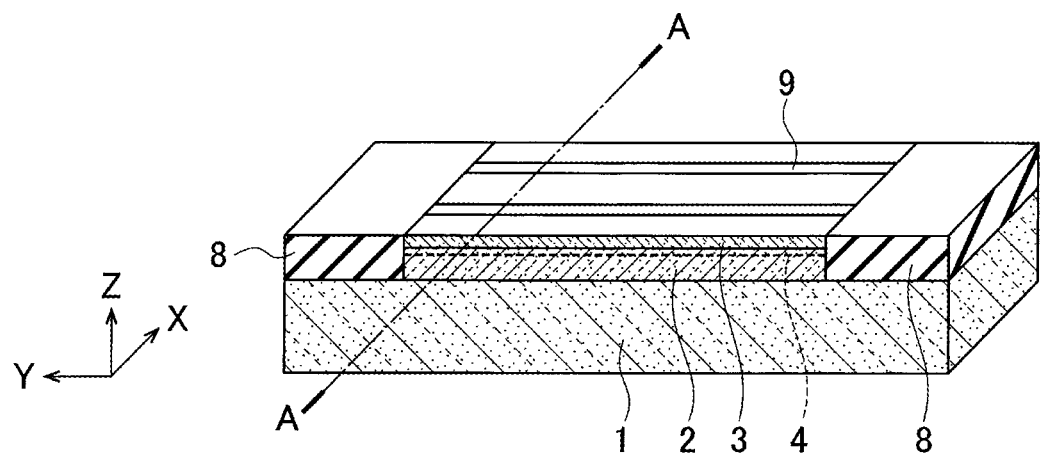
FIG. 12A is a perspective view illustrating the method for manufacturing the semiconductor device according to the first embodiment.
Figure 12B:
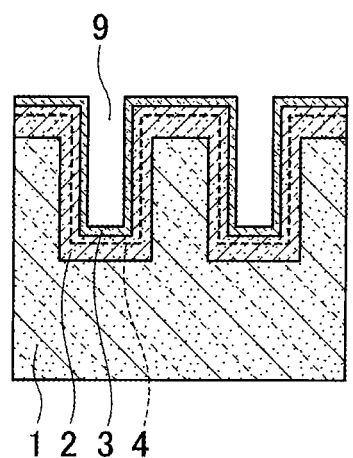
FIG. 12B is a sectional view along a section A-A in FIG. 12A.

Next, as shown in FIGS. 12A and 12B, the resist material 16 is removed with oxygen plasma, sulfuric acid, or the like. Moreover, the insulating film 32 is removed by wet etching using hydrofluoric acid, or dry etching, such as reactive ion etching.

[Fifth Step]

Figure 13A:
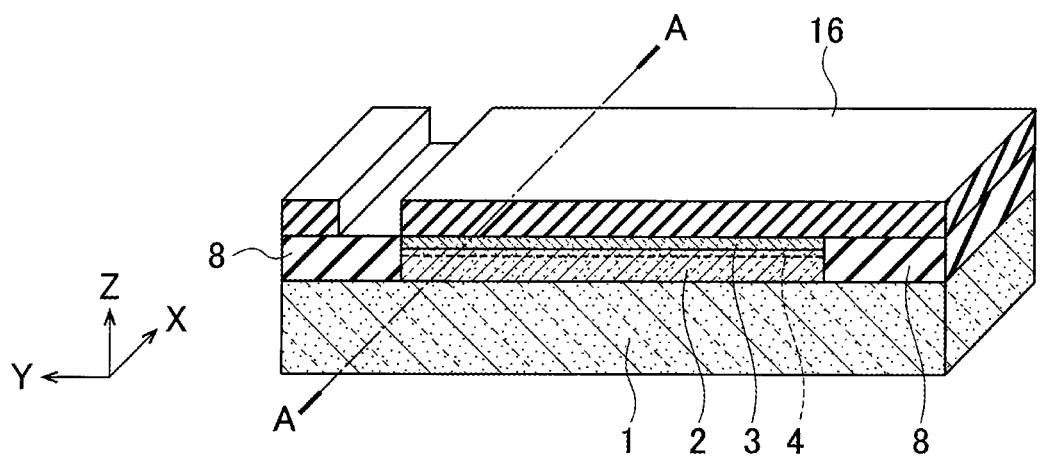
FIG. 13A is a perspective view illustrating the method for manufacturing the semiconductor device according to the first embodiment.
Figure 13B:
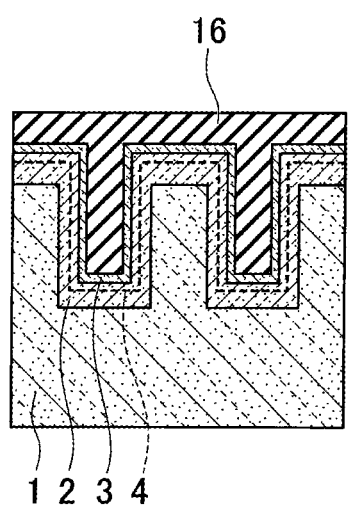
FIG. 13B is a sectional view along a section A-A in FIG. 13A.

Next, as shown in FIGS. 13A and 13B, the resist material 16 is formed on the electron supply region 3, and the cathode electrode 7 is patterned.

Figure 14A:
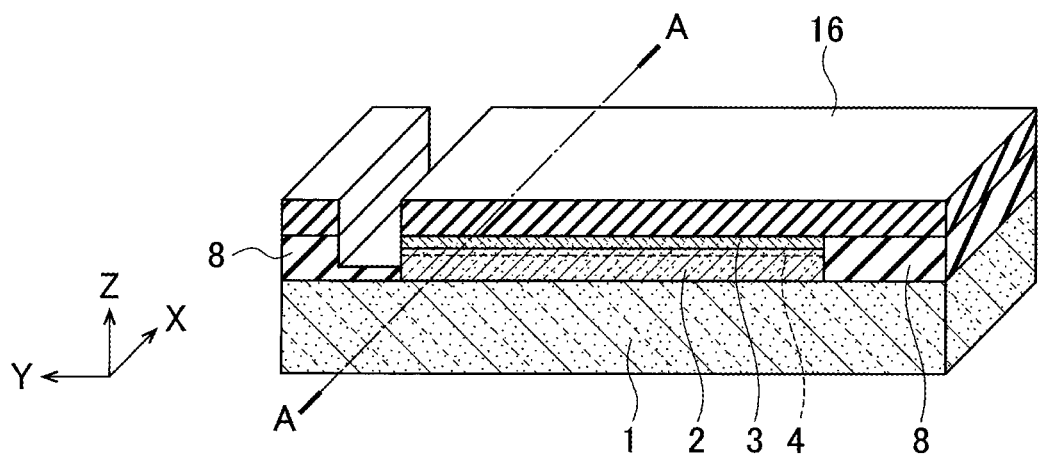
FIG. 14A is a perspective view illustrating the method for manufacturing the semiconductor device according to the first embodiment.
Figure 14B:
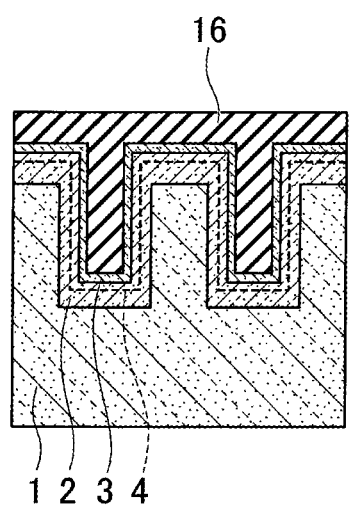
FIG. 14B is a sectional view along a section A-A in FIG. 14A.

Next, as shown in FIGS. 14A and 14B, an electrode embedding pattern is formed by dry etching from the electron supply region 3 to the semiconductor region 2. The embedding depth is preferably several tens of nanometers.

Figure 15A:
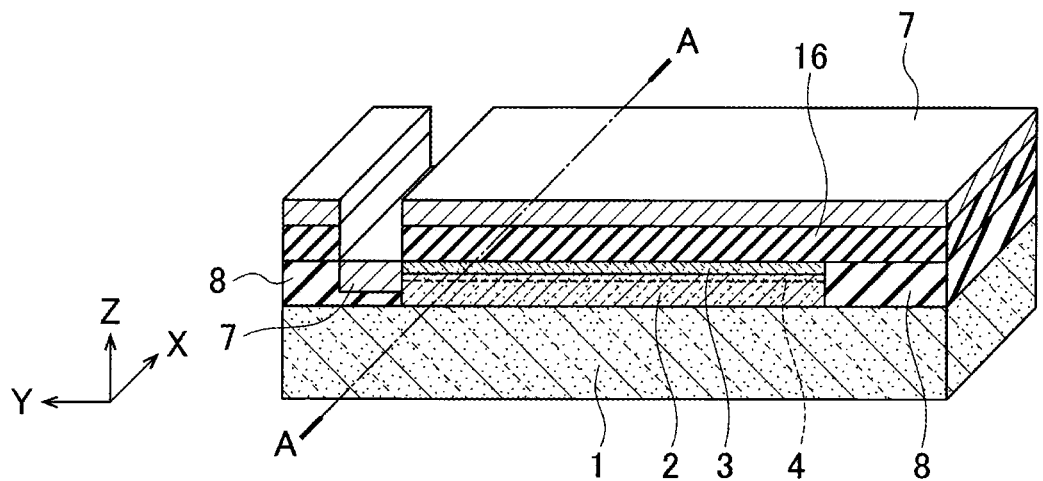
FIG. 15A is a perspective view illustrating the method for manufacturing the semiconductor device according to the first embodiment.
Figure 15B:
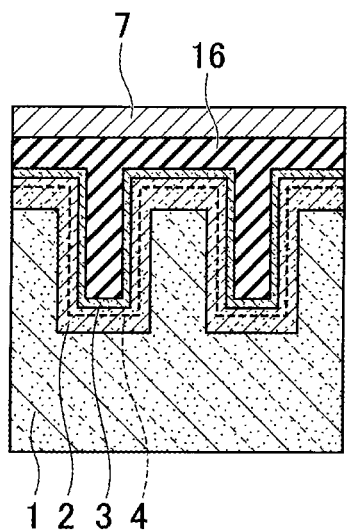
FIG. 15B is a sectional view along a section A-A in FIG. 15A.

Next, as shown in FIGS. 15A and 15B, a metal to be the cathode electrode 7 (ohmic electrode) is embedded using a vapor deposition method, a sputtering method, or the like.

Figure 16A:
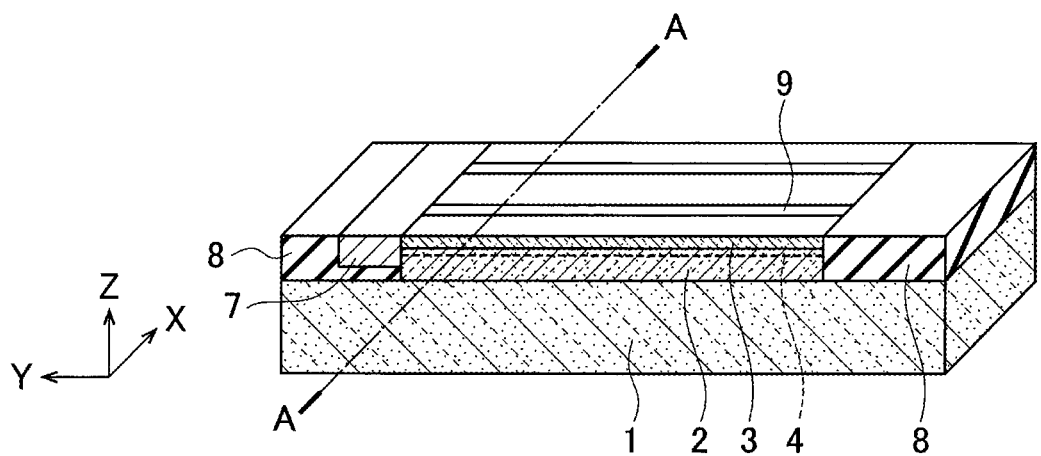
FIG. 16A is a perspective view illustrating the method for manufacturing the semiconductor device according to the first embodiment.
Figure 16B:
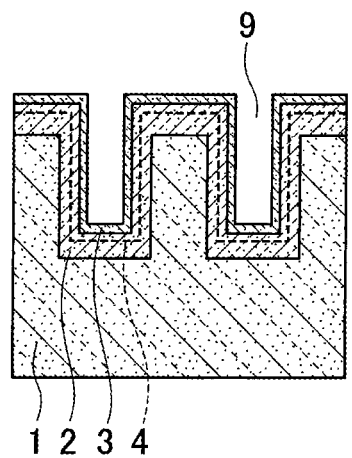
FIG. 16B is a sectional view along a section A-A in FIG. 16A.

Next, as shown in FIGS. 16A and 16B, the cathode electrode 7 (ohmic electrode) is formed by lifting off the metal formed on the resist material 16 in an acetone solution.

Figure 17A:
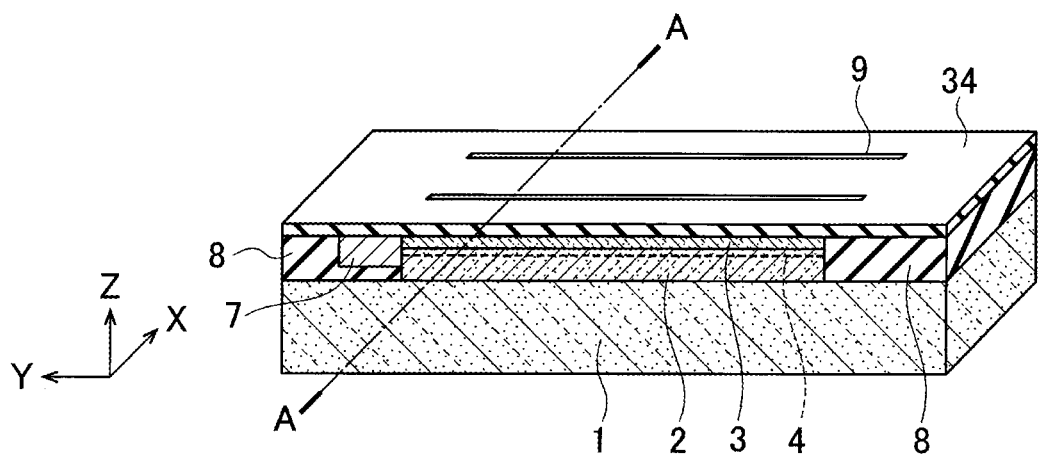
FIG. 17A is a perspective view illustrating the method for manufacturing the semiconductor device according to the first embodiment.
Figure 17B:
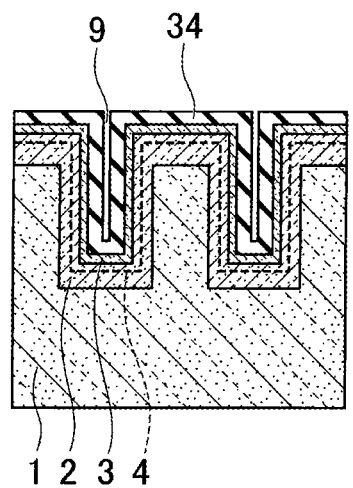
FIG. 17B is a sectional view along a section A-A in FIG. 17A.

Next, as shown in FIGS. 17A and 17B, an insulating film 34 is deposited on the electron supply region 3 to be used as a protective film, and the substrate 1 is moved to a rapid thermal processing apparatus (RTA) and heat-treated at a high temperature of 800 to 1000° C. for several tens of seconds. A silicon nitride film may be used as the insulating film 34, and an LPCVD method may be used as a deposition method.

Figure 18A:
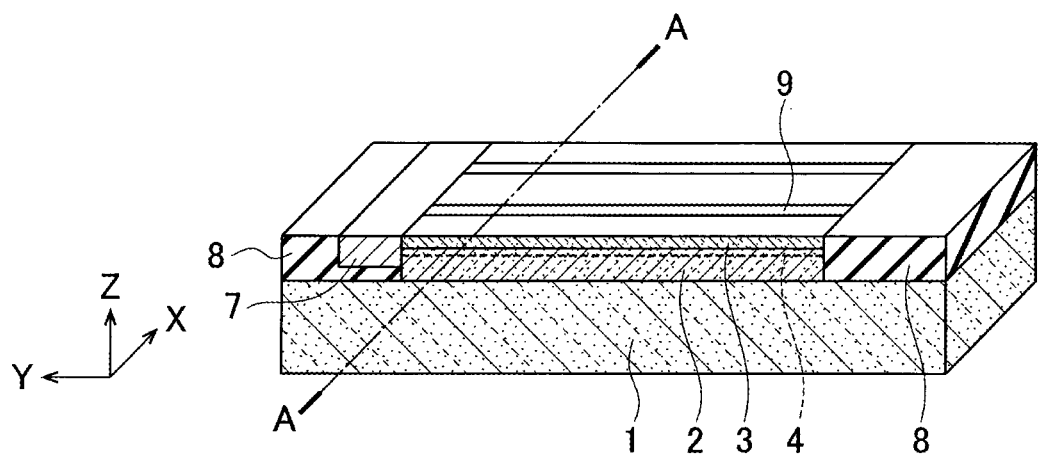
FIG. 18A is a perspective view illustrating the method for manufacturing the semiconductor device according to the first embodiment.
Figure 18B:
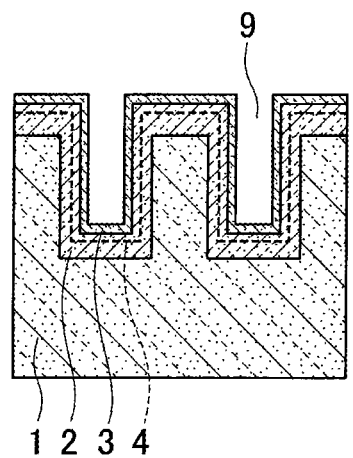
FIG. 18B is a sectional view along a section A-A in FIG. 18A.

Next, as shown in FIGS. 18A and 18B, the insulating film 34 is removed by the dry etching method or the wet etching method. Hot phosphoric acid may be used in the wet etching method.

[Sixth Step]

Figure 19A:
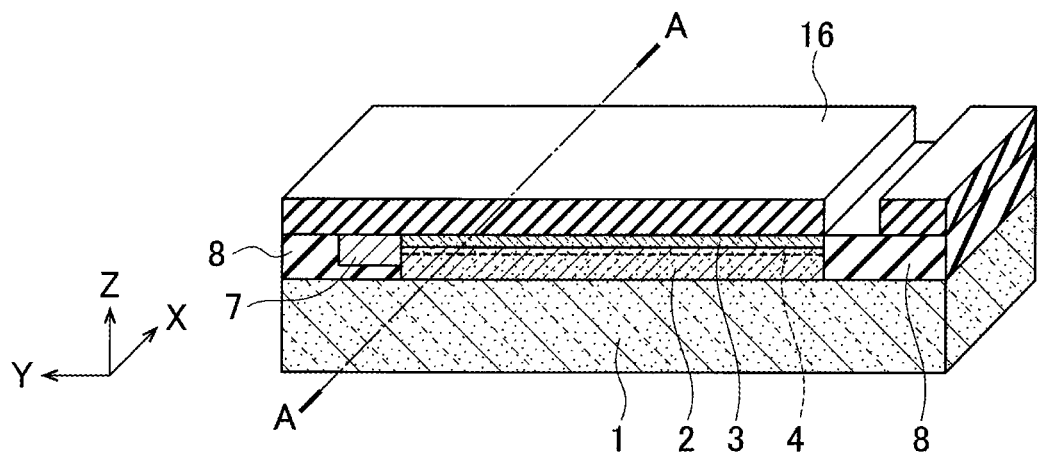
FIG. 19A is a perspective view illustrating the method for manufacturing the semiconductor device according to the first embodiment.
Figure 19B:
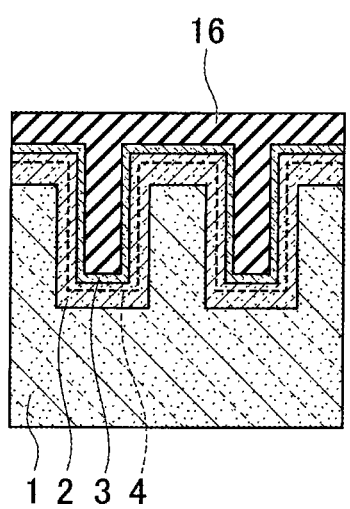
FIG. 19B is a sectional view along a section A-A in FIG. 19A.

Next, as shown in FIGS. 19A and 19B, the resist material 16 is formed on the electron supply region 3, and the anode electrode 6 is patterned.

Figure 20A:
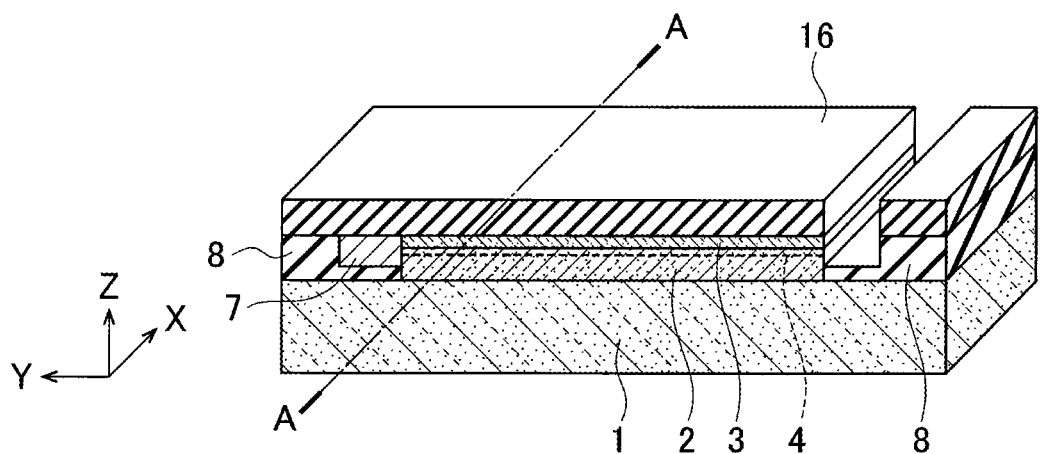
FIG. 20A is a perspective view illustrating the method for manufacturing the semiconductor device according to the first embodiment.
Figure 20B:
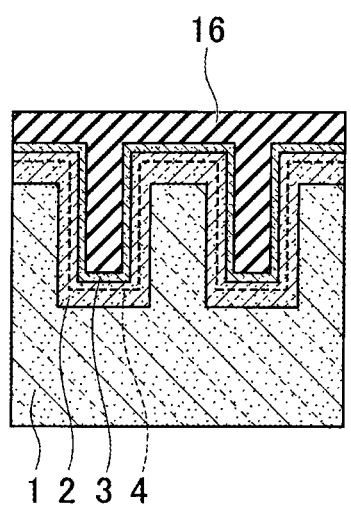
FIG. 20B is a sectional view along a section A-A in FIG. 20A.

Next, as shown in FIGS. 20A and 20B, an electrode embedding pattern is formed by dry etching from the electron supply region 3 to the semiconductor region 2. The embedding depth is preferably several tens of nanometers.

Figure 21A:
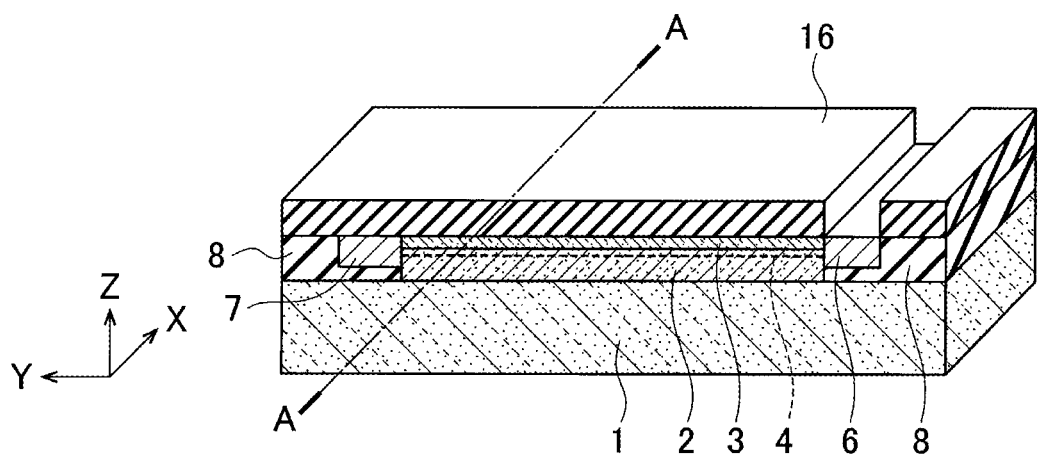
FIG. 21A is a perspective view illustrating the method for manufacturing the semiconductor device according to the first embodiment.
Figure 21B:
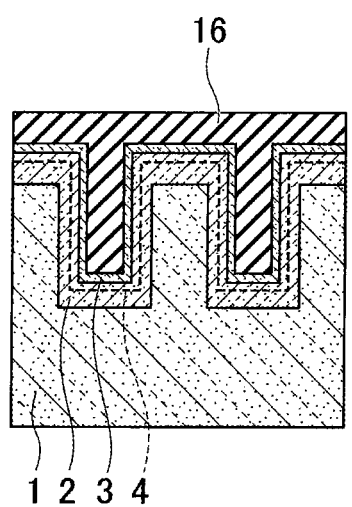
FIG. 21B is a sectional view along a section A-A in FIG. 21A.

Next, as shown in FIGS. 21A and 21B, a metal to be the anode electrode 6 (Schottky electrode) is embedded using the vapor deposition method, the sputtering method, or the like.

Figure 22A:
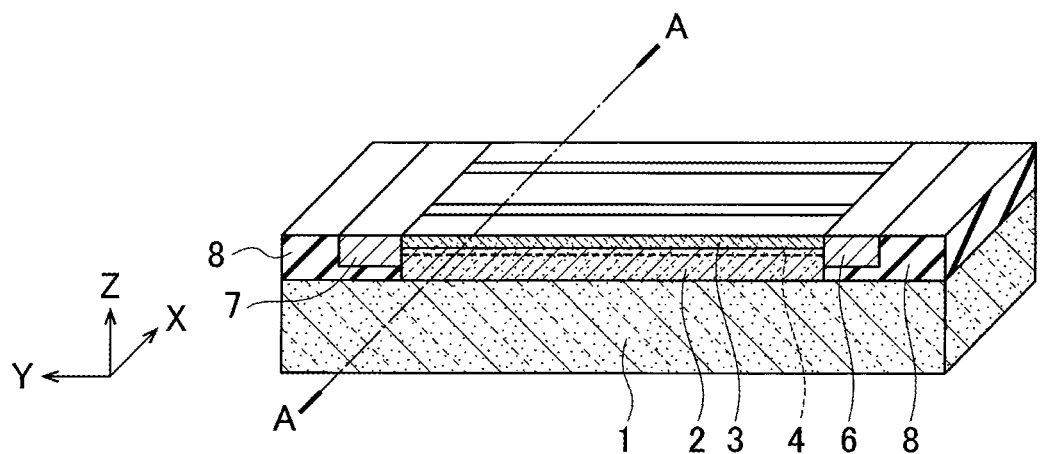
FIG. 22A is a perspective view illustrating the method for manufacturing the semiconductor device according to the first embodiment.
Figure 22B:
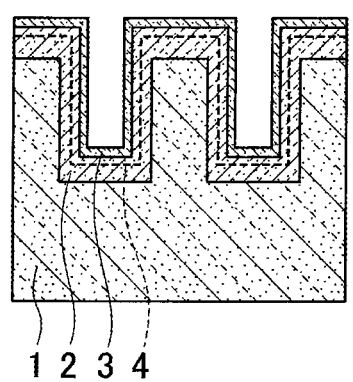
FIG. 22B is a sectional view along a section A-A in FIG. 22A.

Next, as shown in FIGS. 22A and 22B, the anode electrode 6 (Schottky electrode) is formed by lifting off the metal formed on the resist material 16 in an acetone solution.

[Seventh Step]

Figure 23A:
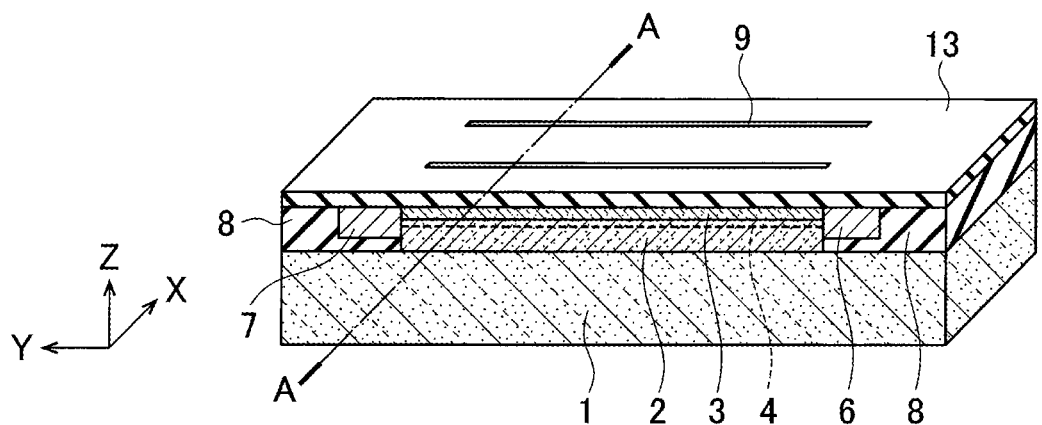
FIG. 23A is a perspective view illustrating the method for manufacturing the semiconductor device according to the first embodiment.
Figure 23B:
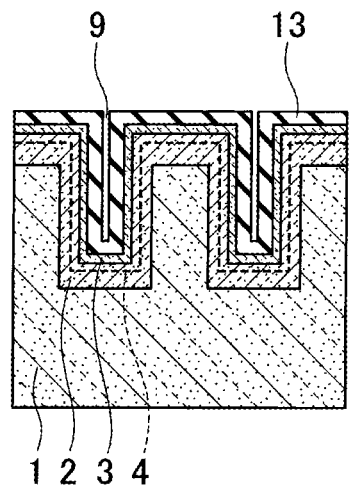
FIG. 23B is a sectional view along a section A-A in FIG. 23A.

Next, as shown in FIGS. 23A and 23B, an insulating film 13 is deposited on the electron supply region 3 to be used as a protective film, and the substrate 1 is moved to the rapid thermal processing apparatus (RTA) and heat-treated at a high temperature of 800 to 1000° C. for several tens of seconds. A silicon nitride film may be used as the insulating film 13, and the LPCVD method may be used as the deposition method.

Figure 24A:
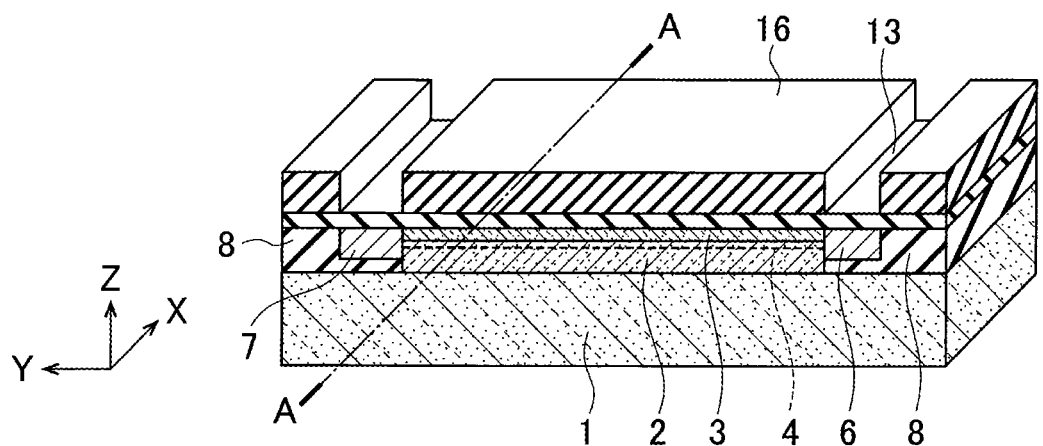
FIG. 24A is a perspective view illustrating the method for manufacturing the semiconductor device according to the first embodiment.
Figure 24B:
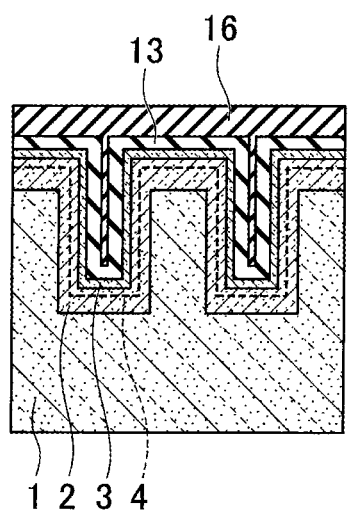
FIG. 24B is a sectional view along a section A-A in FIG. 24A.

Next, as shown in FIGS. 24A and 24B, the resist material 16 is formed on the insulating film 13, and a pattern for electrically connecting to each of the cathode electrode 7 and the anode electrode 6 is formed.

Figure 25:
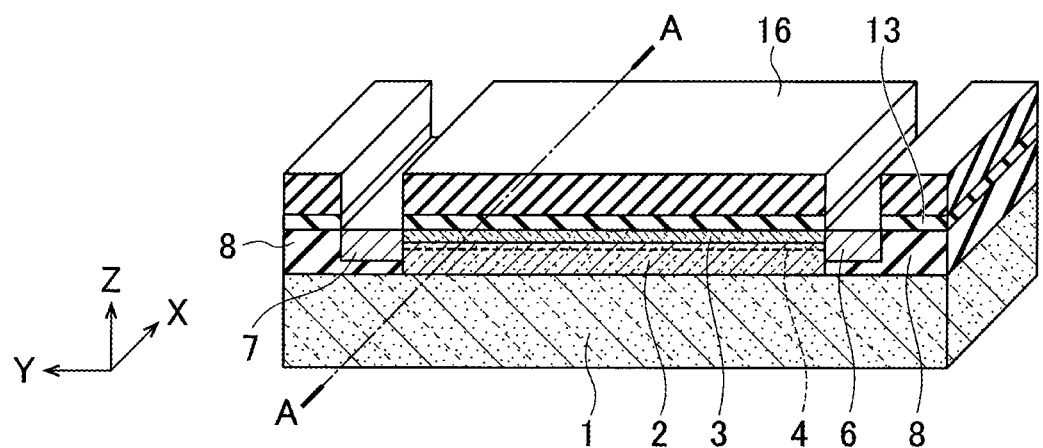
FIG. 25 is a perspective view illustrating the method for manufacturing the semiconductor device according to the first embodiment.

Next, as shown in FIG. 25, the insulating film 13 is removed by the dry etching method or the wet etching method using the resist material 16 as a mask. Hot phosphoric acid may be applied in the wet etching.

Figure 26A:
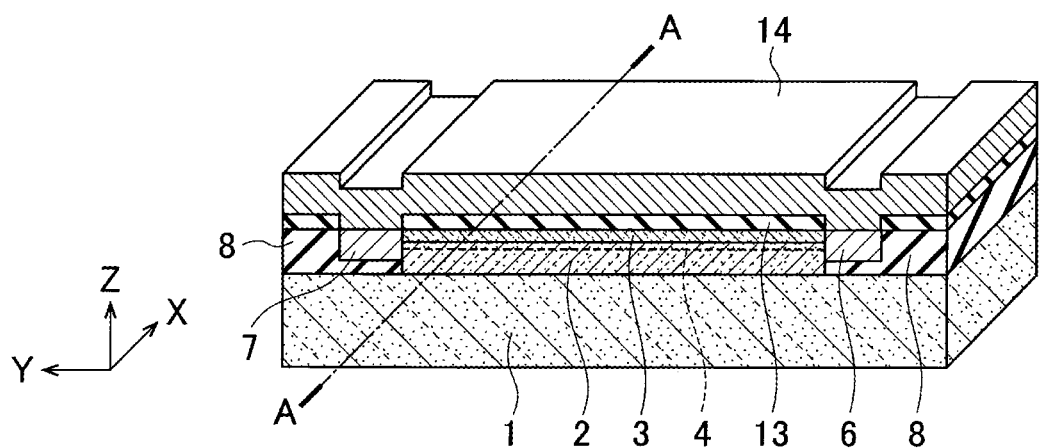
FIG. 26A is a perspective view illustrating the method for manufacturing the semiconductor device according to the first embodiment.
Figure 26B:
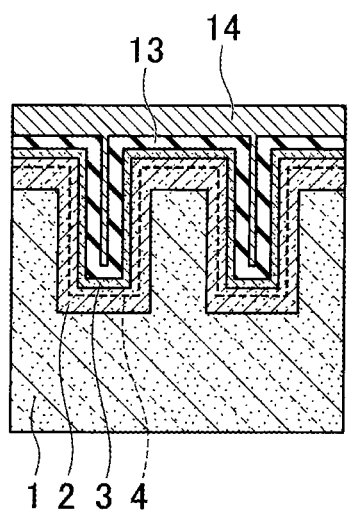
FIG. 26B is a sectional view along a section A-A in FIG. 26A.

Next, as shown in FIGS. 26A and 26B, the resist material 16 is removed, and a metal to be the line electrode 14 is embedded using the vapor deposition method, the sputtering method, or the like.

Figure 27:
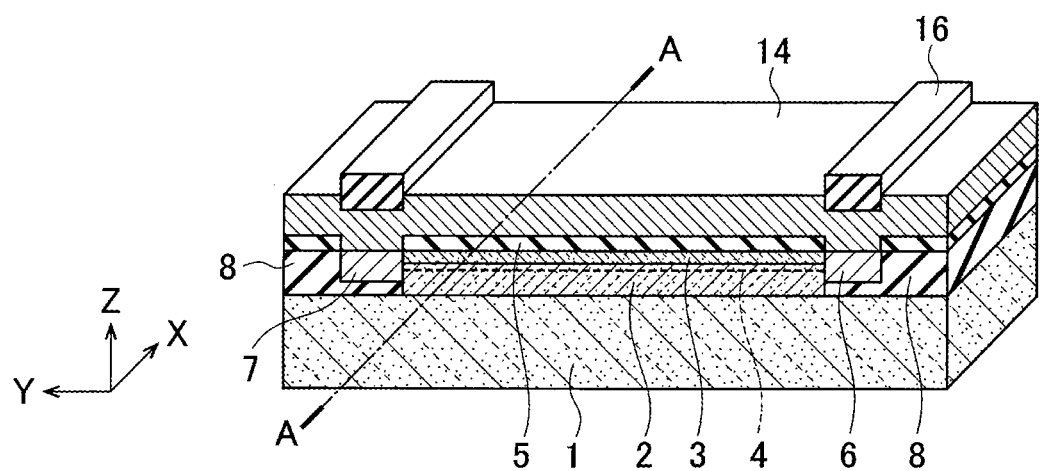
FIG. 27 is a perspective view illustrating the method for manufacturing the semiconductor device according to the first embodiment.
Figure 28:
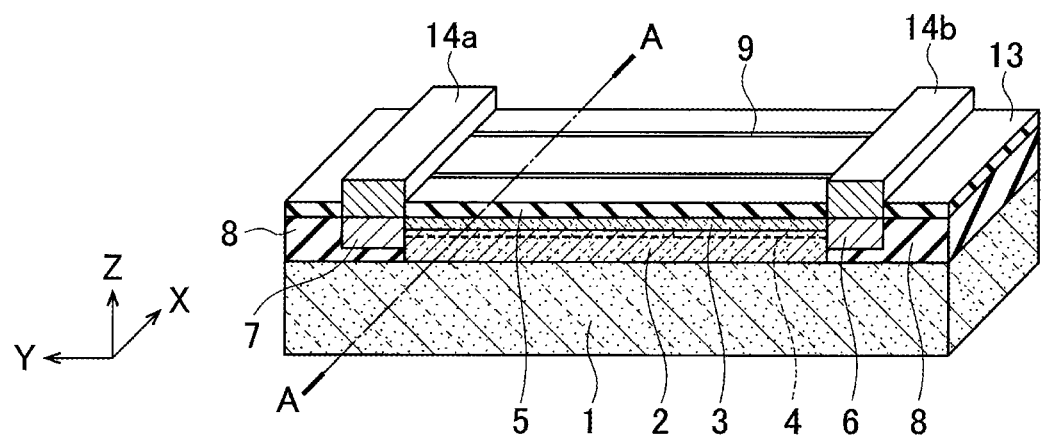
FIG. 28 is a perspective view illustrating the method for manufacturing the semiconductor device according to the first embodiment.

Next, as shown in FIG. 27, using the resist material 16 as a mask, a part of the line electrode 14 is removed by etching. Finally, the resist material 16 is removed, and the line electrodes 14a and 14b are formed as shown in FIG. 28.

[Effect of Semiconductor Device]

As described above, according to the semiconductor device of the first embodiment, the semiconductor region 2 is formed on the side surfaces of the main groove 9 formed in the main surface of the substrate 1, and the electron supply region 3 is formed on the semiconductor region 2. The two-dimensional electron gas layer 4 is thus formed in a direction perpendicular to one direction (Z-axis direction) of the substrate 1. The two-dimensional electron gas layer 4 is in direct contact with and electrically connected to the cathode electrode 7 and the anode electrode 6 at both ends of the main groove 9, so that when a forward bias is applied, the current flows in the horizontal direction (Y-axis direction) of the substrate 1 through the two-dimensional electron gas layer 4. By increasing the depth of the main groove 9 on the side surfaces of the main groove 9, the area per unit substrate area increases. This increases the density of the two-dimensional electron gas layer 4 and thus achieves large current.

Moreover, the cathode electrode 7 and the anode electrode 6 are directly connected to the two-dimensional electron gas layer 4 at both ends of the main groove 9. The electron supply region 3, and other electrodes and conductive regions are not interposed between the cathode electrode 7 and the anode electrode 6 and the two-dimensional electron gas layer 4. Since the current due to the two-dimensional electron gas flows directly between the two-dimensional electron gas layer 4 and the cathode electrode 7 and the anode electrode 6, the high electron mobility of the semiconductor device according to the first embodiment is not impaired. That is, the high electron mobility of the two-dimensional electron gas is maintained. Thus, the on-resistance is reduced.

When the concavo-convex structure is formed in the semiconductor region 2 instead of the substrate 1, the depth of the concave portion or the height of the convex portion of the semiconductor region 2 is a maximum of several micrometers. From the viewpoint of maintaining quality, the film thickness of the semiconductor region 2 is 10 µm or less, and the semiconductor region 2 made of gallium nitride is liable to break at a depth or height higher than that. In the case of the substrate 1, the depth of the main groove 9 is, for example, 500 µm, which achieves a higher channel density and larger current as compared with the case where the concavo-convex structure is formed in the semiconductor region 2.

The cathode electrode 7 is in ohmic contact with the two-dimensional electron gas layer 4, and an energy barrier is between the anode electrode 6 and the two-dimensional electron gas layer 4. By increasing the depth of the main groove 9, the area of the side walls of the main groove 9 per unit substrate area can be increased. That is, since the density of the two-dimensional electron gas layer 4 is increased, a diode achieving large current is provided.

Moreover, in the semiconductor device according to the first embodiment, the main groove 9 has a depth greater than or equal to the width of the main groove 9. As a result, the area efficiency is improved as compared with a semiconductor device using only a flat surface, and large current is achieved.

Making the substrate 1 an insulating or semi-insulating substrate prevents a current flowing in the direction perpendicular to the substrate 1. Further, as will be described later, since the insulation between a second field plate electrode formed on the surface facing the main surface of the substrate 1 and the semiconductor region 2 is ensured, a high withstand voltage semiconductor device is provided.

Moreover, the semiconductor region 2 has a buffer layer in contact with the surface of the main groove 9. In the semiconductor device according to the first embodiment, since the buffer layer is formed on the side surfaces of the main groove 9, the lattice constant of the semiconductor region 2 formed on the substrate 1 and the buffer layer can be adjusted. Thus, the semiconductor region 2 of high quality is formed, and a decrease in withstand voltage due to crystal defects is reduced.

Moreover, in the semiconductor device according to the first embodiment, the semiconductor region 2 has a layer made of gallium nitride. Accordingly, since the two-dimensional electron gas layer 4 having a large band gap and a large breakdown field can be formed, low resistance and high withstand voltage are achieved.

Moreover, in the semiconductor device according to the first embodiment, the side surfaces of the main groove 9 are silicon (111) crystal face. Accordingly, when the semiconductor region 2 is formed of gallium nitride and the electron supply region 3 is formed of aluminum gallium nitride, they can be selectively grown on the side surfaces of the main groove 9, so that by increasing the depth of the main groove 9, the channel density is controlled. In other words, the density of the two-dimensional electron gas layer 4 is increased, and thus large current is achieved.

Second Embodiment

[Configuration of Semiconductor Device]

Figure 29A:
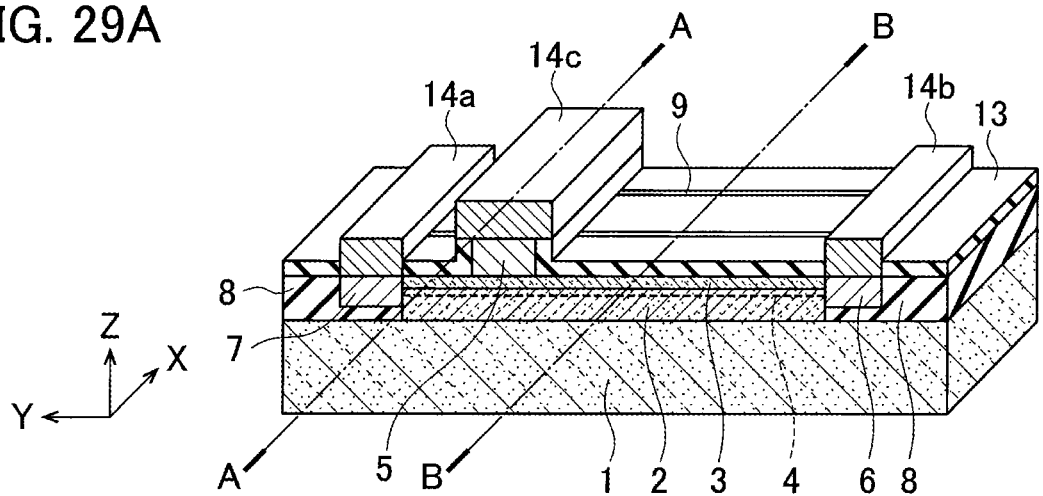
FIG. 29A is a perspective view illustrating a configuration of a semiconductor device according to a second embodiment.
Figure 29B:
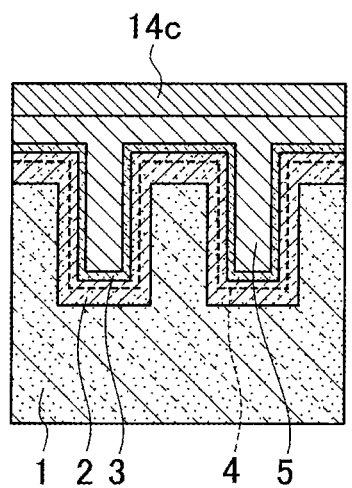
FIG. 29B is a sectional view along a section A-A in FIG. 29A.
Figure 29C:
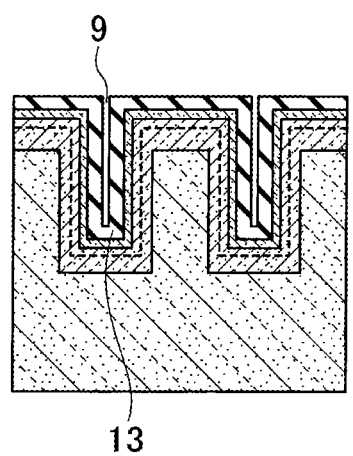
FIG. 29C is a sectional view along a section B-B in FIG. 29A.

With reference to FIGS. 29A to 29C, the configuration of a semiconductor device according to a second embodiment is described. As the semiconductor device, the second embodiment describes a high electron mobility field effect transistor (HEMT) having as a channel a two-dimensional electron gas formed by using a semiconductor heterojunction and a modulation-doping technique.

The semiconductor device according to the second embodiment includes a substrate 1, a semiconductor region 2, an electron supply region 3, a two-dimensional electron gas layer 4, a gate electrode 5 as a third electrode, a drain electrode 6 as a second electrode, a cathode electrode 7 as a first electrode, an element isolation region 8, main grooves 9, an insulating film 13, and lines 14a-14c (sometimes referred to collectively as line 14).

The substrate 1, the semiconductor region 2, and the electron supply region 3 are the same as those in the first embodiment, and the description is omitted.

The drain electrode 6 is formed in contact at least with the two-dimensional electron gas layer 4 and apart from the source electrode 7. The drain electrode 6 is in ohmic contact with the two-dimensional electron gas layer 4. In the example shown in FIGS. 29A to 29C, the drain electrode 6 comes in contact with the electron supply region 3 and the two-dimensional electron gas layer 4 from the main surface side of the substrate 1 and is formed in a depth where the drain electrode 6 is separated from the substrate 1. More specifically, the drain electrode 6 is in direct and electrical contact with low resistance with not only the two-dimensional electron gas layer 4 but also the electron supply region 3 on one end of the main groove 9. The drain electrode 6 extends across the multiple main grooves 9 along the main surface of the substrate 1 in a direction (X-axis direction) orthogonal to the extending direction of the main grooves 9. The drain electrode 6 is formed apart from the source electrode 7 in the extending direction (Y direction) of the main grooves 9.

The source electrode 7 is formed in contact at least with the two-dimensional electron gas layer 4 and apart from the drain electrode 6. The source electrode 7 is in ohmic contact with the two-dimensional electron gas layer 4. In the example shown in FIGS. 29A to 29C, the source electrode 7 comes in contact with the electron supply region 3 and the two-dimensional electron gas layer 4 from the main surface side of the substrate 1 and is formed in a depth where the source electrode 7 is separated from the substrate 1. More specifically, the source electrode 7 is in direct and electrical contact with low resistance with not only the two-dimensional electron gas layer 4 but also the electron supply region 3 on the other end of the main groove 9. The source electrode 7 extends across the multiple main grooves 9 along the main surface of the substrate 1 in a direction (X-axis direction) orthogonal to the extending direction of the main grooves 9.

The gate electrode 5 is located between the source electrode 7 and the drain electrode 6 in the extending direction (Y-axis direction) of the main groove 9 and is formed in contact with the electron supply region 3. As shown in FIG. 29B, the gate electrode 5 is formed inside the electron supply region 3 formed along the side surfaces of the main groove 9. In other words, the gate electrode 5 is formed to face the side surfaces of the main groove 9 with the semiconductor region 2 and the electron supply region 3 interposed therebetween. The gate electrode 5 is formed to be embedded in a part of the main groove 9 in the extending direction across the semiconductor region 2 and the electron supply region 3. The gate electrode 5 extends to correspond to the source electrode 7 and the drain electrode 6 in the direction (X-axis direction) orthogonal to the extending direction of the main groove 9.

The element isolation region 8 is a region for electrically insulating the semiconductor device from other circuits and the like on the main surface side of the substrate 1. The element isolation region 8 is formed between the source electrode 7 and the substrate 1 and between the drain electrode 6 and the substrate 1.

The insulating film 13 is a film for electrically insulating the semiconductor device from other circuits and the like and mechanically protecting the semiconductor device. The insulating film 13 is made of an insulator including a ceramic material, such as a silicon nitride film ($Si_3N_4$) and a silicon oxide film ($SiO_2$). The insulating film 13 is formed on the entire surface on the main surface side of the substrate 1 except above the source electrode 7, the drain electrode 6, and the gate electrode 5.

The line electrode 14 includes the first line 14a connected to the cathode electrode 7, the second line 14b connected to the anode electrode 6, and the third line 14c connected to the gate electrode 5. The first to third lines are independent of each other and electrically insulated.

[Operation of Semiconductor Device]

Next, the basic operation of the semiconductor device shown in FIGS. 29A to 29C is described.

The semiconductor device functions as a transistor by controlling the potential of the gate electrode 5 in a state where a predetermined positive potential is applied to the drain electrode 6 with reference to the potential of the source electrode 7. When the gate-source voltage is set greater than or equal to a predetermined threshold value, a depletion layer extending from the gate electrode 5 to the semiconductor region 2 via the electron supply region 3 is eliminated. As a result, the two-dimensional electron gas layer 4 is formed at the interface between the electron supply region 3 and the semiconductor region 2, and the transistor is turned on. Electrons flow from the source electrode 7 to the drain electrode 6. The semiconductor device utilizes the side surfaces of the main groove 9 to improve the density of the channel connecting the source and the drain and achieve large current.

Further, when the gate-source voltage is made less than the predetermined threshold value, a depletion layer spreads from the gate electrode 5 to the semiconductor region 2 through the electron supply region 3, and the two-dimensional electron gas layer 4 disappears. As a result, the transistor is turned off, and the current is cut off. At this time, a high voltage is instantaneously applied between the source and the drain, and a depletion layer spreads from the gate electrode 5 toward the drain electrode 6. The length of the depletion layer becomes the distance between the gate electrode 5 and the drain electrode 6, and when a high withstand voltage is required, the distance between the gate electrode 5 and the drain electrode 6 may be increased.

The semiconductor region 2 is made of gallium nitride. The band gap and the breakdown field are large, and a large withstand voltage is obtained even with a thin thickness. Therefore, the width of the main groove 9 can be reduced by reducing the thickness of the semiconductor region 2. Accordingly, the area efficiency of the substrate 1 is improved, and a semiconductor element with a large current density is provided.

[Method for Manufacturing Semiconductor Device]

Next, an example of a method for manufacturing the semiconductor device shown in FIGS. 29A to 29C is described with reference to FIGS. 30A to 54B.

[First Step]

Figure 30A:
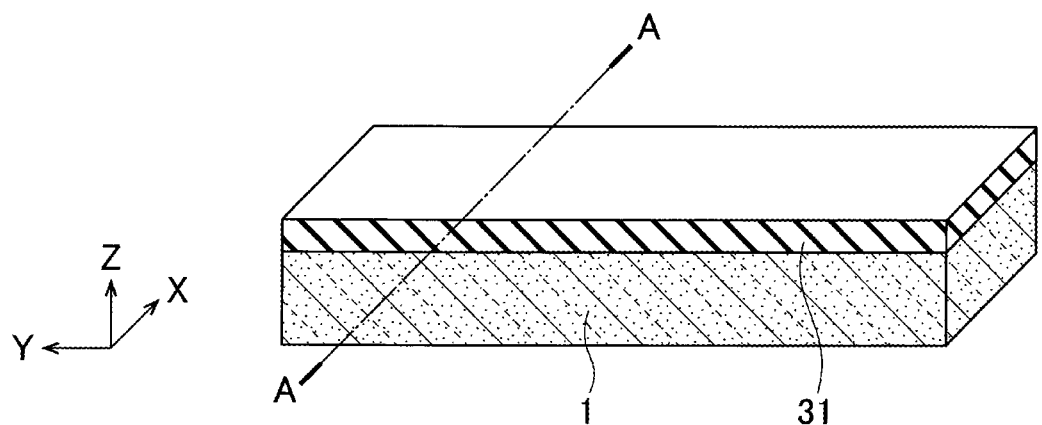
FIG. 30A is a perspective view illustrating a method for manufacturing the semiconductor device according to the second embodiment.
Figure 30B:
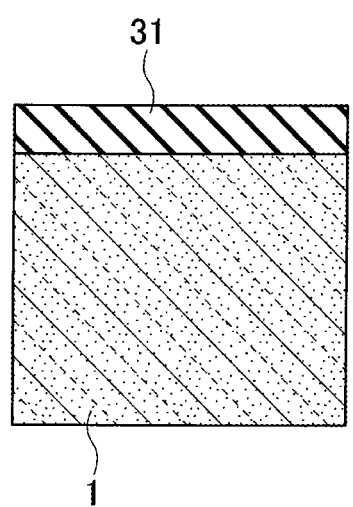
FIG. 30B is a sectional view along a section A-A in FIG. 30A.

First, as shown in FIGS. 30A and 30B, an insulating film 31 is formed on the main surface of the substrate 1 as a mask material for forming the main grooves 9. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main grooves 9 are a silicon crystal face. Note that the silicon crystal face is (111) face.

Figure 31A:
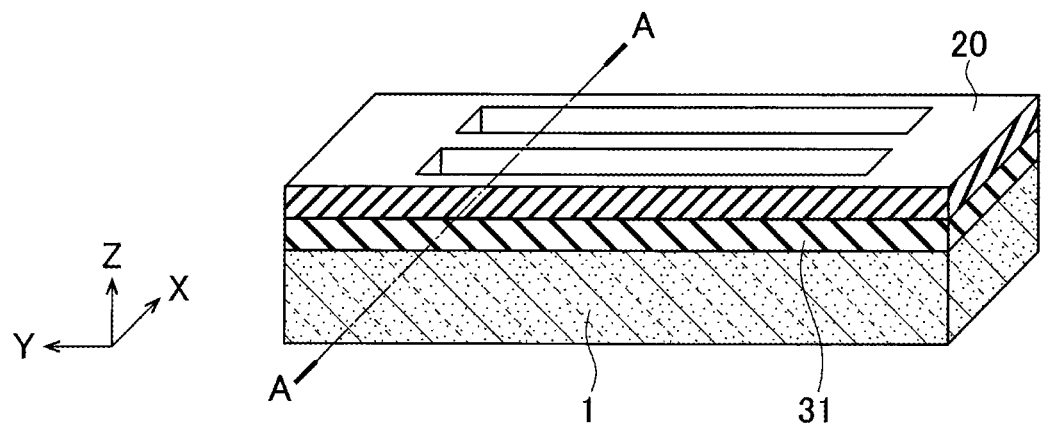
FIG. 31A is a perspective view illustrating the method for manufacturing the semiconductor device according to the second embodiment.
Figure 31B:
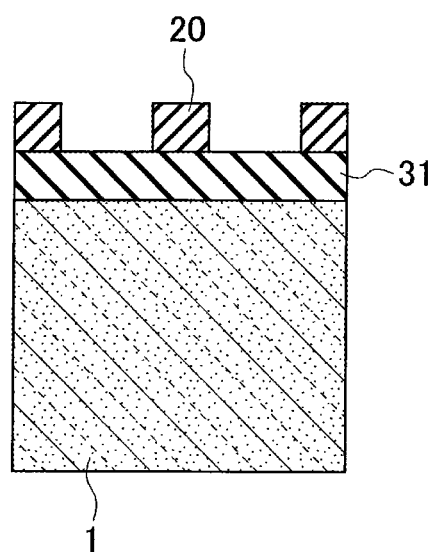
FIG. 31B is a sectional view along a section A-A in FIG. 31A.

Next, as shown in FIGS. 31A and 31B, a resist material 20 is applied to the upper surface of the insulating film 31 by a photolithography method, and regions where the main grooves 9 are to be formed are selectively removed. That is, the resist material 20 is patterned into a shape with openings in the regions where the main grooves 9 are to be formed.

Figure 32A:
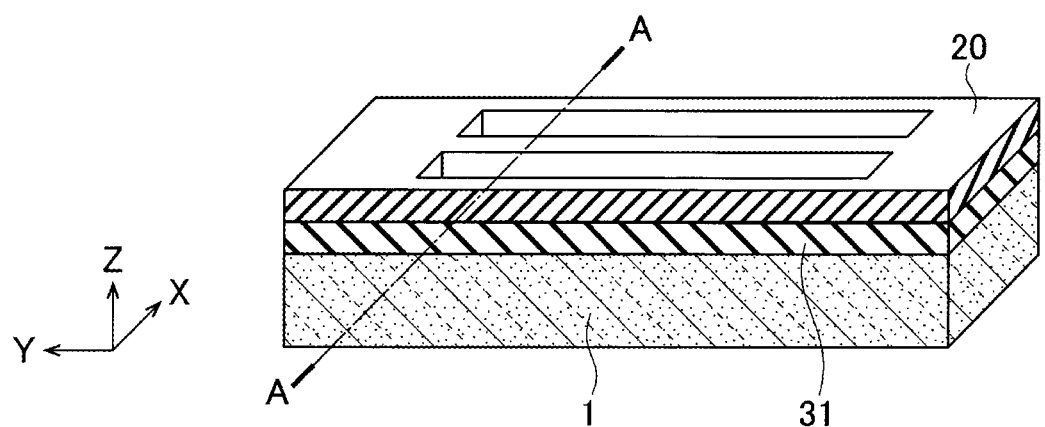
FIG. 32A is a perspective view illustrating the method for manufacturing the semiconductor device according to the second embodiment.
Figure 32B:
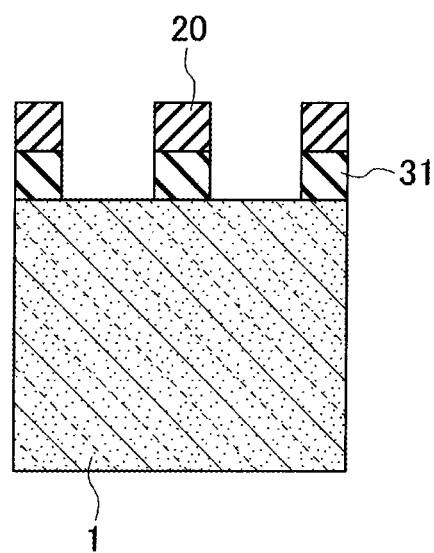
FIG. 32B is a sectional view along a section A-A in FIG. 32A.

Next, as shown in FIGS. 32A and 32B, the insulating film 31 is patterned using the remaining resist material 20 as a mask. Patterning may be performed by wet etching using hydrofluoric acid, or dry etching, such as reactive ion etching.

Figure 33A:
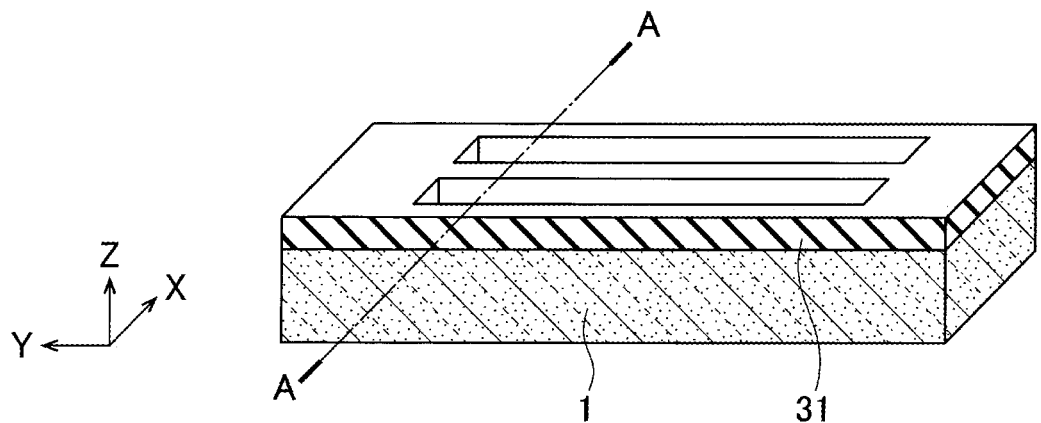
FIG. 33A is a perspective view illustrating the method for manufacturing the semiconductor device according to the second embodiment.
Figure 33B:
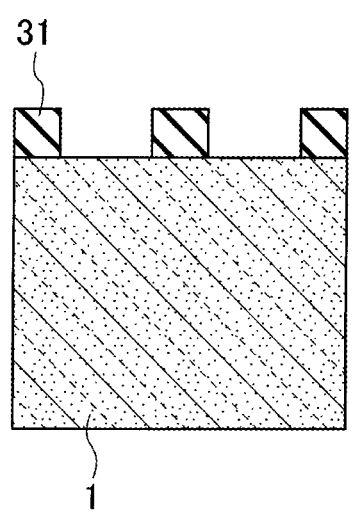
FIG. 33B is a sectional view along a section A-A in FIG. 33A.

After the patterning of the insulating film 31 is completed, as shown in FIGS. 33A and 33B, the resist material 20 is removed by oxygen plasma, sulfuric acid, or the like.

Figure 34A:
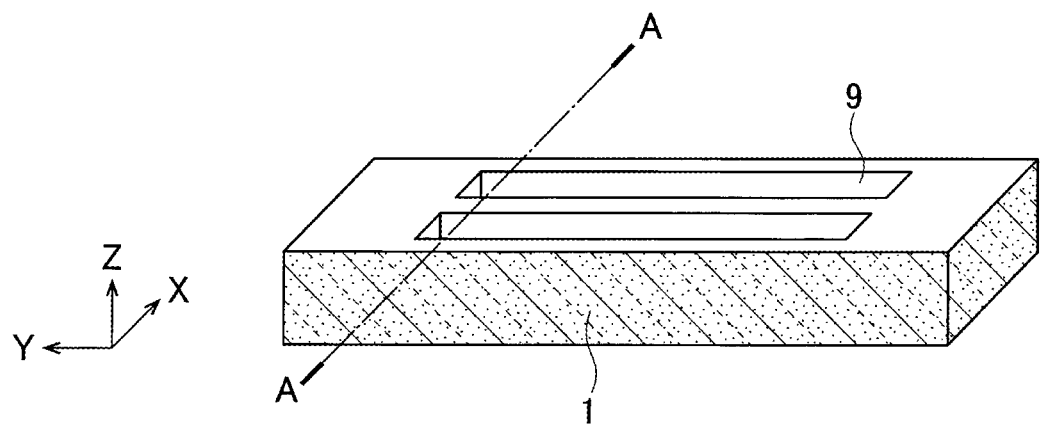
FIG. 34A is a perspective view illustrating the method for manufacturing the semiconductor device according to the second embodiment.
Figure 34B:
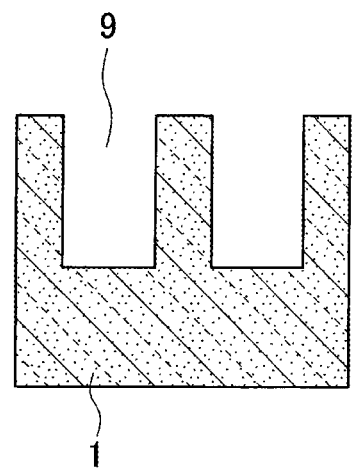
FIG. 34B is a sectional view along a section A-A in FIG. 34A.

Next, as shown in FIGS. 34A and 34B, using the patterned insulating film 31 as a mask, the main grooves 9 are formed in the main surface of the substrate 1 by dry etching. More specifically, the main grooves 9 each extending in a direction (Y-axis direction) along the main surface of the substrate 1 are formed. The main groove 9 is formed to have the aspect ratio of the depth to the width of the main groove 9 greater than or equal to 1. For example, the main groove 9 has a width of about 20 μm and a depth of about 500 μm.

[Second Step]

Figure 35A:
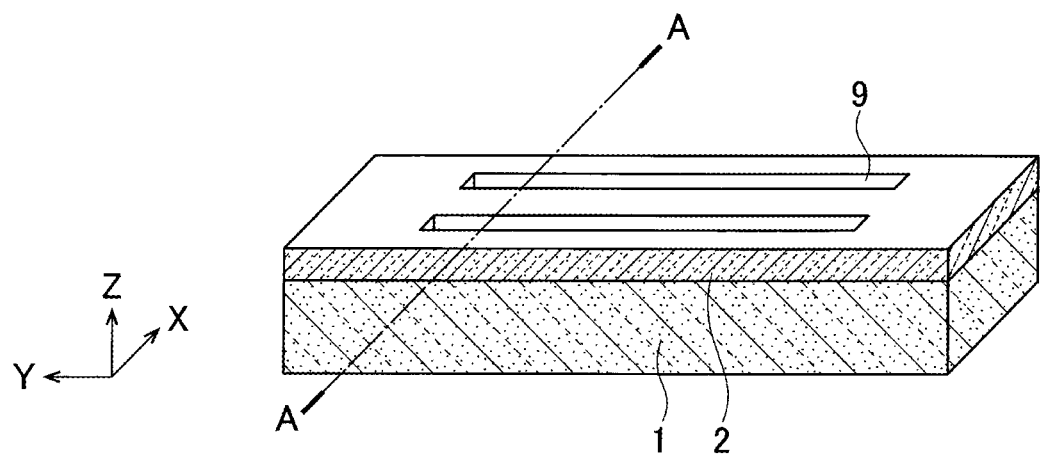
FIG. 35A is a perspective view illustrating the method for manufacturing the semiconductor device according to the second embodiment.
Figure 35B:
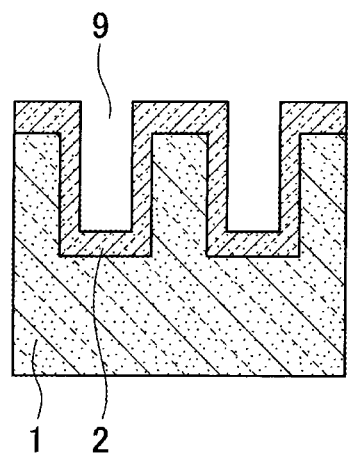
FIG. 35B is a sectional view along a section A-A in FIG. 35A.

Next, as shown in FIGS. 35A and 35B, a buffer layer is grown by a thermal CVD method on the substrate 1 on which the main grooves 9 are formed. Specifically, the substrate 1 is introduced into a MOCVD apparatus and heated to a predetermined temperature (for example, 600° C.). When the temperature is stabilized, the substrate 1 is rotated, and trimethylaluminum (TMA) as a raw material is introduced at a predetermined flow rate onto the surface of the substrate 1 to grow the buffer layer. The film thickness of the buffer layer is several hundreds of nanometers. Then, gallium nitride (GaN) that is not doped with impurities is deposited on the buffer layer, thereby forming the semiconductor region 2 including the buffer layer and the non-doped gallium nitride layer. The film thickness of the non-doped gallium nitride layer is determined by a required withstand voltage value and is described as, for example, 5 μm in the present embodiment.

[Third Step]

Figure 36A:
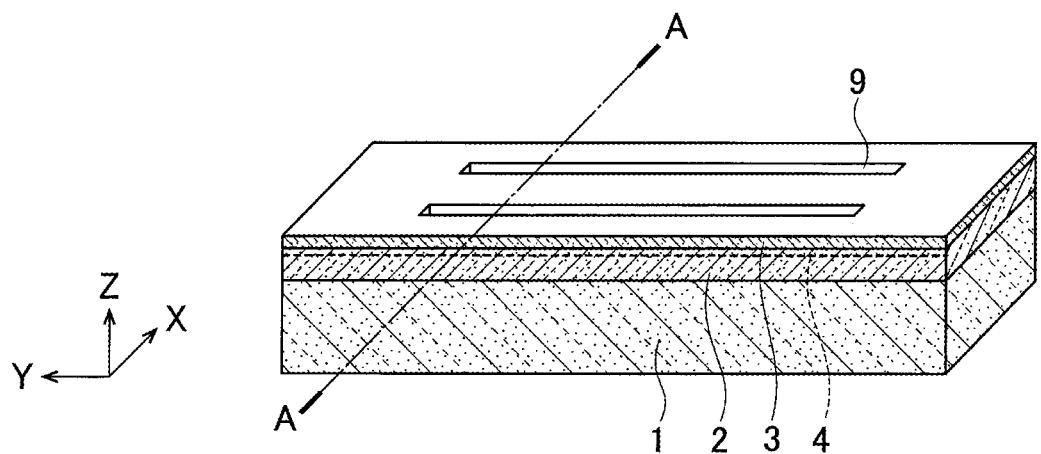
FIG. 36A is a perspective view illustrating the method for manufacturing the semiconductor device according to the second embodiment.
Figure 36B:
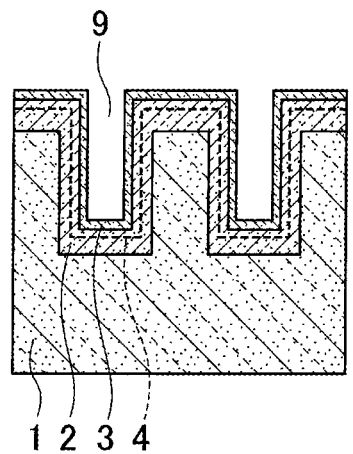
FIG. 36B is a sectional view along a section A-A in FIG. 36A.

Next, as shown in FIGS. 36A and 36B, the electron supply region 3 made of aluminum gallium nitride (AlGaN) is formed by a method similar to the method described in the second step. The film thickness of the electron supply region 3 is preferably several to several tens of nanometers.

[Fourth Step]

Figure 37A:
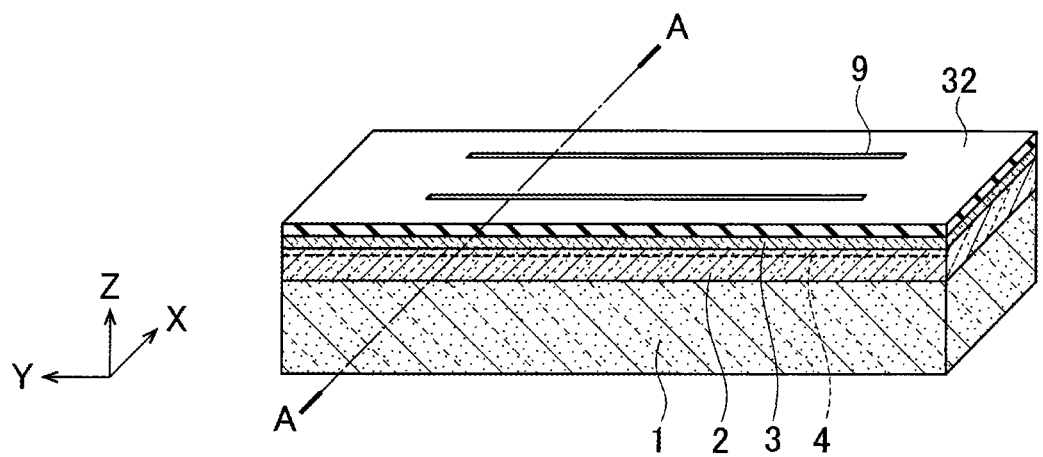
FIG. 37A is a perspective view illustrating the method for manufacturing the semiconductor device according to the second embodiment.
Figure 37B:
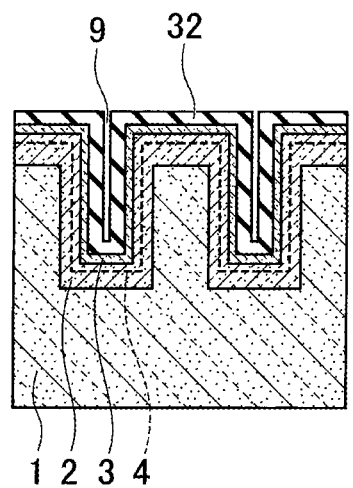
FIG. 37B is a sectional view along a section A-A in FIG. 37A.

Next, as shown in FIGS. 37A and 37B, an insulating film 32 as a mask material is formed on the electron supply region 3. A silicon oxide film may be used as the insulating film 32, and the thermal CVD method or the plasma CVD method may be used as a deposition method.

Figure 38A:
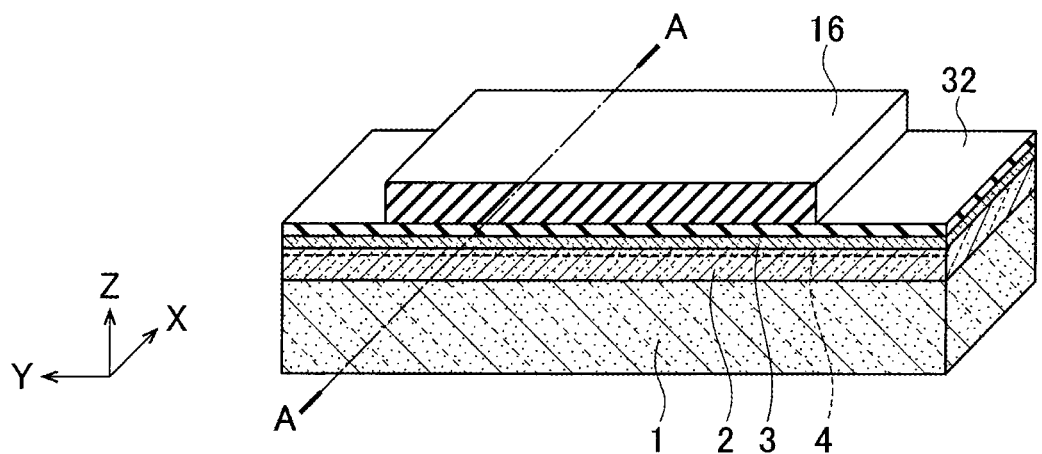
FIG. 38A is a perspective view illustrating the method for manufacturing the semiconductor device according to the second embodiment.
Figure 38B:
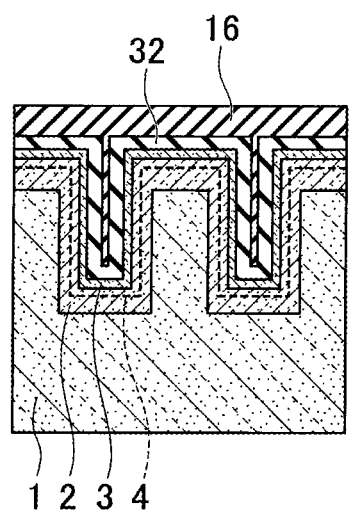
FIG. 38B is a sectional view along a section A-A in FIG. 38A.

Next, as shown in FIGS. 38A and 38B, a resist material 16 is formed on the insulating film 32, and an element isolation area is patterned.

Figure 39:
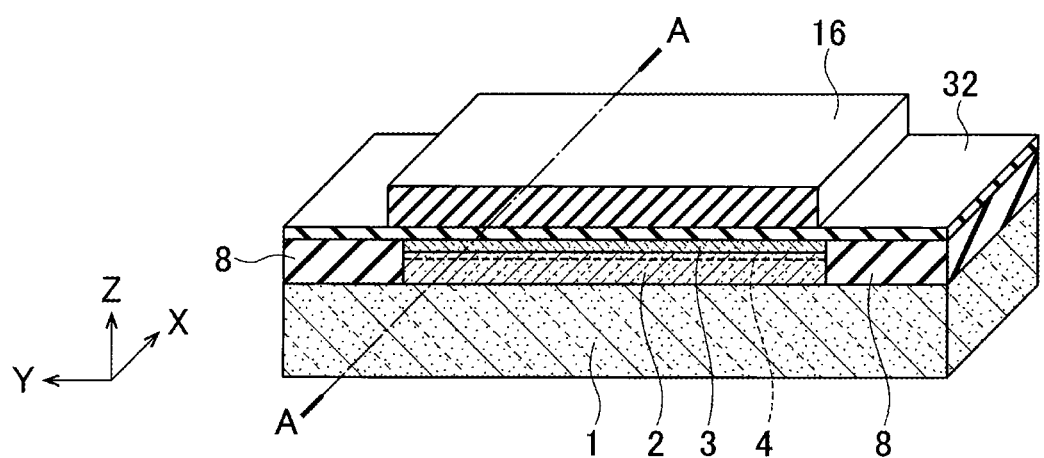
FIG. 39 is a perspective view illustrating the method for manufacturing the semiconductor device according to the second embodiment.

Next, as shown in FIG. 39, an element isolation region 8 is provided by implanting argon ions by an ion implantation method, and element isolation is performed. Note that although the ion implantation method is used in the present embodiment, the substrate 1 having a mesa structure formed by the dry etching method using a patterned mask material may be used.

Figure 40A:
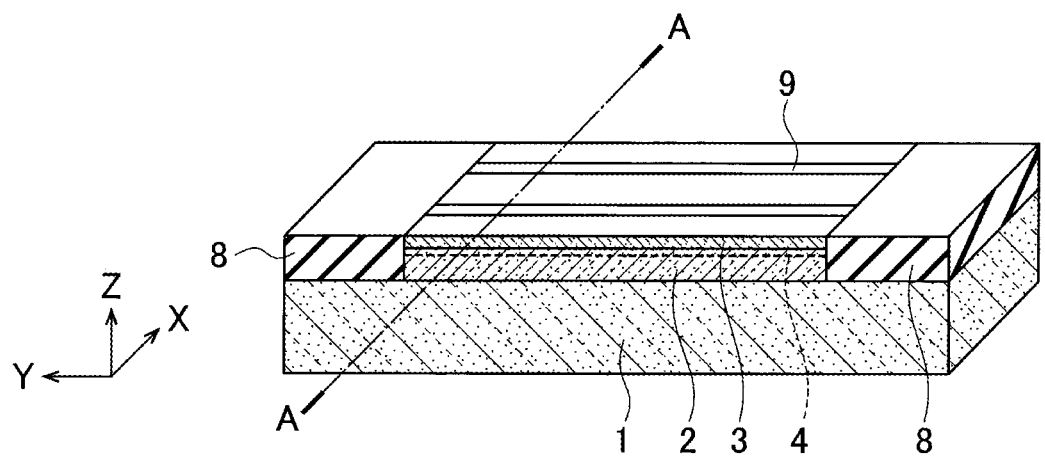
FIG. 40A is a perspective view illustrating the method for manufacturing the semiconductor device according to the second embodiment.
Figure 40B:
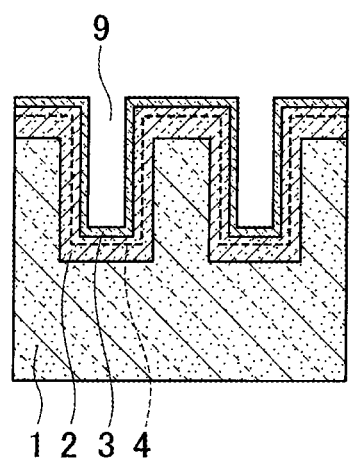
FIG. 40B is a sectional view along a section A-A in FIG. 40A.

Next, as shown in FIGS. 40A and 40B, the resist material 16 is removed with oxygen plasma, sulfuric acid, or the like. Moreover, the insulating film 32 is removed by wet etching using hydrofluoric acid, or dry etching, such as reactive ion etching.

[Fifth Step]

Figure 41A:
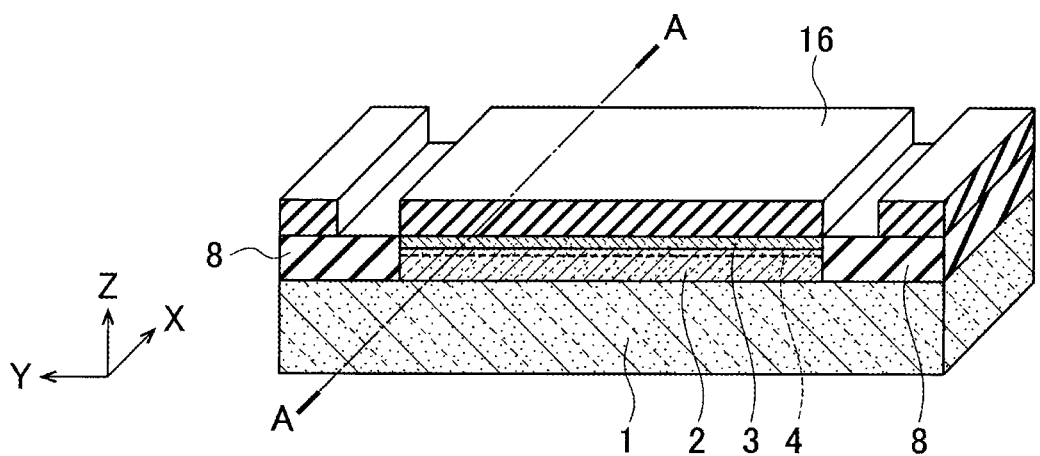
FIG. 41A is a perspective view illustrating the method for manufacturing the semiconductor device according to the second embodiment.
Figure 41B:
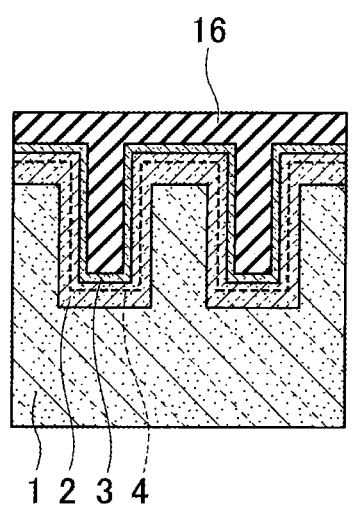
FIG. 41B is a sectional view along a section A-A in FIG. 41A.

Next, as shown in FIGS. 41A and 41B, the resist material 16 is formed on the electron supply region 3, and the source electrode 7 and the drain electrode 6 are patterned.

Figure 42A:
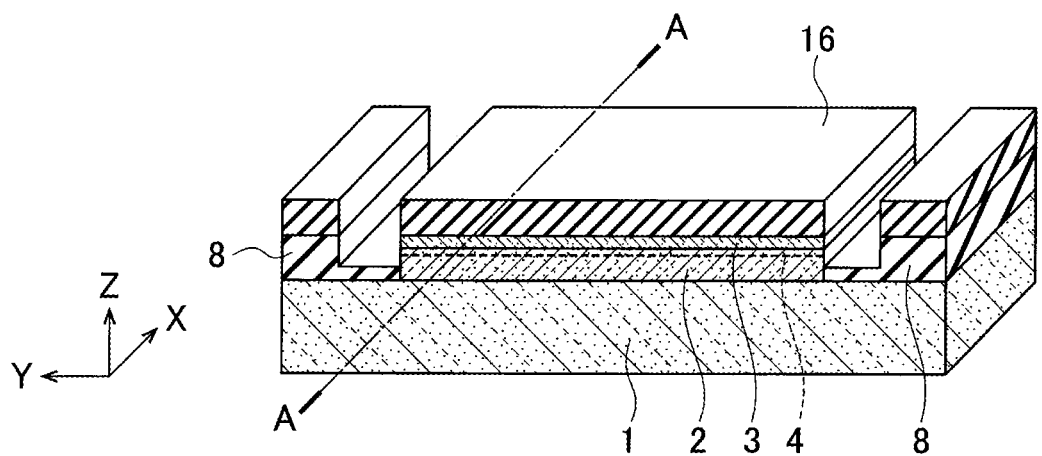
FIG. 42A is a perspective view illustrating the method for manufacturing the semiconductor device according to the second embodiment.
Figure 42B:
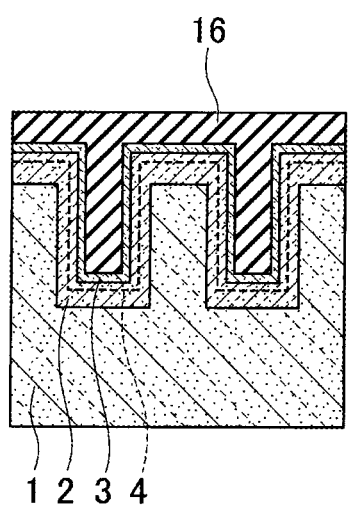
FIG. 42B is a sectional view along a section A-A in FIG. 42A.

Next, as shown in FIGS. 42A and 42B, an electrode embedding pattern is formed by dry etching from the electron supply region 3 to the semiconductor region 2. The embedding depth is preferably several tens of nanometers.

Figure 43A:
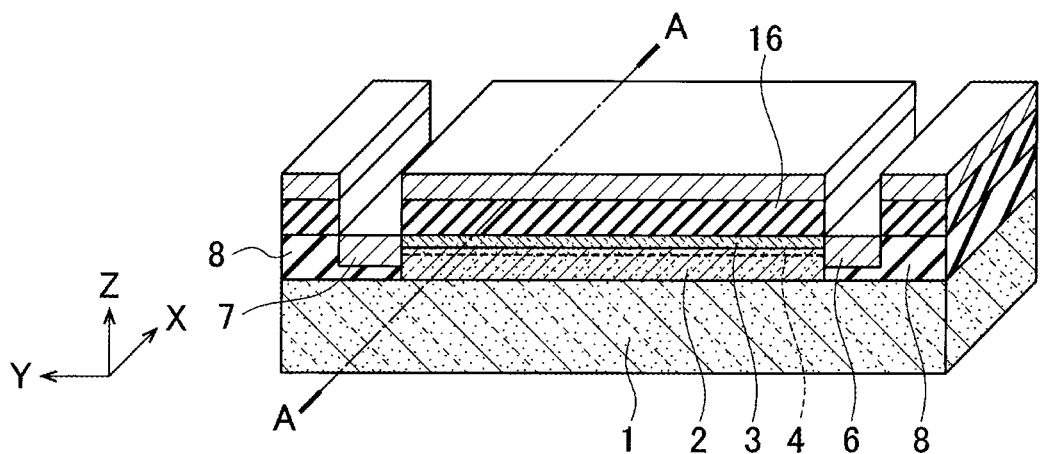
FIG. 43A is a perspective view illustrating the method for manufacturing the semiconductor device according to the second embodiment.
Figure 43B:
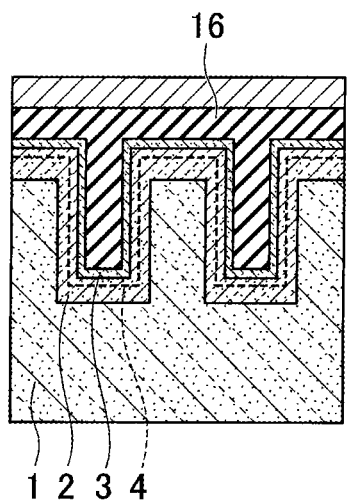
FIG. 43B is a sectional view along a section A-A in FIG. 43A.

Next, as shown in FIGS. 43A and 43B, a metal to be the source electrode 7 and the drain electrode 6 is embedded using a vapor deposition method, a sputtering method, or the like.

Figure 44A:
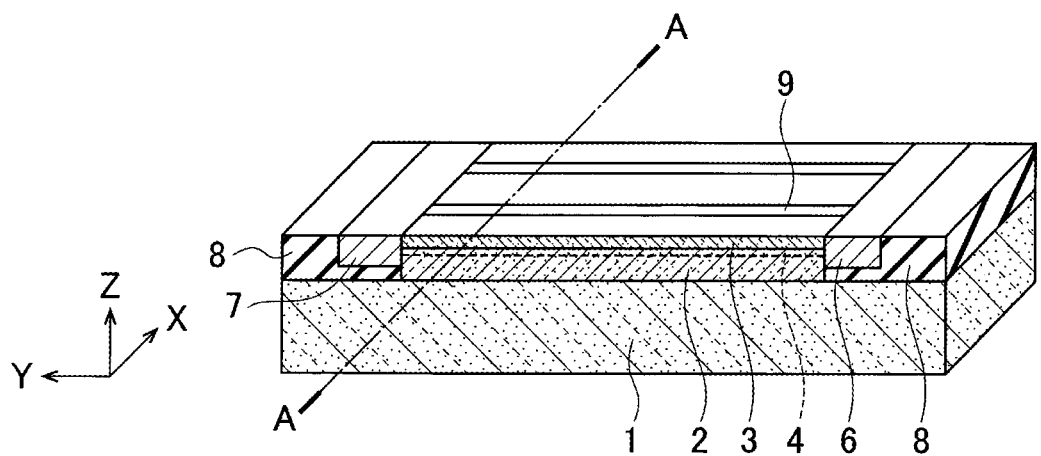
FIG. 44A is a perspective view illustrating the method for manufacturing the semiconductor device according to the second embodiment.
Figure 44B:
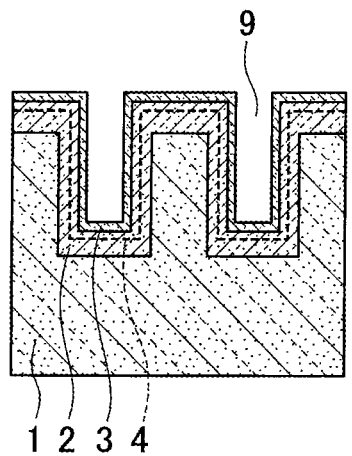
FIG. 44B is a sectional view along a section A-A in FIG. 44A.

Next, as shown in FIGS. 44A and 44B, the source electrode 7 and the drain electrode 6 are formed by lifting off the metal formed on the resist material 16 in an acetone solution.

Figure 45A:
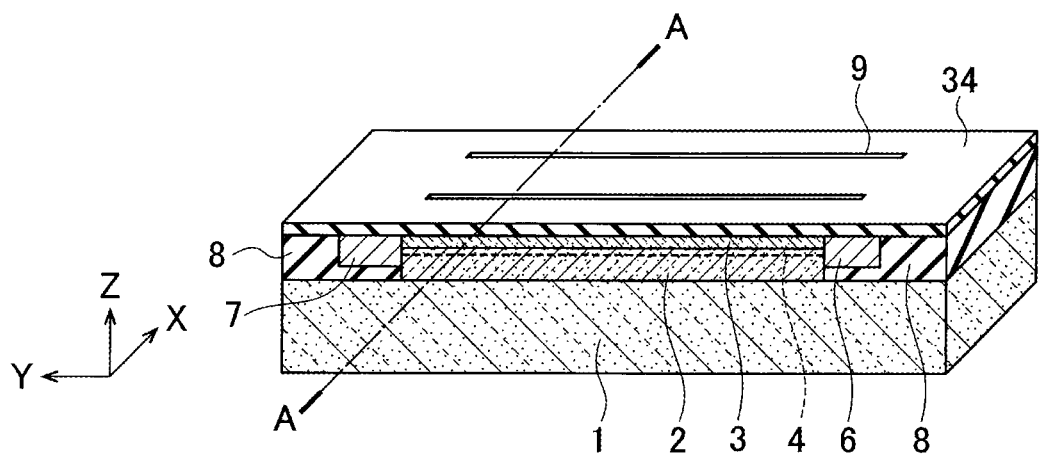
FIG. 45A is a perspective view illustrating the method for manufacturing the semiconductor device according to the second embodiment.
Figure 45B:
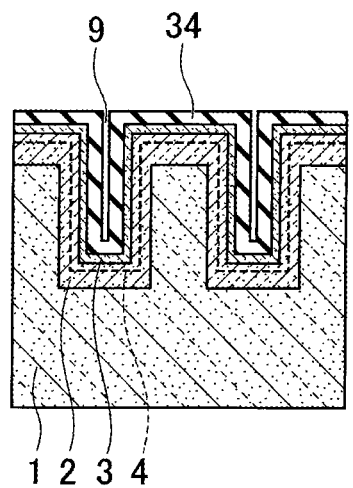
FIG. 45B is a sectional view along a section A-A in FIG. 45A.

Next, as shown in FIGS. 45A and 45B, an insulating film 34 is deposited on the electron supply region 3 to be used as a protective film. The substrate 1 is moved to a rapid thermal processing apparatus (RTA) and heat-treated at a high temperature of 800 to 1000° C. for several tens of seconds. A silicon nitride film may be used as the insulating film 34, and an LPCVD method may be used as the deposition method.

Figure 46A:
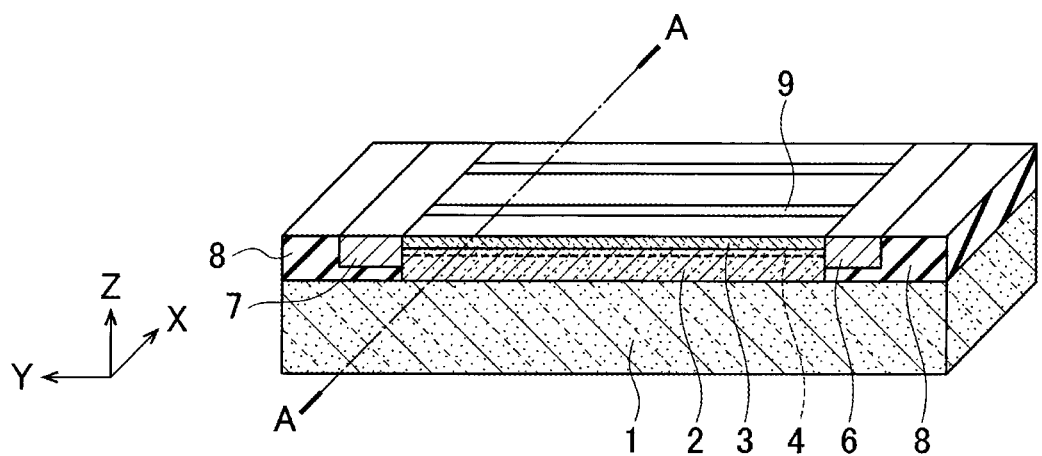
FIG. 46A is a perspective view illustrating the method for manufacturing the semiconductor device according to the second embodiment.
Figure 46B:
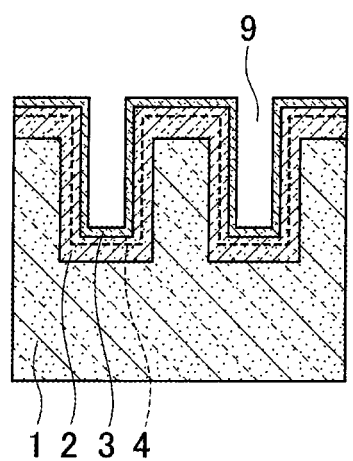
FIG. 46B is a sectional view along a section A-A in FIG. 46A.

Next, as shown in FIGS. 46A and 46B, the insulating film 34 is removed by the dry etching method or the wet etching method. Hot phosphoric acid may be used in the wet etching method.

[Sixth Step]

Figure 47:
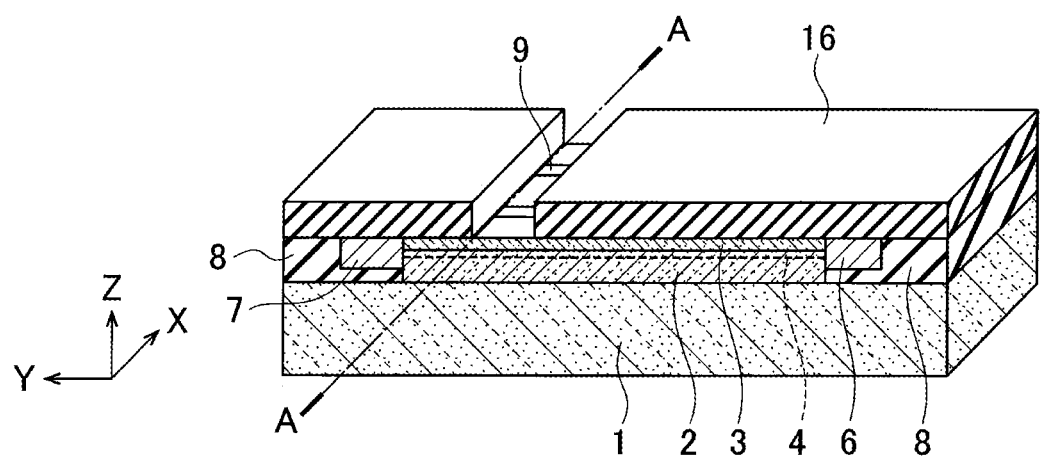
FIG. 47 is a perspective view illustrating the method for manufacturing the semiconductor device according to the second embodiment.

Next, as shown in FIG. 47, the resist material 16 is formed on the electron supply region 3, and the gate electrode 5 is patterned.

Figure 48A:
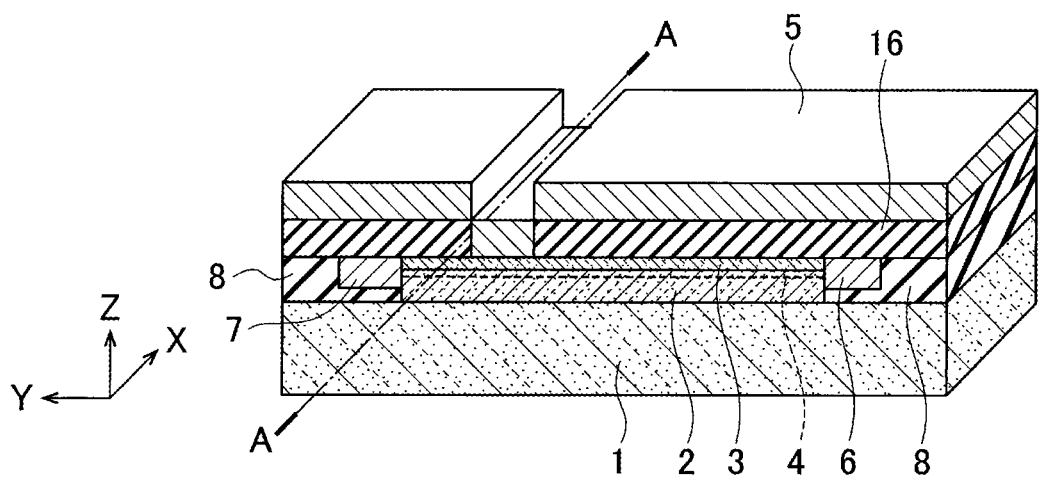
FIG. 48A is a perspective view illustrating the method for manufacturing the semiconductor device according to the second embodiment.
Figure 48B:
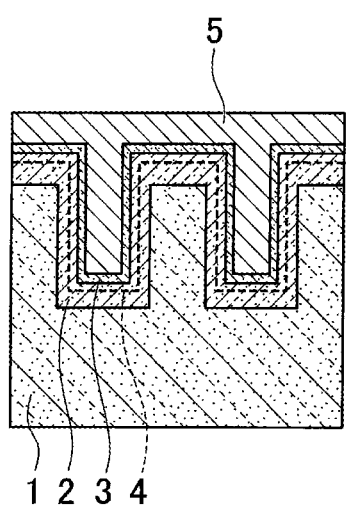
FIG. 48B is a sectional view along a section A-A in FIG. 48A.

Next, as shown in FIGS. 48A and 48B, a metal to be the gate electrode 5 is embedded using the vapor deposition method, the sputtering method, or the like.

Figure 49:
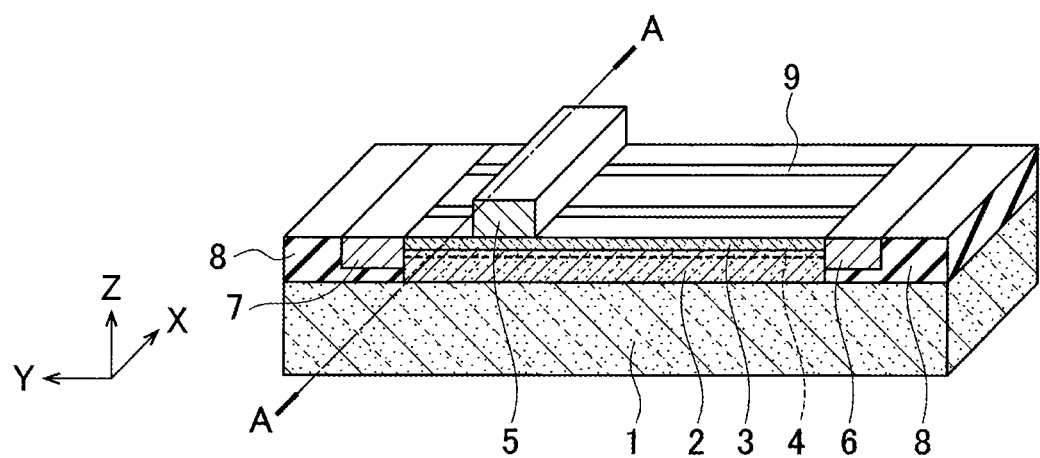
FIG. 49 is a perspective view illustrating the method for manufacturing the semiconductor device according to the second embodiment.

Next, as shown in FIG. 49, the gate electrode 5 is formed by lifting off the electrode formed on the resist material 16 in an acetone solution.

[Seventh Step]

Figure 50A:
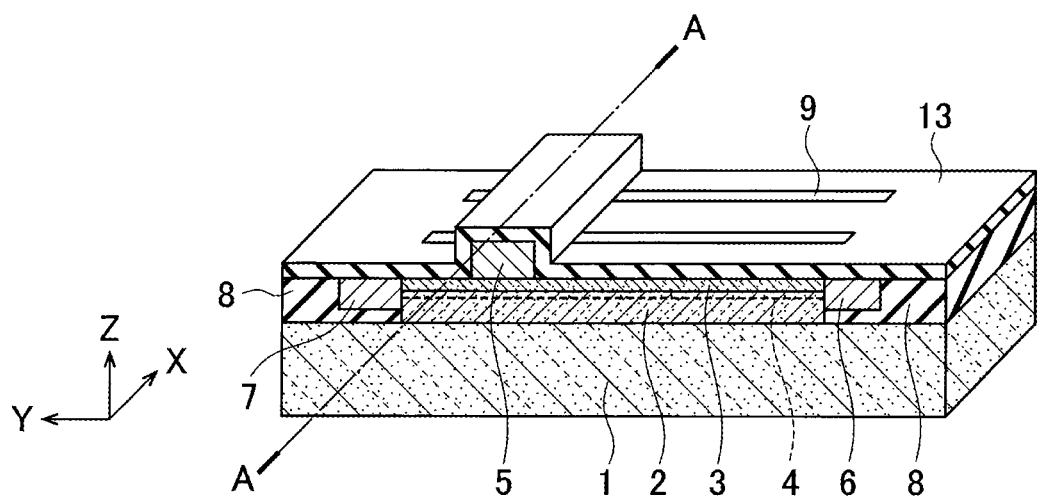
FIG. 50A is a perspective view illustrating the method for manufacturing the semiconductor device according to the second embodiment.
Figure 50B:
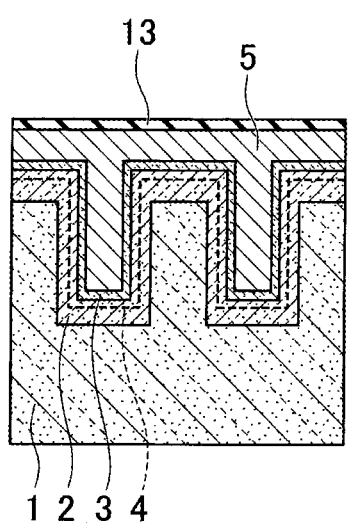
FIG. 50B is a sectional view along a section A-A in FIG. 50A.

Next, as shown in FIGS. 50A and 50B, the insulating film 13 is deposited on the electron supply region 3 and the gate electrode 5 to be used as a protective film, and the substrate 1 is moved to the rapid thermal processing apparatus (RTA) and heat-treated at a high temperature of 800 to 1000° C. for several tens of seconds. A silicon nitride film may be used as the insulating film 13, and the LPCVD method may be used as the deposition method.

Figure 51:
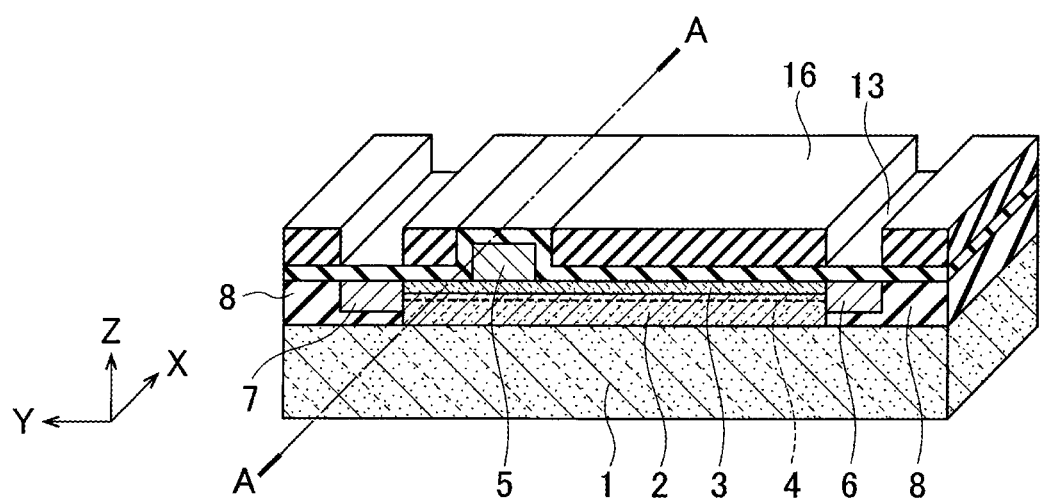
FIG. 51 is a perspective view illustrating the method for manufacturing the semiconductor device according to the second embodiment.

Next, as shown in FIG. 51, the resist material 16 is formed on the insulating film 13, and a pattern for electrically connecting to each of the cathode electrode 7, the anode electrode 6, and the gate electrode 5 is formed.

Figure 52A:
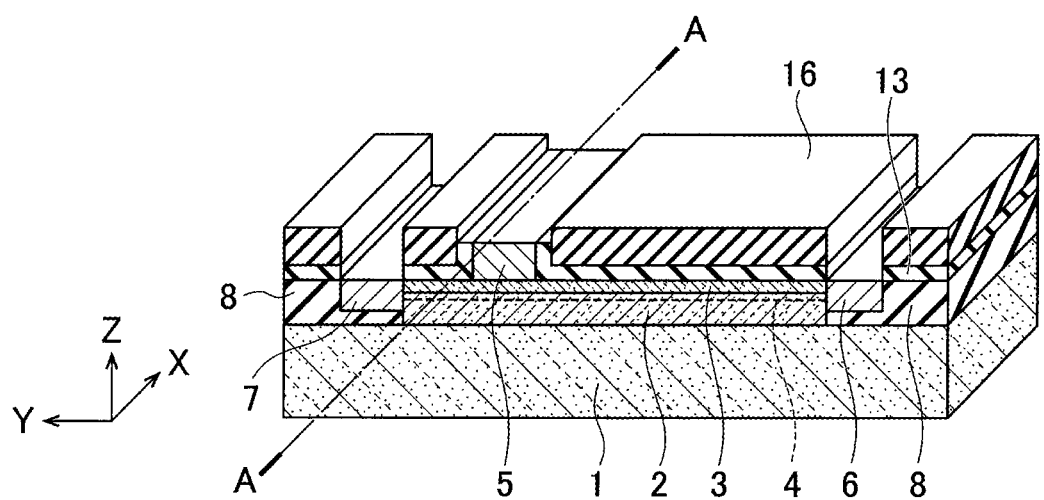
FIG. 52A is a perspective view illustrating the method for manufacturing the semiconductor device according to the second embodiment.
Figure 52B:
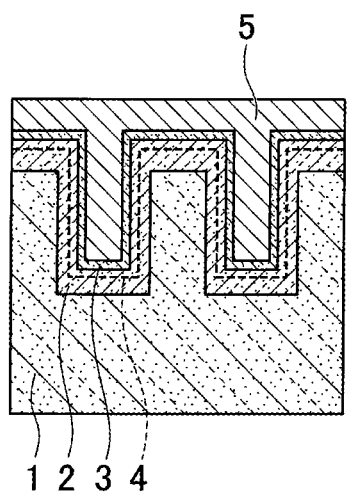
FIG. 52B is a sectional view along a section A-A in FIG. 52A.

Next, as shown in FIGS. 52A and 52B, the insulating film 13 is removed by the dry etching method or the wet etching method using the resist material 16 as a mask. Hot phosphoric acid may be applied in the wet etching.

Figure 53A:
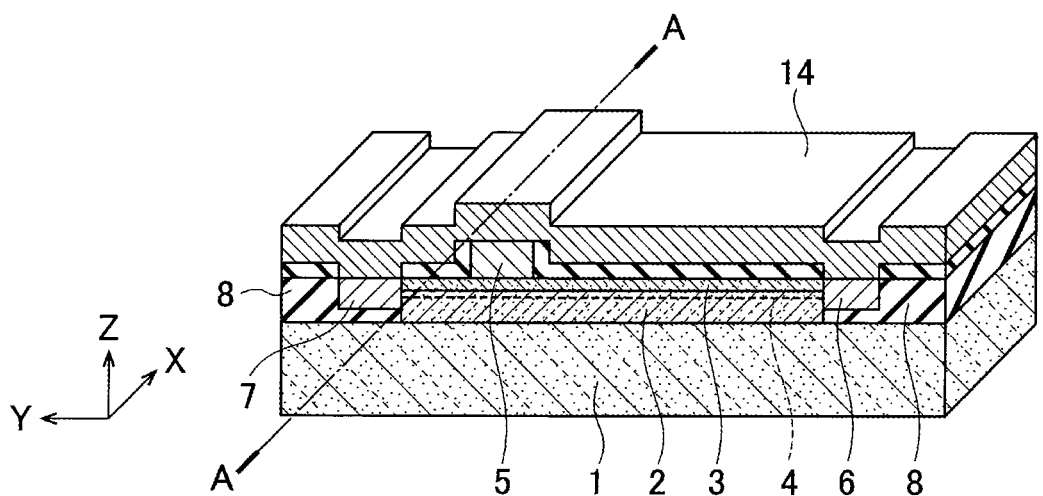
FIG. 53A is a perspective view illustrating the method for manufacturing the semiconductor device according to the second embodiment.
Figure 53B:
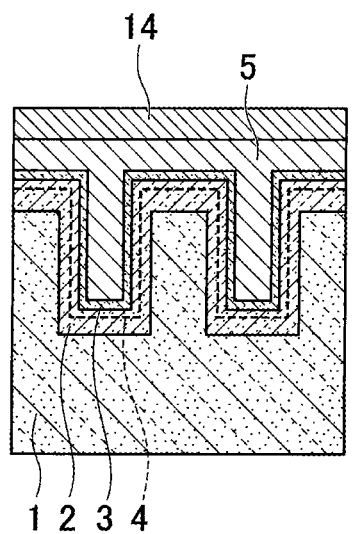
FIG. 53B is a sectional view along a section A-A in FIG. 53A.

Next, as shown in FIGS. 53A and 53B, the resist material 16 is removed, and a metal to be the line electrode 14 is embedded using the vapor deposition method, the sputtering method, or the like.

Figure 54A:
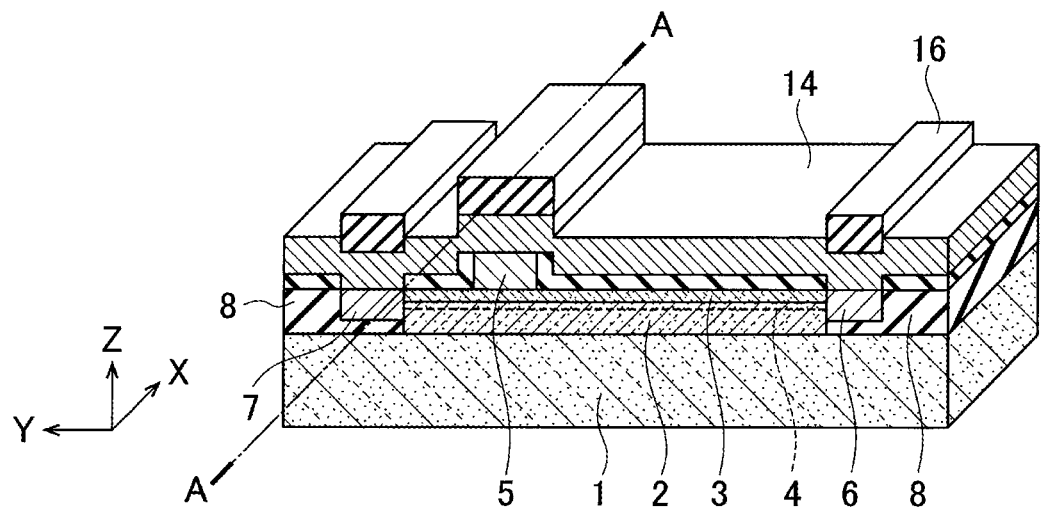
FIG. 54A is a perspective view illustrating the method for manufacturing the semiconductor device according to the second embodiment.
Figure 54B:
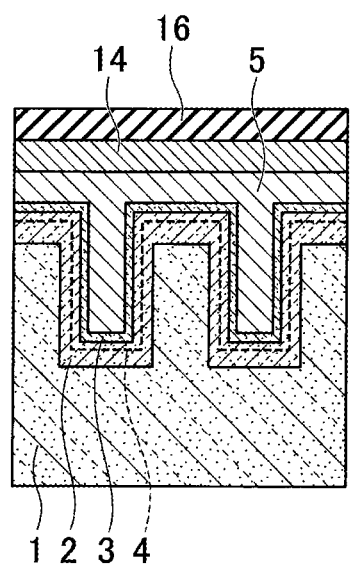
FIG. 54B is a sectional view along a section A-A in FIG. 54A.

Next, as shown in FIGS. 54A and 54B, the line electrode 14 is patterned using the resist material 16. Finally, the resist material 16 is removed, and the line electrode 14 is formed as shown in FIGS. 29A to 29C.

[Effect of Semiconductor Device]

As described above, according to the semiconductor device of the second embodiment, the semiconductor region 2 is formed on the side surfaces of the main groove 9 formed in the main surface of the substrate 1, and the electron supply region 3 is formed on the semiconductor region 2. The two-dimensional electron gas layer 4 is thus formed in a direction perpendicular to one direction (Z-axis direction) of the substrate 1. The two-dimensional electron gas layer 4 is in direct contact with and electrically connected to the cathode electrode 7 and the anode electrode 6 at both ends of the main groove 9, so that when a forward bias is applied, the current flows in the horizontal direction (Y-axis direction) of the substrate 1 through the two-dimensional electrons gas layer 4. By increasing the depth of the main groove 9 on the side surfaces of the main groove 9, the area per unit substrate area is increased. This increases the density of the two-dimensional electron gas layer 4 and thus achieves large current as compared with the HEMT having a planar structure described in Patent Literature 1, for example.

Moreover, the source electrode 7 and the drain electrode 6 are directly connected to the two-dimensional electron gas layer 4 at both ends of the main groove 9. The electron supply region 3, and other electrodes and conductive regions are not interposed between the source electrode 7 and the drain electrode 6 and the two-dimensional electron gas layer 4. Since the current due to the two-dimensional electron gas 4 flows directly between the two-dimensional electron gas layer 4 and the cathode electrode 7 and the anode electrode 6, the high electron mobility of the semiconductor device according to the second embodiment is impaired. That is, the high electron mobility of the two-dimensional electron gas is maintained. Thus, the on-resistance is reduced.

The semiconductor device according to the second embodiment further includes the gate electrode 5 that is formed between the source electrode 7 and the drain electrode 6 in the extending direction of the main groove 9 and controls the number of carriers in the two-dimensional electron gas layer 4. The source electrode 7 and the drain electrode 6 are in ohmic contact with the two-dimensional electron gas layer 4. By increasing the depth of the main groove 9, the area of the side walls of the main groove 9 per unit substrate area can be increased. That is, since the density of the two-dimensional electron gas layer 4 is increased, a high electron mobility field effect transistor achieving large current is provided.

The gate electrode 5 is formed to face the side surfaces of the main groove 9 with the semiconductor region 2 and the electron supply region 3 interposed therebetween. The gate electrode 5 is embedded to the bottom part of the main groove 9 to face the side surfaces of the main groove 9 across the electron supply region 3. This makes the concentration of the two-dimensional electron gas layer 4 uniform and thus provides a semiconductor device that has less occurrence of electric field concentration and achieves a high withstand voltage.

In addition, it goes without saying that the operational effects obtained by the configuration common to the semiconductor device according to the first embodiment are also obtained by the semiconductor device according to the second embodiment.

(Modification 1)

Next, a modification 1 of the second embodiment is described. The modification 1 uses insulating sapphire instead of silicon as the material of the substrate 1. A sapphire substrate has a smaller mismatch in crystal lattice constant with gallium nitride as compared with a silicon substrate, and a high-quality substrate is obtained. Thus, a semiconductor device with a high withstand voltage is provided. Further, since the buffer layer required for the silicon substrate is significantly reduced, a semiconductor device manufactured at low cost is provided.

(Modification 2)

Next, a modification 2 of the second embodiment is described. The modification 2 uses a semi-insulator instead of silicon as the material of the substrate 1. For example, silicon carbide (SiC) may be used as the semi-insulator. A semi-insulating substrate has a smaller mismatch in crystal lattice constant with gallium nitride as compared with a silicon substrate, and a high-quality substrate is obtained. Thus, a semiconductor device with a high withstand voltage is provided. Further, since the insulating property is higher than that of the silicon substrate, a semiconductor device reducing leakage current is provided. Furthermore, making the substrate 1 a semi-insulator prevents a current flowing in a direction perpendicular to the substrate 1 (Z direction).

Moreover, the use of silicon carbide superior in thermal conductivity to silicon improves the cooling ability of the substrate 1. This prevents the increase in on-resistance due to temperature rise and thus provides a semiconductor device achieving low loss.

(Modification 3)

Next, a modification 3 of the second embodiment is described with reference to FIGS. 55A to 68B.

[Configuration of Semiconductor Device]

Figure 55A:
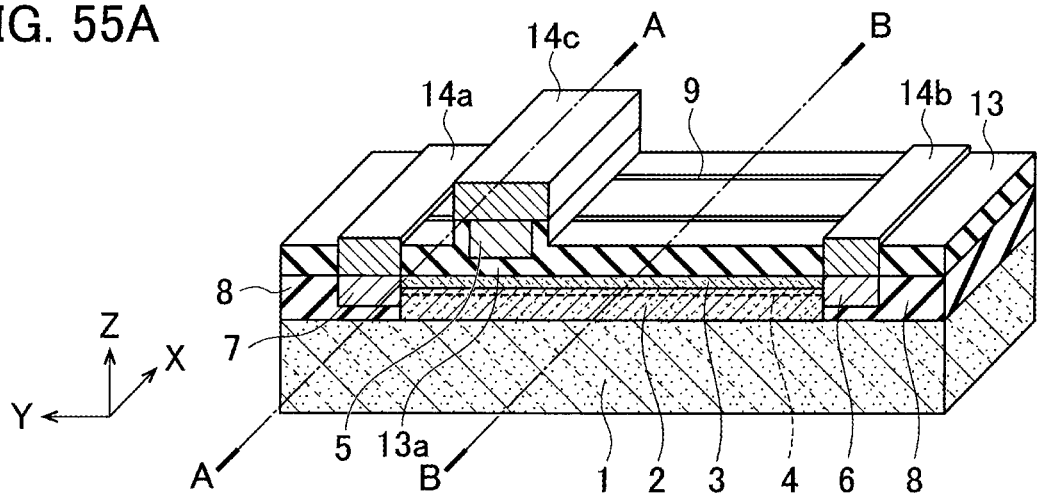
FIG. 55A is a perspective view illustrating a configuration of a semiconductor device according to a modification 3 of the second embodiment.
Figure 55B:
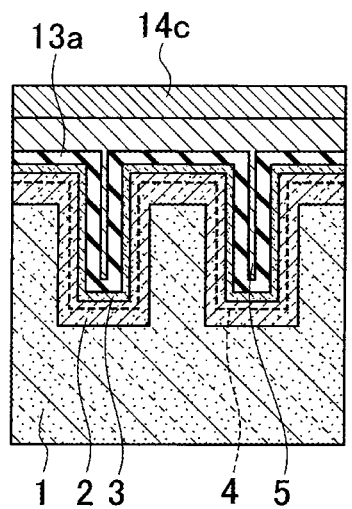
FIG. 55B is a sectional view along a section A-A in FIG. 55A.
Figure 55C:
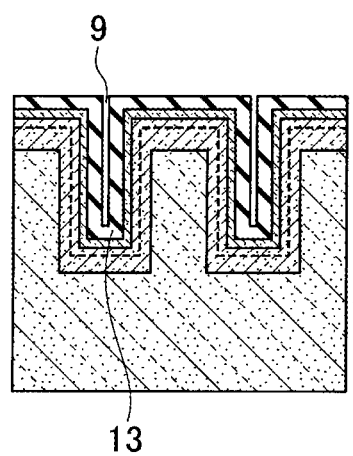
FIG. 55C is a sectional view along a section B-B in FIG. 55A.

As shown in FIGS. 55A to 55C, in a semiconductor device according to the modification 3, the gate electrode 5 is formed between the source electrode 7 and the drain electrode 6 and is formed with respect to the electron supply region 3 with the insulating film 13a interposed therebetween. That is, in the modification 3, the insulating film 13a is formed directly under the gate electrode 5, and the gate electrode 5 does not contact the electron supply region 3. Other configurations are the same as those in the second embodiment. Further, the basic operation of the semiconductor device according to the modification 3 is the same as that in the second embodiment, and thus the description is omitted.

[Method for Manufacturing Semiconductor Device]

Next, an example of a method for manufacturing the semiconductor device according to the modification 3 is described. Since the first to fourth steps are the same as those in the second embodiment, illustration and description are omitted. Moreover, in the same step, description of the same portion as that in the second embodiment is omitted.

[Fifth Step]

Figure 56A:
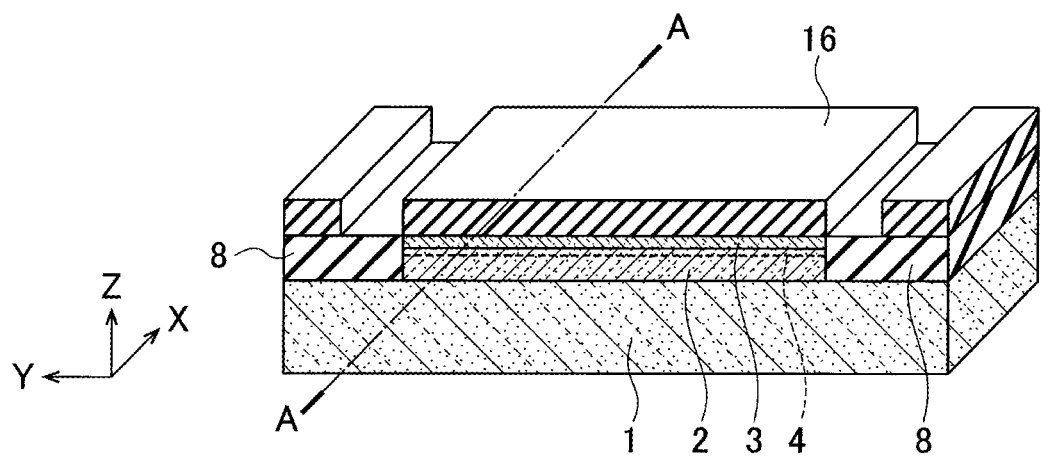
FIG. 56A is a perspective view illustrating a method for manufacturing the semiconductor device according to the modification 3 of the second embodiment.
Figure 56B:
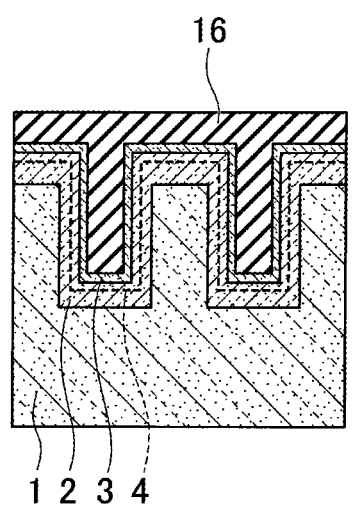
FIG. 56B is a sectional view along a section A-A in FIG. 56A.

As shown in FIGS. 56A and 56B, the resist material 16 is formed on the electron supply region 3, and the source electrode 7 and the drain electrode 6 are patterned.

Figure 57:
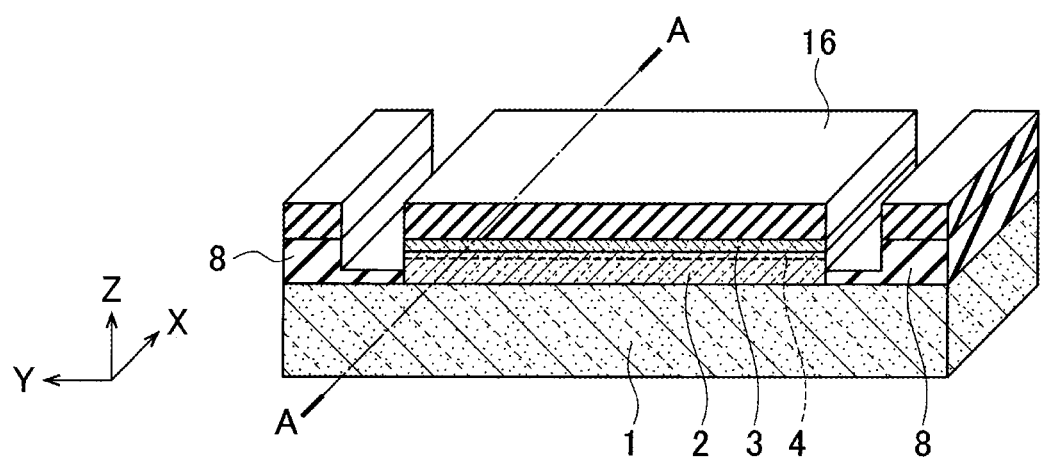
FIG. 57 is a perspective view illustrating the method for manufacturing a semiconductor device according to the modification 3 of the second embodiment.

Next, as shown in FIG. 57, an electrode embedding pattern is formed by dry etching from the electron supply region 3 to the semiconductor region 2. The embedding depth is preferably several tens of nanometers.

Figure 58A:
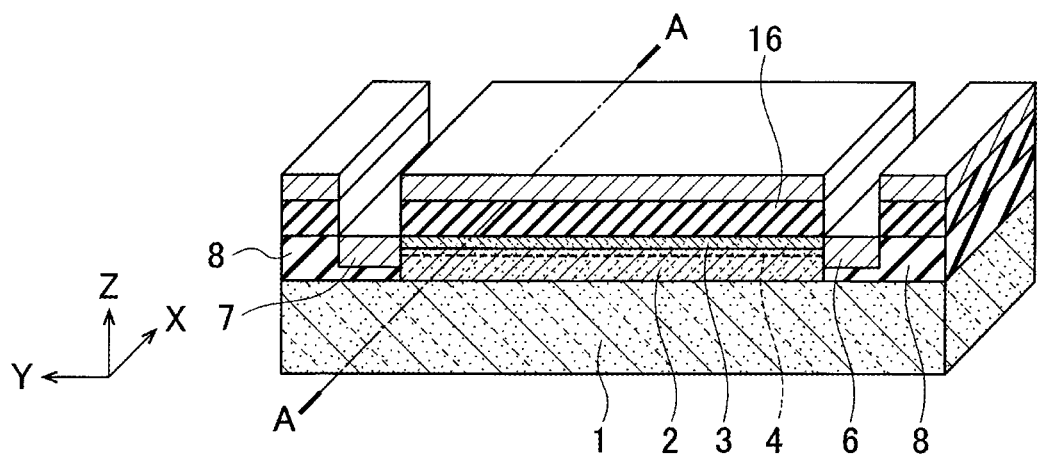
FIG. 58A is a perspective view illustrating the method for manufacturing the semiconductor device according to the modification 3 of the second embodiment.
Figure 58B:
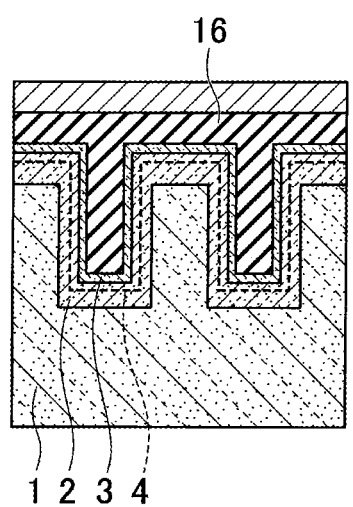
FIG. 58B is a sectional view along a section A-A in FIG. 58A.

Next, as shown in FIGS. 58A and 58B, a metal to be the source electrode 7 and the drain electrode 6 is embedded using a vapor deposition method, a sputtering method, or the like.

Figure 59A:
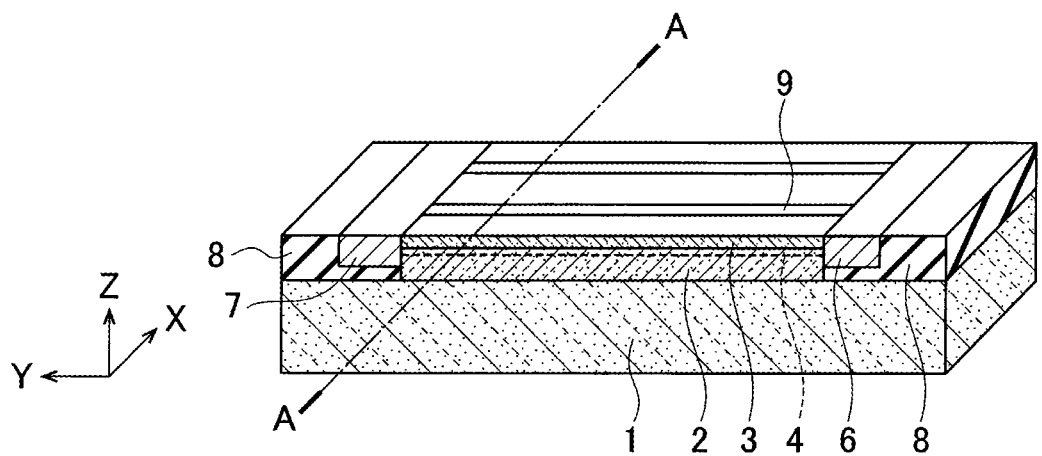
FIG. 59A is a perspective view illustrating the method for manufacturing the semiconductor device according to the modification 3 of the second embodiment.
Figure 59B:
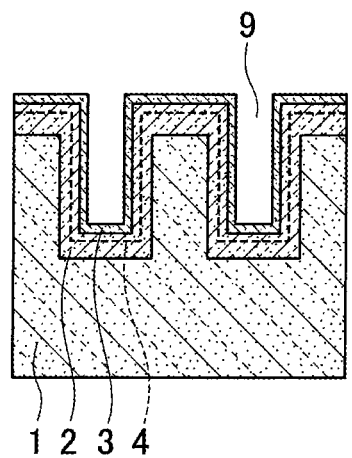
FIG. 59B is a sectional view along a section A-A in FIG. 59A.

Next, as shown in FIGS. 59A and 59B, the source electrode 7 and the drain electrode 6 are formed by lifting off the metal formed on the resist material 16 in an acetone solution.

Figure 60A:
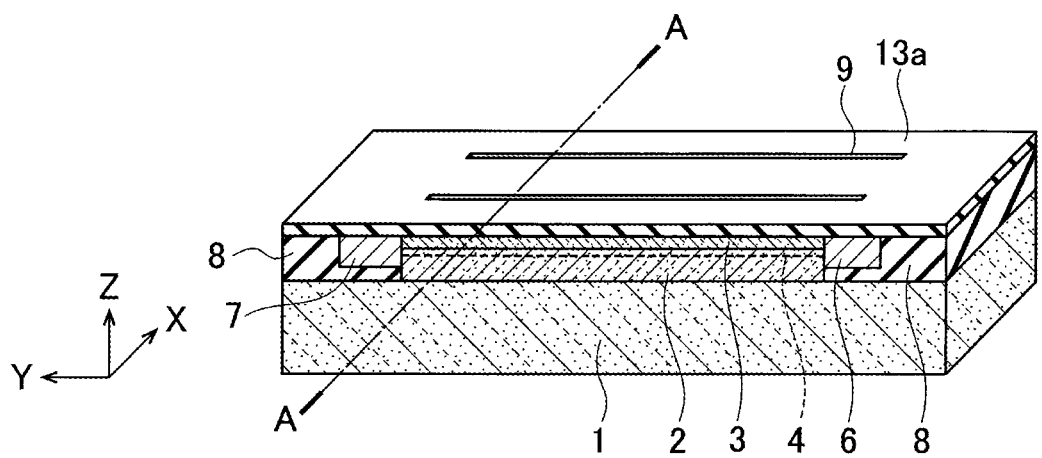
FIG. 60A is a perspective view illustrating the method for manufacturing the semiconductor device according to the modification 3 of the second embodiment.
Figure 60B:
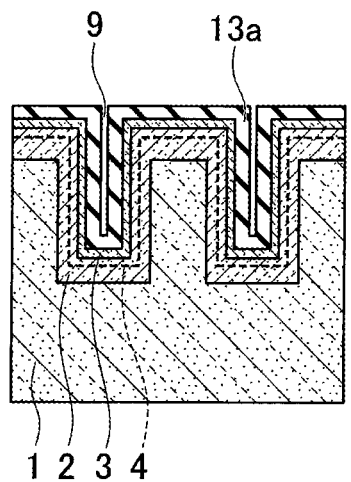
FIG. 60B is a sectional view along a section A-A in FIG. 60A.

Next, as shown in FIGS. 60A and 60B, an insulating film 13a is deposited on the electron supply region 3 to be used as a protective film. The substrate 1 is moved to a rapid thermal processing apparatus (RTA) and heat-treated at a high temperature of 800 to 1000° C. for several tens of seconds. A silicon nitride film may be used as the insulating film 13a, and an LPCVD method may be used as the deposition method.

[Sixth Step]

Figure 61:
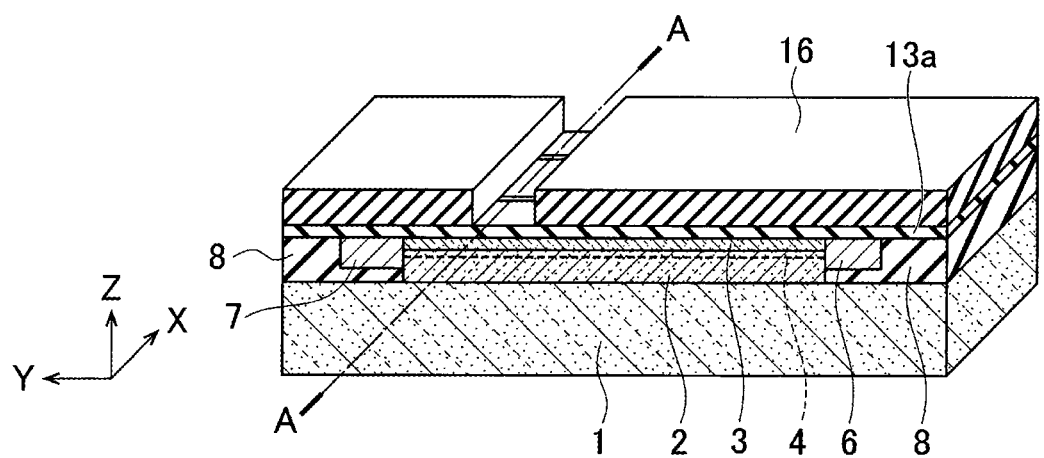
FIG. 61 is a perspective view illustrating the method for manufacturing the semiconductor device according to the modification 3 of the second embodiment.

Next, as shown in FIG. 61, the resist material 16 is formed on the insulating film 13a, and the gate electrode 5 is patterned.

Figure 62A:
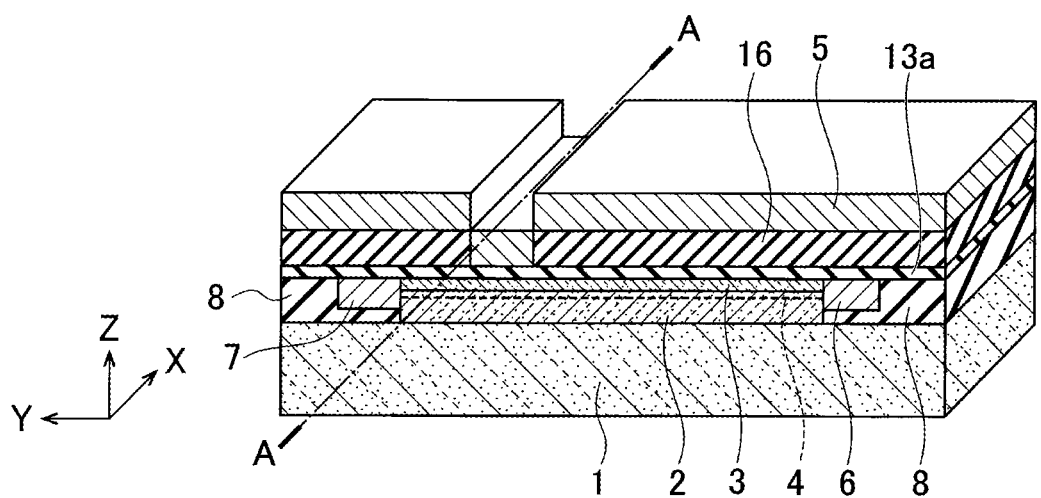
FIG. 62A is a perspective view illustrating the method for manufacturing the semiconductor device according to the modification 3 of the second embodiment.
Figure 62B:
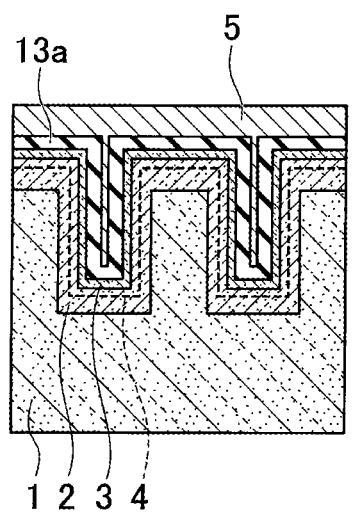
FIG. 62B is a sectional view along a section A-A in FIG. 62A.
Figure 63:
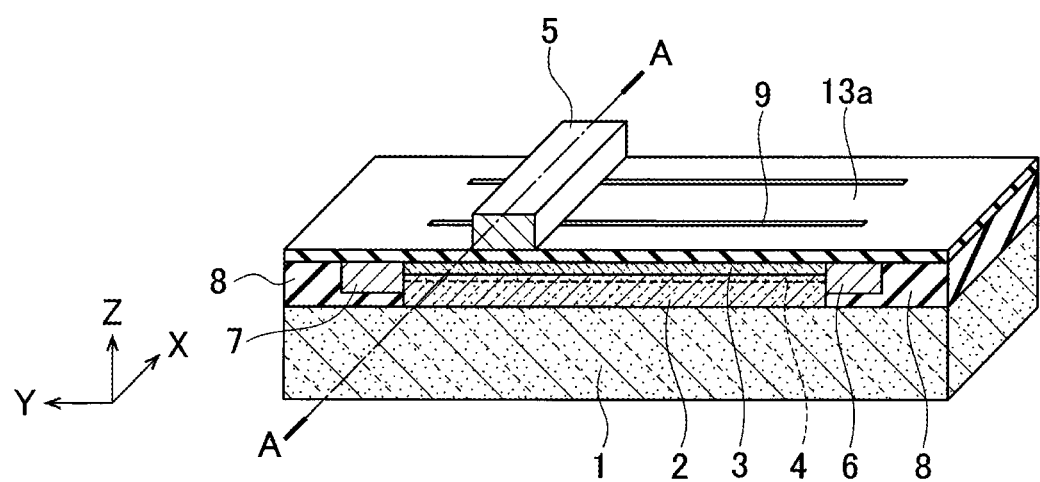
FIG. 63 is a perspective view illustrating the method for manufacturing the semiconductor device according to the modification 3 of the second embodiment.

Next, as shown in FIGS. 62A and 62B, a metal to be the gate electrode 5 is embedded using the vapor deposition method, the sputtering method, or the like.

Next, as shown in FIGS. 63A and 63B, the gate electrode 5 is formed by lifting off the electrode formed on the resist material 16 in an acetone solution.

[Seventh Step]

Figure 64A:
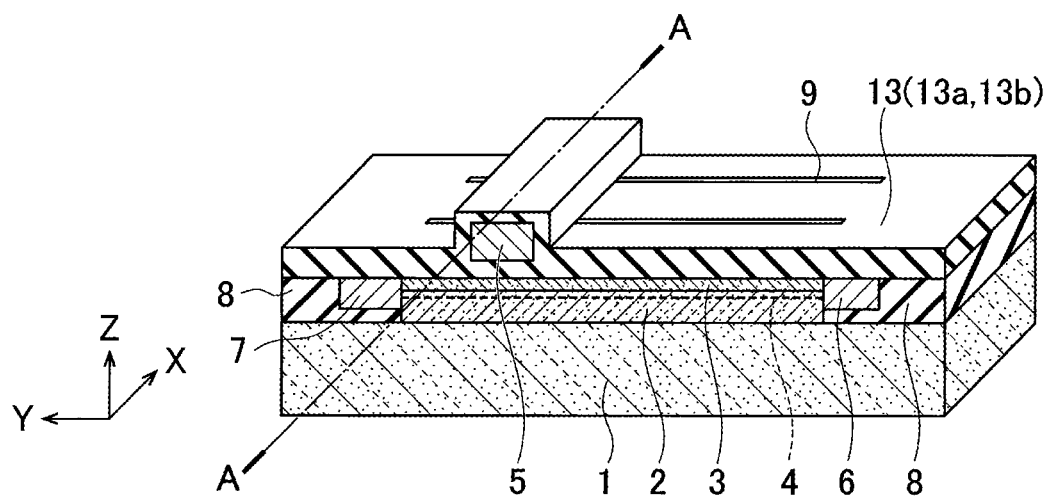
FIG. 64A is a perspective view illustrating the method for manufacturing the semiconductor device according to the modification 3 of the second embodiment.
Figure 64B:
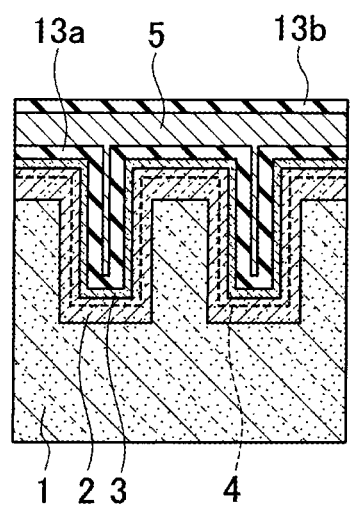
FIG. 64B is a sectional view along a section A-A in FIG. 64A.

Next, as shown in FIGS. 64A and 64B, an insulating film 13b is deposited on the electron supply region 3 and the gate electrode 5 to be used as a protective film, and the substrate 1 is moved to the rapid thermal processing apparatus (RTA) and heat-treated at a high temperature of 800 to 1000° C. for several tens of seconds. A silicon nitride film may be used as the insulating film 13b, and the LPCVD method may be used as the deposition method. The insulating film 13a is arranged under the gate electrode 5, and the insulating film 13b is arranged on the gate electrode 5. The insulating film 13a and the insulating film 13b constitute the insulating film 13.

Figure 65:
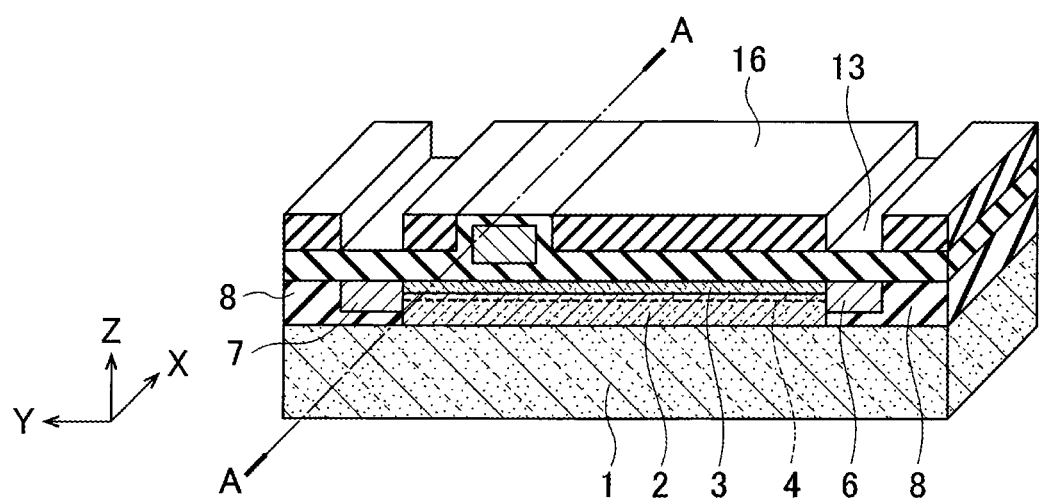

Next, as shown in FIG. 65, the resist material 16 is formed on the insulating film 13, and a pattern for electrically connecting to each of the cathode electrode 7, the anode electrode 6, and the gate electrode 5 is formed.

Figure 66A:
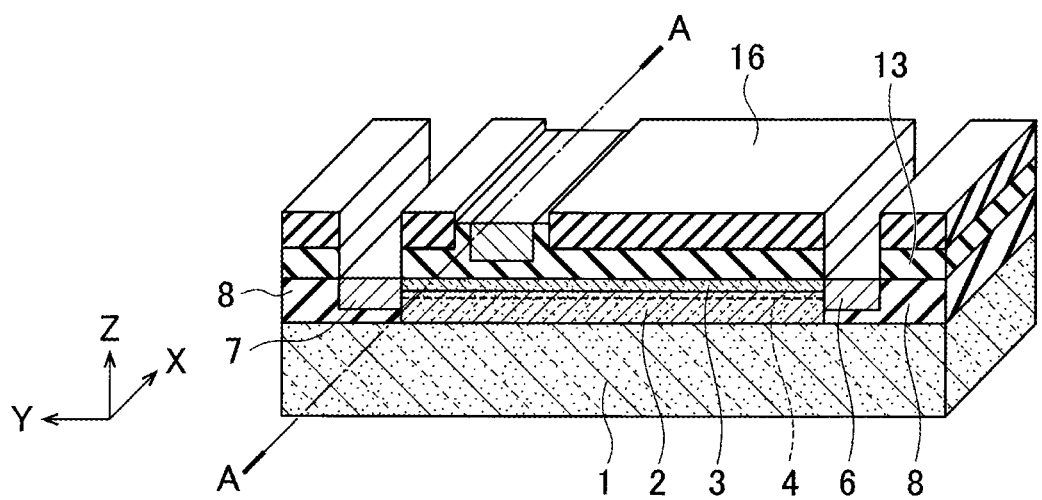
Figure 66B:
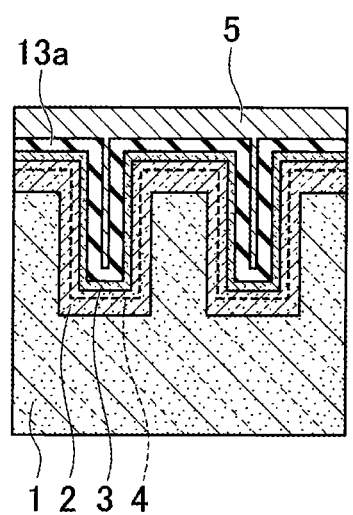

Next, as shown in FIGS. 66A and 66B, the insulating film 13 is removed by the dry etching method or the wet etching method using the resist material 16 as a mask. Hot phosphoric acid may be applied in the wet etching.

Figure 67A:
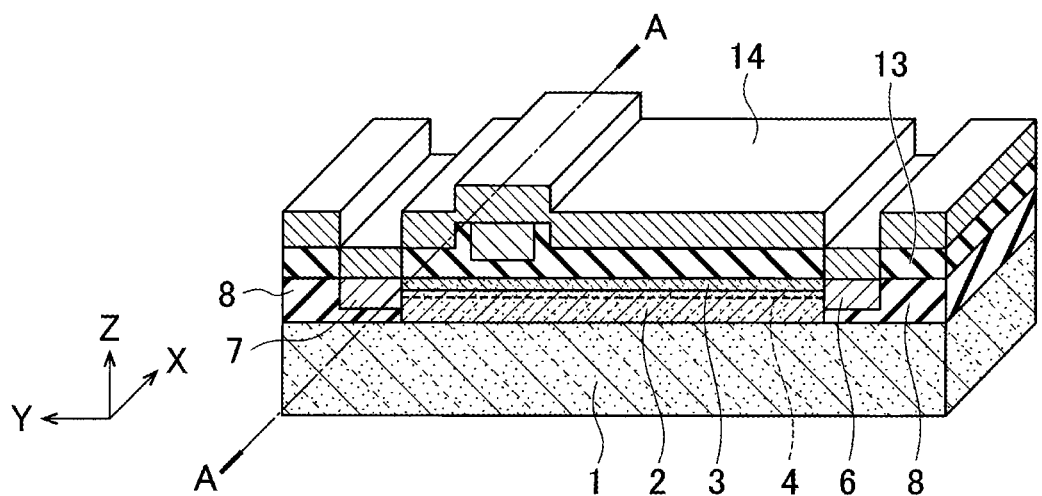
Figure 67B:
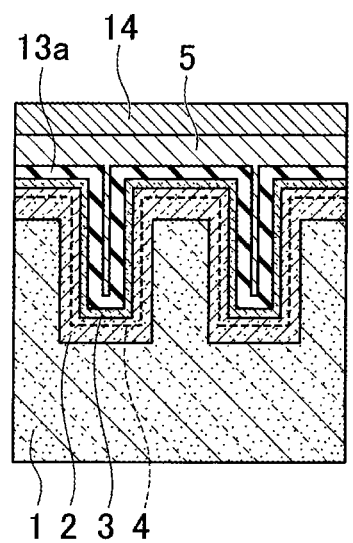

Next, as shown in FIGS. 67A and 67B, the resist material 16 is removed, and a metal to be the line electrode 14 is embedded using the vapor deposition method, the sputtering method, or the like.

Figure 68A:
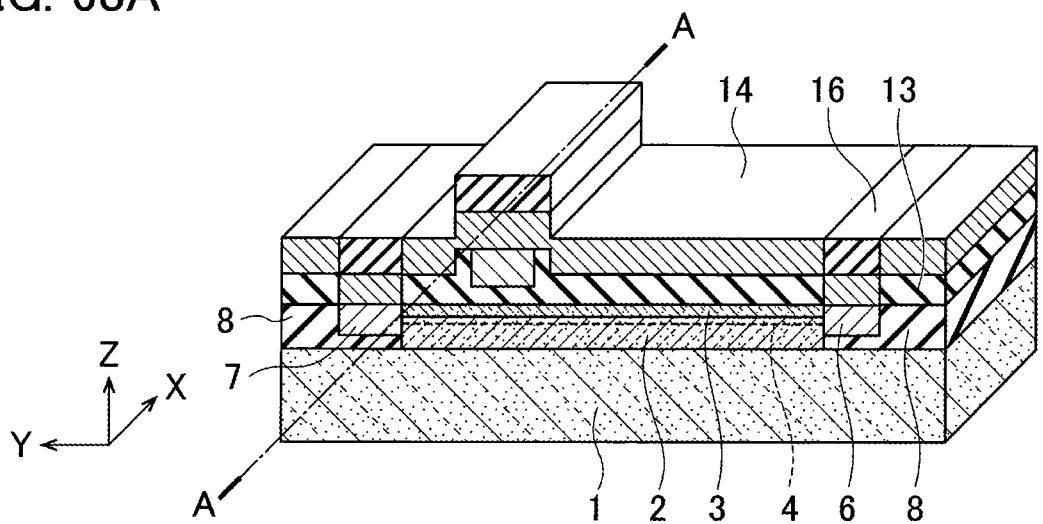
Figure 68B:
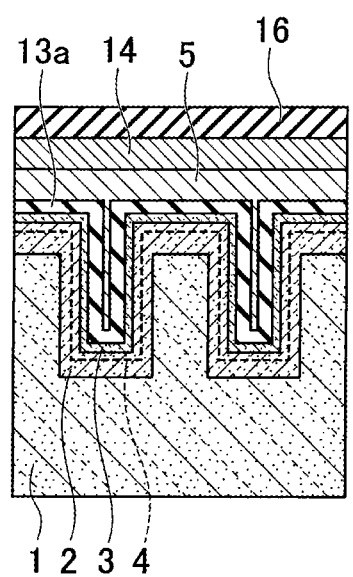

Next, as shown in FIGS. 68A and 68B, the line electrode 14 is patterned using the resist material 16. Finally, the resist material 16 is removed, and the line electrode 14 is formed as shown in FIGS. 55A to 55C.

[Effect of Semiconductor Device]

In the modification 3, the insulating film 13a is formed directly under the gate electrode 5. This makes the insulation between the electron supply region 3 and the gate electrode 5 high and reduces the leakage current when the gate voltage is increased, thereby achieving large current.

(Fourth Modification)

Next, a modification 4 of the second embodiment is described with reference to FIGS. 69A to 84B.

[Configuration of Semiconductor Device]

Figure 69A:
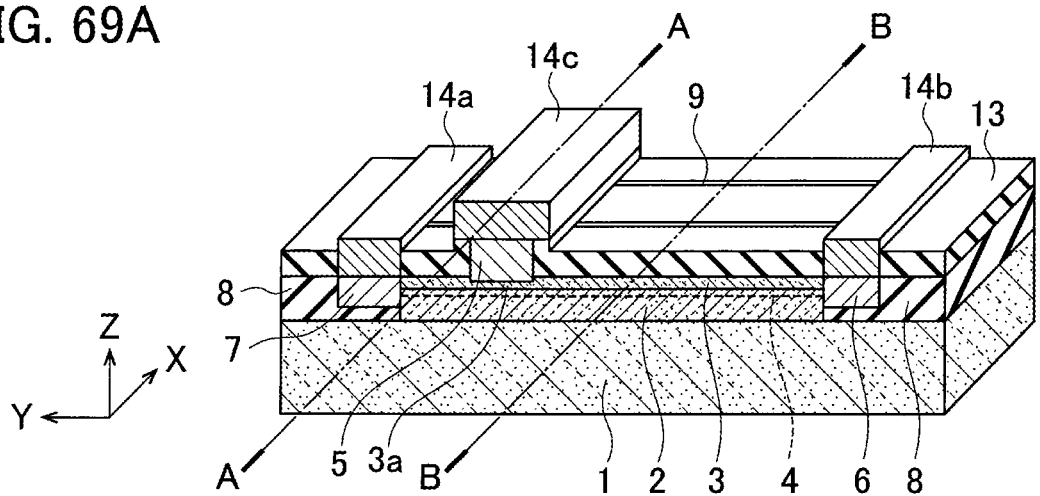
Figure 69B:
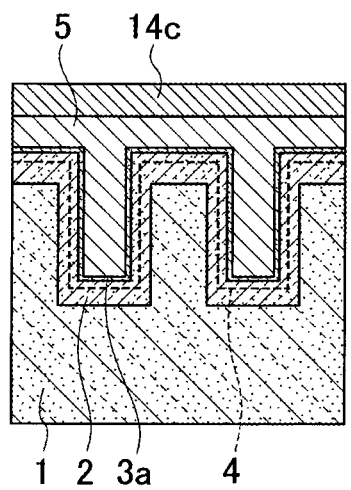
Figure 69C:
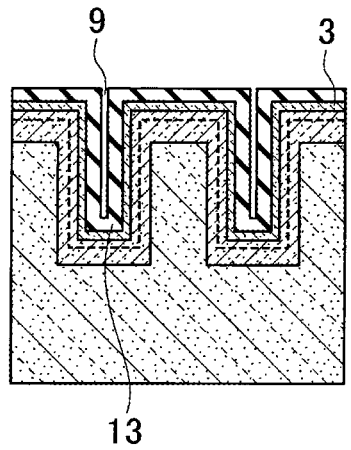

As shown in FIGS. 69A to 69C, in a semiconductor device according to the modification 4, the gate electrode 5 is formed between the source electrode 7 and the drain electrode 6 to get into the electron supply region 3. The electron supply region 3 in a region where the gate electrode 5 is stacked is formed thinner than that in a region where the gate electrode 5 is not stacked. The electron supply region 3 in the region where the gate electrode 5 is stacked has a concave shape. Other configurations are the same as those in the second embodiment. Further, the basic operation of the semiconductor device according to the modification 4 is the same as that in the second embodiment, and thus the description is omitted.

[Method for Manufacturing Semiconductor Device]

Next, an example of a method for manufacturing the semiconductor device according to the modification 4 is described. Since the first to fourth steps are the same as in the second embodiment, illustration and description are omitted. Moreover, in the same step, description of the same portion as that in the second embodiment is omitted.

[Fifth Step]

Figure 70A:
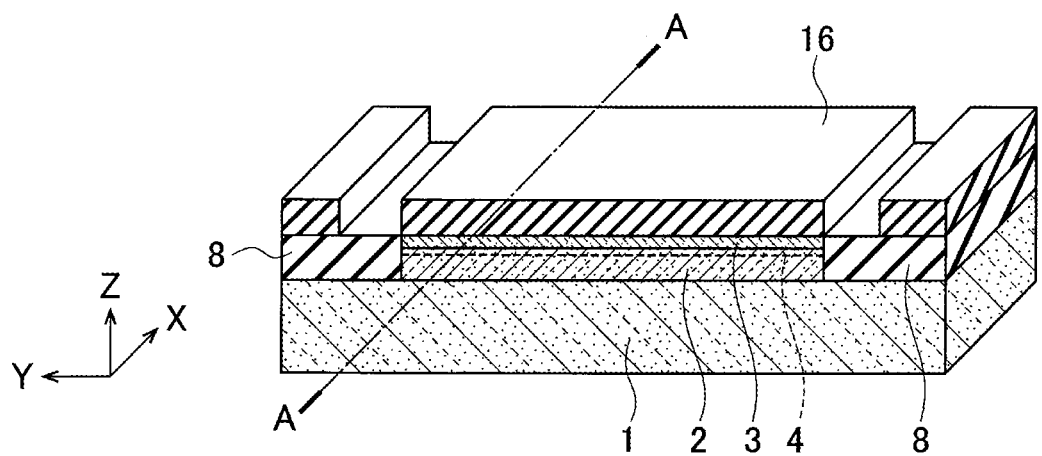
Figure 70B:
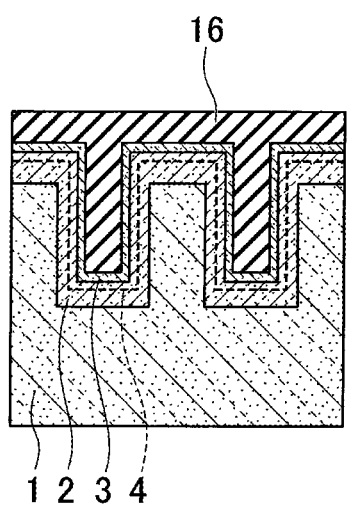

As shown in FIGS. 70A and 70B, the resist material 16 is formed on the electron supply region 3, and the source electrode 7 and the drain electrode 6 are patterned.

Next, as shown in FIG. 71, an electrode embedding pattern is formed by dry etching from the electron supply region 3 to the semiconductor region 2. The embedding depth is preferably several tens of nanometers.

Next, as shown in FIGS. 72A and 72B, a metal to be the source electrode 7 and the drain electrode 6 is embedded using a vapor deposition method, a sputtering method, or the like.

Next, as shown in FIGS. 73A and 73B, the source electrode 7 and the drain electrode 6 are formed by lifting off the metal formed on the resist material 16 in an acetone solution.

Next, as shown in FIGS. 74A and 74B, an insulating film 13 is deposited on the electron supply region 3 to be used as a protective film. The substrate 1 is moved to a rapid thermal processing apparatus (RTA) and heat-treated at a high temperature of 800 to 1000° C. for several tens of seconds. A silicon nitride film may be used as the insulating film 13, and an LPCVD method may be used as the deposition method.

[Sixth Step]

Next, as shown in FIG. 75, the resist material 16 is formed on the insulating film 13, and the gate electrode 5 is patterned.

Next, as shown in FIGS. 76A and 76B, the electron supply region 3 is etched at a portion where the gate electrode 5 is to be deposited by dry etching or wet etching.

Next, as shown in FIGS. 77A and 77B, the electron supply region 3 directly under the gate electrode 5 is etched to have a reduced film thickness. The film thickness of the electron supply region 3 directly under the gate electrode 5 is controlled by the etching. At this time, the etching amount (film thickness) of the electron supply region 3 is preferably several to several tens of nanometers.

Next, as shown in FIGS. 78A and 78B, a metal to be the gate electrode 5 is embedded using the vapor deposition method, the sputtering method, or the like.

Next, as shown in FIG. 79, the gate electrode 5 is formed by lifting off the electrode formed on the resist material 16 in an acetone solution.

[Seventh Step]

Next, as shown in FIGS. 80A and 80B, an insulating film 13 is deposited on the electron supply region 3 and the gate electrode 5 to be used as a protective film, and the substrate 1 is moved to the rapid thermal processing apparatus (RTA) and heat-treated at a high temperature of 800 to 1000° C. for several tens of seconds. A silicon nitride film may be used as the insulating film 13, and the LPCVD method may be used as the deposition method.

Next, as shown in FIG. 81, the resist material 16 is formed on the insulating film 13, and a pattern for electrically connecting to each of the cathode electrode 7, the anode electrode 6 and the gate electrode 5 is formed.

Next, as shown in FIG. 82, the insulating film 13 is removed by the dry etching method or the wet etching method using the resist material 16 as a mask. Hot phosphoric acid may be applied in the wet etching.

Next, as shown in FIGS. 83A and 83B, the resist material 16 is removed, and a metal to be the line electrode 14 is embedded using the vapor deposition method, the sputtering method, or the like.

Next, as shown in FIGS. 84A and 84B, the line electrode 14 is patterned using the resist material 16. Finally, the resist material 16 is removed, and the line electrode 14 is formed as shown in FIGS. 69A to 69C.

[Effect of Semiconductor Device]

In the modification 4, the gate electrode 5 gets into the electron supply region 3. As a result, the depletion layer of the gate electrode 5 affects the two-dimensional electron gas layer 4 formed at the interface between the electron supply region 3 and the semiconductor region 2, and thus the two-dimensional electron gas layer 4 directly under the gate electrode 5 is extinguished. Accordingly, normally-off is achieved.

(Fifth Modification)

Next, a modification 5 of the second embodiment is described with reference to FIGS. 85A to 103B.

[Configuration of Semiconductor Device]

As shown in FIGS. 85A to 85C, in a semiconductor device according to the modification 5, the gate electrode 5 is formed between the source electrode 7 and the drain electrode 6 and is formed with respect to the electron supply region 3 with a p-type semiconductor region 15 interposed therebetween. That is, in the modification 5, the p-type semiconductor region 15 is formed directly under the gate electrode 5, and the gate electrode 5 does not contact the electron supply region 3. The p-type semiconductor region 15 is arranged between the gate electrode 5 and the electron supply region 3. Other configurations are the same as those of the second embodiment. Further, the basic operation of the semiconductor device according to the modification 5 is the same as that in the second embodiment, and thus the description is omitted.

[Method for Manufacturing Semiconductor Device]

Next, an example of a method for manufacturing the semiconductor device according to the modification 5 is described. Since the first to fourth steps are the same as those in the second embodiment, description is omitted. Moreover, in the same step, description of the same portion as that in the first embodiment is omitted.

[Fifth Step]

As shown in FIGS. 86A and 86B, the resist material 16 is formed on the electron supply region 3, and the source electrode 7 and the drain electrode 6 are patterned.

Next, as shown in FIG. 87, an electrode embedding pattern is formed by dry etching from the electron supply region 3 to the semiconductor region 2. The embedding depth is preferably several tens of nanometers.

Next, as shown in FIGS. 88A and 88B, a metal to be the source electrode 7 and the drain electrode 6 is embedded using a vapor deposition method, a sputtering method, or the like.

Next, as shown in FIGS. 89A and 89B, the source electrode 7 and the drain electrode 6 are formed by lifting off the metal formed on the resist material 16 in an acetone solution.

Next, as shown in FIGS. 90A and 90B, an insulating film 13 is deposited on the electron supply region 3 to be used as a protective film. The substrate 1 is moved to a rapid thermal processing apparatus (RTA) and heat-treated at a high temperature of 800 to 1000° C. for several tens of seconds. A silicon nitride film may be used as the insulating film 13, and an LPCVD method may be used as the deposition method.

[Sixth Step]

Next, as shown in FIG. 91, the resist material 16 is formed on the insulating film 13, and the gate electrode 5 is patterned.

Next, as shown in FIGS. 92A and 92B, the insulating film 13 is patterned using the remaining resist material 16 as a mask to expose the electron supply region 3. The patterning may be performed by wet etching using hydrofluoric acid, or dry etching, such as reactive ion etching.

Next, as shown in FIGS. 93A and 93B, a gallium nitride layer not doped with impurities is grown on the substrate 1 by a thermal CVD method. Specifically, the substrate 1 is introduced into a MOCVD apparatus and heated to a predetermined temperature (for example, 600° C.). When the temperature is stabilized, the substrate 1 is rotated, and trimethylaluminum (TMA) as a raw material is introduced at a predetermined flow rate onto the surface of the substrate 1 to grow the gallium nitride layer not doped with impurities. Then, magnesium ions are implanted into the gallium nitride layer, and the gallium nitride layer is activated by heating at 900 to 1000° C. As a result, the p-type semiconductor region 15 made of p-type gallium nitride is formed. In addition, other than the ion implantation method, a gas containing magnesium may be input.

Next, as shown in FIGS. 94A and 94B, the resist material 16 is formed on a portion where the gate electrode 5 is to be formed, and patterning is performed.

Next, as shown in FIGS. 95A and 95B, the p-type semiconductor region 15 other than the portion where the gate electrode 5 is formed is removed by dry etching, and the resist material 16 is also removed.

Next, as shown in FIG. 96, the resist material 16 is formed on the portion other than the portion where the gate electrode 5 is to be formed, and patterning is performed.

Next, as shown in FIGS. 97A and 97B, a metal to be the gate electrode 5 is embedded using the vapor deposition method, the sputtering method, or the like.

Next, as shown in FIG. 98, the gate electrode 5 is formed by lifting off the electrode formed on a resist material 16 in an acetone solution.

[Seventh Step]

Next, as shown in FIGS. 99A and 99B, an insulating film 13 is deposited on the electron supply region 3 and the gate electrode 5 to be used as a protective film, and the substrate 1 is moved to the rapid thermal processing apparatus (RTA) and heat-treated at a high temperature of 800 to 1000° C. for several tens of seconds. A silicon nitride film may be used as the insulating film 13, and an LPCVD method may be used as the deposition method.

Next, as shown in FIG. 100, the resist material 16 is formed on the insulating film 13, and a pattern for electrically connecting to the cathode electrode 7, the anode electrode 6 and the gate electrode 5 is formed.

Next, as shown in FIGS. 101A and 101B, the insulating film 13 is removed by the dry etching method or the wet etching method using the resist material 16 as a mask. Hot phosphoric acid may be applied in the wet etching.

Next, as shown in FIGS. 102A and 102B, the resist material 16 is removed, and a metal to be the line electrode 14 is embedded using the vapor deposition method, the sputtering method, or the like.

Next, as shown in FIGS. 103A and 103B, the line electrode 14 is patterned using the resist material 16. Finally, the resist material 16 is removed, and the line electrode 14 is formed as shown in FIGS. 85A to 85C.

[Effect of Semiconductor Device]

In the modification 5, the p-type semiconductor region 15 is formed directly under the gate electrode 5. This raises the conductor level of the electron supply region 3 and the semiconductor region 2 and makes the conductor level of the two-dimensional electron gas layer 4 higher than the Fermi level. Accordingly, normally-off is achieved.

(Sixth Modification)

Next, a modification 6 of the second embodiment is described with reference to FIGS. 104A to 110.

[Configuration of Semiconductor Device]

As shown in FIGS. 104A to 104C, in a semiconductor device according to the modification 6, end portions of the main groove 9 have a radius of curvature. More specifically, on a side surface of the main groove 9, end portions along the extending direction of the main groove 9 each have a radius of curvature greater than the thickness of the electron supply region 3 when viewed in the extending direction of the main groove 9. The end portions of the side surface of the main groove 9 include an end portion of the side surface of the main groove 9 that intersects the bottom surface of the main groove 9 and an end portion of the side surface of the main groove 9 that intersects the main surface of the substrate 1. In a cut surface (XZ plane) perpendicular to the extending direction (Y direction) of the main groove 9, the end portions of the main groove 9 each have the radius of curvature greater than the thickness of the electron supply region 3.

For this reason, portions of the semiconductor region 2, the electron supply region 3, the gate electrode 5, and the insulating film 13 stacked on the surface of the main groove 9 corresponding to the end portions of the side surface of the main groove 9 each have a radius of curvature greater than that of the semiconductor device according to the second embodiment. Other configurations are the same as those in the second embodiment. Further, the basic operation of the semiconductor device according to the modification 6 is the same as that in the first embodiment, and thus the description is omitted.

[Method for Manufacturing Semiconductor Device]

Next, an example of a method for manufacturing the semiconductor device according to the modification 6 is described. Since the second to seventh steps are the same as those in the second embodiment, illustration and description are omitted. Moreover, in the same step, description of the same portion as that in the second embodiment is omitted.

[First Step]

First, as shown in FIGS. 105A and 105B, an insulating film 31 is formed on the main surface of the substrate 1 as a mask material for forming the main grooves 9. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main grooves 9 are a silicon crystal face. Note that the silicon crystal face is (111) face.

Next, as shown in FIGS. 106A and 106B, a resist material 20 is applied to the upper surface of the insulating film 31 by a photolithography method, and regions where the main grooves 9 are to be formed are selectively removed. That is, the resist material 20 is patterned into a shape with openings in the regions where the main grooves 9 are to be formed.

Next, as shown in FIGS. 107A and 107B, the insulating film 31 is patterned using the remaining resist material 20 as a mask. Patterning may be performed by wet etching using hydrofluoric acid, or dry etching, such as reactive ion etching.

After the patterning of the insulating film 31 is completed, as shown in FIGS. 108A and 108B, the resist material 20 is removed by oxygen plasma, sulfuric acid, or the like.

Next, as shown in FIGS. 109A and 109B, using the patterned insulating film 31 as a mask, the main grooves 9 are formed in the main surface of the substrate 1 by a dry etching method. More specifically, the main grooves 9 each extending in a direction (Y-axis direction) along the main surface of the substrate 1 are formed. The main groove 9 is formed to have the aspect ratio of the depth to the width of the main groove 9 greater than or equal to 1. For example, the main groove 9 has a width of about 20 μm and a depth of about 500 μm.

Next, as shown in FIG. 110, the main grooves 9 each having a radius of curvature greater than or equal to a predetermined value are formed by heat-treating the substrate 1 on which the main grooves 9 are formed. Conditions of the heat treatment are, for example, 1100 to 1300° C. in an inert gas atmosphere, and 10 to 30 minutes of annealing time. The radius of curvature of each end portion of the main groove 9 is greater than the film thickness of the electron supply region 3 formed in the second step.

[Effect of Semiconductor Device]

In the modification 6, the end portions on the side surface of the main groove 9 along the extending direction of the main groove 9 have a radius of curvature greater than the thickness of the electron supply region 3 when viewed in the extending direction of the main groove 9. Accordingly, the distance between the semiconductor region 2 and the electron supply region 3 is kept constant at the corner parts of the main surface of the substrate 1 in which the main groove 9 is formed and the bottom surface of the main groove 9. This makes the concentration of the two-dimensional electron gas layer 4 uniform. As a result, electric field concentration is less likely to occur, and a high withstand voltage is achieved.

(Seventh Modification)

Next, a modification 7 of the second embodiment is described with reference to FIGS. 111A to 113B.

[Configuration of Semiconductor Device]

As shown in FIGS. 111A to 111C, in a semiconductor device according to the modification 7, the electron supply region 3 is selectively formed on a surface of the semiconductor region 2 opposite to the side surfaces of the main groove 9. That is, the electron supply region 3 is formed only on the side surfaces of the main groove 9. The electron supply region 3 is not formed on the main surface of the substrate 1 and the bottom surface of the main groove 9. Other configurations are the same as those in the second embodiment. Further, the basic operation of the semiconductor device according to the modification 7 is the same as that in the second embodiment, and thus the description is omitted.

[Method for Manufacturing Semiconductor Device]

Next, an example of a method for manufacturing the semiconductor device according to the modification 7 is described. Since the first to second steps and the fourth to seventh steps are the same as those in the second embodiment, description is omitted. Moreover, in the same step, description of the same portion as that in the second embodiment is omitted.

[Third Step]

As shown in FIGS. 112A and 112B, the electron supply region 3 made of aluminum gallium nitride (AlGaN) is formed by a method similar to the method described in the second step. The film thickness of the electron supply region 3 is preferably several to several tens of nanometers.

Next, as shown in FIGS. 113A and 113B, the electron supply region 3 is etched by performing directional etching by dry etching using a high-density plasma etching apparatus, such as RIE (Reactive Ion Etching), ECR (Electron Cyclotron Resonance), or ICP (Inductively Coupled Plasma). The electron supply region 3 formed on the main surface of the substrate 1 and the bottom surface of the main groove 9 is etched, which lefts the electron supply region 3 on the side surfaces of the main groove 9.

[Effect of Semiconductor Device]

In the modification 7, the electron supply region 3 is selectively formed only on the side surfaces of the main groove 9. Since the electron supply region 3 is not formed on the main surface of the substrate 1 and the bottom surface of the main groove 9, non-uniform concentration of the two-dimensional electron gas layer 4 on the main surface of the substrate 1 and the bottom surface of the main groove 9 is suppressed. This prevents a decrease in withstand voltage.

(Eighth Modification)

Next, a modification 8 of the second embodiment is described with reference to FIGS. 114A to 126C.

[Configuration of Semiconductor Device]

As shown in FIGS. 114A to 114D, in a semiconductor device according to the modification 8, electrode grooves 17 are formed in contact with the main grooves 9, and the source electrode 7 and the drain electrode 6 are embedded in the electrode grooves 17. In the eighth modification, as shown in FIG. 114D, electrode grooves 17 are formed in contact with one end of the main grooves 9, and the drain electrode 6 is embedded in the electrode grooves 17. Although not shown, electrode grooves 17 are formed in contact with the other end of the main grooves 9, and the source electrode 7 is embedded in the electrode grooves 17. Electrode grooves 17 may be formed in contact with only one end of the main grooves 9, and only one of the source electrode 7 and the drain electrode 6 may be embedded in the electrode grooves 17. A crystal face different from the side surfaces of the main groove 9 is exposed on the side surfaces of the electrode groove 17. That is, a crystal face different from the (111) crystal face is exposed on the side surfaces of the electrode groove 17.

As shown in FIG. 114D, an insulating film 13b is formed in a region including the side surfaces and the bottom surface of each of the electrode groove 17, and the source electrode 7 and the drain electrode 6 are electrically insulated from the substrate 1 by the insulating film 13b and an element isolation region 8. Other configurations are the same as those in the second embodiment. Further, the basic operation of the semiconductor device according to the modification 8 is the same as that in the second embodiment, and thus the description is omitted.

[Method for Manufacturing Semiconductor Device]

Next, an example of a method for manufacturing the semiconductor device according to the modification 8 is described. Since the fifth to seventh steps are the same as those in the second embodiment, description is omitted. Moreover, in the same step, description of the same portion as that in the second embodiment is omitted.

[First Step]

First, as shown in FIGS. 115A and 115B, an insulating film 31 is formed on the main surface of the substrate 1 as a mask material for forming the main grooves 9 and the electrode grooves 17. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main grooves 9 are a silicon crystal face.

Next, as shown in FIGS. 116A and 116B, a resist material 20 is applied to the upper surface of the insulating film 31 by a photolithography method, and regions where the main grooves 9 and the electrode grooves 17 are to be formed are selectively removed. That is, the resist material 20 is patterned into a shape with openings in the regions where the main grooves 9 and the electrode grooves 17 are to be formed.

Next, as shown in FIGS. 117A and 117B, the insulating film 31 is patterned using the remaining resist material 20 as a mask. Patterning may be performed by wet etching using hydrofluoric acid, or dry etching, such as reactive ion etching.

After the patterning of the insulating film 31 is completed, as shown in FIGS. 118A and 118B, the resist material 20 is removed by oxygen plasma, sulfuric acid, or the like.

Next, as shown in FIGS. 119A and 119B, using the patterned insulating film 31 as a mask, the main grooves 9 and the electrode grooves 17 are simultaneously formed in the main surface of the substrate 1 by a dry etching method. More specifically, the main grooves 9 each extending in a direction (Y-axis direction) along the main surface of the substrate 1 and the electrode grooves 17 in contact with both ends of the main grooves 9 are formed. The main groove 9 is formed to have the aspect ratio of the depth to the width of the main groove 9 greater than or equal to 1. For example, the main groove 9 has a width of about 20 μm and a depth of about 500 μm. Note that the crystal face that appears on the side surfaces of the main groove 9 is (111) face. On the other hand, the side surfaces of the electrode groove 17 are not parallel to the side surfaces of the main groove 9 but are inclined with respect to the side surfaces of the main groove 9. For this reason, the crystal face exposed on the side surfaces of the electrode groove 17 is a crystal face different from the (111) face. The electrode groove 17 and the main groove 9 are equal in depth. The width of the electrode groove 17 in the X direction increases as it goes away from the main groove 9. A crystal face different from the (111) face may be exposed on the side surfaces of the electrode groove 17 by decreasing the width in the X direction of the electrode groove 17 as it goes away from the main groove 9.

[Second Step]

Next, as shown in FIGS. 120A to 120C, a buffer layer is grown by a thermal CVD method on the substrate 1 on which the main grooves 9 are formed. Specifically, the substrate 1 is introduced into a MOCVD apparatus and heated to a predetermined temperature (for example, 600° C.). When the temperature is stabilized, the substrate 1 is rotated, and trimethylaluminum (TMA) as a raw material is introduced at a predetermined flow rate onto the surface of the substrate 1 to grow the buffer layer. The film thickness of the buffer layer is several hundreds of nanometers. Then, gallium nitride (GaN) that is not doped with impurities is deposited on the buffer layer, thereby forming the semiconductor region 2 including the buffer layer and the non-doped gallium nitride layer. The film thickness of the non-doped gallium nitride layer is determined by a required withstand voltage value and is described as, for example, 5 µm in the present embodiment.

[Third Step]

Next, as shown in FIGS. 121A to 121C, the electron supply region 3 made of aluminum gallium nitride (AlGaN) is formed by a method similar to the method described in the second step. The film thickness of the electron supply region 3 is preferably several to several tens of nanometers.

Note that in semiconductor crystal growth, it is possible to control crystal growth based on the form of the growth surface. For example, the crystal face exposed on the side surfaces of the main grooves 9 and that exposed on the side surfaces of the electrode grooves 17 are made different. Accordingly, the semiconductor region 2 and the electron supply region 3 are selectively grown only on the surface of the main grooves 9 without growing the semiconductor region 2 and the electron supply region 3 on the surface of the electrode grooves 17 including the side surfaces and the bottom surface of the electrode grooves 17.

[Fourth Step]

Next, as shown in FIG. 122, the substrate 1 is heated to 700° C. to 1100° C. in an oxygen atmosphere, and an insulating film 13b made of a silicon oxide film is selectively formed on the surface of the electrode grooves 17 where the substrate 1 (silicon) is exposed. The insulating film 13b is not formed on the surface of the main grooves 9 and the main surface of the substrate 1 where the semiconductor region 2 and the electron supply region 3 are formed.

Next, as shown in FIGS. 123A to 123C, an insulating film 39 as a mask material is formed on the electron supply region 3 and the insulating film 13b. A silicon oxide film may be used as the insulating film 39, and the thermal CVD method or the plasma CVD method may be used as the deposition method.

Next, as shown in FIGS. 124A and 124B, a resist material 16 is formed on the insulating film 39, and an element isolation area is patterned.

Next, as shown in FIGS. 125A and 125B, an element isolation region 8 is provided by implanting argon ions by an ion implantation method, and element isolation is performed. Note that although the ion implantation method is used in the present modification, the substrate 1 having a mesa structure formed by the dry etching method using a patterned mask material may be used.

Next, as shown in FIGS. 126A to 126C, the resist material 16 is removed with oxygen plasma, sulfuric acid, or the like. Moreover, the insulating film 39 is removed by wet etching using hydrofluoric acid, or dry etching, such as reactive ion etching.

Then, the fifth to seventh steps of the second embodiment described with reference to FIGS. 41A to 54B are performed, and thus the semiconductor device according to the modification 8 shown in FIGS. 114A to 114D is completed.

[Effect of Semiconductor Device]

In the modification 8, the source electrode 7 and the drain electrode 6 are embedded in the electrode grooves 17. As a result, the source electrode 7 and the drain electrode 6 are formed in direct contact with not only the two-dimensional electron gas layer 4 formed on the main surface of the substrate 1 but also the two-dimensional electron gas layer 4 formed on the surface (side surfaces and bottom surface) of the main grooves 9. Therefore, the source electrode 7 and the drain electrode 6 can extract current while maintaining the channel density in the two-dimensional electron gas layer 4, which achieves large current and low contact resistance.

By forming the electrode grooves 17 having a crystal face different from that of the main grooves 9 for crystal growth, a region in which crystal growth is intentionally not performed is formed. As a result, the semiconductor region 2 and the electron supply region 3 are exposed at the boundary between the main grooves 9 and the electrode grooves 17. By forming an electrode in the electrode grooves 17, a good ohmic contact is obtained with the two-dimensional electron gas layer. This provides a semiconductor device reducing the on-resistance.

In the fifth step of the second embodiment (FIGS. 42A and 42B), the electrode embedding pattern (etching process) of the source electrode 7 and the drain electrode 6 is formed to a depth of several tens of nanometers. It is difficult to form this etching pattern as deep as the main grooves 9. In the first step, electrode grooves 17 having a crystal face, on which AlGaN (electron supply region 3)/GaN (semiconductor region 2) are not formed, exposed on the side surfaces thereof are formed simultaneously with the main grooves 9. As a result, the source electrode 7 and the drain electrode 6 are formed in direct contact with the two-dimensional electron gas layer 4 formed on the surface of the main grooves 9 without forming the electrode embedding pattern as deep as the main grooves 9 in the fifth step.

(Ninth Modification)

Next, with reference to FIG. 127, a modification 9 of the second embodiment is described. The modification 9 includes at least two semiconductor devices (first semiconductor device and second semiconductor device). The two semiconductor devices may include the semiconductor device according to the second embodiment, and/or the semiconductor device according to the modifications 1 to 8. Further, they may include a semiconductor device according to a third embodiment or that according to a fourth embodiment which will be described later. Further, the two semiconductor devices may be the same or different. The number of semiconductor devices may not be limited to two, and three or more semiconductor devices (third semiconductor device . . . ) may be provided.

FIG. 127 shows an example including three semiconductor devices according to the second embodiment. In the modification 9, the source electrode 7 or the drain electrode 6 is shared with an adjacent semiconductor device, and thus the electrode used in the semiconductor device can be half of a single unit. As a result, the area efficiency of the substrate 1 is improved, and large current is achieved.

(Tenth Modification)

Semiconductor devices according to modifications 10 to 12 of the second embodiment each include a stress relaxation structure that relaxes the stress applied to at least one of the electron supply region 3 and the semiconductor region 2 in the extending direction (Y direction) of the main grooves 9. First, a stress relaxation structure according to the modification 10 of the second embodiment is described with reference to FIGS. 128A to 138C.

[Configuration of Semiconductor Device]

As shown in FIGS. 128A to 128E, the stress relaxation structure according to the modification 10 is a relaxation insulating film 21*a* and a relaxation insulating film 21*b* formed in contact with the surface of the main grooves 9 outside a region between the source electrode 7 and the drain electrode 6. The relaxing insulating film 21*a* and the relaxing insulating film 21*b* are formed outside a channel region connecting the source electrode 7 and the drain electrode 6.

As shown in FIG. 128C, the relaxation insulating film 21*b* is formed on the surface of the substrate 1 and the side surfaces and the bottom surface of the main grooves 9, and the electron supply region 3 and the semiconductor region 2 are not provided between the relaxation insulating film 21*b* and the substrate 1. Although not shown, the same applies to the relaxing insulating film 21*a*. As described above, the relaxing insulating film 21*a* and the relaxing insulating film 21*b* extend in a direction (X direction) perpendicular to the extending direction of the main grooves 9 outside the region between the source electrode 7 and the drain electrode 6 and cut off the electron supply region 3 and the semiconductor region 2 that are continuously formed along the extending direction (Y direction) of the main grooves 9. Other configurations are the same as those in the second embodiment. Further, the basic operation of the semiconductor device according to the modification 10 is the same as that in the second embodiment, and thus the description is omitted.

Note that the modification 10 shows an example in which both the relaxation insulating film 21*a* and the relaxation insulating film 21*b* are formed. However, only one of the relaxing insulating film 21*a* and the relaxing insulating film 21*b* may be formed. Moreover, the modification 10 shows an example in which one relaxation insulating film 21*a* and one relaxation insulating film 21*b* are formed. However, multiple independent relaxation insulating films 21*a* may be formed outside the source electrode 7. Moreover, multiple independent relaxation insulating films 21*b* may be formed outside the drain electrode 6.

[Method for Manufacturing Semiconductor Device]

Next, an example of a method for manufacturing the semiconductor device according to the modification 10 is described. Since the fourth to seventh steps are the same as those in the second embodiment, illustration and description are omitted. Moreover, in the same step, description of the same portion as that in the second embodiment is omitted.

[First Step]

First, as shown in FIGS. 129A and 129B, an insulating film 31 is formed on the main surface of the substrate 1 as a mask material for forming the main grooves 9. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main grooves 9 are a silicon crystal face.

Next, as shown in FIGS. 130A and 130B, a resist material 20 is applied to the upper surface of the insulating film 31 by a photolithography method, and regions where the main grooves 9 are to be formed are selectively removed.

Next, as shown in FIGS. 131A and 131B, the insulating film 31 is patterned using the remaining resist material 20 as a mask. Patterning may be performed by wet etching using hydrofluoric acid, or dry etching, such as reactive ion etching.

After the patterning of the insulating film 31 is completed, as shown in FIGS. 155A and 155B, the resist material 20 is removed by oxygen plasma, sulfuric acid, or the like.

Next, as shown in FIGS. 133A and 133B, using the patterned insulating film 31 as a mask, the main grooves 9 are formed in the main surface of the substrate 1 by dry etching. More specifically, the main grooves 9 each extending in a direction (Y-axis direction) along the main surface of the substrate 1 are formed. The main groove 9 is formed to have the aspect ratio of the depth to the width of the main groove 9 greater than or equal to 1. For example, the main groove 9 has a width of about 20 μm and a depth of about 500 μm.

The length of the main groove 9 in the extending direction (Y direction) is greater than the length of the main groove 9 in FIGS. 34A and 34B. The openings in FIGS. 34A and 34B are formed in the channel region, which is the region between the source electrode 7 and the drain electrode 6. On the other hand, the main grooves 9 in FIGS. 133A and 133B are formed in the region where the source electrode 7 and the drain electrode 6 are formed, and also formed outside the region between the source electrode 7 and the drain electrode 6, that is, in the region where the relaxation insulating films 21*a* and 21*b* are formed.

Next, as shown in FIGS. 134A and 134B, the substrate 1 is thermally oxidized to form an insulating film 21 on the side surfaces and the bottom surface of the main grooves 9 and the surface of the substrate 1. The insulating film 21 is, for example, a silicon oxide film ($SiO_2$ film).

Next, as shown in FIGS. 135A to 135C, a resist material 16 is applied to the upper surface of the insulating film 21 by a photolithography method. The resist material 16 in the region where the relaxation insulating films 21*a* and 21*b* are to be formed is left, and the other resist material 16 is selectively removed. That is, the resist material 16 is patterned in accordance with the region where the relaxation insulating films 21*a* and 21*b* are formed.

Next, as shown in FIGS. 136A to 136C, the insulating film 21 is etched by a dry etching method using the patterned resist material 16 as a mask to form the relaxation insulating films 21*a* and 21*b*. As the etching method, wet etching using hydrofluoric acid, or dry etching, such as reactive ion etching, may be used. Then, the resist material 16 is removed by oxygen plasma, sulfuric acid, or the like. The relaxation insulating films 21*a* and 21*b* are thus formed at both ends of the main grooves 9 in the extending direction.

[Second Step]

Next, as shown in FIGS. 137A to 137C, a buffer layer is grown by a thermal CVD method on the substrate 1 on which the main grooves 9 are formed. Specifically, the substrate 1 is introduced into a MOCVD apparatus and heated to a predetermined temperature (for example, 600° C.). When the temperature is stabilized, the substrate 1 is rotated, and trimethylaluminum (TMA) as a raw material is introduced at a predetermined flow rate onto the surface of the substrate 1 to grow the buffer layer. The film thickness of the buffer layer is several hundreds of nanometers. Then, gallium nitride (GaN) that is not doped with impurities is deposited on the buffer layer, thereby forming the semiconductor region 2 including the buffer layer and the non-doped gallium nitride layer. The film thickness of the non-doped gallium nitride layer is determined by a required withstand voltage value and is described as, for example, 5 μm in the present modification.

At this time, the semiconductor region 2 is not formed in the region where the relaxation insulating films 21*a* and 21*b* are formed. That is, the semiconductor region 2 does not grow on the relaxation insulating films 21*a* and 21*b*.

[Third Step]

Next, as shown in FIGS. 138A to 138C, the electron supply region 3 made of aluminum gallium nitride (AlGaN) is formed by a method similar to the method described in the second step. The film thickness of the electron supply region 3 is preferably several to several tens of nanometers.

At this time, the electron supply region 3 is not formed in the region where the relaxation insulating films 21*a* and 21*b* are formed. That is, the electron supply region 3 is not formed on the relaxation insulating films 21*a* and 21*b*.

Then, the fourth to seventh steps of the second embodiment described with reference to FIGS. 37A to 54B are performed, and thus the semiconductor device according to the modification 10 shown in FIGS. 128A to 128E is completed.

[Effect of Semiconductor Device]

The semiconductor device according to the modification 10 has a stress relaxation structure that relaxes the stress applied to at least one of the semiconductor region 2 and the electron supply region 3 in the extending direction of the main grooves 9. The stress in the extending direction of the main grooves 9 during crystal growth of the semiconductor region 2 and the electron supply region 3 is relaxed, and film cracking is prevented. As a result, the substrate 1 of high quality is obtained without reducing the channel density, and the semiconductor device achieving large current is provided.

The stress relaxation structure according to the modification 10 includes the relaxation insulating films 21*a* and 21*b* formed in contact with the surface of the main grooves 9 outside the region between the source electrode 7 and the drain electrode 6. By providing the relaxation insulating films 21*a* and 21*b*, a region where the semiconductor region 2 and the electron supply region 3 do not grow is formed. That is, the relaxation insulating films 21*a* and 21*b* cut off the electron supply region 3 and the semiconductor region 2 that are continuously formed along the extending direction (Y direction) of the main grooves 9. Therefore, the stress in the extending direction of the main grooves 9 is relaxed.

(Eleventh Modification)

Next, a stress relaxation structure according to a modification 11 of the second embodiment is described with reference to FIGS. 139A to 146B.

[Configuration of Semiconductor Device]

As shown in FIGS. 139A to 139E, the stress relaxation structure according to the modification 11 is cross grooves 18 that intersect the main grooves 9 outside the region between the source electrode 7 and the drain electrode 6. The cross grooves 18 are formed outside the channel region connecting the source electrode 7 and the drain electrode 6. The cross grooves 18 are each a groove extending in a direction (X direction) perpendicular to the extending direction (Y direction) of the main grooves 9, and the depth thereof is the same as or deeper than the main grooves 9. On the side surfaces of cross grooves 18, a crystal face different from the side surfaces of the main grooves 9 is exposed. An insulating film 18 is formed on the side surfaces and the bottom surface of the cross grooves 18, but the semiconductor region 2 and the electron supply region 3 are not formed thereon.

As described above, the cross grooves 18 extend in the direction (X direction) perpendicular to the extending direction of the main grooves 9 outside the region between the source electrode 7 and the drain electrode 6, and cut off the electron supply region 3 and the semiconductor region 2 that are continuously formed along the extending direction of the main grooves (Y direction). Other configurations are the same as those in the second embodiment. Further, the basic operation of the semiconductor device according to the modification 11 is the same as that in the second embodiment, and thus the description is omitted.

Note that although the modification 11 shows an example in which the cross grooves 18 are formed on both sides outside the source electrode 7 and the drain electrode 6, only one of them may be formed. Moreover, the modification 11 shows an example in which one cross groove 18 is formed on each side outside the source electrode 7 and the drain electrode 6. However, multiple independent cross grooves 18 may be formed. Furthermore, the relaxation insulating films 21*a* and 21*b* of the modification 10 and the intersecting grooves 18 of the modification 11 may be combined. That is, the relaxation insulating films (21*a*, 21*b*) and the cross grooves 18 extending in the X direction may be formed outside the region between the source electrode 7 and the drain electrode 6.

[Method for Manufacturing Semiconductor Device]

Next, an example of a method for manufacturing the semiconductor device according to the modification 11 is described. Since the fourth to seventh steps are the same as in the second embodiment, illustration and description are omitted. Moreover, in the same step, description of the same portion as that in the second embodiment is omitted.

[First Step]

First, as shown in FIGS. 140A and 140B, an insulating film 31 is formed on the main surface of the substrate 1 as a mask material for forming the main grooves 9 and the cross grooves 18. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main grooves 9 are a silicon crystal face.

Next, as shown in FIGS. 141A and 141B, a resist material 20 is applied to the upper surface of the insulating film 31 by a photolithography method, and regions where the main grooves 9 and the cross grooves 18 are to be formed are selectively removed. That is, the resist material 20 is patterned into a shape with openings in regions where the main grooves 9 and the cross grooves 18 are to be formed.

Next, as shown in FIGS. 142A to 142C, the insulating film 31 is patterned using the remaining resist material 20 as a mask. Patterning may be performed by wet etching using hydrofluoric acid, or dry etching, such as reactive ion etching.

After the patterning of the insulating film 31 is completed, as shown in FIGS. 143A and 143B, the resist material 20 is removed by oxygen plasma, sulfuric acid, or the like.

Next, as shown in FIGS. 144A to 144C, using the patterned insulating film 31 as a mask, the main grooves 9 and the cross grooves 18 are simultaneously formed in the main surface of the substrate 1 by a dry etching method. The cross groove 18 is formed to have the aspect ratio of the depth to the width of the cross groove 18 greater than or equal to 1. For example, the cross groove 18 has a depth of about 500 μm. Here, an example in which the main grooves 9 and the cross grooves 18 are formed simultaneously is shown, but the main grooves 9 and the cross grooves 18 may be formed in different steps.

[Second Step]

Next, as shown in FIGS. 145A and 145B, a buffer layer is grown by a thermal CVD method on the substrate 1 on which the main grooves 9 are formed. Specifically, the substrate 1 is introduced into a MOCVD apparatus and heated to a predetermined temperature (for example, 600° C.). When the temperature is stabilized, the substrate 1 is rotated, and trimethylaluminum (TMA) as a raw material is introduced at a predetermined flow rate onto the surface of the substrate 1 to grow the buffer layer. The film thickness of the buffer layer is several hundreds of nanometers. Then, gallium nitride (GaN) that is not doped with impurities is deposited on the buffer layer, thereby forming the semiconductor region 2 including the buffer layer and the non-doped gallium nitride layer. The film thickness of the non-doped gallium nitride layer is determined by a required withstand voltage value and is described as, for example, 5 µm in the present modification.

At this time, a crystal face different from the side surfaces of the main grooves 9 is exposed on the side surfaces of the cross grooves 18. For this reason, the semiconductor region 2 is not formed on the side surfaces of the cross grooves 18.

[Third Step]

Next, as shown in FIGS. 146A and 146B, the electron supply region 3 made of aluminum gallium nitride (AlGaN) is formed by a method similar to the method described in the second step. The film thickness of the electron supply region 3 is preferably several to several tens of nanometers.

At this time, a crystal face different from the side surfaces of the main grooves 9 is exposed on the side surfaces of the cross grooves 18. For this reason, the electron supply region 3 is not formed on the side surfaces of the cross grooves 18.

Then, the fourth to seventh steps of the second embodiment described with reference to FIGS. 37A to 54B are performed, and thus the semiconductor device according to the modification 11 shown in FIGS. 139A to 139E is completed.

[Effect of Semiconductor Device]

The semiconductor device according to the modification 11 has a stress relaxation structure that relaxes the stress applied to at least one of the semiconductor region 2 and the electron supply region 3 in the extending direction of the main grooves 9. The stress in the extending direction of the main grooves 9 during crystal growth of the semiconductor region 2 and the electron supply region 3 is relaxed, and film cracking is prevented. As a result, the substrate 1 of high quality is obtained without reducing the channel density, and the semiconductor device achieving large current is provided.

The stress relaxation structure according to the modification 11 includes the cross grooves 18 that intersect with the main grooves 9 outside the region between the source electrode 7 and the drain electrode 6. By providing the cross grooves 18, a region where the semiconductor region 2 and the electron supply region 3 do not grow is formed. That is, the cross grooves 18 cut off the electron supply region 3 and the semiconductor region 2 that are continuously formed along the extending direction (Y direction) of the main grooves 9. Therefore, the stress in the extending direction of the main grooves 9 is relaxed.

(Twelfth Modification)

Next, a stress relaxation structure according to a modification 12 of the second embodiment is described with reference to FIGS. 139A to 150.

[Configuration of Semiconductor Device]

A semiconductor device according to the modification 12 includes at least two semiconductor devices (first semiconductor device and second semiconductor device). The two semiconductor devices may include the semiconductor device according to the second embodiment, and/or the semiconductor device according to the modifications 1 to 11. Further, they may include a semiconductor device according to a third embodiment or that according to a fourth embodiment which will be described later. Further, the two semiconductor devices may be the same or different. The number of semiconductor devices may not be limited to two, and three or more semiconductor devices (third semiconductor device . . . ) may be provided.

As shown in FIGS. 147A and 147B, a first semiconductor device 100*a* and a second semiconductor device 100*b* share the substrate 1 and are adjacent to each other in the extending direction (Y direction) of the main grooves 9 through a connection region in which connection grooves 23 are formed. As shown in FIG. 147B, as a stress relaxation structure according to the modification 12, first main grooves which are main grooves 9 provided in the first semiconductor device 100*a* and second main grooves which are main grooves 9 provided in the second semiconductor device 100*b* are connected by the connection grooves 23 having a crystal face exposed, which is different from the side surfaces of the first main grooves and the second main grooves, on at least a part of the side surfaces thereof.

The extending direction of the first main grooves and the extending direction of the second main grooves are parallel, but are arranged on different straight lines. In other words, the side surfaces of the first main grooves and the side surfaces of the second main grooves are parallel but arranged on different planes. The connecting grooves 23 are inclined with respect to each of the extending direction of the first main grooves and the extending direction of the second main grooves. In other words, the side surfaces of the connection grooves 23 are inclined with respect to each of the side surfaces of the first main grooves and the side surfaces of the second main grooves.

Note that the operation and manufacturing method for the semiconductor device according to the modification 12 are the same as those in the second embodiment, and the description is omitted.

[Effect of Semiconductor Device]

The semiconductor device according to the modification 12 has a stress relaxation structure (connection grooves 23) that relaxes the stress applied to at least one of the semiconductor region 2 and the electron supply region 3 in the extending direction of the main grooves 9. The stress in the extending direction of the main grooves 9 (first main grooves and second main grooves) during crystal growth of the semiconductor region 2 and the electron supply region 3 is relaxed, and film cracking is prevented. As a result, the substrate 1 of high quality is obtained without reducing the channel density, and the semiconductor device achieving large current is provided.

The stress relaxation structure according to the modification 12 includes the connection grooves 23 connected to the first main grooves of the first semiconductor device 100*a* and the second main grooves of the second semiconductor device 100*b* and having a crystal face exposed, which is different from the side surfaces of the first main grooves and the second main grooves, on at least a part of the side surfaces thereof. Therefore, the semiconductor region 2 and the electron supply region 3 are formed on the side surfaces of the first main grooves and the second main grooves, but are not formed on the side surfaces of the connection grooves 23. Therefore, a connection region where the semiconductor region 2 and the electron supply region 3 do not grow is formed between the first semiconductor device 100*a* and the second semiconductor device 100*b*. That is, the connection grooves 23 cut off the electron supply region 3 and the semiconductor region 2 that are continuously formed along the extending direction (Y direction) of the main grooves 9. Therefore, the stress in the extending direction of the main grooves 9 is relaxed.

As a first alternative example of the connection grooves 23, as shown in FIG. 148, connection grooves 24 having two or more different crystal faces provided on the side surfaces thereof may be used. The connection grooves 24 each have a step shape in a plan view. A region where the semiconductor region 2 and the electron supply region 3 do not grow is formed in a portion between the first semiconductor device 100*a* and the second semiconductor device 100*b*.

As a second alternative example of the connection grooves 23, as shown in FIG. 149, connection grooves 25 having two or more different crystal faces exposed on the side surfaces thereof may be used. Two different crystal faces are provided on the side surfaces of the connection grooves 25. Further, the extending direction of the first main grooves and the extending direction of the second main grooves are parallel and arranged on the same straight lines. In other words, the side surfaces of the first main grooves and the side surfaces of the second main grooves are parallel and arranged on the same planes.

As a third alternative example of the connection grooves 23, as shown in FIG. 150, the extending direction of first main grooves 9*a* of the first semiconductor device 100*a* are not parallel to the extending direction of second main grooves 9*b* of the second semiconductor device 100*b* and are inclined to each other. In a connection region 26, the first main grooves 9*a* and the second main grooves 9*b* are connected. In the connection region 26 where the first main grooves 9*a* and the second main grooves 9*b* are connected, the stress in the extending directions of the first main grooves and the extending directions of the second main grooves when the semiconductor region 2 and the electron supply region 3 are grown is cut off. Therefore, the stress is relaxed.

The modification 12 further relaxes the stress in the extending directions of the main grooves by being combined with the modifications 10 and 11. That is, at least one of the relaxation insulating films 21*a*, 21*b* and the cross grooves 18 may be combined in the connection region of the modification 12.

Third Embodiment

Next, a third embodiment is described with reference to FIGS. 151A to 156B. The third embodiment differs from the second embodiment in that a semiconductor device has a first field plate electrode 11. Description of the same components as those in the second embodiment is omitted by citing the reference numbers, and the description below is made focusing on the differences.

[Configuration of Semiconductor Device]

As shown in FIGS. 151A to 151C, a first field plate electrode 11 is formed between a gate electrode 5 and a drain electrode 6 to be embedded in main grooves 9. The first field plate electrode 11 is formed to be in contact with an electron supply region 3 through an insulating film 13. The first field plate electrode 11 has the same potential as that of a source electrode 7 or the gate electrode 5.

[Operation of Semiconductor Device]

As in the second embodiment, when the gate-source voltage is made less than the predetermined threshold value, a depletion layer spreads from the gate electrode 5 to the semiconductor region 2 through the electron supply region 3, and the two-dimensional electron gas layer 4 disappears.

As a result, the transistor is turned off, and the current is cut off. At this time, a high voltage is instantaneously applied between the source and the drain. Thus, a depletion layer spreads from the gate electrode 5 toward the drain electrode 6. At this time, an electric field is applied from the drain electrode 6 to the gate electrode 5, and electric field concentration occurs at the end of the gate electrode 5 on the side close to the drain electrode 6, so that the withstand voltage of the semiconductor device decreases.

In the third embodiment, the first field plate electrode 11 is formed between the gate electrode 5 and the drain electrode 6, and a part of the electric field from the drain electrode 6 is applied to the first field plate electrode 11. Accordingly, the electric field concentration at the end of the gate electrode 5 is reduced, preventing the withstand voltage from decreasing. The first field plate electrode 11 is made of the same material as the line electrode 14.

[Method for Manufacturing Semiconductor Device]

Next, an example of a method for manufacturing the semiconductor device according to the third embodiment is described. Since the first to sixth steps are the same as those in the second embodiment, description is omitted. Moreover, in the same step, description of the same portion as that in the second embodiment is omitted.

[Seventh Step]

Next, as shown in FIGS. 152A and 152B, an insulating film 13 is deposited on the electron supply region 3 and the gate electrode 5 to be used as a protective film, and the substrate 1 is moved to the rapid thermal processing apparatus (RTA) and heat-treated at a high temperature of 800 to 1000° C. for several tens of seconds. A silicon nitride film may be used as the insulating film 13, and an LPCVD method may be used as the deposition method.

Next, as shown in FIG. 153, the resist material 16 is formed on the insulating film 13, and a pattern for electrically connecting to each of the cathode electrode 7, the anode electrode 6 and the gate electrode 5 is formed.

Next, as shown in FIGS. 154A and 154B, the insulating film 13 is removed by the dry etching method or the wet etching method using the resist material 16 as a mask. Hot phosphoric acid may be applied in the wet etching.

Next, as shown in FIGS. 155A and 155B, the resist material 16 is removed, and a metal to be the line electrode 14 and the first field plate electrode 11 is embedded using the vapor deposition method, the sputtering method, or the like.

Next, as shown in FIGS. 156A and 156B, the line electrode 14 and the first field plate electrode 11 are patterned using the resist material 16 and a resist material 16*a*. The resist material 16 is formed, and the line electrode 14 is patterned. At the same time, the resist material 16*a* is formed, and the first field plate electrode 11 is also patterned. Finally, the resist material 16 and the resist material 16*a* are removed, and the line electrodes 14*a* to 14*c* and the first field plate electrode 11 are formed as shown in FIGS. 151A to 151C.

[Effect of Semiconductor Device]

According to the third embodiment, the first field plate electrode 11 is formed to be embedded in the main grooves 9. By embedding the first field plate electrode 11 in the main grooves 9, the area efficiency of the electrode is improved as compared with a semiconductor device using a plane. The first field plate electrode 11 is formed between the gate electrode 5 and the drain electrode 6, and a part of the electric field from the drain electrode 6 is applied to the first field plate electrode 11. Accordingly, the electric field concentration at the end of the gate electrode 5 is reduced, preventing the withstand voltage from decreasing.

The first field plate electrode 11 is applicable not only to a transistor but also to the semiconductor device according to the first embodiment, that is, a diode. In this case, the first field plate electrode 11 is formed between the cathode electrode 7 and the anode electrode 6 to be in contact with the electron supply region 3 through an insulating film. The same effect as in the third embodiment is obtained.

Fourth Embodiment

Next, a fourth embodiment is described with reference to FIGS. 157A to 168C. The fourth embodiment differs from the second embodiment in that a semiconductor device has a second field plate electrode 12. Description of the same components as those in the second embodiment is omitted by citing the reference numbers, and the description below is made focusing on the differences.

[Configuration of Semiconductor Device]

As shown in FIGS. 157A to 157C, the second field plate electrode 12 is formed on a back surface opposite to the main surface of the substrate 1 and is electrically insulated from the semiconductor region 2 and the electron supply region 3. Moreover, the second field plate electrode 12 is formed in a pillar part that forms the main groove 9 on the back surface of the substrate 1. The pillar part is formed between the gate and the drain. That is, the second field plate electrode 12 is formed between the gate electrode 5 and the drain electrode 6 in the extending direction of the main grooves 9 so that at least a part thereof faces the side surfaces of the main groove 9 in the substrate 1.

[Operation of Semiconductor Device]

As in the second embodiment, when the gate-source voltage is made less than the predetermined threshold value, a depletion layer spreads from the gate electrode 5 to the semiconductor region 2 through the electron supply region 3, and the two-dimensional electron gas layer 4 disappears. As a result, the transistor is turned off, and the current is cut off. At this time, a high voltage is instantaneously applied between the source and the drain. Thus, a depletion layer spreads from the gate electrode 5 toward the drain electrode 6. At this time, an electric field is applied from the drain electrode 6 to the gate electrode 5, and electric field concentration occurs at the end of the gate electrode 5 on the side close to the drain electrode 6, so that the withstand voltage of the semiconductor device decreases.

The second field plate electrode 12 having the same potential as that of the gate electrode 5 or the source electrode 7 is formed to be embedded between the gate and the drain on the back surface facing the main surface of the substrate 1, thereby reducing the electric field concentration between the gate and the drain. This achieves the high withstand voltage.

[Method for Manufacturing Semiconductor Device]

Next, an example of a method for manufacturing the semiconductor device according to the fourth embodiment is described. Since the second to seventh steps are the same as those in the second embodiment, description is omitted. In the fourth embodiment, the eighth step is further performed after the seventh step. Moreover, in the same step, description of the same portion as that in the second embodiment is omitted.

[First Step]

First, as shown in FIGS. 158A and 158B, an insulating film 31 is formed on the main surface of the substrate 1 as a mask material for forming the main grooves 9. The insulating film 31 is made of, for example, a silicon oxide film ($SiO_2$) and has a thickness of several micrometers. The insulating film 31 is deposited on the substrate 1 by a chemical vapor deposition method, such as a thermal CVD method or a plasma CVD method. The substrate 1 is selected so that the side surfaces of the main groove 9 are a silicon crystal face. Note that the silicon crystal face is the (111) face.

Next, as shown in FIGS. 159A and 159B, a resist material 20 is applied to the upper surface of the insulating film 31 by a photolithography method, and regions where the main grooves 9 are to be formed are selectively removed. That is, the resist material 20 is patterned into a shape with openings in the regions where the main grooves 9 are to be formed.

Next, as shown in FIGS. 160A and 160B, the insulating film 31 is patterned using the remaining resist material 20 as a mask. Patterning may be performed by wet etching using hydrofluoric acid, or dry etching, such as reactive ion etching.

After the patterning of the insulating film 31 is completed, as shown in FIGS. 161A and 161B, the resist material 20 is removed by oxygen plasma, sulfuric acid, or the like.

Next, as shown in FIGS. 162A and 162B, using the patterned insulating film 31 as a mask, the main grooves 9 are formed in the main surface of the substrate 1 by a dry etching method. More specifically, the main grooves 9 each extending in a direction (Y-axis direction) along the main surface of the substrate 1 are formed. The main groove 9 is formed to have the aspect ratio of the depth to the width of the main groove 9 greater than or equal to 1. For example, the main groove 9 has a width of about 20 μm and a depth of about 500 μm.

Next, as shown in FIGS. 163A to 163C, an insulating film 40 as a mask material is formed on the back surface of the substrate 1 on which the main grooves 9 are formed. The film thickness of the insulating film 40 is preferably several micrometers. A silicon oxide film may be used as the insulating film 40, and the thermal CVD method or the plasma CVD method may be used as the deposition method.

Next, as shown in FIGS. 164A to 164C, a resist material 16 is formed on the insulating film 40. Then, as shown in FIGS. 165A to 165C, a pattern for forming a second field plate electrode 12 facing the side surfaces of the main groove 9 is formed.

Next, as shown in FIGS. 166A to 166C, the insulating film 40 is etched using the patterned resist material 16 as a mask to form a mask for forming a back surface groove 10 on the back surface of the substrate 1. Then, the resist material 30 is removed by oxygen plasma, sulfuric acid, or the like.

Next, as shown in FIGS. 167A to 167C, the back surface groove 10 is formed on the back surface of the substrate 1 by a dry etching method using the insulating film 40 as a mask. Then, the insulating film 13 is removed by wet etching using hydrofluoric acid, or dry etching, such as reactive ion etching.

[Eighth Step]

After performing the seventh step, as shown in FIGS. 168A to 168C, the second field plate electrode 12 is formed on the entire back surface of the substrate 1 by a vapor deposition method, a sputtering method, or the like. Thus, the semiconductor device shown in FIGS. 157A to 157C is completed.

[Effect of Semiconductor Device]

According to the fourth embodiment, the second field plate electrode 12 is formed in contact with the back surface of the substrate 1. Accordingly, the back surface of the substrate 1 is used as a field plate electrode. Since wiring on the main surface is reduced as compared with the case where wiring is performed from the main surface of the substrate 1, a semiconductor device not requiring complicated wiring and easily manufactured is provided. Further, since the insulation between the second field plate electrode 12 formed on the back surface of the substrate 1 and the semiconductor region 2 is ensured, a high withstand voltage is achieved. Further, the second field plate electrode 12 having the same potential as that of the gate electrode 5 or the source electrode 7 is formed to be embedded between the gate and the drain on the back surface of the substrate 1, thereby reducing the electric field concentration between the gate and the drain. This achieves the high withstand voltage.

The second field plate electrode 12 is applicable not only to a transistor but also to the semiconductor device according to the first embodiment, that is, a diode. In this case, the second field plate electrode 12 is formed between the cathode electrode 7 and the anode electrode 6 in the extending direction of the main grooves 9 so that at least a part thereof faces the side surfaces of the main groove 9 in the substrate 1. The same effect as in the fourth embodiment is obtained.

OTHER EMBODIMENTS

Although the present invention is described by embodiments as described above, it should not be understood that the description and drawings which form a part of the present disclosure limit the invention. From the disclosure, various alternative embodiments, examples and operational techniques will be apparent to those skilled in the art.

For example, in the above-described embodiments, the manufacture of the semiconductor device using gallium nitride is described. However, a material other than gallium nitride may be used. For example, gallium arsenide (GaAs) or indium phosphide (InP) may be used.

As described above, the present invention naturally includes various embodiments and the like not described here. Therefore, the technical scope of the present invention is defined only by the invention specifying matters according to the scope of claims reasonable from the above description.

REFERENCE SIGNS LIST

1 SUBSTRATE
2 SEMICONDUCTOR REGION
3 ELECTRON SUPPLY REGION
4 TWO-DIMENSIONAL ELECTRON GAS LAYER
5 GATE ELECTRODE (THIRD ELECTRODE)
6 CATHODE ELECTRODE, DRAIN ELECTRODE (SECOND ELECTRODE)
7 ANODE ELECTRODE, SOURCE ELECTRODE (FIRST ELECTRODE)
9 MAIN GROOVE
11 FIRST FIELD PLATE ELECTRODE
12 SECOND FIELD PLATE ELECTRODE
17 ELECTRODE GROOVE
18 CROSS GROOVE (STRESS RELAXATION STRUCTURE)
21a, 21b RELAXATION INSULATING FILM (STRESS RELAXATION STRUCTURE)
23, 24, 25 CONNECTION GROOVE (STRESS RELAXATION STRUCTURE)
26 CONNECTION REGION (STRESS RELAXATION STRUCTURE)

The invention claimed is:

1. A semiconductor device, comprising:
a substrate;
a main groove formed in a main surface of the substrate extending along a longitudinal direction, the main groove having a first terminal end and a second terminal end opposed to each other in the longitudinal direction of the main groove;
a semiconductor region formed in contact with a surface of the substrate in a region extending between the first terminal end and the second terminal end in the longitudinal direction of the main groove;
an electron supply region formed in contact with a surface of the semiconductor region on opposite sides of at least side surfaces of a surface of the main groove to generate a two-dimensional electron gas layer in the semiconductor region;
a first electrode formed in contact with the two-dimensional electron gas layer on the first terminal end; and
a second electrode formed in contact with the two-dimensional electron gas layer on the second terminal end and apart from the first electrode in the longitudinal direction of the main groove, wherein
the main groove has a depth greater than or equal to a total width of the main groove along a direction orthogonal to the longitudinal direction of the main groove.

2. The semiconductor device according to claim 1, further comprising:
an electrode groove formed in contact with the main groove and having a crystal face that is different from a crystal face of the side surfaces of the main groove and is exposed on side surfaces of the electrode groove, wherein at least one of the first electrode or the second electrode is formed inside the electrode groove.

3. The semiconductor device according to claim 2, further comprising:
a stress relaxation structure that relaxes stress applied to at least one of the semiconductor region or the electron supply region in an extending direction of the main groove, wherein
the stress relaxation structure includes a relaxation insulating film formed in contact with the surface of the main groove outside a region between the first electrode and the second electrode.

4. The semiconductor device according to claim 2, further comprising:
a stress relaxation structure that relaxes stress applied to at least one of the semiconductor region or the electron supply region in an extending direction of the main groove, wherein
the stress relaxation structure includes a cross groove that crosses the main groove outside a region between the first electrode and the second electrode.

5. The semiconductor device according to claim 2, comprising:
a first semiconductor device that is the semiconductor device according to claim 2;
a second semiconductor device that is the semiconductor device according to claim 2 and is adjacent in an extending direction of the main groove provided in the first semiconductor device, and
a stress relaxation structure that relaxes stress applied to at least one of the semiconductor region or the electron supply region in an extending direction of the main groove,
wherein as the stress relaxation structure, a first main groove that is the main groove provided in the first semiconductor device, and a second main groove that is the main groove provided in the second semiconductor device are connected by a connection groove that has a crystal face exposed, which is different from the side surfaces of the first main groove and the second main groove, on at least a part of side surfaces thereof.

6. The semiconductor device according to claim 2, wherein
the electron supply region is selectively formed on the surface of the semiconductor region on the opposite sides of the side surfaces of the main groove.

7. The semiconductor device according to claim 2, wherein
the main groove includes an end portion along an extending direction of the main groove on each side surface of the main groove, the end portion having a radius of curvature greater than a thickness of the electron supply region when viewed in the extending direction of the main groove.

8. The semiconductor device according to claim 2, further comprising:
a first field plate electrode formed between the first electrode and the second electrode in an extending direction of the main groove to be in contact with the electron supply region through an insulating film,
wherein the first field plate electrode has the same potential as that of the first electrode.

9. The semiconductor device according to claim 2, further comprising:
a second field plate electrode formed between the first electrode and the second electrode in an extending direction of the main groove to have at least a part thereof facing the side surfaces of the main groove in the substrate,
wherein the second field plate electrode has the same potential as that of the first electrode.

10. The semiconductor device according to claim 2, wherein the substrate is made of an insulator or a semi-insulator.

11. The semiconductor device according to claim 2, wherein
the substrate is made of silicon, and
the side surfaces of the main groove are a (111) crystal face of silicon.

12. The semiconductor device according to claim 2, wherein the substrate is made of silicon carbide.

13. A semiconductor device, comprising:
a first semiconductor device that is the semiconductor device according to claim 2; and
a second semiconductor device that is the semiconductor device according to claim 2,
wherein the first semiconductor device and the second semiconductor device share the first electrode or the second electrode with each other.

14. The semiconductor device according to claim 2, wherein the first electrode is in ohmic contact with the two-dimensional electron gas layer, and an energy barrier is between the second electrode and the two-dimensional electron gas layer.

15. The semiconductor device according to claim 2, further comprising:
a third electrode that is formed between the first electrode and the second electrode in the longitudinal direction of the main groove and controls a number of carriers in the two-dimensional electron gas layer,
wherein the first electrode and the second electrode are in ohmic contact with the two-dimensional electron gas layer.

16. The semiconductor device according to claim 15, wherein the third electrode is formed to face the side surfaces of the main groove with the semiconductor region and the electron supply region interposed therebetween.

17. The semiconductor device according to claim 15, further comprising:
a first field plate electrode formed between the third electrode and the second electrode in the extending direction of the main groove to be in contact with the electron supply region through an insulating film,
wherein the first field plate electrode has the same potential as that of the first electrode or the third electrode.

18. The semiconductor device according to claim 15, further comprising:
a second field plate electrode formed between the third electrode and the second electrode in the extending direction of the main groove to have at least a part thereof facing the side surfaces of the main groove in the substrate,
wherein the second field plate electrode has the same potential as that of the first electrode or the third electrode.

19. The semiconductor device according to claim 2, comprising:
a first semiconductor device that is the semiconductor device according to claim 2;
a second semiconductor device that is the semiconductor device according to claim 2 and is adjacent in an extending direction of the main groove provided in the first semiconductor device, and
a stress relaxation structure that relaxes stress applied to at least one of the semiconductor region or the electron supply region in an extending direction of the main groove,
wherein as the stress relaxation structure, a different crystal face is exposed on side surfaces of a first main groove that is the main groove provided in the first semiconductor device and on side surfaces of a second main groove that is the main groove provided in the second semiconductor device.

20. The semiconductor device according to claim 1, wherein the semiconductor region includes a buffer layer in contact with the surface of the main groove.

21. The semiconductor device according to claim 1, wherein the semiconductor region includes a layer made of gallium nitride.

* * * * *